US011870227B2

(12) United States Patent
Bunea et al.

(10) Patent No.: US 11,870,227 B2
(45) Date of Patent: Jan. 9, 2024

(54) BUILDING INTEGRATED PHOTOVOLTAIC SYSTEM

(71) Applicant: GAF Energy LLC, Parsippany, NJ (US)

(72) Inventors: Gabriela Bunea, San Jose, CA (US); Thierry Nguyen, San Francisco, CA (US); Michael David Kuiper, Newark, CA (US); Evan Michael Wray, Cotati, CA (US); Lewis Abra, San Francisco, CA (US); Peter Clemente, Warren, NJ (US); Brian West, San Francisco, CA (US)

(73) Assignee: GAF Energy LLC, Parsippany, NJ (US)

(*) Notice: Subject to any disclaimer, the term of this patent is extended or adjusted under 35 U.S.C. 154(b) by 0 days.

(21) Appl. No.: 18/176,723

(22) Filed: Mar. 1, 2023

(65) Prior Publication Data
US 2023/0283054 A1 Sep. 7, 2023

Related U.S. Application Data

(63) Continuation of application No. PCT/US2021/049017, filed on Sep. 3, 2021.
(Continued)

(51) Int. Cl.
*H02G 3/04* (2006.01)
*H02S 40/34* (2014.01)
(Continued)

(52) U.S. Cl.
CPC ....... *H02G 3/0437* (2013.01); *H01L 31/0488* (2013.01); *H02S 20/23* (2014.12); *H02S 40/34* (2014.12)

(58) Field of Classification Search
CPC . H01L 31/048; H01L 31/0488; H01L 31/042; H01L 31/02008; H01L 31/02021;
(Continued)

(56) References Cited

U.S. PATENT DOCUMENTS

| 1,981,467 A | 11/1934 | Radtke |
| 3,156,497 A | 11/1964 | Lessard |

(Continued)

FOREIGN PATENT DOCUMENTS

| CA | 2829440 A | 5/2019 |
| CH | 700095 A2 | 6/2010 |

(Continued)

OTHER PUBLICATIONS

Sunflare, Procducts: "Sunflare Develops Prototype for New Residential Solar Shingles"; 2019 <<sunflaresolar.com/news/sunflare-develops-prototype-for-new-residential-solar-shingles>> retrieved Feb. 2, 2021.

(Continued)

*Primary Examiner* — Christina Chern
(74) *Attorney, Agent, or Firm* — Greenberg Traurig, LLP

(57) ABSTRACT

A building integrated photovoltaic system includes a plurality of photovoltaic modules installed in an array on a roof deck. Each of the photovoltaic modules at least one solar cell, a first encapsulant encapsulating the at least one solar cell, a frontsheet juxtaposed with a first surface of the first encapsulant, and a backsheet juxtaposed with a second surface of the first encapsulant. The frontsheet includes a glass layer, a second encapsulant, and a first polymer layer. The backsheet includes a first layer and a second polymer layer attached to the first layer. Each of the photovoltaic modules includes a wire cover bracket, which is configured to overlap the wire cover bracket of an adjacent one of the photovoltaic modules.

16 Claims, 53 Drawing Sheets

Related U.S. Application Data

(60) Provisional application No. 63/074,268, filed on Sep. 3, 2020.

(51) Int. Cl.
*H02S 20/23* (2014.01)
*H01L 31/048* (2014.01)

(58) Field of Classification Search
CPC .......... H02S 40/34; H02S 40/30; H02S 40/36; H02S 20/23–25
See application file for complete search history.

(56) References Cited

U.S. PATENT DOCUMENTS

| | | |
|---|---|---|
| 4,258,948 A | 3/1981 | Hoffmann |
| 4,349,220 A | 9/1982 | Carroll et al. |
| 4,499,702 A | 2/1985 | Turner |
| 4,636,577 A | 1/1987 | Peterpaul |
| 5,167,579 A | 12/1992 | Rotter |
| 5,437,735 A | 8/1995 | Younan et al. |
| 5,590,495 A | 1/1997 | Bressler et al. |
| 5,642,596 A | 7/1997 | Waddington |
| 6,008,450 A | 12/1999 | Ohtsuka et al. |
| 6,033,270 A | 3/2000 | Stuart |
| 6,046,399 A | 4/2000 | Kapner |
| 6,182,403 B1 * | 2/2001 | Mimura .................. H02S 20/23 126/621 |
| 6,320,114 B1 | 11/2001 | Kuechler |
| 6,320,115 B1 | 11/2001 | Kataoka et al. |
| 6,336,304 B1 | 1/2002 | Mimura et al. |
| 6,341,454 B1 | 1/2002 | Koleoglou |
| 6,407,329 B1 | 6/2002 | Iino et al. |
| 6,576,830 B2 | 6/2003 | Nagao et al. |
| 6,928,781 B2 | 8/2005 | Desbois et al. |
| 6,972,367 B2 | 12/2005 | Federspiel et al. |
| 7,138,578 B2 | 11/2006 | Komamine |
| 7,155,870 B2 | 1/2007 | Almy |
| 7,178,295 B2 | 2/2007 | Dinwoodie |
| 7,487,771 B1 | 2/2009 | Eiffert et al. |
| 7,587,864 B2 | 9/2009 | McCaskill et al. |
| 7,678,990 B2 | 3/2010 | McCaskill et al. |
| 7,678,991 B2 | 3/2010 | McCaskill et al. |
| 7,748,191 B2 | 7/2010 | Podirsky |
| 7,819,114 B2 | 10/2010 | Augenbraun et al. |
| 7,824,191 B1 | 11/2010 | Podirsky |
| 7,832,176 B2 | 11/2010 | McCaskill et al. |
| 8,118,109 B1 | 2/2012 | Hacker |
| 8,168,880 B2 | 5/2012 | Jacobs et al. |
| 8,173,889 B2 | 5/2012 | Kalkanoglu et al. |
| 8,210,570 B1 | 7/2012 | Railkar et al. |
| 8,276,329 B2 | 10/2012 | Lenox |
| 8,312,693 B2 | 11/2012 | Cappelli |
| 8,319,093 B2 | 11/2012 | Kalkanoglu et al. |
| 8,333,040 B2 | 12/2012 | Shiao et al. |
| 8,371,076 B2 | 2/2013 | Jones et al. |
| 8,375,653 B2 | 2/2013 | Shiao et al. |
| 8,404,967 B2 | 3/2013 | Kalkanoglu et al. |
| 8,410,349 B2 | 4/2013 | Kalkanoglu et al. |
| 8,418,415 B2 | 4/2013 | Shiao et al. |
| 8,438,796 B2 | 5/2013 | Shiao et al. |
| 8,468,754 B2 | 6/2013 | Railkar et al. |
| 8,468,757 B2 | 6/2013 | Krause et al. |
| 8,505,249 B2 | 8/2013 | Geary |
| 8,512,866 B2 | 8/2013 | Taylor |
| 8,513,517 B2 | 8/2013 | Kalkanoglu et al. |
| 8,586,856 B2 | 11/2013 | Kalkanoglu et al. |
| 8,601,754 B2 | 12/2013 | Jenkins et al. |
| 8,629,578 B2 | 1/2014 | Kurs et al. |
| 8,646,228 B2 | 2/2014 | Jenkins |
| 8,656,657 B2 | 2/2014 | Livsey et al. |
| 8,671,630 B2 | 3/2014 | Lena et al. |
| 8,677,702 B2 | 3/2014 | Jenkins |
| 8,695,289 B2 | 4/2014 | Koch et al. |
| 8,713,858 B1 | 5/2014 | Xie |
| 8,713,860 B2 | 5/2014 | Railkar et al. |
| 8,733,038 B2 | 5/2014 | Kalkanoglu et al. |
| 8,789,321 B2 | 7/2014 | Ishida |
| 8,793,940 B2 | 8/2014 | Kalkanoglu et al. |
| 8,793,941 B2 | 8/2014 | Bosler et al. |
| 8,826,607 B2 | 9/2014 | Shiao et al. |
| 8,835,751 B2 | 9/2014 | Kalkanoglu et al. |
| 8,863,451 B2 | 10/2014 | Jenkins et al. |
| 8,898,970 B2 | 12/2014 | Jenkins et al. |
| 8,925,262 B2 | 1/2015 | Railkar et al. |
| 8,943,766 B2 | 2/2015 | Gombarick et al. |
| 8,946,544 B2 | 2/2015 | Jabos et al. |
| 8,950,128 B2 | 2/2015 | Kalkanoglu et al. |
| 8,959,848 B2 | 2/2015 | Jenkins et al. |
| 8,966,838 B2 | 3/2015 | Jenkins |
| 8,966,850 B2 | 3/2015 | Jenkins et al. |
| 8,994,224 B2 | 3/2015 | Mehta et al. |
| 9,032,672 B2 | 5/2015 | Livsey et al. |
| 9,166,087 B2 | 10/2015 | Chihlas et al. |
| 9,169,646 B2 | 10/2015 | Rodrigues et al. |
| 9,170,034 B2 | 10/2015 | Bosler et al. |
| 9,178,465 B2 | 11/2015 | Shiao et al. |
| 9,202,955 B2 | 12/2015 | Livsey et al. |
| 9,212,832 B2 | 12/2015 | Jenkins |
| 9,217,584 B2 | 12/2015 | Kalkanoglu et al. |
| 9,270,221 B2 | 2/2016 | Zhao |
| 9,273,885 B2 | 3/2016 | Rordigues et al. |
| 9,276,141 B2 | 3/2016 | Kalkanoglu et al. |
| 9,331,224 B2 | 5/2016 | Koch et al. |
| 9,356,174 B2 | 5/2016 | Duarte et al. |
| 9,359,014 B1 | 6/2016 | Yang et al. |
| 9,412,890 B1 | 8/2016 | Meyers |
| 9,528,270 B2 | 12/2016 | Jenkins et al. |
| 9,605,432 B1 | 3/2017 | Robbins |
| 9,711,672 B2 | 7/2017 | Wang |
| 9,755,573 B2 | 9/2017 | Livsey et al. |
| 9,786,802 B2 | 10/2017 | Shiao et al. |
| 9,831,818 B2 | 11/2017 | West |
| 9,912,284 B2 | 3/2018 | Svec |
| 9,923,515 B2 | 3/2018 | Rodrigues et al. |
| 9,938,729 B2 | 4/2018 | Coon |
| 9,991,412 B2 | 6/2018 | Gonzalez et al. |
| 9,998,067 B2 | 6/2018 | Kalkanoglu et al. |
| 10,027,273 B2 | 7/2018 | West et al. |
| 10,115,850 B2 | 10/2018 | Rodrigues et al. |
| 10,128,660 B1 | 11/2018 | Apte et al. |
| 10,156,075 B1 | 12/2018 | McDonough |
| 10,187,005 B2 | 1/2019 | Rodrigues et al. |
| 10,256,765 B2 | 4/2019 | Rodrigues et al. |
| 10,284,136 B1 | 5/2019 | Mayfield et al. |
| 10,454,408 B2 | 10/2019 | Livsey et al. |
| 10,530,292 B1 | 1/2020 | Cropper et al. |
| 10,560,048 B2 | 2/2020 | Fisher et al. |
| 10,563,406 B2 | 2/2020 | Kalkanoglu et al. |
| D879,031 S | 3/2020 | Lance et al. |
| 10,784,813 B2 | 9/2020 | Kalkanoglu et al. |
| D904,289 S | 12/2020 | Lance et al. |
| 11,012,026 B2 | 5/2021 | Kalkanoglu et al. |
| 11,177,639 B1 | 11/2021 | Nguyen et al. |
| 11,217,715 B2 | 1/2022 | Sharenko et al. |
| 11,251,744 B1 | 2/2022 | Bunea et al. |
| 11,258,399 B2 | 2/2022 | Kalkanoglu et al. |
| 11,283,394 B2 | 3/2022 | Perkins et al. |
| 11,424,379 B2 | 8/2022 | Sharenko et al. |
| 11,431,280 B2 | 8/2022 | Liu et al. |
| 11,431,281 B2 | 8/2022 | Perkins et al. |
| 2002/0053360 A1 | 5/2002 | Kinoshita et al. |
| 2002/0129849 A1 | 9/2002 | Heckeroth |
| 2003/0101662 A1 | 6/2003 | Ullman |
| 2003/0132265 A1 | 7/2003 | Villela et al. |
| 2003/0217768 A1 | 11/2003 | Guha |
| 2005/0030187 A1 | 2/2005 | Peress et al. |
| 2005/0115603 A1 | 6/2005 | Yoshida et al. |
| 2005/0144870 A1 | 7/2005 | Dinwoodie |
| 2005/0178428 A1 | 8/2005 | Laaly et al. |
| 2006/0042683 A1 | 3/2006 | Gangemi |
| 2006/0046084 A1 | 3/2006 | Yang et al. |
| 2007/0181174 A1 | 8/2007 | Ressler |
| 2007/0193618 A1 | 8/2007 | Bressler et al. |

(56) References Cited

U.S. PATENT DOCUMENTS

| | | |
|---|---|---|
| 2007/0249194 A1 | 10/2007 | Liao |
| 2007/0295385 A1 | 12/2007 | Sheats et al. |
| 2008/0006323 A1 | 1/2008 | Kalkanoglu et al. |
| 2008/0035140 A1 | 2/2008 | Placer et al. |
| 2008/0315061 A1 | 2/2008 | Placer et al. |
| 2008/0078440 A1 | 4/2008 | Lim et al. |
| 2008/0185748 A1 | 8/2008 | Kalkanoglu |
| 2008/0271774 A1 | 11/2008 | Kalkanoglu et al. |
| 2008/0302030 A1 | 12/2008 | Stancel et al. |
| 2009/0000222 A1 | 1/2009 | Kalkanoglu et al. |
| 2009/0014058 A1 | 1/2009 | Croft et al. |
| 2009/0019795 A1 | 1/2009 | Szacsvay et al. |
| 2009/0044850 A1 | 2/2009 | Kimberley |
| 2009/0114261 A1 | 5/2009 | Stancel et al. |
| 2009/0133340 A1 | 5/2009 | Shiao et al. |
| 2009/0159118 A1 | 6/2009 | Kalkanoglu et al. |
| 2009/0178350 A1 | 7/2009 | Kalkanoglu et al. |
| 2009/0229652 A1 | 9/2009 | Mapel et al. |
| 2010/0019580 A1 | 1/2010 | Croft et al. |
| 2010/0095618 A1 | 4/2010 | Edison et al. |
| 2010/0101634 A1 | 4/2010 | Frank et al. |
| 2010/0116325 A1 | 5/2010 | Nikoonahad |
| 2010/0131108 A1 | 5/2010 | Meyer |
| 2010/0139184 A1 | 6/2010 | Williams et al. |
| 2010/0146878 A1 | 6/2010 | Koch et al. |
| 2010/0159221 A1 | 6/2010 | Kourtakis et al. |
| 2010/0170169 A1 | 7/2010 | Railkar et al. |
| 2010/0242381 A1 | 9/2010 | Jenkins |
| 2010/0313499 A1 | 12/2010 | Gangemi |
| 2010/0326488 A1 | 12/2010 | Aue et al. |
| 2010/0326501 A1 | 12/2010 | Zhao et al. |
| 2011/0030761 A1 | 2/2011 | Kalkanoglu et al. |
| 2011/0036386 A1 | 2/2011 | Browder |
| 2011/0036389 A1 | 2/2011 | Hardikar et al. |
| 2011/0048507 A1* | 3/2011 | Livsey .................... F24S 25/61  52/173.3 |
| 2011/0058337 A1 | 3/2011 | Han et al. |
| 2011/0061326 A1 | 3/2011 | Jenkins |
| 2011/0100436 A1 | 5/2011 | Cleereman et al. |
| 2011/0104488 A1 | 5/2011 | Muessig et al. |
| 2011/0132427 A1 | 6/2011 | Kalkanoglu et al. |
| 2011/0168238 A1 | 7/2011 | Metin et al. |
| 2011/0239555 A1 | 10/2011 | Cook et al. |
| 2011/0302859 A1 | 12/2011 | Crasnianski |
| 2012/0034799 A1 | 2/2012 | Hunt |
| 2012/0060902 A1 | 3/2012 | Drake |
| 2012/0137600 A1 | 6/2012 | Jenkins |
| 2012/0176077 A1 | 7/2012 | Oh et al. |
| 2012/0212065 A1 | 8/2012 | Cheng et al. |
| 2012/0233940 A1 | 9/2012 | Perkins et al. |
| 2012/0240490 A1 | 9/2012 | Gangemi |
| 2012/0260977 A1 | 10/2012 | Stancel |
| 2012/0266942 A1 | 10/2012 | Komatsu et al. |
| 2012/0279150 A1 | 11/2012 | Pislkak et al. |
| 2012/0291848 A1 | 11/2012 | Sherman et al. |
| 2013/0008499 A1 | 1/2013 | Verger et al. |
| 2013/0014455 A1 | 1/2013 | Grieco |
| 2013/0193769 A1 | 8/2013 | Mehta et al. |
| 2013/0247988 A1 | 9/2013 | Reese et al. |
| 2013/0284267 A1 | 10/2013 | Plug et al. |
| 2013/0306137 A1 | 11/2013 | Ko |
| 2014/0090697 A1 | 4/2014 | Rodrigues et al. |
| 2014/0150843 A1 | 6/2014 | Pearce et al. |
| 2014/0173997 A1 | 6/2014 | Jenkins |
| 2014/0179220 A1 | 6/2014 | Railkar et al. |
| 2014/0182222 A1 | 7/2014 | Kalkanoglu et al. |
| 2014/0254776 A1 | 9/2014 | O'Connor et al. |
| 2014/0266289 A1 | 9/2014 | Della Sera et al. |
| 2014/0311556 A1 | 10/2014 | Feng et al. |
| 2014/0352760 A1 | 12/2014 | Haynes et al. |
| 2014/0366464 A1 | 12/2014 | Rodrigues et al. |
| 2015/0089895 A1 | 4/2015 | Leitch |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0142008 A1 | 5/2016 | Lopez et al. |
| 2016/0254776 A1 | 9/2016 | Rodrigues et al. |
| 2016/0276508 A1 | 9/2016 | Huang et al. |
| 2016/0359451 A1 | 12/2016 | Mao et al. |
| 2017/0159292 A1 | 6/2017 | Chihlas et al. |
| 2017/0179319 A1 | 6/2017 | Yamashita et al. |
| 2017/0179726 A1 | 6/2017 | Garrity et al. |
| 2017/0237390 A1 | 8/2017 | Hudson et al. |
| 2017/0331415 A1 | 11/2017 | Koppi et al. |
| 2018/0094438 A1 | 4/2018 | Wu et al. |
| 2018/0097472 A1 | 4/2018 | Anderson et al. |
| 2018/0115275 A1 | 4/2018 | Flanigan et al. |
| 2018/0254738 A1 | 9/2018 | Yang et al. |
| 2018/0351502 A1 | 12/2018 | Almy et al. |
| 2018/0367089 A1 | 12/2018 | Stutterheim et al. |
| 2019/0030867 A1 | 1/2019 | Sun et al. |
| 2019/0081436 A1 | 3/2019 | Onodi et al. |
| 2019/0123679 A1 | 4/2019 | Rodrigues et al. |
| 2019/0253022 A1 | 8/2019 | Hardar et al. |
| 2019/0305717 A1 | 10/2019 | Allen et al. |
| 2020/0109320 A1 | 4/2020 | Jiang |
| 2020/0144958 A1 | 5/2020 | Rodrigues et al. |
| 2020/0220819 A1 | 7/2020 | Vu et al. |
| 2020/0224419 A1 | 7/2020 | Boss et al. |
| 2020/0343397 A1 | 10/2020 | Hem-Jensen |
| 2021/0115223 A1 | 4/2021 | Bonekamp et al. |
| 2021/0159353 A1 | 5/2021 | Li et al. |
| 2021/0343886 A1 | 11/2021 | Sharenko et al. |
| 2022/0149213 A1 | 5/2022 | Mensink et al. |

FOREIGN PATENT DOCUMENTS

| | | |
|---|---|---|
| CN | 202797032 U | 3/2013 |
| DE | 1958248 A1 | 11/1971 |
| EP | 1039361 A1 | 9/2000 |
| EP | 1837162 A1 | 9/2007 |
| EP | 1774372 A1 | 7/2011 |
| EP | 2446481 A2 | 5/2012 |
| EP | 2784241 A1 | 10/2014 |
| JP | 10046767 A | 2/1998 |
| JP | 2002-106151 A | 4/2002 |
| JP | 2001-098703 A | 10/2002 |
| JP | 2017-027735 A | 2/2017 |
| JP | 2018053707 A | 4/2018 |
| KR | 20090084060 A | 8/2009 |
| KR | 10-2019-0000367 A | 1/2019 |
| KR | 10-2253483 B1 | 5/2021 |
| NL | 2026856 B1 | 6/2022 |
| WO | 2011/049944 A1 | 4/2011 |
| WO | 2015/133632 A1 | 9/2015 |
| WO | 2019/201416 A1 | 10/2019 |
| WO | 2020-159358 A1 | 8/2020 |
| WO | 2021-247098 A1 | 12/2021 |

OTHER PUBLICATIONS

RGS Energy, 3.5kW POWERHOUSE 3.0 system installed in an afternoon; Jun. 7, 2019 <<facebook.com/RGSEnergy/>> retrieved Feb. 2, 2021.

Tesla, Solar Roof <<tesla.com/solarroof>> retrieved Feb. 2, 2021.

"Types of Roofing Underlayment", Owens Corning Roofing; <<https://www.owenscorning.com/en-us/roofing/tools/how-roofing-underlayment-helps-protect-your-home>> retrieved Nov. 1, 2021.

* cited by examiner

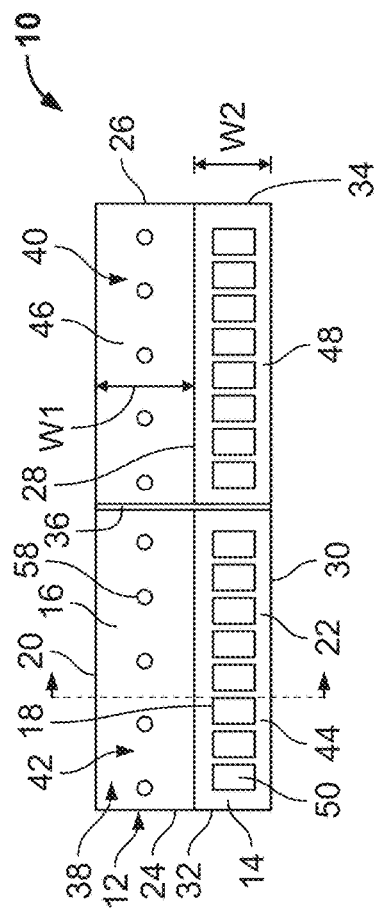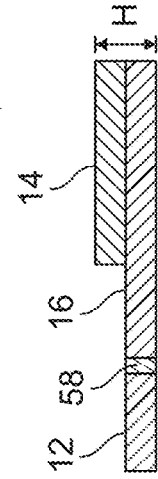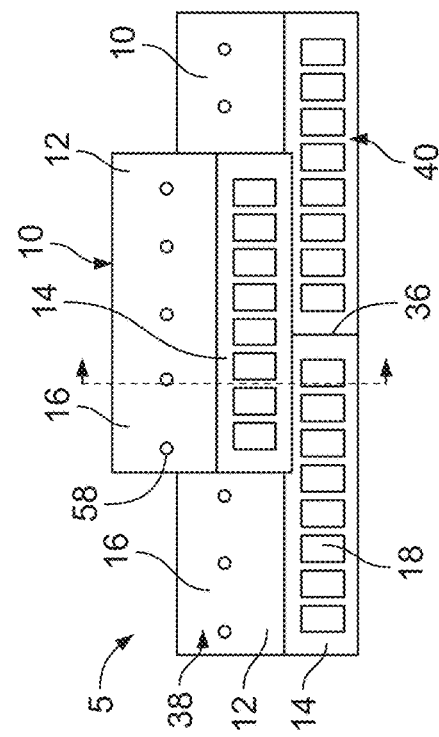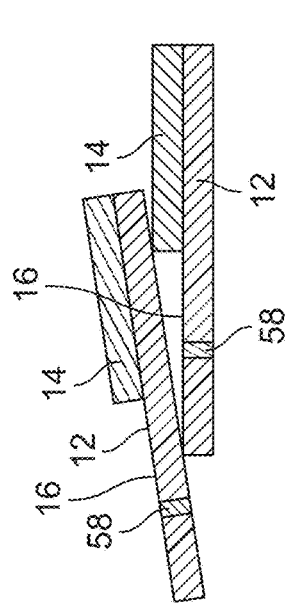

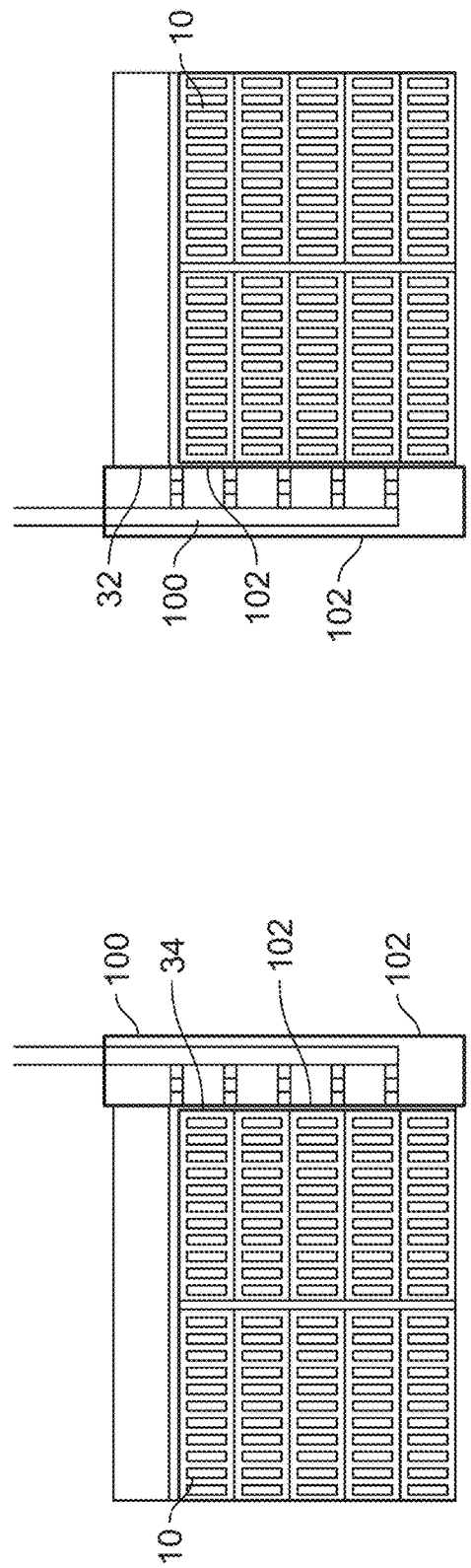
FIG. 3A
FIG. 3B
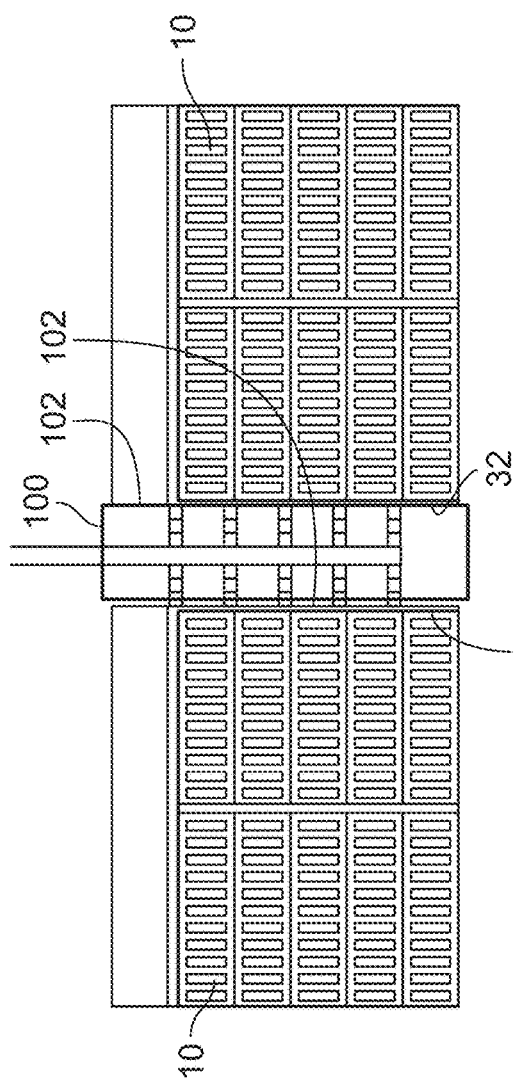
FIG. 3C

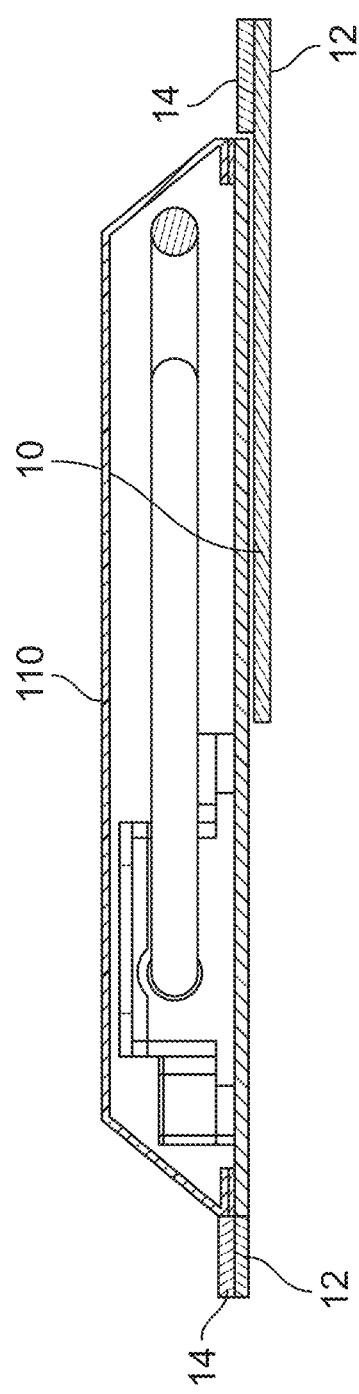
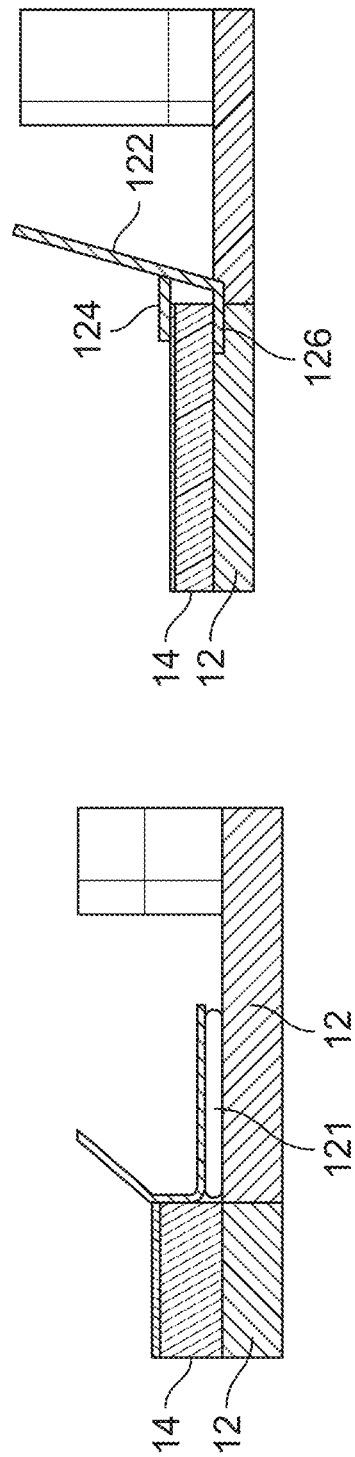
FIG. 14A
FIG. 14B
FIG. 14C

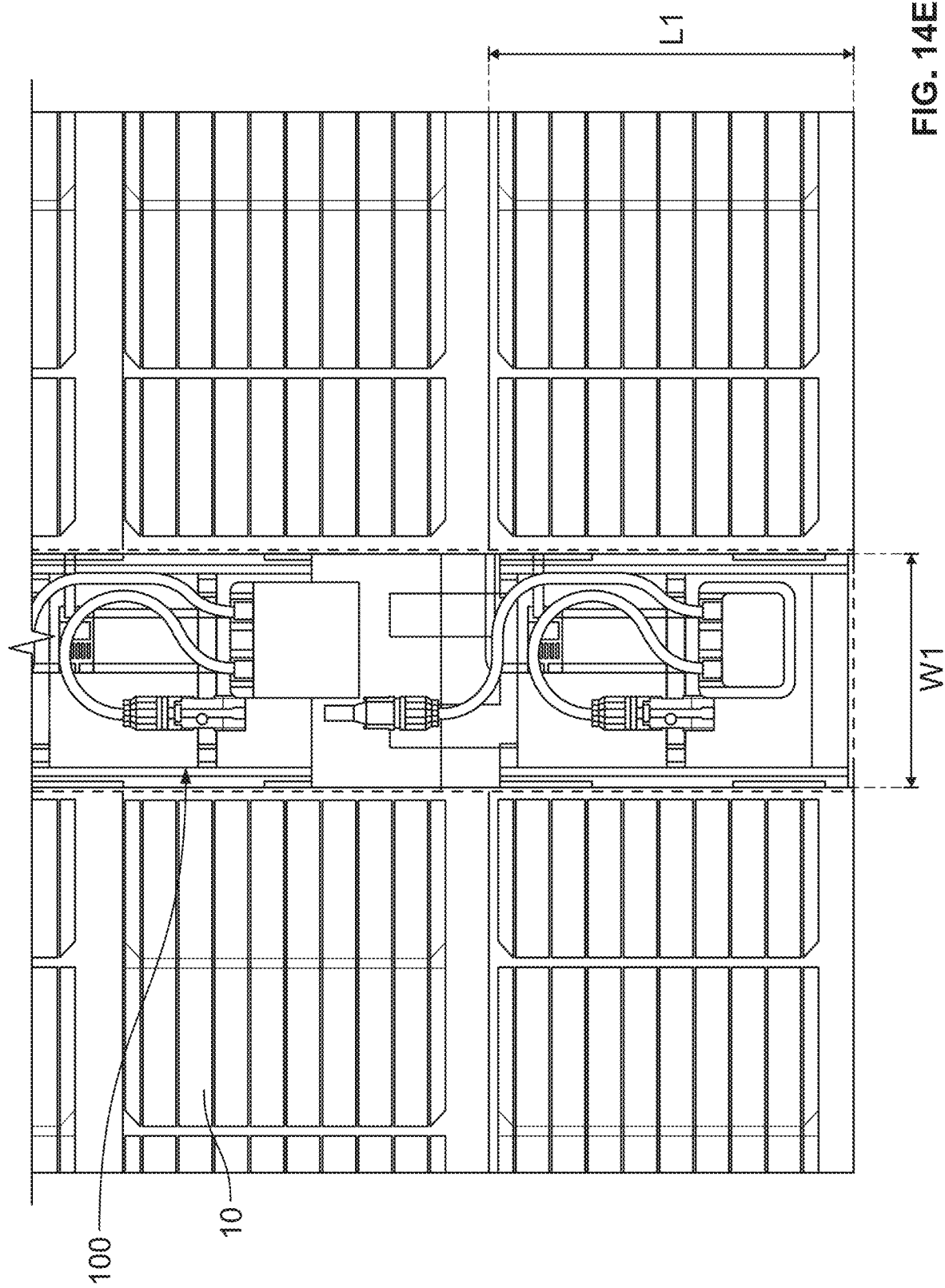

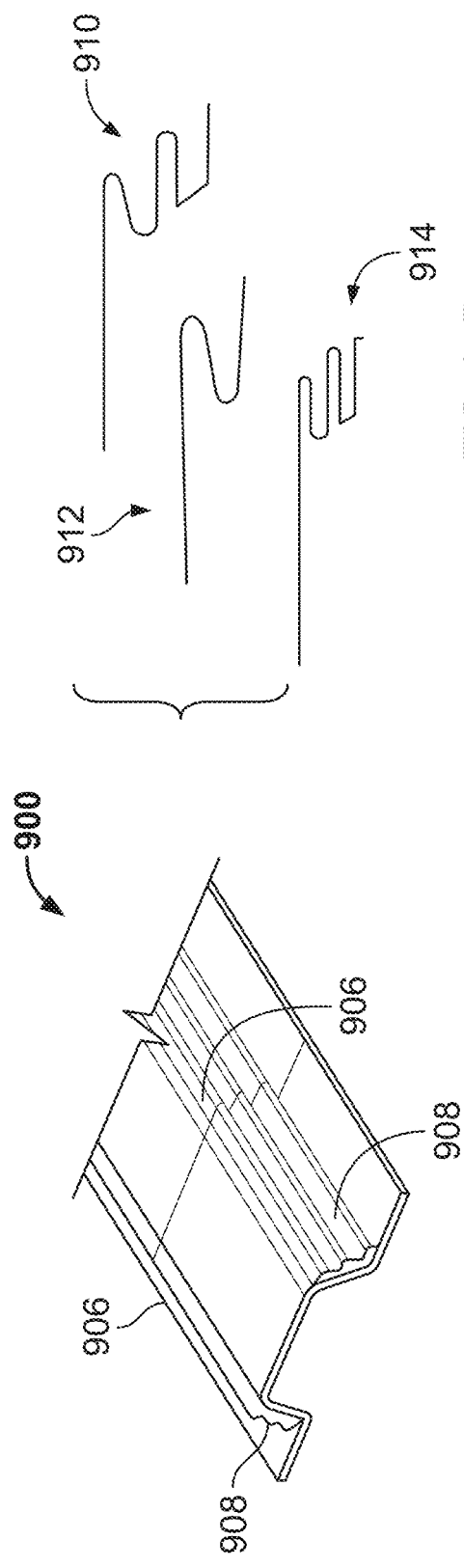
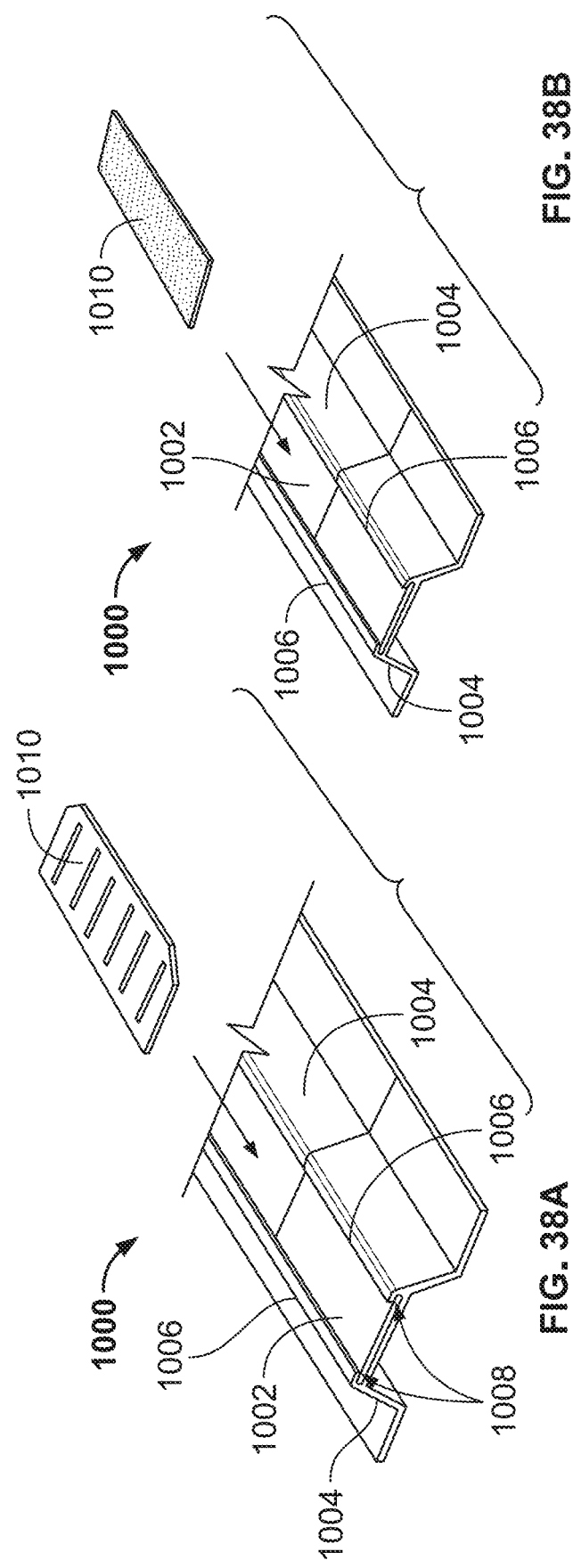

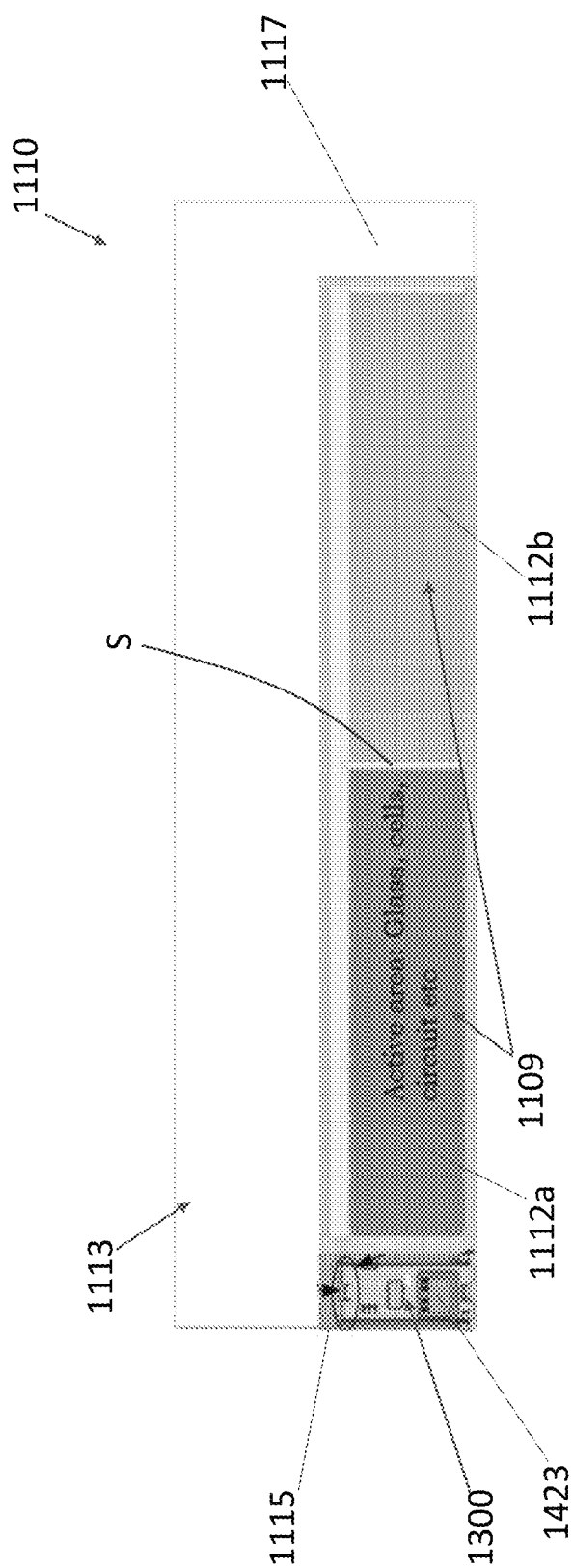
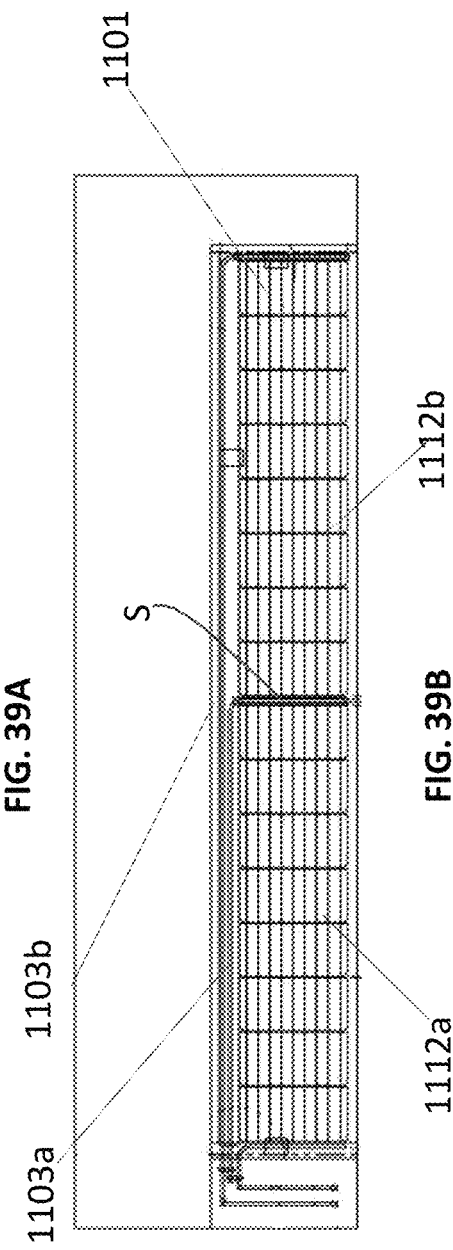
FIG. 39A
FIG. 39B

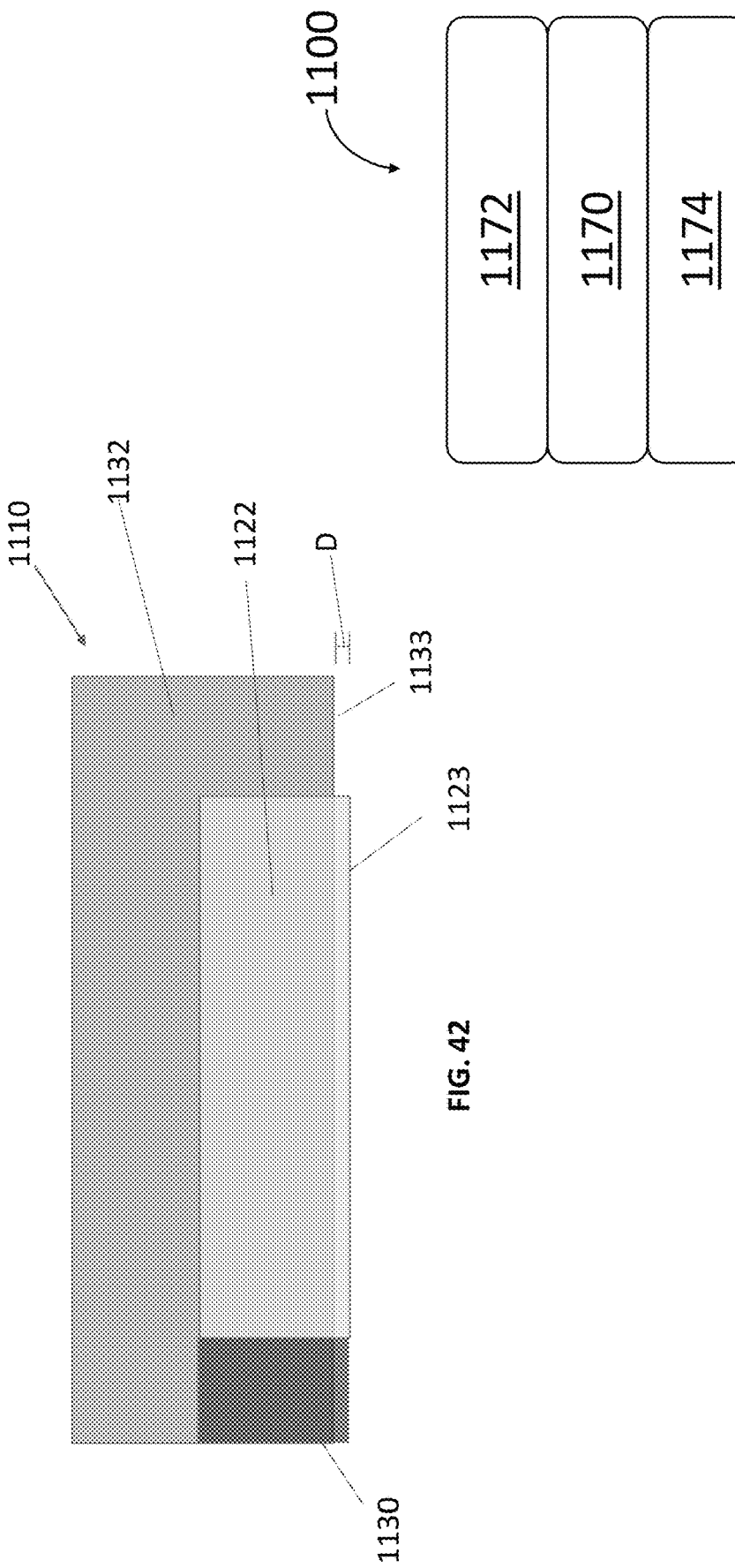

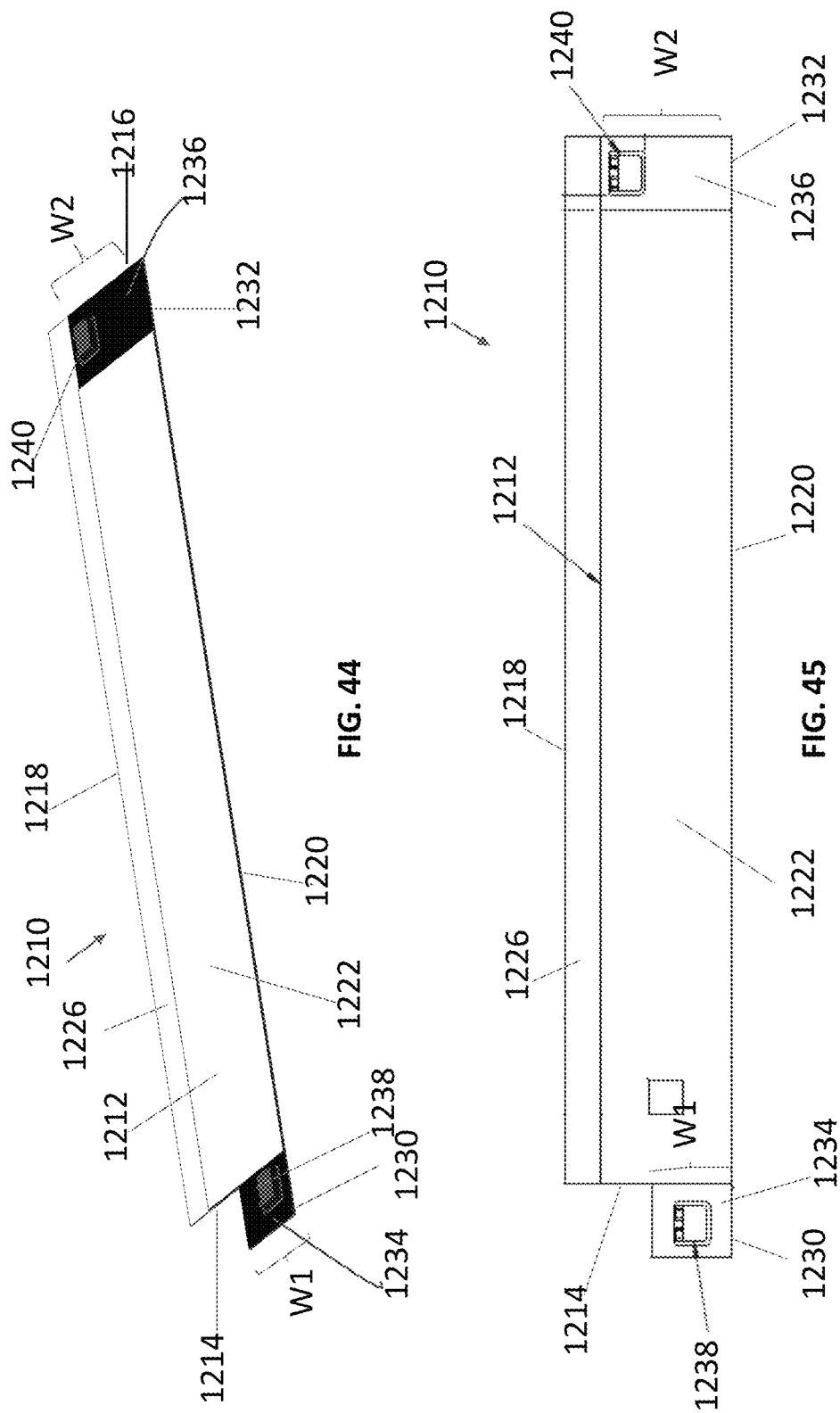

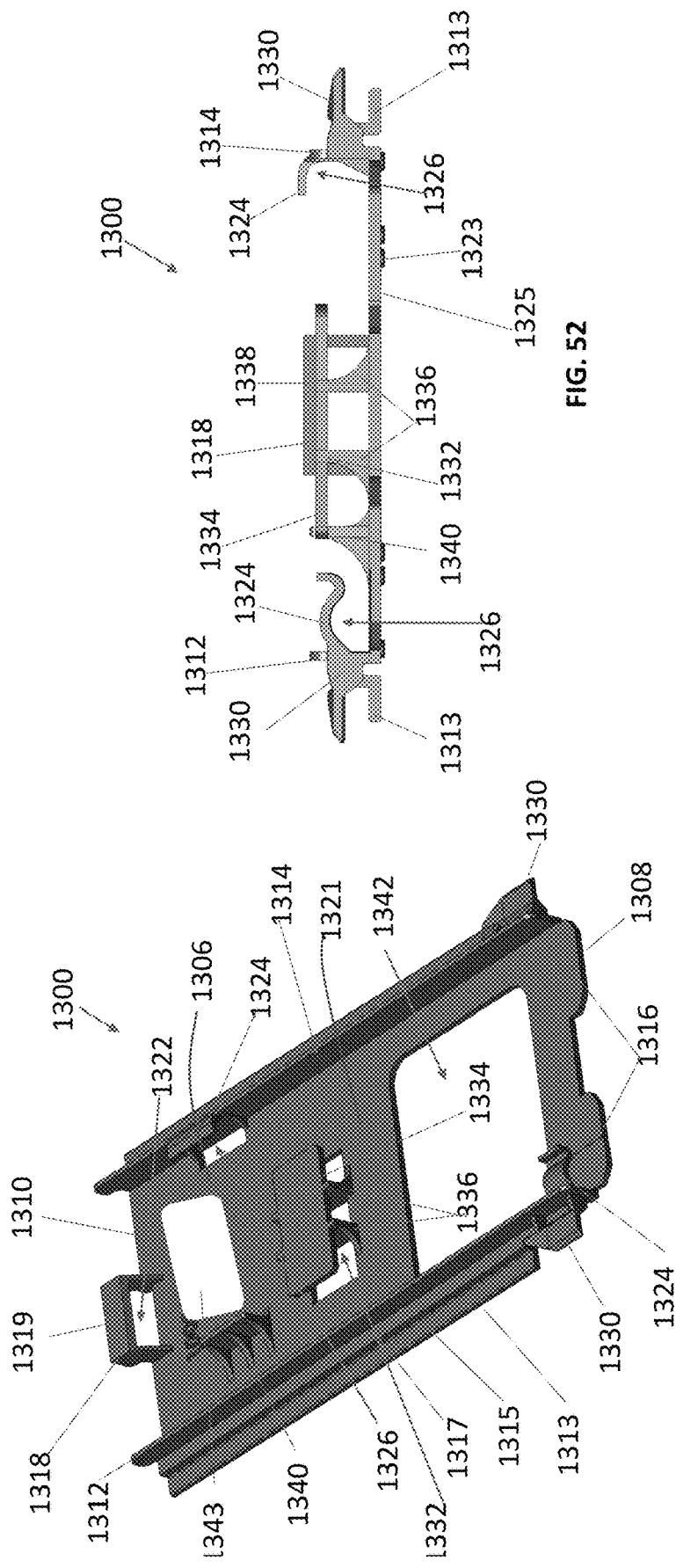

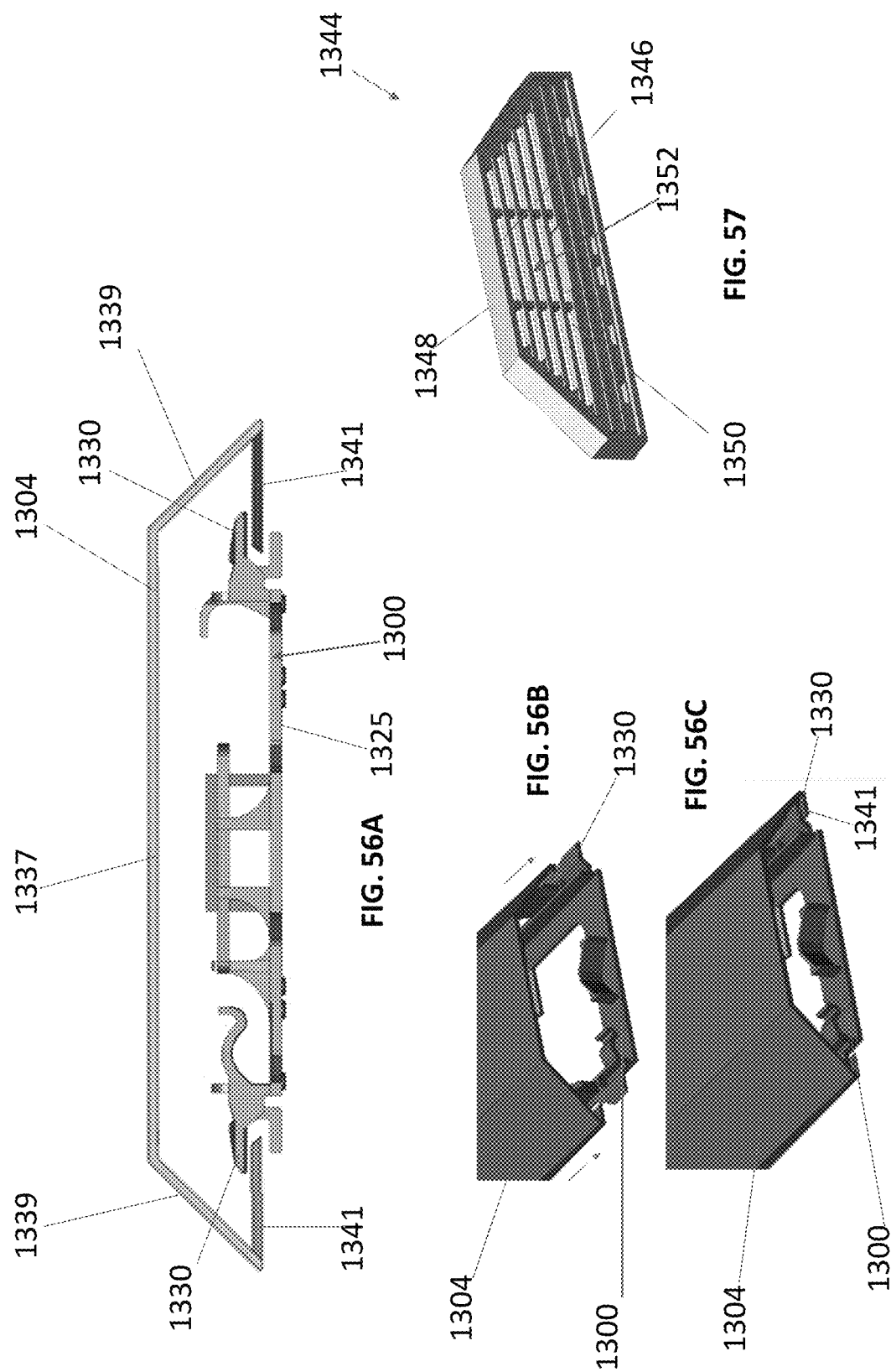

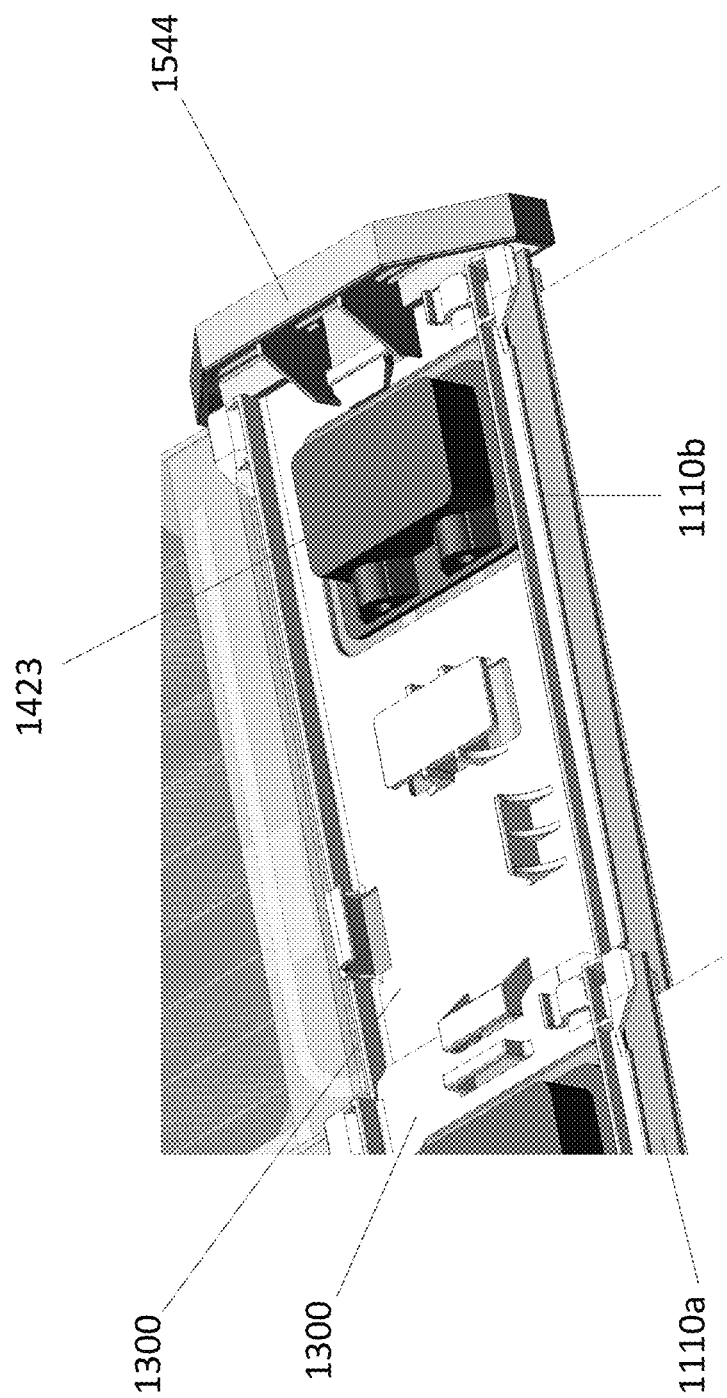

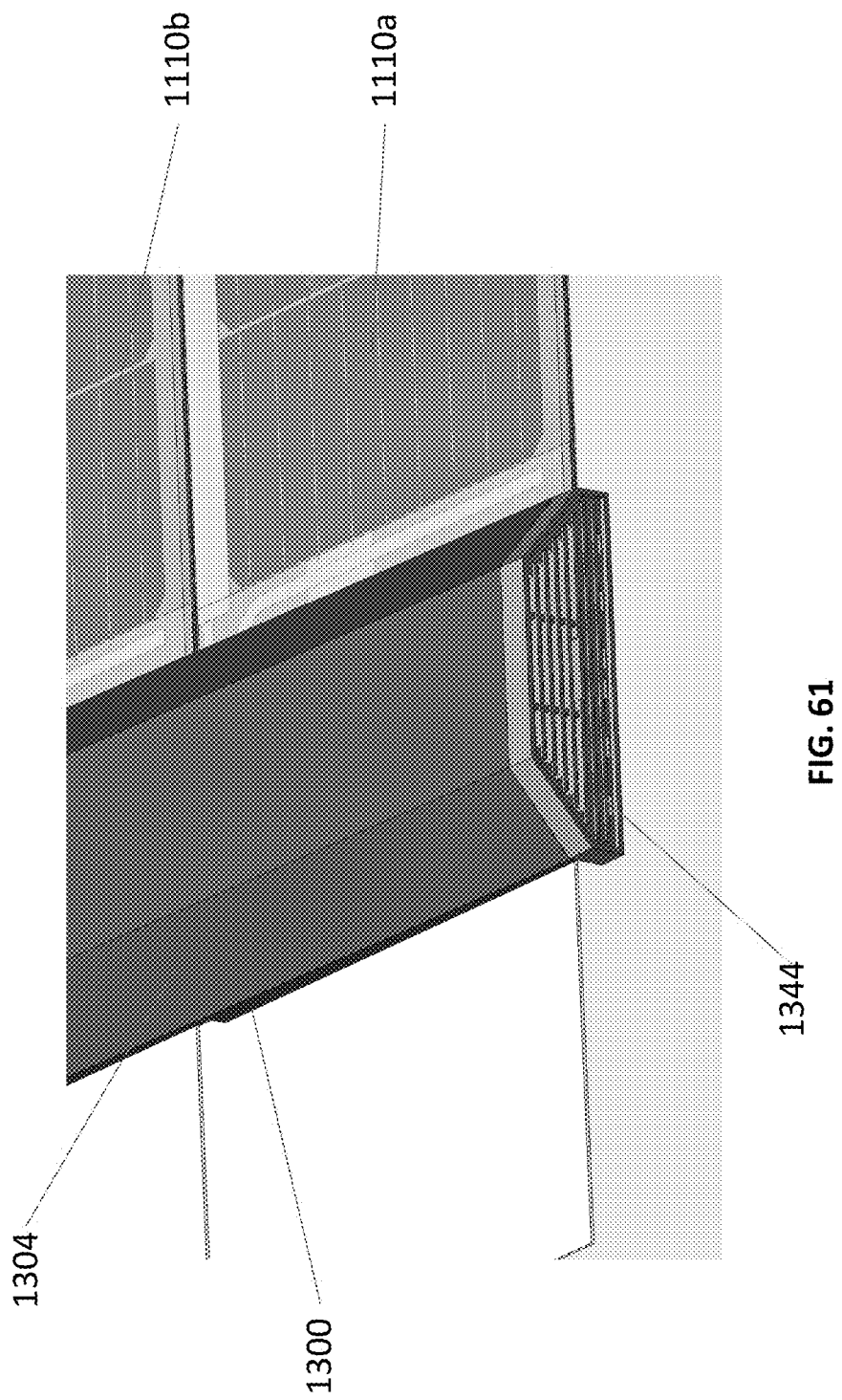

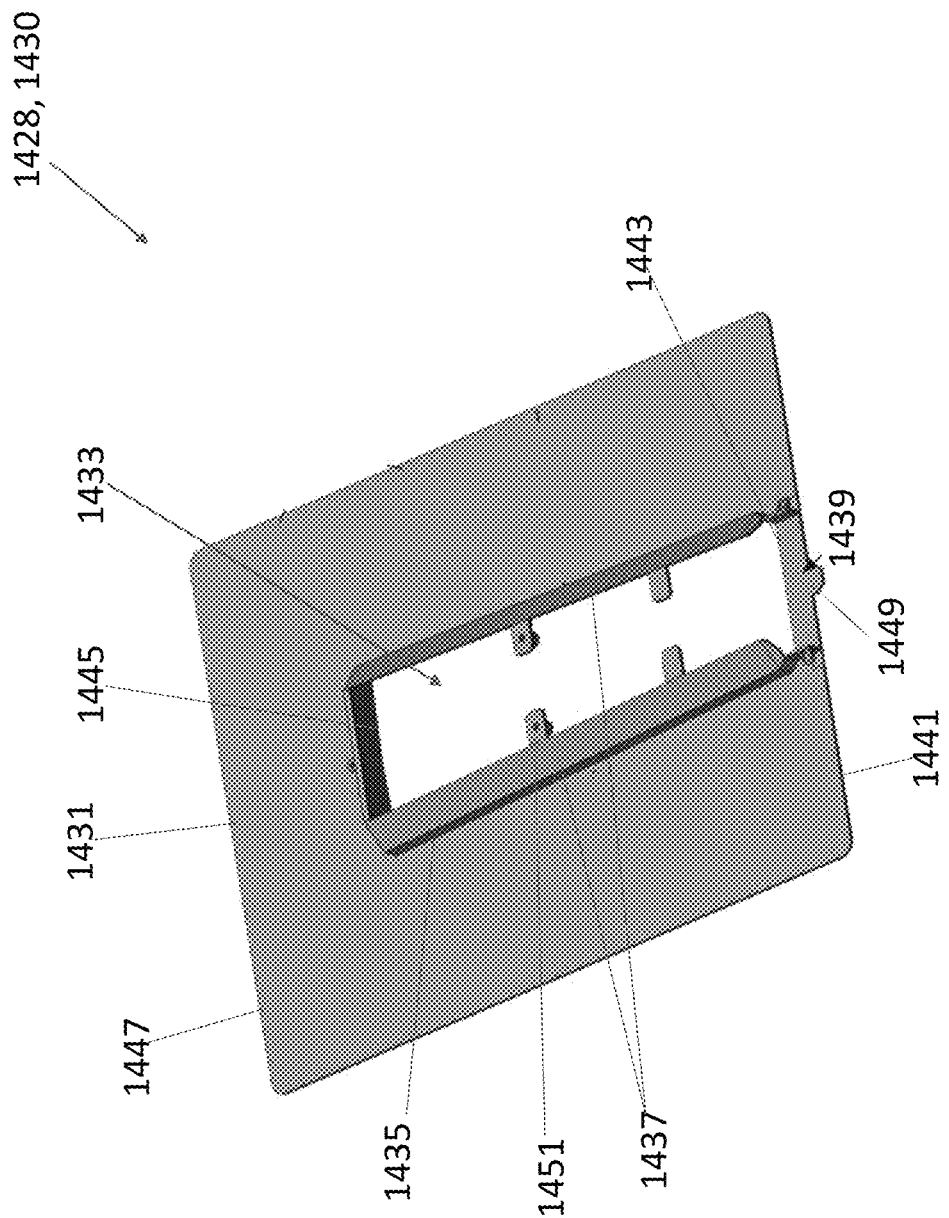

BUILDING INTEGRATED PHOTOVOLTAIC SYSTEM

CROSS-REFERENCE TO RELATED APPLICATION

This application is a continuation of commonly-owned, co-pending International Application Serial No. PCT/US2021/049017, filed Sep. 3, 3031, entitled "BUILDING INTEGRATED PHOTOVOLTAIC SYSTEM," which relates to and claims the benefit of commonly-owned, U.S. Provisional Patent Application Ser. No. 63/074,268, filed Sep. 3, 2020, entitled "PHOTOVOLTAIC SHINGLES AND METHODS OF INSTALLING SAME," the contents of which are incorporated herein by reference in their entirety.

FIELD OF THE INVENTION

The present invention relates to a building integrated photovoltaic system.

BACKGROUND OF THE INVENTION

Photovoltaic systems having solar panels are commonly installed on roofing of structures. What is needed is a building integrated photovoltaic system configured to be efficiently installed on a roof structure.

SUMMARY OF THE INVENTION

In some embodiments, a system, includes a plurality of photovoltaic modules installed on a roof deck, wherein the photovoltaic modules are arranged in an array on the roof deck, wherein each of the photovoltaic modules includes a first end and a second end opposite the first end, at least one solar cell, a first encapsulant encapsulating the at least one solar cell, wherein the first encapsulant includes a first surface and a second surface opposite the first surface, a frontsheet juxtaposed with the first surface of the first encapsulant, wherein the frontsheet includes a glass layer, a second encapsulant, and a first polymer layer, a backsheet juxtaposed with the second surface of the encapsulant, wherein the backsheet includes a first layer, and a second polymer layer attached to the first layer, wherein the first layer forms a lower surface of the photovoltaic module, and a wire cover bracket located at the first end, wherein the wire cover bracket of one of the photovoltaic modules is configured to overlap the wire cover bracket of an adjacent another one of the photovoltaic modules, and wherein the wire cover bracket is configured to receive at least one electrical component.

In some embodiments, the first encapsulant is selected from the group consisting of thermosetting polyolefin, thermosetting polyolefin encapsulant material, thermosetting ethylene-vinyl acetate (EVA), EVA encapsulants, thermoplastic olefin, thermoplastic polyolefin (TPO) and hybrids and combinations thereof. In some embodiments, the first encapsulant includes a thermosetting polyolefin encapsulant material. In some embodiments, the first encapsulant has a thickness of 1 μm to 900 μm.

In some embodiments, the first polymer layer includes a fluoropolymer. In some embodiments, the fluoropolymer is selected from the group consisting of ethylene tetrafluoroethylene (ETFE), polyvinylidene fluoride (PVDF), tetrafluoroethylene-hexafluoropropylene copolymers (FEP), tetrafluoroethylene-hexafluoropropylene-vinylidene fluoride copolymers (THV), polyvinyl fluoride (PVF), and blends thereof. In some embodiments, the first polymer layer includes a material selected from the group consisting of acrylics, polyesters, silicones, and polycarbonates. In some embodiments, the first polymer layer has a thickness of 0.01 mm to 0.5 mm. In some embodiments, the first layer includes a polymer. In some embodiments, the first layer includes thermoplastic polyolefin (TPO). In some embodiments, the first layer includes polyvinyl chloride (PVC). In some embodiments, the first layer includes ethylene propylene diene monomer (EPDM) rubber.

In some embodiments, the system further includes at least one jumper module electrically connecting a first subarray of the array and a second subarray of the array, wherein the at least one jumper module includes, at least one electrical bussing, an encapsulant encapsulating the at least one electrical bussing, wherein the encapsulant of the at least one jumper module includes a first surface and a second surface opposite the first surface of the encapsulant of the at least one jumper module, wherein the at least one electrical bussing electrically connects the first subarray to the second subarray, a frontsheet juxtaposed with the first surface of the encapsulant of the at least one jumper module, wherein the frontsheet of the at least one jumper module includes a first layer, and a first polymer layer attached to the first layer of the frontsheet of the at least one jumper module, and wherein the first layer of the frontsheet of the jumper module forms an upper surface of the jumper module.

In some embodiments, the at least one jumper module includes a first side lap located at a first end thereof and a second side lap located at a second end thereof opposite the first end of the at least one jumper module. In some embodiments, the at least one electrical bussing extends from a location proximate to the first end of the at least one jumper module to a location proximate to the second end of the at least one jumper module. In some embodiments, the at least one jumper module includes a first junction box located on the first side lap, and wherein the first junction box is electrically connected to the at least one electrical bussing. In some embodiments, the at least one jumper module includes a second junction box located on the second side lap, and wherein the second junction box is electrically connected to the at least one electrical bussing. In some embodiments, the at least one electrical component includes a third junction box. In some embodiments, the third junction box of each of the photovoltaic modules of the first subarray is electrically connected to the first junction box, and wherein the third junction box of each of the photovoltaic modules of the second subarray is electrically connected to the second junction box.

In some embodiments, at least one of the plurality of photovoltaic modules of the first subarray includes a head lap portion, and wherein one of the at least one jumper module overlays the head lap portion. In some embodiments, the at least one of the plurality of photovoltaic modules of the first subarray includes a first side lap, and wherein the first side lap of the one of the at least one jumper module is proximate to the first side lap of the at least one of the plurality of photovoltaic modules of the first subarray. In some embodiments, the at least one of the plurality of photovoltaic modules of the first subarray includes a second side lap, and wherein the second side lap of the one of the at least one jumper module is proximate to the second side lap of the at least one of the plurality of photovoltaic modules of the first subarray. In some embodiments, the at least one jumper module includes a plurality of jumper modules, and wherein the first side lap of another one of the plurality of jumper modules overlaps the second side lap of one of the plurality of jumper modules. In some embodiments, the first junction box of the another one of the plurality of jumper modules is proximate to and electrically connected to the second junction box of the one of the plurality of jumper modules. In some embodiments, at least one of the plurality of photovoltaic modules of the second subarray includes a head lap portion, and wherein the another one of the plurality of jumper modules overlaps the head lap portion of the at least one of the plurality of photovoltaic modules of the second subarray. In some embodiments, each of the plurality of photovoltaic modules of includes the first side lap, and wherein the wire cover bracket is attached to the first side lap.

In some embodiments, the wire cover brackets of the plurality of photovoltaic modules of the first subarray are configured to form a first wire channel, and wherein the wire cover brackets of the plurality of photovoltaic modules of the second subarray are configured to form a second wire channel. In some embodiments, the system further includes at least one cover removably attached to at least one of the wire cover brackets. In some embodiments, the at least one cover is removably attached to a plurality of the wire cover brackets.

In some embodiments, the system further comprises a transition box located proximate to the first wire channel, wherein the transition box is electrically connected to the first junction box. In some embodiments, each of the photovoltaic modules includes at least one bussing wire electrically connected to the at least one solar cell. In some embodiments, the at least one bussing wire is covered with a polymer layer. In some embodiments, the a polymer layer is expanded polyethylene ("EPE"). In some embodiments, the at least one bussing wire is coated with a colorant. In some embodiments, the glass layer has a thickness of 1 mm to 4 mm. In some embodiments, the second encapsulant includes a thickness of 1 µm to 900 µm. In some embodiments, the first polymer layer includes a thickness of 0.01 mm to 0.5 mm. In some embodiments, the glass layer includes a first edge, and wherein the first layer includes a second edge offset from the first edge.

In some embodiments, the first layer of the backsheet includes a composite material. In some embodiments, the composite material includes a substrate having a first surface and a second surface opposite the first surface of the substrate, a cap juxtaposed with the first surface of the substrate, and a core juxtaposed with the second surface of the substrate. In some embodiments, the cap includes at least one of one or more polymers, at least one infrared-reflective pigment, a stabilizer package, one or more fillers, or combinations thereof. In some embodiments, the cap includes at least one of one or more thermoplastic polyolefins, at least one infrared-reflective black pigment, a stabilizer package, one or more fillers, or combinations thereof. In some embodiments, the stabilizer package includes at least one ultraviolet (UV) absorber. In some embodiments, the cap does not include a white colorant. In some embodiments, the cap includes one or more thermoplastic polyolefins, an ultraviolet absorber, an infrared-reflective black pigment, and optionally one or more fillers, and wherein the cap does not comprise at least one of a white colorant, a white pigment, or any combination thereof. In some embodiments, the infrared-reflective pigment is 0.01% by weight to 15% by weight of a total weight of the cap. In some embodiments, the core includes one or more polymers, a stabilizer package, one or more fillers, or combinations thereof.

In some embodiments, the wire cover bracket includes a first end, a second end opposite the first end of the wire cover bracket, and at least one tab extending from the first end, wherein the at least one tab of the wire cover bracket of the one of the photovoltaic modules is configured to overlap the wire cover bracket of the adjacent another one of the photovoltaic modules. In some embodiments, the wire cover bracket includes at least one clip configured to receive an electrical wire. In some embodiments, the wire cover bracket is attached to the first side lap by an adhesive. In some embodiments, the at least one cover is textured.

In some embodiments, the system further includes a plurality of step flaps, wherein each of the step flaps is installed adjacent to a corresponding one of the photovoltaic modules. In some embodiments, the second side lap of each of the photovoltaic modules overlaps a corresponding at least one roofing shingle. In some embodiments, the roofing shingle is an asphalt shingle.

In some embodiments, the second side lap is of the photovoltaic module is attached to the at least one roofing shingle by an adhesive, a fleece layer and an adhesive, plasma treatment, or combinations thereof. In some embodiments, the system further includes a first flashing base installed on the roof deck proximate to and aligned with the first wire channel, wherein the transition box is installed on the first flashing base. In some embodiments, the first flashing base includes an aperture, wherein the transition box includes a sidewall and a cover portion extending from the sidewall, and wherein the cover portion of the transition box covers at least a portion of the aperture of the first flashing base, and wherein the first junction box is located within the aperture. In some embodiments, the system further includes a second flashing base installed on the roof deck proximate to and aligned with the second wire channel, wherein the second flashing base includes an aperture, and wherein the second junction box is located within the aperture of the second flashing base. In some embodiments, the system further includes an electrical cable passthrough, wherein the electrical cable passthrough is located within the aperture of the second flashing base. In some embodiments, the system further includes a plurality of roofing shingles, wherein the roofing shingles overlay the first flashing base, the second flashing base, and a headlap of each of the jumper modules. In some embodiments, each of the photovoltaic shingles includes an adhesive located on a rear surface of the first layer. In some embodiments, the adhesive is at least one peel and stick film sheet.

BRIEF DESCRIPTION OF THE DRAWINGS

FIGS. 1A through 1D are top plan and cross-sectional views of some embodiments of a photovoltaic shingle and some embodiments of a system of photovoltaic shingles;

FIGS. 3A through 3E are embodiments of photovoltaic shingles and associated wireways employed by the photovoltaic shingles;

FIGS. 14A through 14E illustrate embodiments of photovoltaic shingles and associated wireways and covers;

FIGS. 37A and 37B illustrate some embodiments of a lid for a wireway;

FIGS. 38A and 38B illustrate some embodiments of a lid for a wireway;

FIGS. 39A and 39B are top plan views of some embodiments of a photovoltaic module;

FIG. 42 is a top plan view of some embodiments of a photovoltaic module;

FIG. 43 is a schematic view of some embodiments of a backsheet employed by a photovoltaic module;

FIG. 44 is a top perspective view of some embodiments of a jumper module for a photovoltaic system;

FIG. 45 is a top plan view of the jumper module shown in FIG. 44;

FIGS. 51 through 57 are views of embodiments of a wire cover bracket;

FIG. 60 is a top perspective view of embodiments of overlapping wire cover brackets;

FIG. 61 is a top perspective view of embodiments of a cover and a cap installed on the wire cover brackets shown in FIG. 60;

FIG. 62 is a top perspective view of embodiments of a first flashing base employed by the photovoltaic system shown in FIG. 58;

DETAILED DESCRIPTION

Figure 2A:
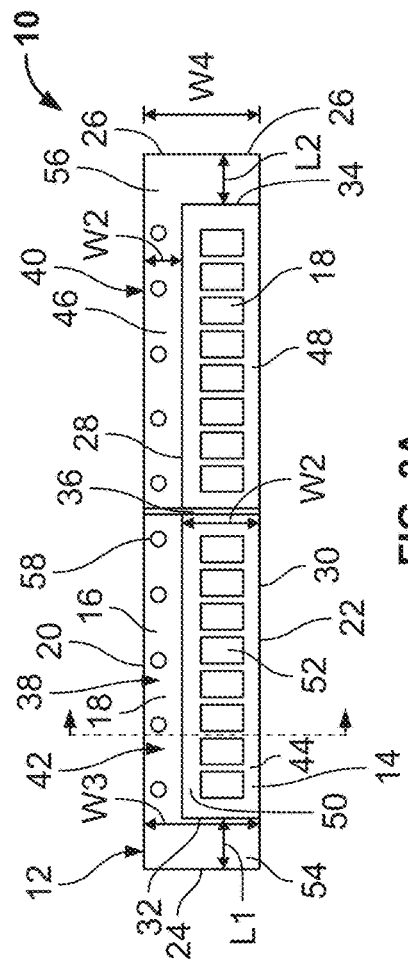
FIGS. 2A through 2E are top plan views, cross-sectional views and a bottom plan view of some embodiments of a photovoltaic shingle and some embodiments of a system of photovoltaic shingles.
Figure 2B:
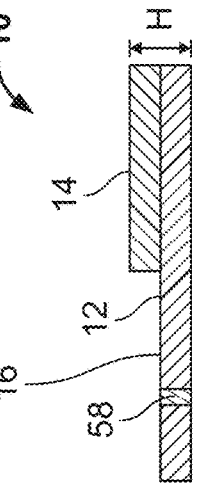

Referring to FIGS. 1A through 2D, in some embodiments, a roofing system 5 includes a plurality of photovoltaic shingles 10, each of which includes a first layer 12 and a second layer 14 overlaying the first layer 12. In some embodiments, the first layer 12 includes a head lap 16. In some embodiments, the second layer 14 includes at least one solar cell 18. In some embodiments, the at least one solar cell 18 includes a plurality of the solar cells 18. In some embodiments, at least one of the plurality of photovoltaic shingles 10 overlays at least the head lap 16 of another of the plurality of photovoltaic shingles 10.

Still referring to FIGS. 1A through 2D, in some embodiments, the first layer 12 includes a first end 20, a second end 22 opposite the first end 20, a third end 24 extending from the first end 20 of to the second end 22, and a fourth end 26 opposite the third end 24 and extending from the first end 20 to the second end 22. In some embodiments, the head lap 16 extends from the third end 24 to the fourth end 26. In some embodiments, the second layer 14 extends from the third end 24 of the first layer 12 to the fourth end 26 of the first layer 12. In some embodiments, the second layer 14 extends intermediate the third and fourth ends 24, 26 of the first layer 12. In some embodiments, the second layer 14 is located proximate to the second end 22 of the first layer 12.

In an embodiment, the second layer 14 includes a first end 28, a second end 30 opposite the first end 28, a third end 32 extending from the first end 28 to the second end 30, and a fourth end 34 opposite the third end 32 and extending from the first end 28 to the second end 30. In some embodiments, the second end 30 of the second layer 14 is substantially aligned with the second end 22 of the first layer 12.

In some embodiments, the head lap 16 includes a first width W1 and the second layer 14 includes a second width W2. In some embodiments, the first width W1 extends from the first end of the first layer 12 to the first end 28 of the second layer 14. In some embodiments, the second width W2 extends from the first end 28 of the second layer 14 to the second end 30 of the second layer 14. In some embodiments, the first width W1 is greater than the second width W2. In some embodiments, the second width W2 is greater than the first width W1. In some embodiments, the first width W1 and the second width W2 are equal to one another.

In some embodiments, the first width W1 is in a range of 1 inch to 10 inches. In some embodiments, the first width W1 is in a range of 2 inches to 10 inches. In some embodiments, the first width W1 is in a range of 3 inches to 10 inches. In some embodiments, the first width W1 is in a range of 4 inches to 10 inches. In some embodiments, the first width W1 is in a range of 5 inches to 10 inches. In some embodiments, the first width W1 is in a range of 6 inches to 10 inches. In some embodiments, the first width W1 is in a range of 7 inches to 10 inches. In some embodiments, the first width W1 is in a range of 8 inches to 10 inches. In some embodiments, the first width W1 is in a range of 9 inches to 10 inches.

In some embodiments, the first width W1 is in a range of 1 inch to 9 inches. In some embodiments, the first width W1 is in a range of 2 inches to 9 inches. In some embodiments, the first width W1 is in a range of 3 inches to 9 inches. In some embodiments, the first width W1 is in a range of 4 inches to 9 inches. In some embodiments, the first width W1 is in a range of 5 inches to 9 inches. In some embodiments, the first width W1 is in a range of 6 inches to 9 inches. In some embodiments, the first width W1 is in a range of 7 inches to 9 inches. In some embodiments, the first width W1 is in a range of 8 inches to 9 inches.

In some embodiments, the first width W1 is in a range of 1 inch to 8 inches. In some embodiments, the first width W1 is in a range of 2 inches to 8 inches. In some embodiments, the first width W1 is in a range of 3 inches to 8 inches. In some embodiments, the first width W1 is in a range of 4 inches to 8 inches. In some embodiments, the first width W1 is in a range of 5 inches to 8 inches. In some embodiments, the first width W1 is in a range of 6 inches to 8 inches. In some embodiments, the first width W1 is in a range of 7 inches to 8 inches.

In some embodiments, the first width W1 is in a range of 1 inch to 7 inches. In some embodiments, the first width W1 is in a range of 2 inches to 7 inches. In some embodiments, the first width W1 is in a range of 3 inches to 7 inches. In some embodiments, the first width W1 is in a range of 4 inches to 7 inches. In some embodiments, the first width W1 is in a range of 5 inches to 7 inches. In some embodiments, the first width W1 is in a range of 6 inches to 7 inches.

In some embodiments, the first width W1 is in a range of 1 inch to 6 inches. In some embodiments, the first width W1 is in a range of 2 inches to 6 inches. In some embodiments, the first width W1 is in a range of 3 inches to 6 inches. In some embodiments, the first width W1 is in a range of 4 inches to 6 inches. In some embodiments, the first width W1 is in a range of 5 inches to 6 inches.

In some embodiments, the first width W1 is in a range of 1 inch to 5 inches. In some embodiments, the first width W1 is in a range of 2 inches to 5 inches. In some embodiments, the first width W1 is in a range of 3 inches to 5 inches. In some embodiments, the first width W1 is in a range of 4 inches to 5 inches.

In some embodiments, the first width W1 is in a range of 1 inch to 4 inches. In some embodiments, the first width W1 is in a range of 2 inches to 4 inches. In some embodiments, the first width W1 is in a range of 3 inches to 4 inches. In some embodiments, the first width W1 is in a range of 1 inch to 3 inches. In some embodiments, the first width W1 is in a range of 2 inches to 3 inches. In some embodiments, the first width W1 is in a range of 1 inch to 2 inches.

In some embodiments, the first width W1 is 1 inch. In some embodiments, the first width W1 is 2 inches. In some embodiments, the first width W1 is 3 inches. In some embodiments, the first width W1 is 4 inches. In some embodiments, the first width W1 is 5 inches. In some embodiments, the first width W1 is 6 inches. In some embodiments, the first width W1 is 7 inches. In some embodiments, the first width W1 is 8 inches. In some embodiments, the first width W1 is 9 inches. In some embodiments, the first width W1 is 10 inches.

In some embodiments, the second width W2 is in a range of 1 inch to 10 inches. In some embodiments, the second width W2 is in a range of 2 inches to 10 inches. In some embodiments, the second width W2 is in a range of 3 inches to 10 inches. In some embodiments, the second width W2 is in a range of 4 inches to 10 inches. In some embodiments, the second width W2 is in a range of 5 inches to 10 inches. In some embodiments, the second width W2 is in a range of 6 inches to 10 inches. In some embodiments, the second width W2 is in a range of 7 inches to 10 inches. In some embodiments, the second width W2 is in a range of 8 inches to 10 inches. In some embodiments, the second width W2 is in a range of 9 inches to 10 inches.

In some embodiments, the second width W2 is in a range of 1 inch to 9 inches. In some embodiments, the second width W2 is in a range of 2 inches to 9 inches. In some embodiments, the second width W2 is in a range of 3 inches to 9 inches. In some embodiments, the second width W2 is in a range of 4 inches to 9 inches. In some embodiments, the second width W2 is in a range of 5 inches to 9 inches. In some embodiments, the second width W2 is in a range of 6 inches to 9 inches. In some embodiments, the second width W2 is in a range of 7 inches to 9 inches. In some embodiments, the second width W2 is in a range of 8 inches to 9 inches.

In some embodiments, the second width W2 is in a range of 1 inch to 8 inches. In some embodiments, the second width W2 is in a range of 2 inches to 8 inches. In some embodiments, the second width W2 is in a range of 3 inches to 8 inches. In some embodiments, the second width W2 is in a range of 4 inches to 8 inches. In some embodiments, the second width W2 is in a range of 5 inches to 8 inches. In some embodiments, the second width W2 is in a range of 6 inches to 8 inches. In some embodiments, the second width W2 is in a range of 7 inches to 8 inches.

In some embodiments, the second width W2 is in a range of 1 inch to 7 inches. In some embodiments, the second width W2 is in a range of 2 inches to 7 inches. In some embodiments, the second width W2 is in a range of 3 inches to 7 inches. In some embodiments, the second width W2 is in a range of 4 inches to 7 inches. In some embodiments, the second width W2 is in a range of 5 inches to 7 inches. In some embodiments, the second width W2 is in a range of 6 inches to 7 inches.

In some embodiments, the second width W2 is in a range of 1 inch to 6 inches. In some embodiments, the second width W2 is in a range of 2 inches to 6 inches. In some embodiments, the second width W2 is in a range of 3 inches to 6 inches. In some embodiments, the second width W2 is in a range of 4 inches to 6 inches. In some embodiments, the second width W2 is in a range of 5 inches to 6 inches.

In some embodiments, the second width W2 is in a range of 1 inch to 5 inches. In some embodiments, the second width W2 is in a range of 2 inches to 5 inches. In some embodiments, the second width W2 is in a range of 3 inches to 5 inches. In some embodiments, the second width W2 is in a range of 4 inches to 5 inches.

In some embodiments, the second width W2 is in a range of 1 inch to 4 inches. In some embodiments, the second width W2 is in a range of 2 inches to 4 inches. In some embodiments, the second width W2 is in a range of 3 inches to 4 inches. In some embodiments, the second width W2 is in a range of 1 inch to 3 inches. In some embodiments, the second width W2 is in a range of 2 inches to 3 inches. In some embodiments, the second width W2 is in a range of 1 inch to 2 inches.

In some embodiments, the second width W2 is 1 inch. In some embodiments, the second width W2 is 2 inches. In some embodiments, the second width W2 is 3 inches. In some embodiments, the second width W2 is 4 inches. In some embodiments, the second width W2 is 5 inches. In some embodiments, the second width W2 is 6 inches. In some embodiments, the second width W2 is 7 inches. In some embodiments, the second width W2 is 8 inches. In some embodiments, the second width W2 is 9 inches. In some embodiments, the second width W2 is inches.

Still referring to FIGS. 1A through 2D, in some embodiments, each of the plurality of photovoltaic shingles 10 includes a fold line 36 extending from the first end 20 of the first layer 12 to the second end 22 of the first layer 12 and intermediate the third and fourth ends 24, 26 of the first layer 12. In some embodiments, the fold line 36 extends from and through the first end 28 of the second layer 14 to the second end 30 of the second layer 14. In some embodiments, the fold line 36 enables the photovoltaic shingle 10 to be folded in half for reduction of space in connection with the storage or transport of the photovoltaic shingle 10. In some embodiments, each of the plurality of photovoltaic shingles 10 includes a first section 38 extending from the third end 24 of the first layer 12 to the fold line 36, and a second section 40 extending from the fourth end 26 of the first layer 12 to the fold line 36. In some embodiments, the first section 38 includes a first portion 42 of the head lap 16 and a first portion 44 of the second layer 14, and the second section 40 includes a second portion 46 of the head lap 16 and a second portion 48 of the second layer 14. In some embodiments, the at least one solar cell 18 includes a first one 50 of the at least one solar cell 18 located in the first portion 44 of the second layer 14 and a second one 52 of the at least one solar cell 18 located in the second portion 48 of the second layer 14. In some embodiments, the first one 50 of the at least one solar cell 18 includes a first plurality of the solar cells 18, and the second one 52 of the at least one solar cell 18 includes a second plurality of the solar cells 18.

Figure 2C:
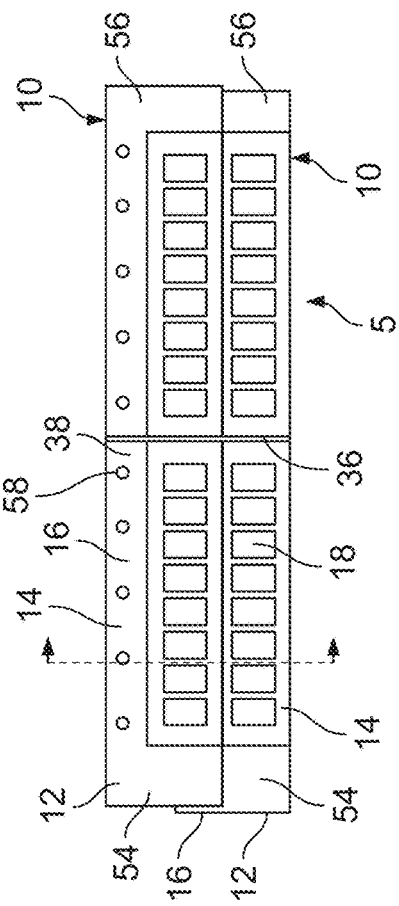
Figure 2D:
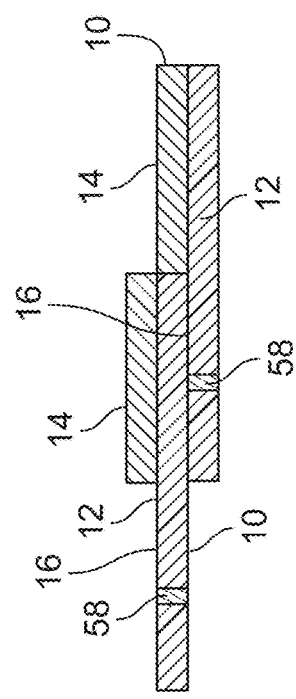

Referring to FIGS. 2A and 2C, in some embodiments, the second layer 14 extends intermediate the third and fourth ends 24, 26 of the first layer 12. In some embodiments, the first layer includes a first step flap 54 adjacent the third end 32 of the second layer 14 and a second step flap 56 adjacent the fourth end 34 of the second layer 14. In some embodiments, the first step flap 54 includes a length L1 extending from the third end 32 of the second layer 14 to the third end 24 of the first layer 12. In some embodiments, the first step flap 54 includes a width W3 extending from the first end 20 of the first layer 12 to the second end 22 of the first layer 12. In some embodiments, the second step flap 56 includes a length L2 extending from the fourth end 34 of the second layer 14 to the fourth end 26 of the first layer 12. In some embodiments, the second step flap 56 includes a width W4 extending from the first end 20 of the first layer 12 to the second end 22 of the first layer 12. In some embodiments, the width W3 is equal to the width W4. In some embodiments, the length L1 and is equal to the length L2. In some embodiments, the head lap 16, the first step flap 54, and the second step flap 56 are contiguous.

In some embodiments, the second layer 14 extends from the third end 24 of the first layer 12 to a location intermediate the third and fourth ends 24, 26 of the first layer 12. In some embodiments, the first layer 12 includes the second step flap 56 adjacent the fourth end 34 of the second layer 14. In some embodiments, the head lap 16 and the second step flap 56 are contiguous. In some embodiments, the second layer 14 extends from the fourth end 26 of the first layer 12 to a location intermediate the third and fourth ends 24, 26 of the first layer 12. In some embodiments, the first layer 12 includes the first step flap 54 adjacent the third end 32 of the second layer 14. In some embodiments, the head lap 16 and the first step flap 54 are contiguous.

In some embodiments, each of the first layer 12 and the second layer 14 is composed of a polymer. In some embodiments, each of the first layer 12 and the second layer 14 is composed of thermoplastic polyolefin (TPO). In some embodiments, each of the first layer 12 and the second layer 14 is composed of polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), or polyimide; polyvinyl chloride (PVC); ethylene propylene diene monomer (EPDM) rubber silicone rubber; fluoropolymers-ethylene tetrafluoroethylene (ETFE), polyvinyl dene fluoride (PVDF), tetrafluoroethylene-hexafluoropropylene copolymers (FEP), and tetrafluoroethylene-hexafluoropropylene-vinylidene fluoride copolymers (THV), or blends thereof.

In some embodiments, the first layer 12 and the second layer 14 are laminated. In some embodiments, the second layer 14 is ultrasonically welded to the first layer 12. In some embodiments, the second layer 14 is heat welded to the first layer 12. In some embodiments, the second layer 14 is thermally bonded to the first layer 12.

In some embodiments, an impact resistance of the photovoltaic shingle 10 is characterized by a Class 4 rating in accordance with the standards of ANSI FM 4473 test standards.

In some embodiments, the plurality of photovoltaic shingles 10 is installed on a roof deck 200. In some embodiments, the plurality of photovoltaic shingles 10 is installed directly to the roof deck 200. In some embodiments, each of the plurality of photovoltaic shingles 10 is installed on the roof deck 200 by a plurality of fasteners 58. In some embodiments, the plurality of fasteners 58 are installed through the head lap 16. In some embodiments, the plurality of fasteners 58 includes a plurality of nails.

Figure 2E:
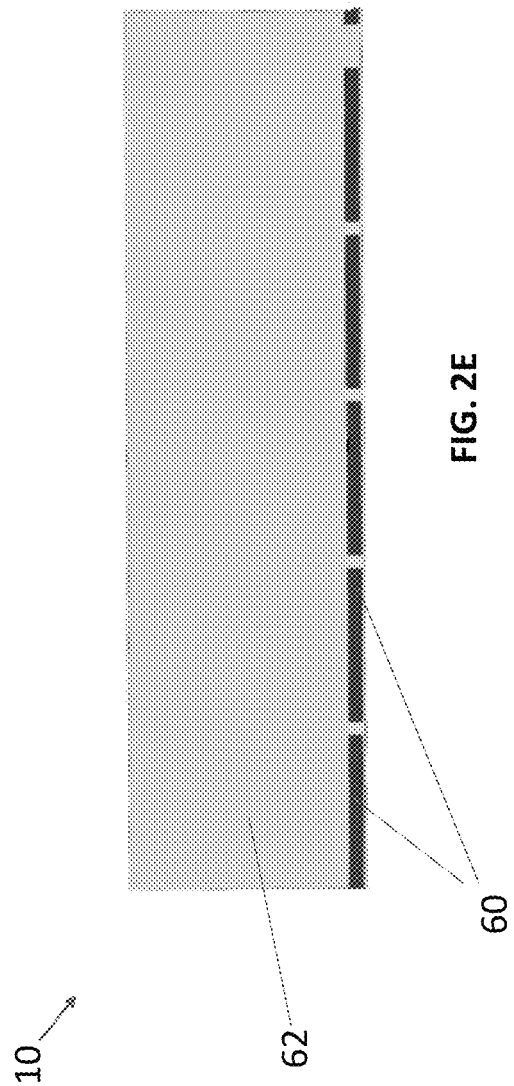
Figure 3D:
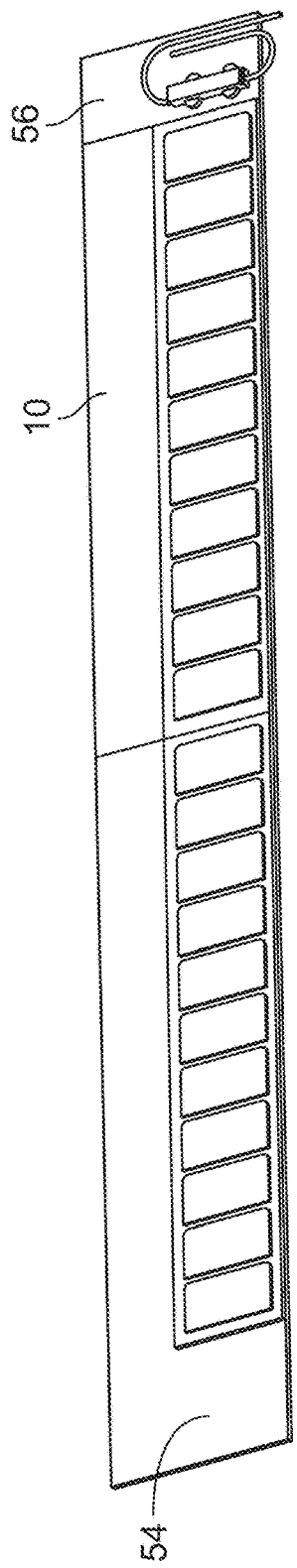
Figure 3E:
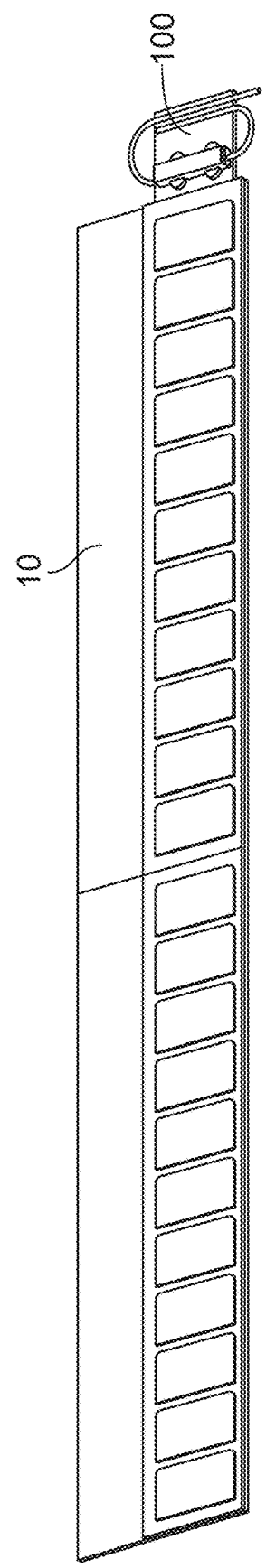
Figure 4:
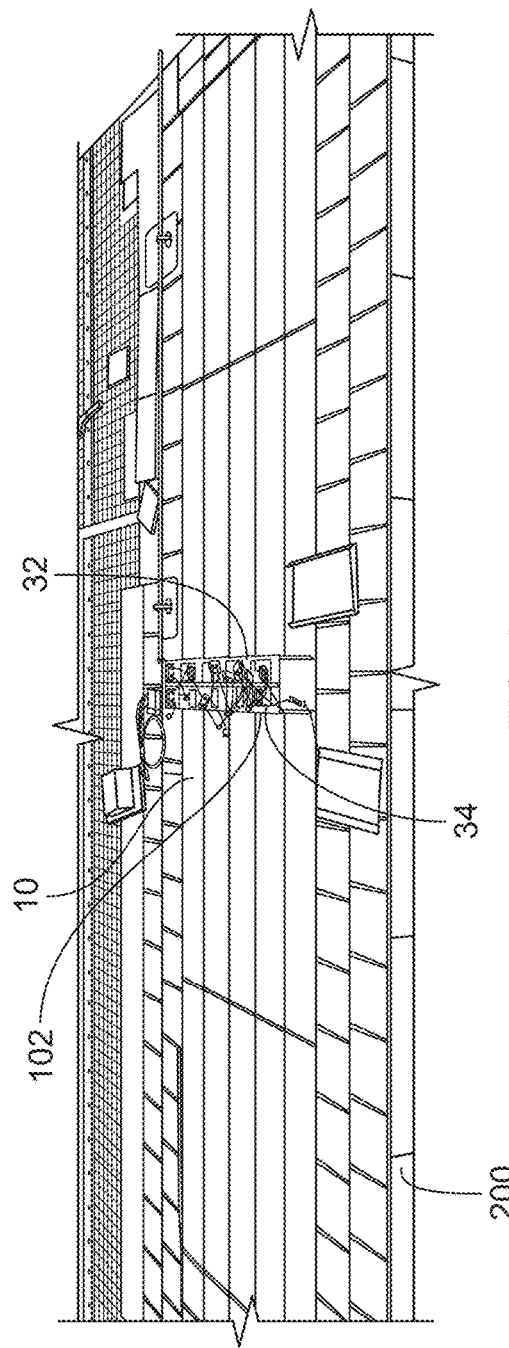
FIGS. 4 and 5 are embodiments of roofing systems including photovoltaic shingles and associated wireways.
Figure 5:
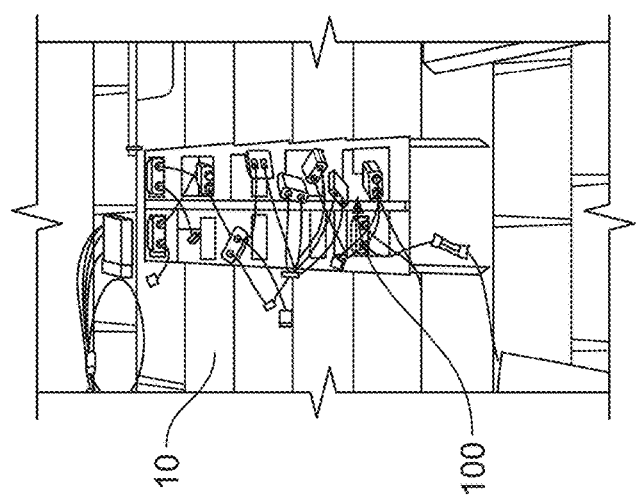

Referring to FIG. 2E, in some embodiments, each of the plurality of photovoltaic shingles 10 is installed on the roof deck 200 by an adhesive 60. In some embodiments, the adhesive 60 is adhered directly to the roof deck 200. In some embodiments, the adhesive 60 is adhered to an underlayment. In some embodiments, the underlayment is adhered directly to the roof deck 200. In some embodiments, the adhesive 60 is located on a rear surface 62 of the photovoltaic shingle 10. In some embodiments, the adhesive 60 includes at least one adhesive strip. In some embodiments, the adhesive 60 includes a plurality of adhesive strips. In some embodiments, the plurality of adhesive strips is arranged intermittently. In some embodiments, the adhesive 60 is located proximate to one edge of the photovoltaic shingle 10. In some embodiments, the adhesive 60 is a peel and stick film sheet. In some embodiments, the peel and stick film sheet includes at least one sheet of film removably attached to the rear surface 62. In some embodiments, the peel and stick film sheet is composed of EverGuard Freedom HW peel and stick membrane manufactured by GAF. In some embodiments, the adhesive 60 includes polyvinyl butyrate, acrylic, silicone, or polycarbonate. In some embodiments, the adhesive 60 includes pressure sensitive adhesives.

Figure 6:
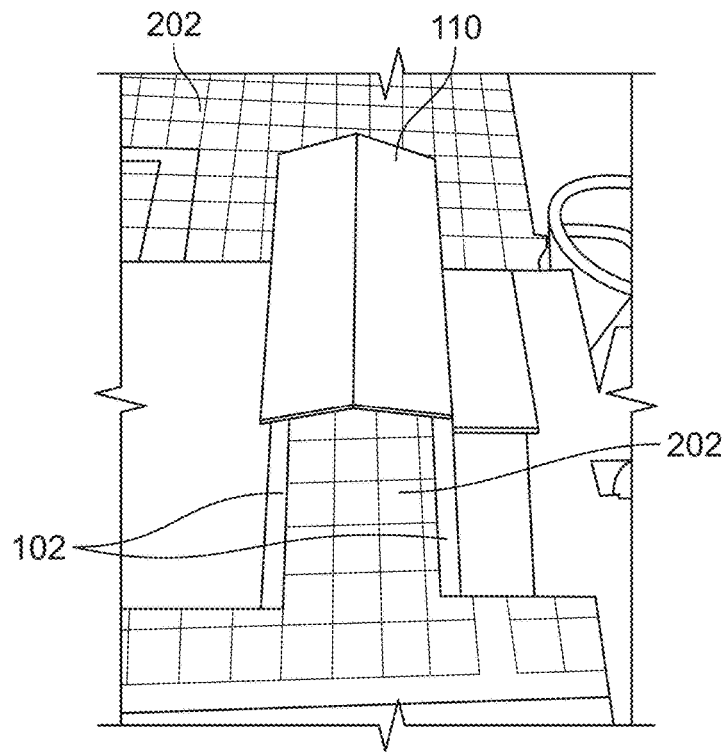
FIGS. 6 through 7B are embodiments of wireways having flashing and covers.
Figure 7A:
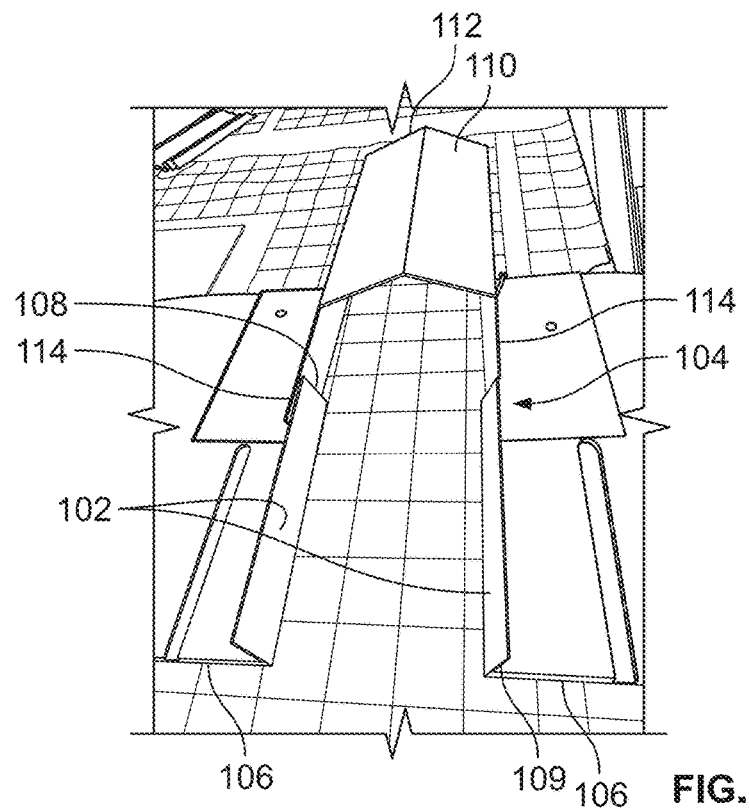
Figure 7B:
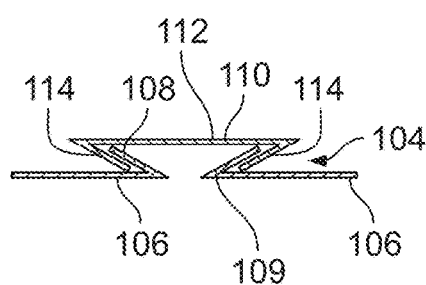
Figure 8:
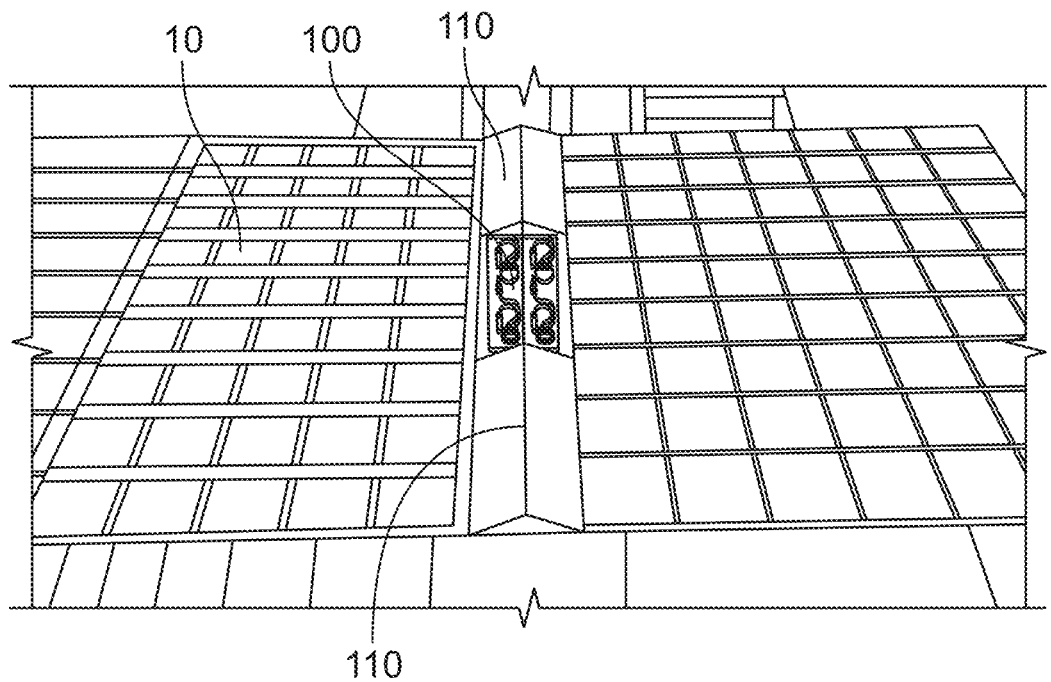
FIGS. 8 and 9 are embodiments of photovoltaic shingles having wireways and associated covers.
Figure 9:
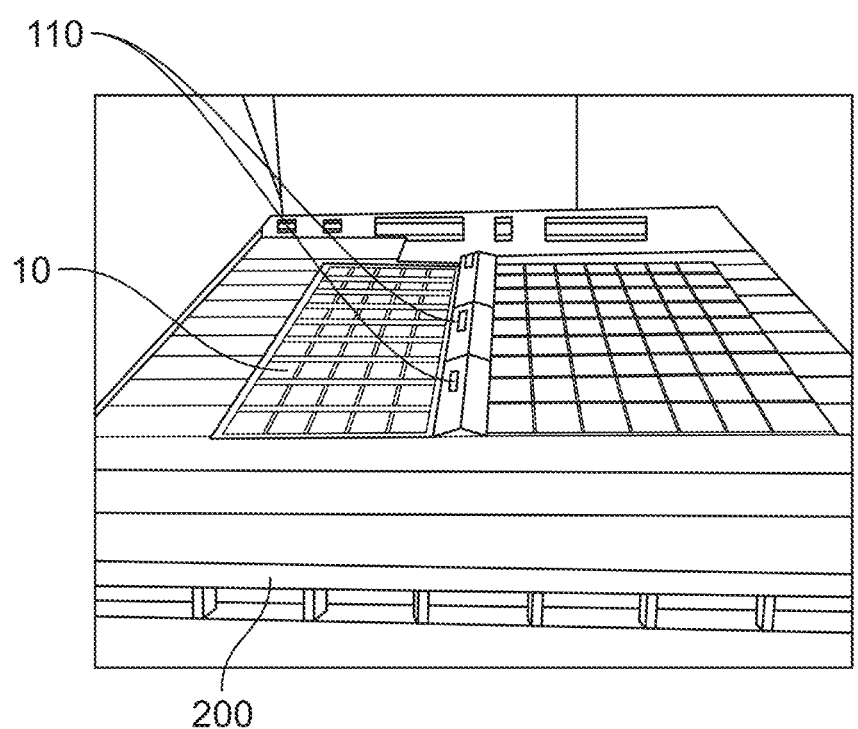
Figure 10:
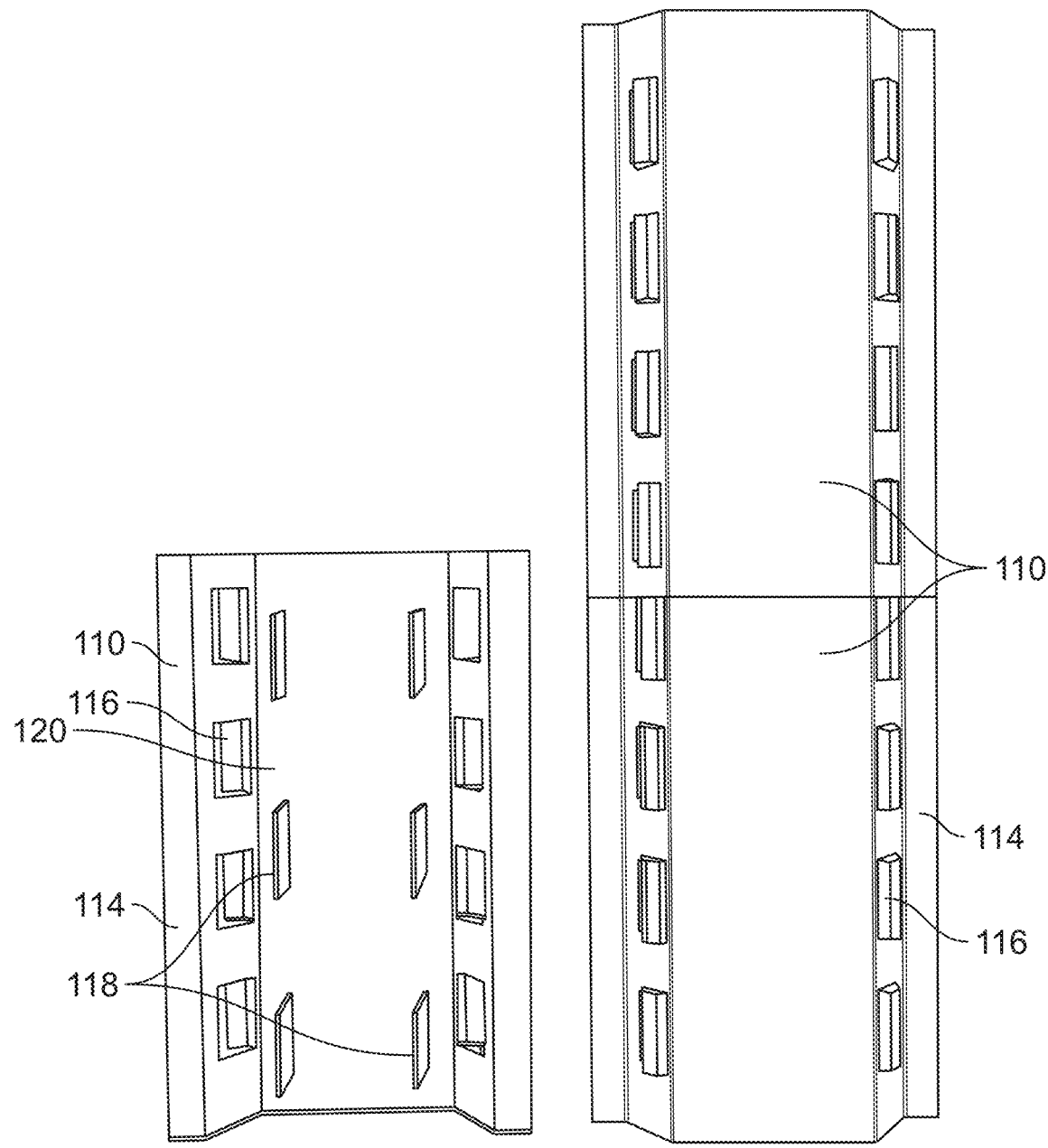
FIGS. 10 through 11 are embodiments of a wireway cover.
Figure 11:
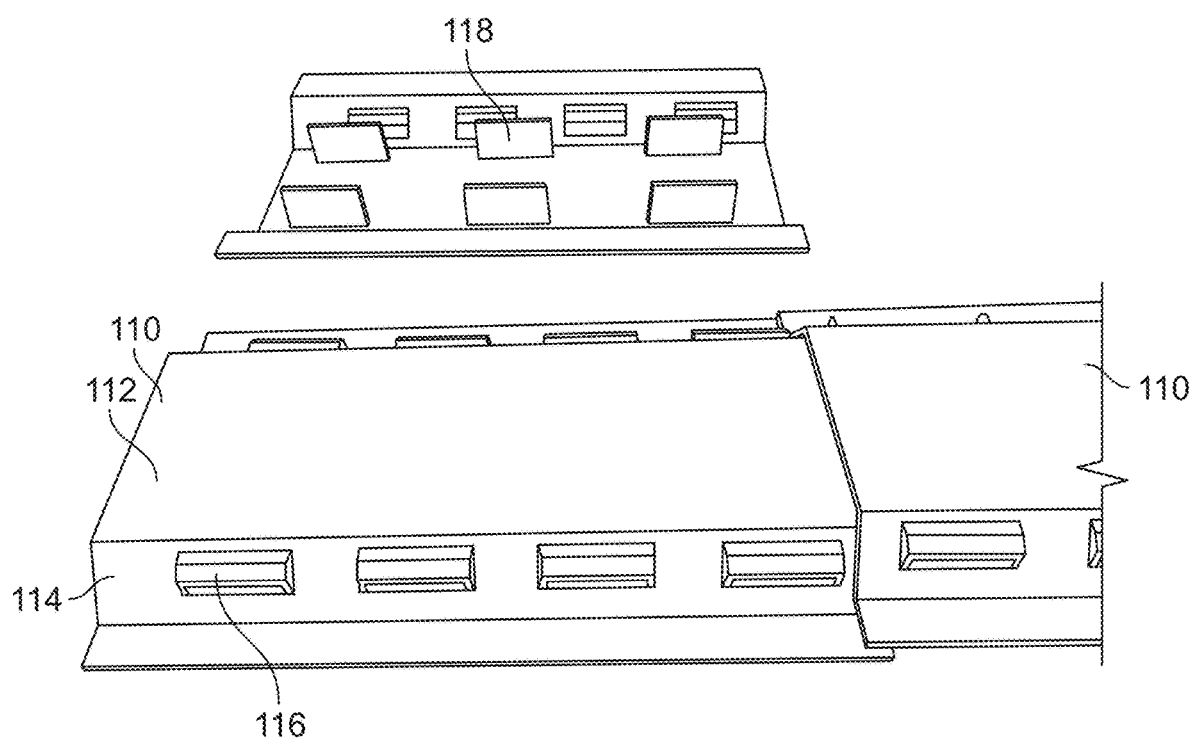

In some embodiments, the system 5 includes an underlayment layer 202 installed on the roof deck 200 (see FIG. 6). In some embodiments, the plurality of photovoltaic shingles 10 overlay the underlayment layer 202.

Referring to FIGS. 1A through 1D, in some embodiments, one of the plurality of photovoltaic shingles 10 overlays the head lap 16 of another of the plurality of photovoltaic shingles 10. In some embodiments, one of the plurality of photovoltaic shingles 10 overlays the first section 38 and the second section 40 of the another of the of the plurality of photovoltaic shingles 10 for a staggered installation of the photovoltaic shingles 10. In some embodiments, the first section 38 of the one of the plurality of photovoltaic shingles 10 overlays the first section 38 and the second section 40 of the another of the of the plurality of photovoltaic shingles 10. In some embodiments, the second section 40 of the one of the plurality of photovoltaic shingles 10 overlays the first section 38 and the second section 40 of the another of the of the plurality of photovoltaic shingles 10.

Referring to FIGS. 2A through 2D, in some embodiments, the first step flap 54 of one of the plurality of photovoltaic shingles 10 overlays the first step flap 54 of another of the plurality of photovoltaic shingles 10, and the second step flap 56 of the one of the plurality of photovoltaic shingles 10 overlays the second step flap 56 of the another of the plurality of photovoltaic shingles 10 for a non-staggered installation of the photovoltaic shingles 10. In some embodiments, the first step flap 54 of the one of the plurality of photovoltaic shingles 10 substantially aligns with the first step flap 54 of the another of the plurality of photovoltaic shingles 10, and the second step flap 56 of the one of the plurality of photovoltaic shingles 10 substantially aligns with the second step flap 56 of the another of the plurality of photovoltaic shingles 10. In some embodiments, the third end 32 of the second layer 14 of the one of the plurality of photovoltaic shingles 10 substantially aligns with the third end 32 of the second layer 14 of the another of the plurality of photovoltaic shingles 10, and the fourth end 34 of the second layer 14 of the one of the plurality of photovoltaic shingles 10 substantially aligns with the fourth end 34 of the second layer 14 of the another of the plurality of photovoltaic shingles 10. In some embodiments, the second step flap 56 of one of the plurality of photovoltaic shingles 10 overlays the first step flap 54 of another of the plurality of photovoltaic shingles 10.

In some embodiments, each of the plurality of photovoltaic shingles 10 meets the standards of Florida Testing Application Standard (TAS) 100-95 when tested in accordance therewith.

In some embodiments, each of the plurality of photovoltaic shingles includes a height H1 in a range of 5 mm to 20 mm. In some embodiments, each of the plurality of photovoltaic shingles includes a height H1 in a range of 6 mm to 20 mm. In some embodiments, each of the plurality of photovoltaic shingles includes a height H1 in a range of 7 mm to 20 mm. In some embodiments, each of the plurality of photovoltaic shingles includes a height H1 in a range of 8 mm to 20 mm. In some embodiments, each of the plurality of photovoltaic shingles includes a height H1 in a range of 9 mm to 20 mm. In some embodiments, each of the plurality of photovoltaic shingles includes a height H1 in a range of 10 mm to 20 mm. In some embodiments, each of the plurality of photovoltaic shingles includes a height H1 in a range of 11 mm to 20 mm. In some embodiments, each of the plurality of photovoltaic shingles includes a height H1 in a range of 12 mm to 20 mm. In some embodiments, each of the plurality of photovoltaic shingles includes a height H1 in a range of 13 mm to 20 mm. In some embodiments, each of the plurality of photovoltaic shingles includes a height H1 in a range of 14 mm to 20 mm. In some embodiments, each of the plurality of photovoltaic shingles includes a height H1 in a range of 15 mm to 20 mm. In some embodiments, each of the plurality of photovoltaic shingles includes a height H1 in a range of 16 mm to 20 mm. In some embodiments, each of the plurality of photovoltaic shingles includes a height in a range of 17 mm to 20 mm. In some embodiments, each of the plurality of photovoltaic shingles includes a height H1 in a range of 18 mm to 20 mm. In some embodiments, each of the plurality of photovoltaic shingles includes a height H1 in a range of 19 mm to 20 mm.

In some embodiments, each of the plurality of photovoltaic shingles includes a height H1 in a range of 5 mm to 19 mm. In some embodiments, each of the plurality of photovoltaic shingles includes a height H1 in a range of 6 mm to 19 mm. In some embodiments, each of the plurality of photovoltaic shingles includes a height H1 in a range of 7 mm to 19 mm. In some embodiments, each of the plurality of photovoltaic shingles includes a height H1 in a range of 8 mm to 19 mm. In some embodiments, each of the plurality of photovoltaic shingles includes a height H1 in a range of 9 mm to 19 mm. In some embodiments, each of the plurality of photovoltaic shingles includes a height H1 in a range of 10 mm to 19 mm. In some embodiments, each of the plurality of photovoltaic shingles includes a height H1 in a range of 11 mm to 19 mm. In some embodiments, each of the plurality of photovoltaic shingles includes a height H1 in a range of 12 mm to 19 mm. In some embodiments, each of the plurality of photovoltaic shingles includes a height H1 in a range of 13 mm to 19 mm. In some embodiments, each of the plurality of photovoltaic shingles includes a height H1 in a range of 14 mm to 19 mm. In some embodiments, each of the plurality of photovoltaic shingles includes a height H1 in a range of 15 mm to 19 mm. In some embodiments, each of the plurality of photovoltaic shingles includes a height H1 in a range of 16 mm to 19 mm. In some embodiments, each of the plurality of photovoltaic shingles includes a height H1 in a range of 17 mm to 19 mm. In some embodiments, each of the plurality of photovoltaic shingles includes a height H1 in a range of 18 mm to 19 mm.

In some embodiments, each of the plurality of photovoltaic shingles includes a height H1 in a range of 5 mm to 18 mm. In some embodiments, each of the plurality of photovoltaic shingles includes a height H1 in a range of 6 mm to 18 mm. In some embodiments, each of the plurality of photovoltaic shingles includes a height H1 in a range of 7 mm to 18 mm. In some embodiments, each of the plurality of photovoltaic shingles includes a height H1 in a range of 8 mm to 18 mm. In some embodiments, each of the plurality of photovoltaic shingles includes a height H1 in a range of 9 mm to 18 mm. In some embodiments, each of the plurality of photovoltaic shingles includes a height H1 in a range of 10 mm to 18 mm. In some embodiments, each of the plurality of photovoltaic shingles includes a height H1 in a range of 11 mm to 18 mm. In some embodiments, each of the plurality of photovoltaic shingles includes a height H1 in a range of 12 mm to 18 mm. In some embodiments, each of the plurality of photovoltaic shingles includes a height H1 in a range of 13 mm to 18 mm. In some embodiments, each of the plurality of photovoltaic shingles includes a height H1 in a range of 14 mm to 18 mm. In some embodiments, each of the plurality of photovoltaic shingles includes a height H1 in a range of 15 mm to 18 mm. In some embodiments, each of the plurality of photovoltaic shingles includes a height H1 in a range of 16 mm to 18 mm. In some embodiments, each of the plurality of photovoltaic shingles includes a height H1 in a range of 17 mm to 18 mm.

In some embodiments, each of the plurality of photovoltaic shingles includes a height H1 in a range of 5 mm to 17 mm. In some embodiments, each of the plurality of photovoltaic shingles includes a height H1 in a range of 6 mm to 17 mm. In some embodiments, each of the plurality of photovoltaic shingles includes a height H1 in a range of 7 mm to 17 mm. In some embodiments, each of the plurality of photovoltaic shingles includes a height H1 in a range of 8 mm to 17 mm. In some embodiments, each of the plurality of photovoltaic shingles includes a height H1 in a range of 9 mm to 17 mm. In some embodiments, each of the plurality of photovoltaic shingles includes a height H1 in a range of 10 mm to 17 mm. In some embodiments, each of the plurality of photovoltaic shingles includes a height H1 in a range of 11 mm to 17 mm. In some embodiments, each of the plurality of photovoltaic shingles includes a height H1 in a range of 12 mm to 17 mm. In some embodiments, each of the plurality of photovoltaic shingles includes a height H1 in a range of 13 mm to 17 mm. In some embodiments, each of the plurality of photovoltaic shingles includes a height H1 in a range of 14 mm to 17 mm. In some embodiments, each of the plurality of photovoltaic shingles includes a height H1 in a range of 15 mm to 17 mm. In some embodiments, each of the plurality of photovoltaic shingles includes a height H1 in a range of 16 mm to 17 mm.

In some embodiments, each of the plurality of photovoltaic shingles includes a height H1 in a range of 5 mm to 16 mm. In some embodiments, each of the plurality of photovoltaic shingles includes a height H1 in a range of 6 mm to 16 mm. In some embodiments, each of the plurality of photovoltaic shingles includes a height H1 in a range of 7 mm to 16 mm. In some embodiments, each of the plurality of photovoltaic shingles includes a height H1 in a range of 8 mm to 16 mm. In some embodiments, each of the plurality of photovoltaic shingles includes a height H1 in a range of 9 mm to 16 mm. In some embodiments, each of the plurality of photovoltaic shingles includes a height H1 in a range of 10 mm to 16 mm. In some embodiments, each of the plurality of photovoltaic shingles includes a height H1 in a range of 11 mm to 16 mm. In some embodiments, each of the plurality of photovoltaic shingles includes a height H1 in a range of 12 mm to 16 mm. In some embodiments, each of the plurality of photovoltaic shingles includes a height H1 in a range of 13 mm to 16 mm. In some embodiments, each of the plurality of photovoltaic shingles includes a height H1 in a range of 14 mm to 16 mm. In some embodiments, each of the plurality of photovoltaic shingles includes a height H1 in a range of 15 mm to 16 mm.

In some embodiments, each of the plurality of photovoltaic shingles includes a height H1 in a range of 5 mm to 15 mm. In some embodiments, each of the plurality of photovoltaic shingles includes a height H1 in a range of 6 mm to 15 mm. In some embodiments, each of the plurality of photovoltaic shingles includes a height H1 in a range of 7 mm to 15 mm. In some embodiments, each of the plurality of photovoltaic shingles includes a height H1 in a range of 8 mm to 15 mm. In some embodiments, each of the plurality of photovoltaic shingles includes a height H1 in a range of 9 mm to 15 mm. In some embodiments, each of the plurality of photovoltaic shingles includes a height H1 in a range of 10 mm to 15 mm. In some embodiments, each of the plurality of photovoltaic shingles includes a height H1 in a range of 11 mm to 15 mm. In some embodiments, each of the plurality of photovoltaic shingles includes a height H1 in a range of 12 mm to 15 mm. In some embodiments, each of the plurality of photovoltaic shingles includes a height H1 in a range of 13 mm to 15 mm. In some embodiments, each of the plurality of photovoltaic shingles includes a height H1 in a range of 14 mm to 15 mm.

In some embodiments, each of the plurality of photovoltaic shingles includes a height H1 in a range of 5 mm to 14 mm. In some embodiments, each of the plurality of photovoltaic shingles includes a height H1 in a range of 6 mm to 14 mm. In some embodiments, each of the plurality of photovoltaic shingles includes a height H1 in a range of 7 mm to 14 mm. In some embodiments, each of the plurality of photovoltaic shingles includes a height H1 in a range of 8 mm to 14 mm. In some embodiments, each of the plurality of photovoltaic shingles includes a height H1 in a range of 9 mm to 14 mm. In some embodiments, each of the plurality of photovoltaic shingles includes a height H1 in a range of 10 mm to 14 mm. In some embodiments, each of the plurality of photovoltaic shingles includes a height H1 in a range of 11 mm to 14 mm. In some embodiments, each of the plurality of photovoltaic shingles includes a height H1 in a range of 12 mm to 14 mm. In some embodiments, each of the plurality of photovoltaic shingles includes a height H1 in a range of 13 mm to 14 mm.

In some embodiments, each of the plurality of photovoltaic shingles includes a height H1 in a range of 5 mm to 13 mm. In some embodiments, each of the plurality of photovoltaic shingles includes a height H1 in a range of 6 mm to 13 mm. In some embodiments, each of the plurality of photovoltaic shingles includes a height H1 in a range of 7 mm to 13 mm. In some embodiments, each of the plurality of photovoltaic shingles includes a height H1 in a range of 8 mm to 13 mm. In some embodiments, each of the plurality of photovoltaic shingles includes a height H1 in a range of 9 mm to 13 mm. In some embodiments, each of the plurality of photovoltaic shingles includes a height H1 in a range of 10 mm to 13 mm. In some embodiments, each of the plurality of photovoltaic shingles includes a height H1 in a range of 11 mm to 13 mm. In some embodiments, each of the plurality of photovoltaic shingles includes a height H1 in a range of 12 mm to 13 mm.

In some embodiments, each of the plurality of photovoltaic shingles includes a height H1 in a range of 5 mm to 12 mm. In some embodiments, each of the plurality of photovoltaic shingles includes a height H1 in a range of 6 mm to 12 mm. In some embodiments, each of the plurality of photovoltaic shingles includes a height H1 in a range of 7 mm to 12 mm. In some embodiments, each of the plurality of photovoltaic shingles includes a height H1 in a range of 8 mm to 12 mm. In some embodiments, each of the plurality of photovoltaic shingles includes a height H1 in a range of 9 mm to 12 mm. In some embodiments, each of the plurality of photovoltaic shingles includes a height H1 in a range of 10 mm to 12 mm. In some embodiments, each of the plurality of photovoltaic shingles includes a height H1 in a range of 11 mm to 12 mm.

In some embodiments, each of the plurality of photovoltaic shingles includes a height H1 in a range of 5 mm to 11 mm. In some embodiments, each of the plurality of photovoltaic shingles includes a height H1 in a range of 6 mm to 11 mm. In some embodiments, each of the plurality of photovoltaic shingles includes a height H1 in a range of 7 mm to 11 mm. In some embodiments, each of the plurality of photovoltaic shingles includes a height H1 in a range of 8 mm to 11 mm. In some embodiments, each of the plurality of photovoltaic shingles includes a height H1 in a range of 9 mm to 11 mm. In some embodiments, each of the plurality of photovoltaic shingles includes a height H1 in a range of 10 mm to 11 mm.

In some embodiments, each of the plurality of photovoltaic shingles includes a height H1 in a range of 5 mm to 10 mm. In some embodiments, each of the plurality of photovoltaic shingles includes a height H1 in a range of 6 mm to 10 mm. In some embodiments, each of the plurality of photovoltaic shingles includes a height H1 in a range of 7 mm to 10 mm. In some embodiments, each of the plurality of photovoltaic shingles includes a height H1 in a range of 8 mm to 10 mm. In some embodiments, each of the plurality of photovoltaic shingles includes a height H1 in a range of 9 mm to 10 mm.

In some embodiments, each of the plurality of photovoltaic shingles includes a height H1 in a range of 5 mm to 9 mm. In some embodiments, each of the plurality of photovoltaic shingles includes a height H1 in a range of 6 mm to 9 mm. In some embodiments, each of the plurality of photovoltaic shingles includes a height H1 in a range of 7 mm to 9 mm. In some embodiments, each of the plurality of photovoltaic shingles includes a height H1 in a range of 8 mm to 9 mm.

In some embodiments, each of the plurality of photovoltaic shingles includes a height H1 in a range of 5 mm to 8 mm. In some embodiments, each of the plurality of photovoltaic shingles includes a height H1 in a range of 6 mm to 8 mm. In some embodiments, each of the plurality of photovoltaic shingles includes a height H1 in a range of 7 mm to 8 mm.

In some embodiments, each of the plurality of photovoltaic shingles includes a height H1 in a range of 5 mm to 7 mm. In some embodiments, each of the plurality of photovoltaic shingles includes a height H1 in a range of 6 mm to 7 mm. In some embodiments, each of the plurality of photovoltaic shingles includes a height H1 in a range of 5 mm to 6 mm.

In some embodiments, each of the plurality of photovoltaic shingles includes a height H1 of 5 mm. In some embodiments, each of the plurality of photovoltaic shingles includes a height H1 of 6 mm. In some embodiments, each of the plurality of photovoltaic shingles includes a height H1 of 7 mm. In some embodiments, each of the plurality of photovoltaic shingles includes a height H1 of 8 mm. In some embodiments, each of the plurality of photovoltaic shingles includes a height H1 of 9 mm. In some embodiments, each of the plurality of photovoltaic shingles includes a height H1 of 10 mm. In some embodiments, each of the plurality of photovoltaic shingles includes a height H1 of 11 mm. In some embodiments, each of the plurality of photovoltaic shingles includes a height H1 of 12 mm. In some embodiments, each of the plurality of photovoltaic shingles includes a height H1 of 13 mm. In some embodiments, each of the plurality of photovoltaic shingles includes a height H1 of 14 mm. In some embodiments, each of the plurality of photovoltaic shingles includes a height H1 of 15 mm. In some embodiments, each of the plurality of photovoltaic shingles includes a height H1 of 16 mm. In some embodiments, each of the plurality of photovoltaic shingles includes a height H1 of 17 mm. In some embodiments, each of the plurality of photovoltaic shingles includes a height H1 of 18 mm. In some embodiments, each of the plurality of photovoltaic shingles includes a height H1 of 19 mm. In some embodiments, each of the plurality of photovoltaic shingles includes a height H1 of 20 mm.

Referring to FIGS. 3A through 5, in some embodiments, the system 5 includes at least one wireway 100 installed proximate to the plurality of photovoltaic shingles 10 on the roof deck 200. In some embodiments, the at least one wireway 100 is installed intermediate the plurality of photovoltaic shingles 10. In some embodiments, the at least one wireway 100 is installed proximate to each of the third ends 32 of the second layers 14. In some embodiments, the at least one wireway 100 overlays each of the first step flaps 54. In some embodiments, the at least one wireway 100 is installed proximate to each of the fourth ends 34 of the second layers 14. In some embodiments, the at least one wireway 100 overlays each of the second step flaps 56. In some embodiments, the at least one wireway 100 is installed intermediate each of the third ends 32 of a first plurality of the photovoltaic shingles 10 and the fourth ends 34 of a second plurality of the photovoltaic shingles 10. In some embodiments, the at least one wireway 100 overlays each of the first step flaps 54. In some embodiments, the at least one wireway 100 overlays each of the second step flaps 56. In some embodiments, the step flaps 54, 56 form the wireway 100.

Referring to FIGS. 6 through 11, in some embodiments, the at least one wireway 100 includes a pair of rails 102 spaced apart from one another. In some embodiments, the rails 102 extend outwardly from the roof deck 200. In some embodiments, the rails 102 are substantially parallel to another. In some embodiments, each of the rails 102 includes side flashing 104. In some embodiments, each of the side flashing 104 includes a first portion 106 positioned on the roof deck 200 and second portion 108 extending obliquely and inwardly in a first direction relative to the first portion 106. In some embodiments, slots 109 are formed between the first portions 106 and the second portions 108. In some embodiments, the at least one wireway 100 is rectangular in shape. In some embodiments, the photovoltaic shingles 10 overlay the second portion 108 of the side flashing 104. In some embodiments, the at least one wireway 100 is sized and shaped to receive electrical components of a photovoltaic system, such as an electrical junction box, electrical wire, and electrical connectors.

Still referring to FIGS. 6 through 11, in some embodiments, the at least one wireway 100 includes a lid 110. In some embodiments, the lid 110 is removably attached to the at least one wireway 100. In some embodiments, the lid 110 includes a cover portion 112 and a pair of rails 114 spaced apart from one another and extending obliquely and inwardly in a second direction opposite the first direction of the second portion 108 of the rails 102. In some embodiments, the lid 110 is removably engaged with the side flashing 104 of the wireway 100 such that the rails 114 of the lid 110 engage (e.g., snap-in) the second portions 108 of the side flashing 104. In some embodiments, the lid 110 is substantially rectangular in shape. In some embodiments, the rails 114 extend outwardly and obliquely in the first direction. In some embodiments, the lid 110 is removably attached to the at least one wireway 100 by screws, nails, rivets, adhesives or other fasteners.

In some embodiments, the at least one wireway 100 includes a plurality of wireways 100. In some embodiments, one of the lids 110 of one of the plurality of wireways 100 overlaps another of the lids 110 of another of the plurality of wireways 100 (see FIGS. 9 through 11). In some embodiments, the overlapping lids 110 promote water shedding. In some embodiments, the at least one wireway 100 is moisture resistant. As used herein, the term "moisture resistant" means having a water transmission rate of less than or equal to 0.05 U.S. perms, as measured by ASTM E 96, Procedure B—Standard Test Methods for Water Vapor Transmission of Materials. In some embodiments, the wireway 100 withstands walking loads/step resistance that conforms to standards under UL 3741 test standards (UL Standard for Safety Photovoltaic Hazard. Control). In some embodiments, the wireway 100 includes an axe impact resistance that conforms to standards under UL 3741 test standards. In some embodiments, the wireway 100 includes a body fall resistance that conforms to standards under UL 3741 test standards.

Figure 12A:
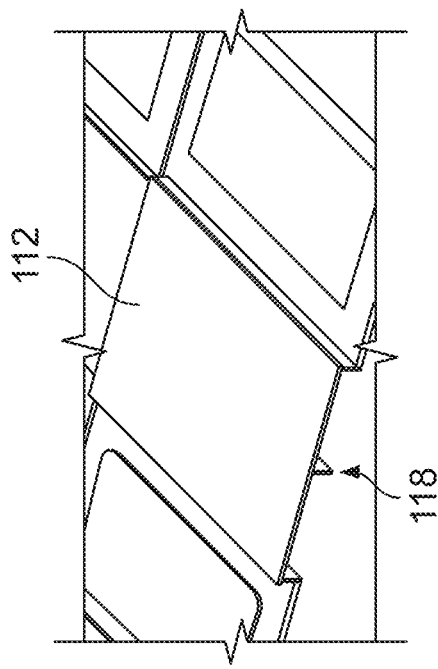
FIGS. 12A through 12D are top perspective views of embodiments of a wireway cover.
Figure 12B:
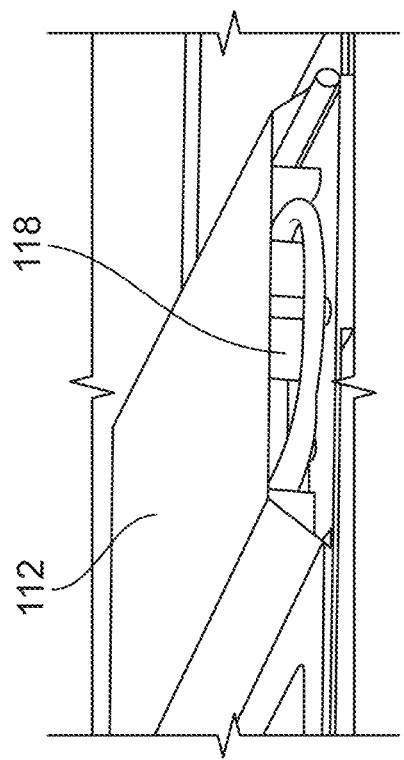
Figure 12C:
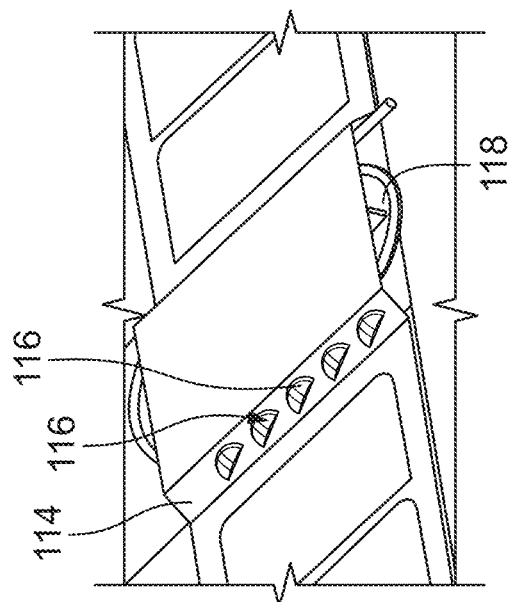
Figure 12D:
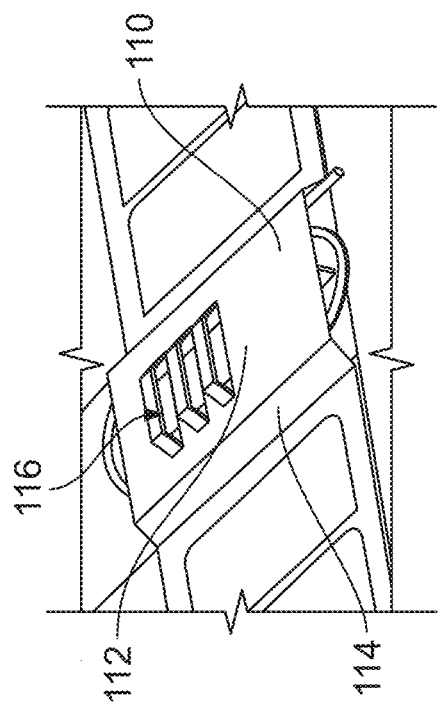

In certain embodiments, the lid 110 includes a plurality of louvers 116. See FIGS. 12C and 12D. In some embodiments, the louvers 116 are formed within the rails 114 of the lid 110. In some embodiments, the louvers 116 are formed within the cover portion 112. In some embodiments, the louvers 116 are elongated. In some embodiments, the louvers 116 are rectangular in shape. In some embodiments, the louvers 116 are semi-circular in shape.

Figure 13A:
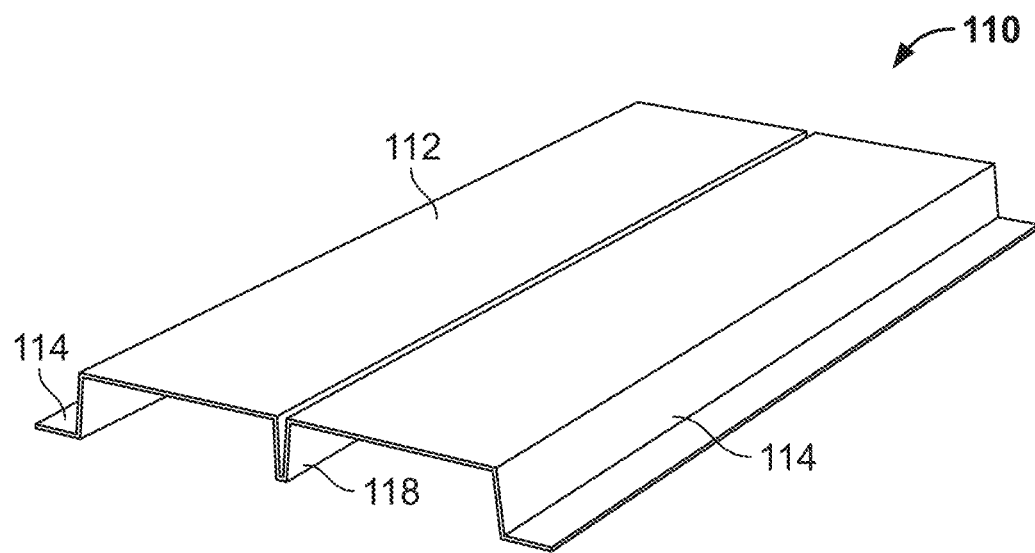
FIGS. 13A and 13B are top perspective views of embodiments of covers for wireways.
Figure 13B:
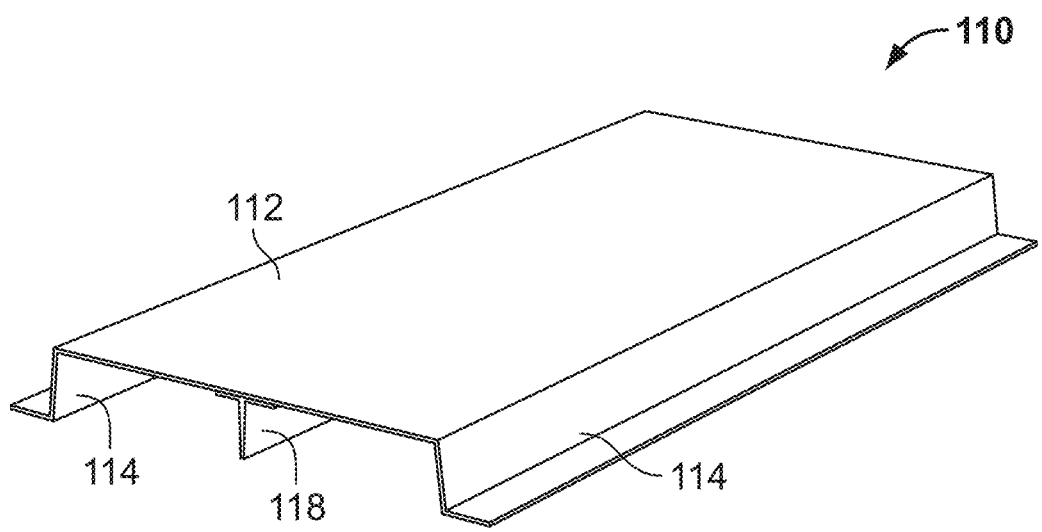

In some embodiments, the lid 110 includes at least one support member 118 extending from an interior surface 120 of the cover portion 112. In some embodiments, the at least one support member 118 includes a plurality of support members. In some embodiments, each of the plurality of support members 118 is spaced apart from one another. In some embodiments, each of the plurality of support members 118 is oriented in at least two opposing rows (see FIGS. 10 and 11). In some embodiments, the at least one support member 118 is integral with the cover portion 112. In some embodiments, the at least one support member 118 is formed by crimping a section of the cover portion 112 (see FIGS. 12A and 13A). In some embodiments, the at least one support member 118 is attached to the interior surface 120 of the cover portion 112 (see FIGS. 12B and 13B). In some embodiments, the at least one support member 118 is attached to the interior surface 120 of the cover portion 112 by welding. In some embodiments, the at least one support member 118 is attached to the interior surface 120 of the cover portion 112 by an adhesive. In some embodiments, the at least one support member 118 includes a T-rail shape.

Referring to FIGS. 14A through 14C, In some embodiments, the lid 110 is attached to the first layer 12 of one the photovoltaic shingles 10 by an adhesive 121. In some embodiments, the lid 110 includes a hook member 122. In some embodiments, the hook member 122 includes an upper rail 124 and a lower rail 126 spaced apart from and substantially parallel to the upper rail 124. In some embodiments, the hook member 122 is removably positioned intermediate the first layer 12 of one of the plurality of photovoltaic shingles 10 and the second layer 14 of the one of the plurality of photovoltaic shingles 10 such that the second layer 14 is positioned between the upper and lower rails 124, 126.

Figure 14D:
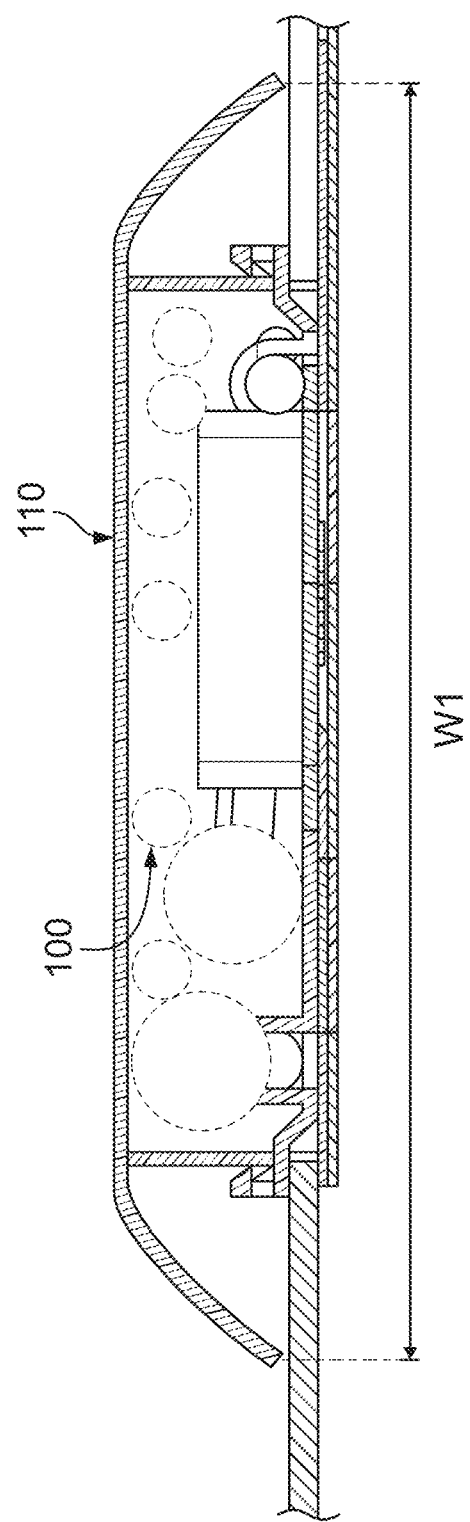

Referring to FIGS. 14D and 14E, in some embodiments, the wireway 100 includes a length L1 of 100 mm to 450 mm. In some embodiments, the wireway 100 includes a length L1 of 100 mm to 400 mm. In some embodiments, the wireway 100 includes a length L1 of 100 mm to 350 mm. In some embodiments, the wireway 100 includes a length L1 of 100 mm to 300 mm. In some embodiments, the wireway 100 includes a length L1 of 100 mm to 250 mm. In some embodiments, the wireway 100 includes a length L1 of 100 mm to 200 mm. In some embodiments, the wireway 100 includes a length L1 of 100 mm to 150 mm.

In some embodiments, the wireway 100 includes a length L1 of 150 mm to 450 mm. In some embodiments, the wireway 100 includes a length L1 of 150 mm to 400 mm. In some embodiments, the wireway 100 includes a length L1 of 150 mm to 350 mm. In some embodiments, the wireway 100 includes a length L1 of 150 mm to 300 mm. In some embodiments, the wireway 100 includes a length L1 of 150 mm to 250 mm. In some embodiments, the wireway 100 includes a length L1 of 150 mm to 200 mm.

In some embodiments, the wireway 100 includes a length L1 of 200 mm to 450 mm. In some embodiments, the wireway 100 includes a length L1 of 200 mm to 400 mm. In some embodiments, the wireway 100 includes a length L1 of 200 mm to 350 mm. In some embodiments, the wireway 100 includes a length L1 of 200 mm to 300 mm. In some embodiments, the wireway 100 includes a length L1 of 200 mm to 250 mm.

In some embodiments, the wireway 100 includes a length L1 of 250 mm to 450 mm. In some embodiments, the wireway 100 includes a length L1 of 250 mm to 400 mm. In some embodiments, the wireway 100 includes a length L1 of 250 mm to 350 mm. In some embodiments, the wireway 100 includes a length L1 of 250 mm to 300 mm.

In some embodiments, the wireway 100 includes a length L1 of 300 mm to 450 mm. In some embodiments, the wireway 100 includes a length L1 of 300 mm to 400 mm. In some embodiments, the wireway 100 includes a length L1 of 300 mm to 350 mm. In some embodiments, the wireway 100 includes a length L1 of 350 mm to 450 mm. In some embodiments, the wireway 100 includes a length L1 of 350 mm to 400 mm. In some embodiments, the wireway 100 includes a length L1 of 400 mm to 450 mm.

In some embodiments, the wireway 100 includes a width W1 of 100 mm to 200 mm. In some embodiments, the wireway 100 includes a width W1 of 100 mm to 175 mm. In some embodiments, the wireway 100 includes a width W1 of 100 mm to 150 mm. In some embodiments, the wireway 100 includes a width W1 of 100 mm to 125 mm.

In some embodiments, the wireway 100 includes a width W1 of 125 mm to 200 mm. In some embodiments, the wireway 100 includes a width W1 of 125 mm to 175 mm. In some embodiments, the wireway 100 includes a width W1 of 125 mm to 150 mm. In some embodiments, the wireway 100 includes a width W1 of 150 mm to 200 mm. In some embodiments, the wireway 100 includes a width W1 of 150 mm to 175 mm. In some embodiments, the wireway 100 includes a width W1 of 175 mm to 200 mm.

In some embodiments, the wireway 100 includes a height H1 of 5 mm to 25 mm. In some embodiments, the wireway 100 includes a height H1 of 5 mm to 20 mm. In some embodiments, the wireway 100 includes a height H1 of 5 mm to 15 mm. In some embodiments, the wireway 100 includes a height H1 of 5 mm to 10 mm.

In some embodiments, the wireway 100 includes a height H1 of 10 mm to 25 mm. In some embodiments, the wireway 100 includes a height H1 of 10 mm to 20 mm. In some embodiments, the wireway 100 includes a height H1 of 10 mm to 15 mm. In some embodiments, the wireway 100 includes a height H1 of 15 mm to 25 mm. In some embodiments, the wireway 100 includes a height H1 of 15 mm to 20 mm. In some embodiments, the wireway 100 includes a height H1 of 20 mm to 25 mm.

In some embodiments, the wireway 100 is composed of a polymeric material. In some embodiments, the wireway 100 is composed of polypropylene. In some embodiments, the wireway 100 is composed of polyethylene. In some embodiments, the wireway 100 is composed of polyethylene. In some embodiments, the wireway 100 is composed of metal. In some embodiments, the wireway 100 is composed of aluminum.

In some embodiments, the wireway 100 includes a fire resistance that conforms to standards under UL 94 test standards. In some embodiments, the wireway 100 includes a fire-resistance having a V-0 rating in accordance with the standards of UL 94 test standards. In some embodiments, the wireway 100 includes a fire-resistance having a V-1 rating in accordance with the standards of UL 94 test standards. In some embodiments, the wireway 100 includes a fire-resistance having a V-2 rating in accordance with the standards of UL 94 test standards. In some embodiments, the photovoltaic shingle 10 is a component of a roofing/photovoltaic system that conforms to standards under UL 790/ASTM E 108 test standards. In some embodiments, the roofing/photovoltaic system includes a fire-resistance having a Class A rating in accordance with the standards of UL 790/ASTM E 108 test standards.

Figure 15C:
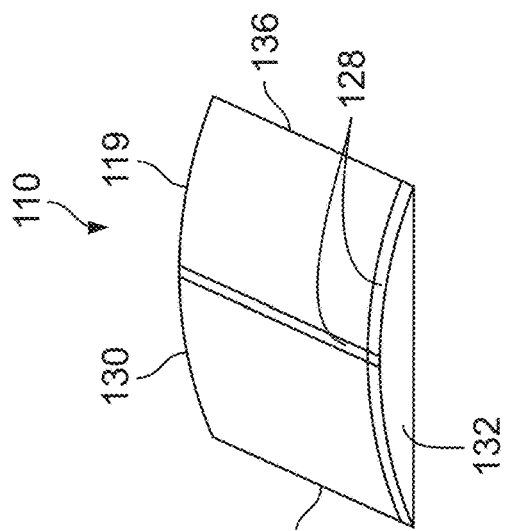
FIGS. 15A through 15C are top perspective views of embodiments of wireway covers including markings.
Figure 15B:
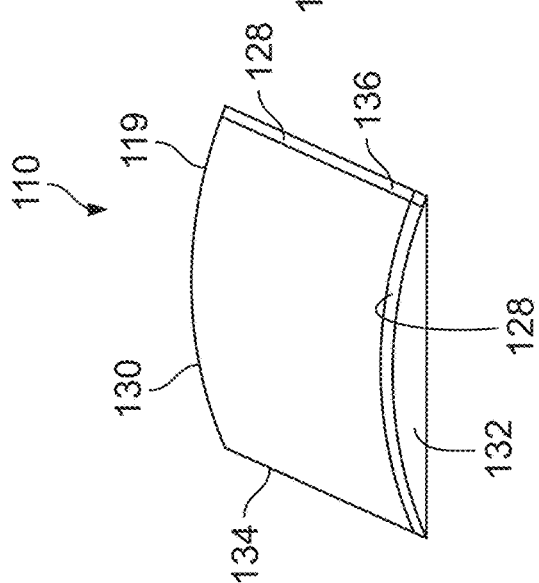
Figure 15A:
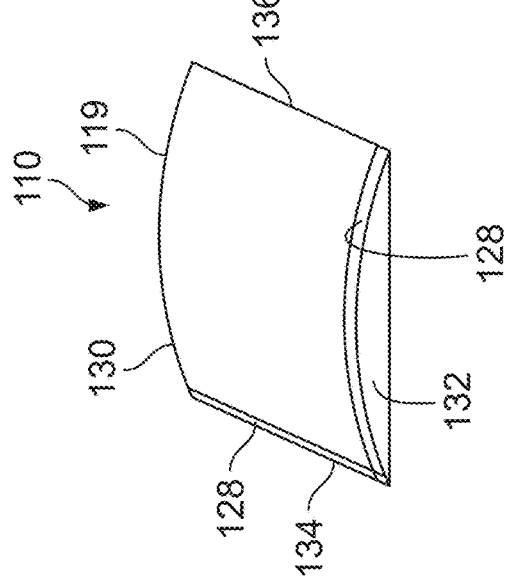
Figure 16:
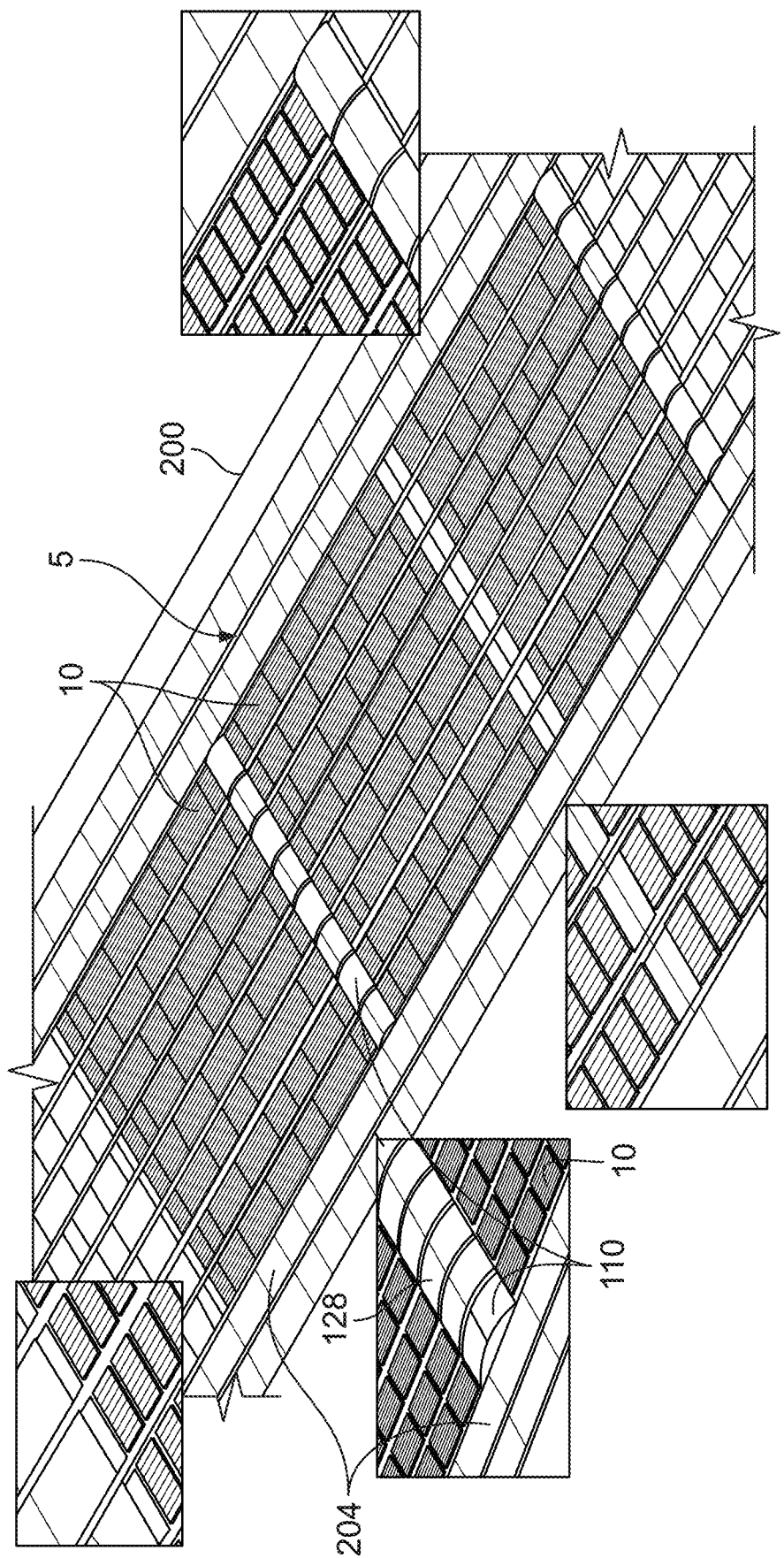
FIG. 16 is a top perspective view of some embodiments of a roofing system with photovoltaic shingles and the wireway covers of FIGS. 15A through 15C.
Figure 17A:
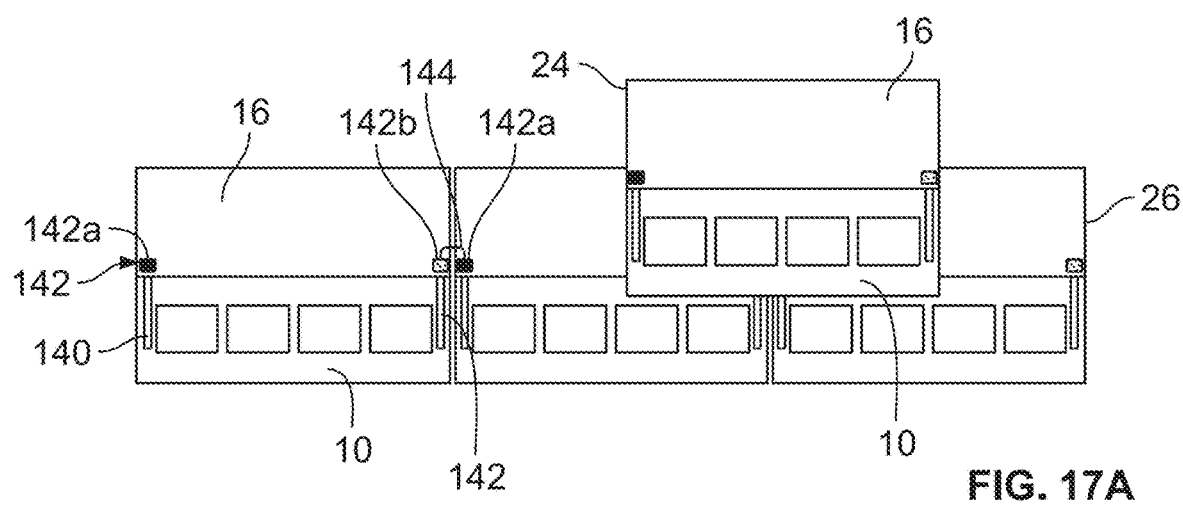
FIGS. 17A and 17B are a top plan view and side cross-sectional view, respectively, of some embodiments of a system of photovoltaic shingles with electrical connectors.
Figure 17B:
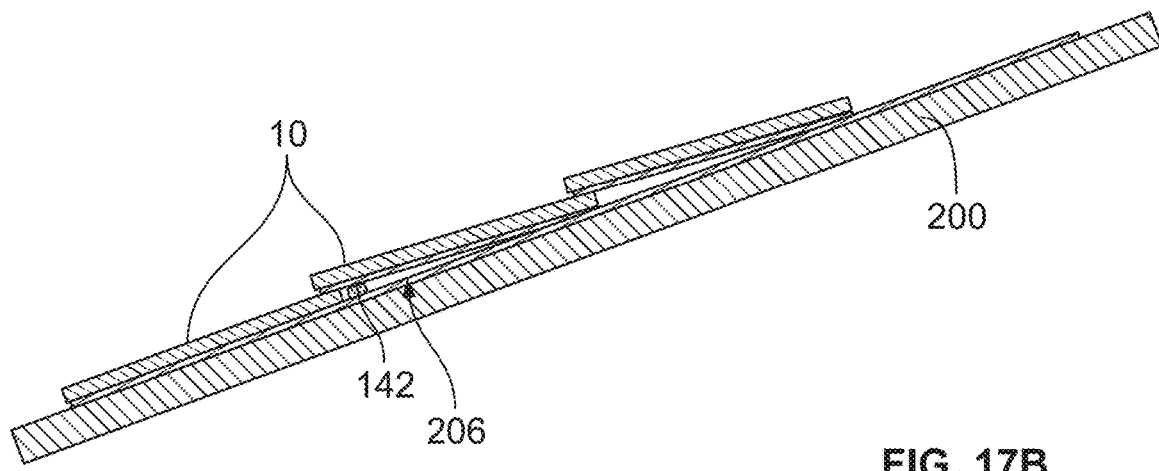
Figure 18A:
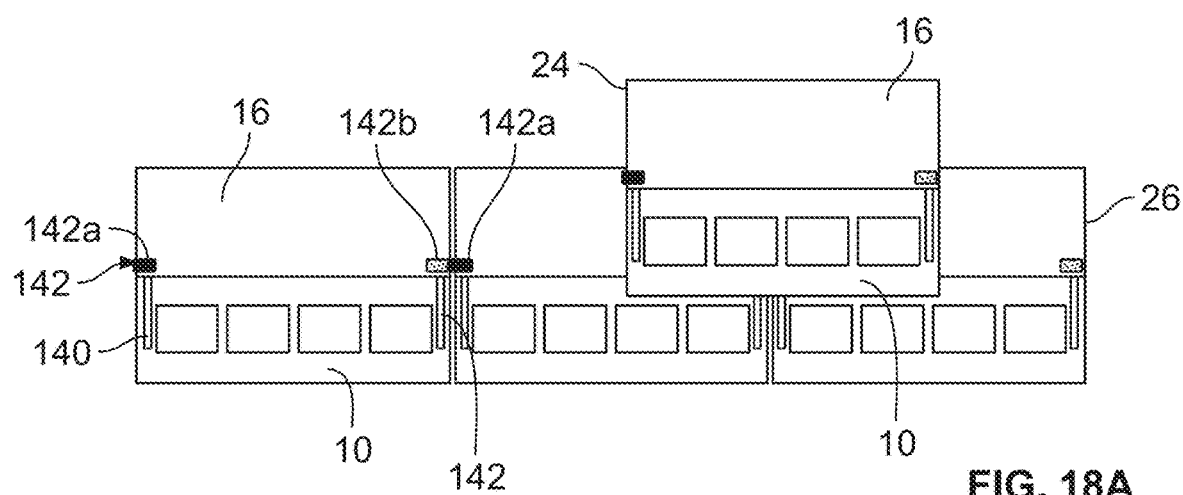
FIGS. 18A and 18B are a top plan view and side cross-sectional view, respectively, of some embodiments of a system of photovoltaic shingles with USB connectors.
Figure 18B:
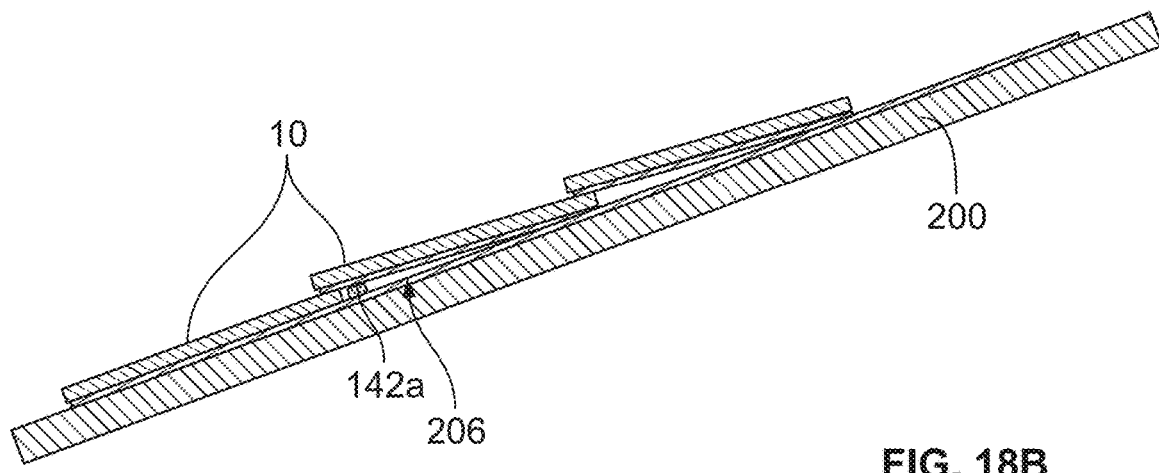

Referring to FIGS. 15A through 16, in some embodiments, the outer surface 119 of the cover portion 112 of the lid 110 includes at least one band 128. In some embodiments, the at least one band 128 includes a first color. In some embodiments, the first color is different from a color of a remainder of the outer surface 119. In some embodiments, the lid 110 includes a first end 130, a second end 132 opposite the first end 130, a third end 134 extending from the first end 130 to the second end 132, and a fourth end 136 extending from the first end 130 to the second end 132.

In some embodiments, one of the at least one band 128 extends from the first end 130 to the second end 132. In some embodiments, the one of the at least one band 128 is proximate to the third end 134. See FIG. 15A. In some embodiments, the one of the at least one band 128 is proximate to the fourth end 136. See FIG. 15B. In some embodiments, the one of the at least one band 128 is intermediate the third end 134 and the fourth end 136. See FIG. 15C. In some embodiments, one of the at least one band 128 extends from the third end 134 to the fourth end 136. In some embodiments, the one of the at least one band 128 is proximate to the first end 130. In some embodiments, the one of the at least one band 128 is proximate to the second end 132. In some embodiments, the at least one band 128 includes a second band 128, wherein the second band 128 extends from the first end 130 to the second end 132. In some embodiments, the second band 128 is proximate to the third end 134. In some embodiments, the second band 128 is proximate to the fourth end 136. In some embodiments, the second band 128 is intermediate the third end 134 and the fourth end 136. In some embodiments, the bands 128 mimic the appearance of the photovoltaic shingles 10 to provide a blended aesthetic look between the lids 110, the photovoltaic shingles 10, and a plurality of roofing shingles 204 of the roofing system 5 (see FIG. 16).

Referring to FIGS. 17A through 18B, in some embodiments, the at least one solar cell 18 includes an electrical bussing 140 and at least one electrical connector 142 electrically connected to the electrical bussing 140. In some embodiments, the at least one electrical connector 142 is positioned on the head lap 16. In some embodiments, the at least one electrical connector 142 includes a first electrical connector 142a and a second electrical connector 142b. In some embodiments, the first electrical connector 142a is positioned proximate to the third end 24 and the second electrical connector 142b is positioned proximate to the fourth end 26. In some embodiments, the first electrical connector 142a of one of the plurality of photovoltaic shingles 10 is connected to the second electrical connector 142b of another of the plurality of photovoltaic shingles 10. In some embodiments, the first electrical connector 142a is a male connector and the second electrical connector 142b is a female connector. In some embodiments, the first and second electrical connectors 142a, 142b are connected to one another by an electrical wire 144 (see FIGS. 17A and 17B). In some embodiments, the first and second electrical connectors 142a, 142b are removably connected to one another. In some embodiments, the first and second electrical connectors 142a, 142b are USB connectors (see FIGS. 18A and 18B). In some embodiments, when the photovoltaic shingles 10 are installed to the roof deck 200, each of the electrical connectors 142 are positioned within a corresponding space 206 formed between one of the photovoltaic shingles 10 and another overlapping one of the photovoltaic shingles 10.

Figure 19:
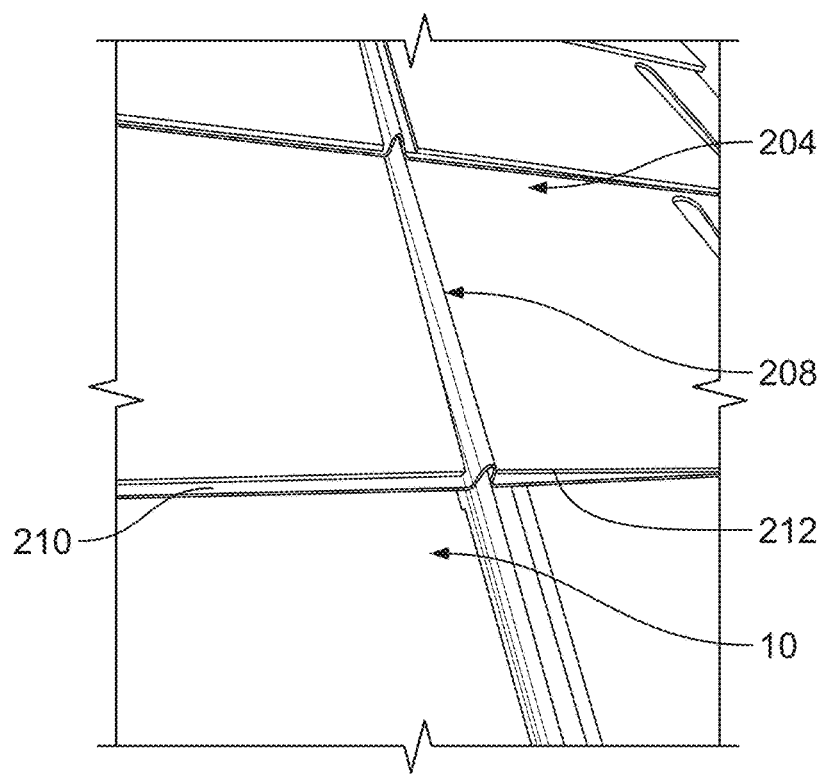
FIG. 19 is a system of photovoltaic shingles having step flashing.
Figure 20:
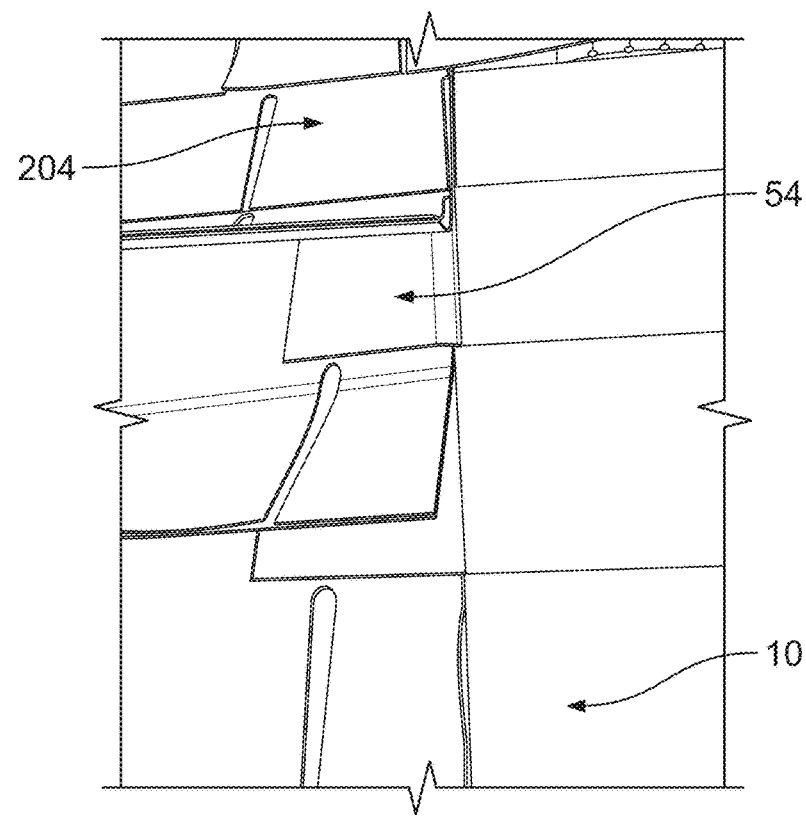
FIGS. 20, 21A and 21B are embodiments of systems of photovoltaic shingles having integrated step flaps.
Figure 21A:
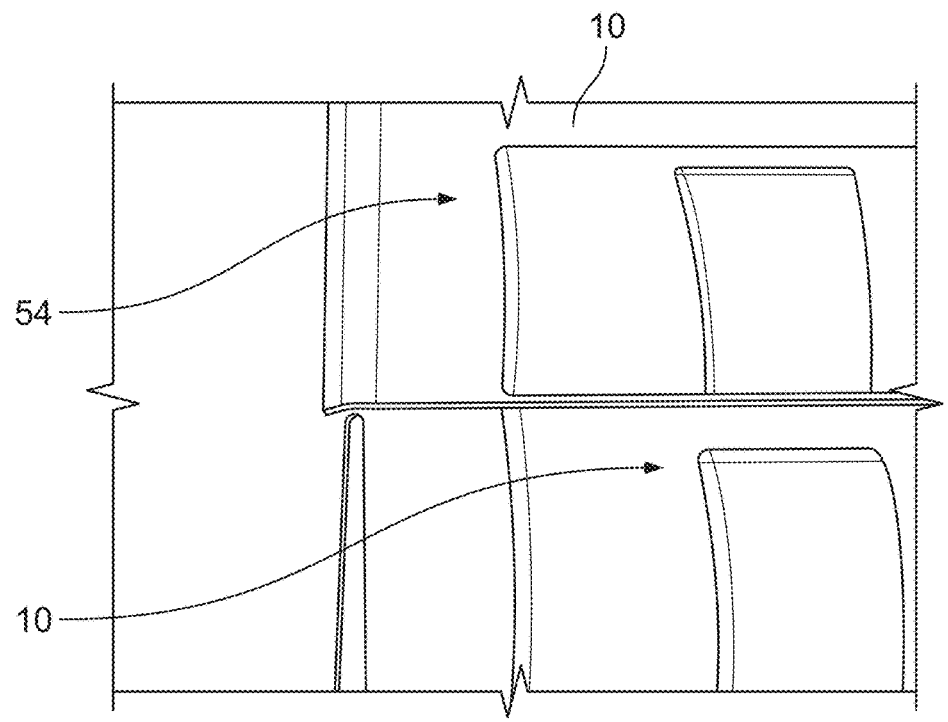
Figure 21B:
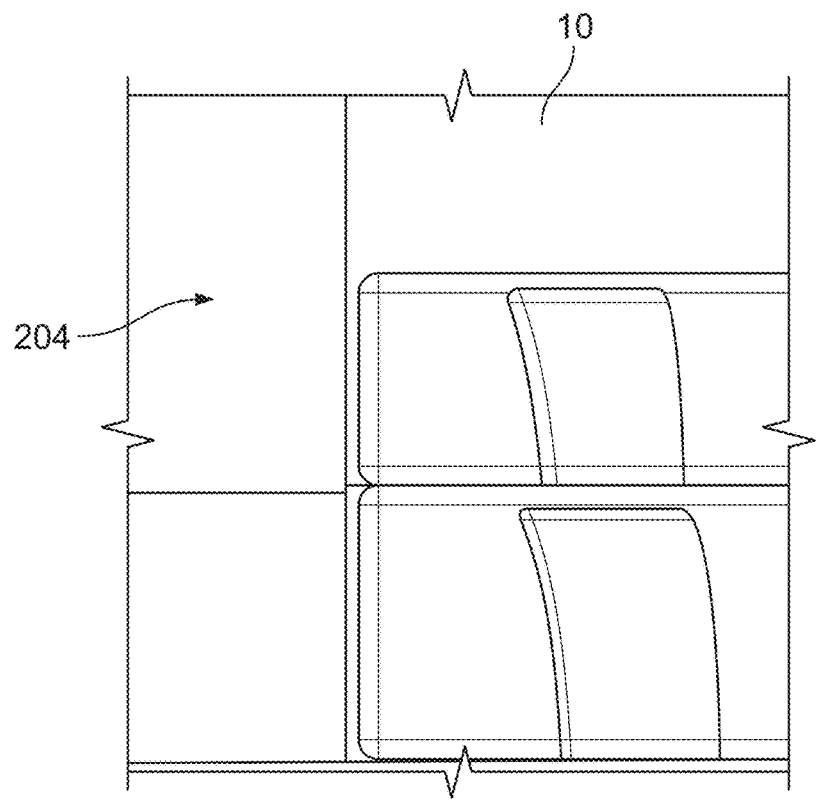
Figure 22B:
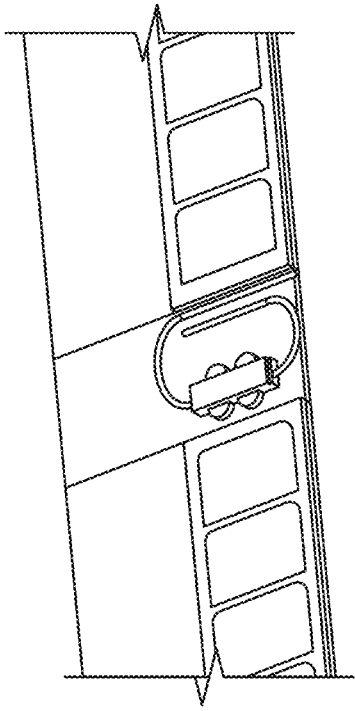
FIGS. 22A through 22D are schematic views of some embodiments of a method of installing a photovoltaic system.
Figure 22D:
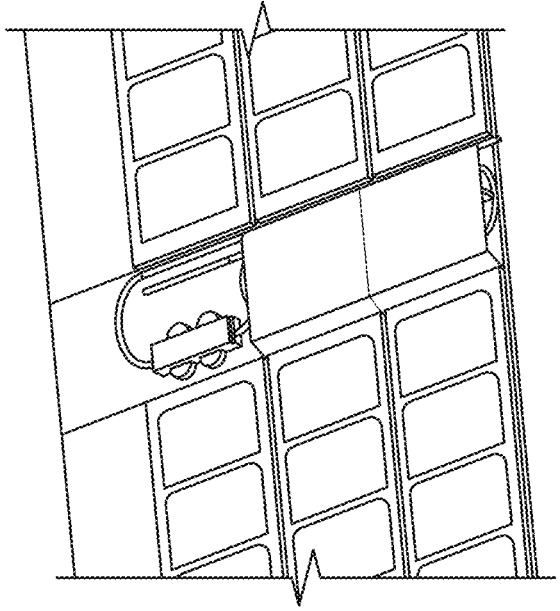
Figure 22A:
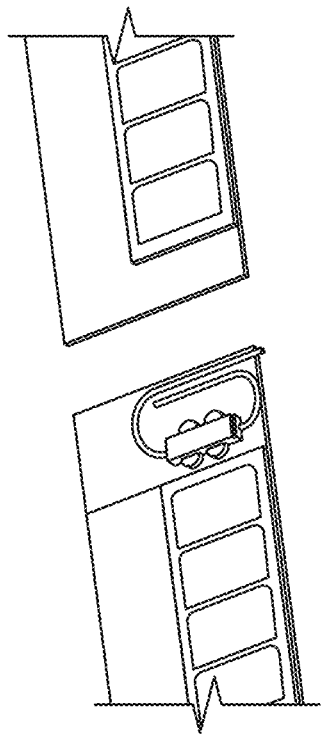
Figure 22C:
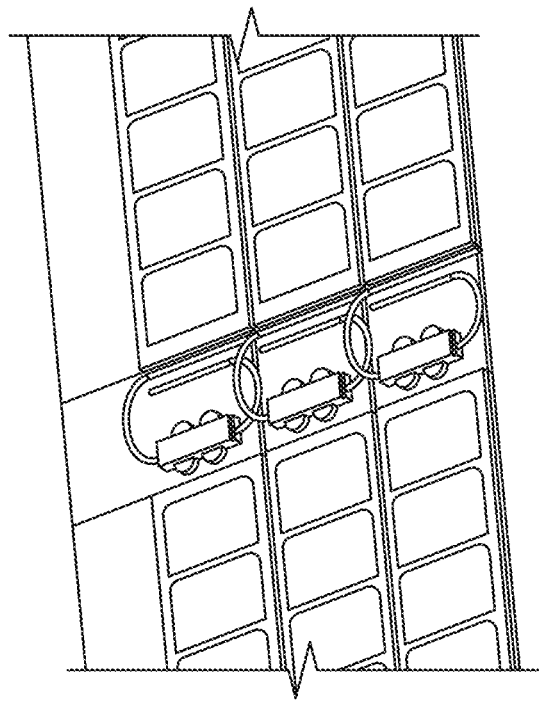
Figure 23B:
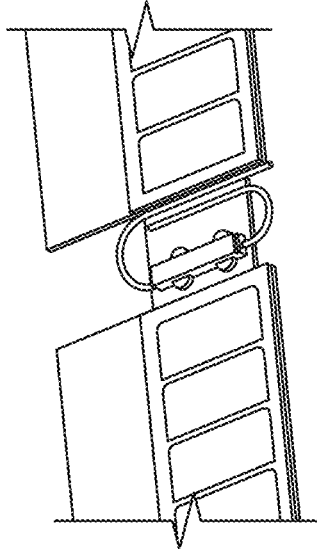
FIGS. 23A through 23D are schematic views of some embodiments of a method of installing a photovoltaic system.
Figure 23D:
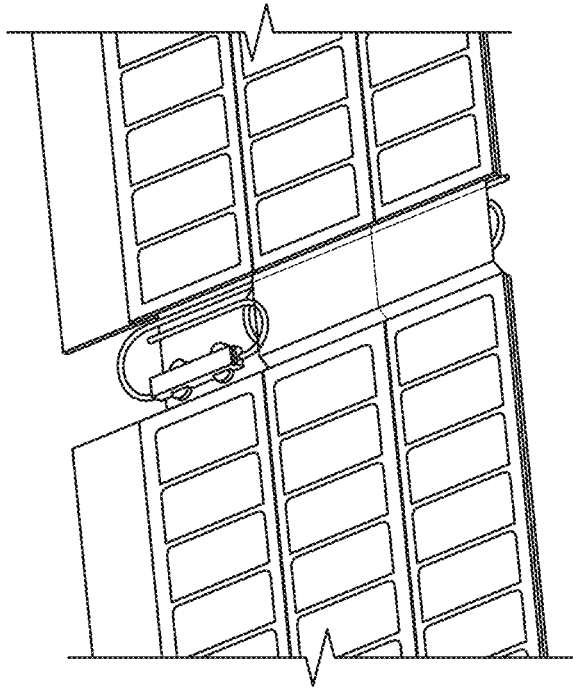
Figure 23A:
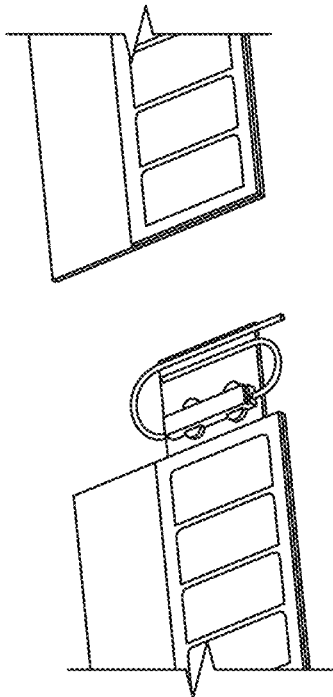
Figure 23C:
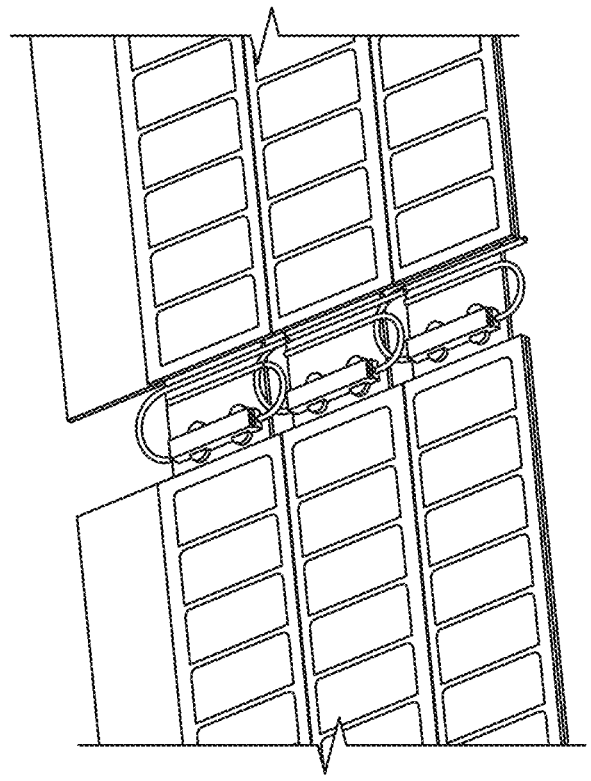

Referring to FIG. 19, in some embodiments, the system 5 includes step flashing 208 installed on the roof deck 200. In some embodiments, the step flashing 208 includes a first portion 210 and a second portion 212. In some embodiments, the photovoltaic shingle 10 overlays the first portion 210, while one of the roofing shingles 204 overlays the second portion 212. In some embodiments, the roofing shingles 204 include asphalt shingles. Referring to FIGS. 20, 21A and 21B, in some embodiments, the one of the roofing shingles 204 overlays one of the step flaps 54, 56 of a corresponding one of the photovoltaic shingles 10. In some embodiments, the plurality of photovoltaic shingles 10 is coplanar with the plurality of roofing shingles 204. As used herein, the term "coplanar" means the plurality of photovoltaic shingles 10 and the plurality of roofing shingles 204 are positioned and extend within the same plane, or the plurality of photovoltaic shingles 10 is positioned and extends in a first plane, and the plurality of roofing shingles 204 is positioned and extends within a second plane that is offset from the first plane of a relatively of no more than ten percent of a height measured from the roof deck to an upper surface of the plurality of photovoltaic shingles.

In some embodiments, a method of installing a photovoltaic system includes the following steps:
  obtaining a first photovoltaic shingle and a second photovoltaic shingle, each of which includes a first layer, and a second layer overlaying the first layer, wherein the first layer includes a head lap, wherein the second layer includes at least one solar cell;
  installing the first photovoltaic shingle on a roof deck; and
  overlaying the second photovoltaic shingle on at least the head lap of the first photovoltaic shingle.

In some embodiments, the method of installing the photovoltaic system may include the step of installing a wireway proximate to the plurality of photovoltaic shingles. In some embodiments, the method of installing the photovoltaic system may include the step of installing at least one electrical junction box installed within the at least one wireway. In some embodiments, the method of installing the photovoltaic system may include the step of installing at least one lid on the at least one wireway.

Referring to FIGS. 22A through 22D, in some embodiments, a method of installing a photovoltaic system includes the following steps:
  obtaining a first photovoltaic shingle, a second photovoltaic shingle, a third photovoltaic shingle, and fourth photovoltaic shingle, each of which includes a first layer, and a second layer overlaying the first layer, wherein the first layer includes a head lap and a step flap, wherein the second layer includes at least one solar cell;

installing a junction box on the step flap of the first photovoltaic shingle;

installing the second photovoltaic shingle on a roof deck;

installing the first photovoltaic shingle on the roof deck by overlaying the step flap of the second photovoltaic shingle with the step flap of the first photovoltaic shingle;

installing a junction box on the step flap of the third photovoltaic shingle;

installing the fourth photovoltaic shingle on the roof deck by overlaying the fourth photovoltaic shingle on at least the head lap of the second photovoltaic shingle;

installing the third photovoltaic shingle on the roof deck by overlaying the step flap of the third photovoltaic shingle with the step flap of the fourth photovoltaic shingle and overlaying the third photovoltaic shingle on at least the head lap of the first photovoltaic shingle.

In some embodiments, the method of installing the photovoltaic system may include the step of covering each of the step flaps and junction boxes with a corresponding lid.

Referring to FIGS. 23A through 23D, in some embodiments, a method of installing a photovoltaic system includes the following steps:

obtaining a first photovoltaic shingle, a second photovoltaic shingle, a third photovoltaic shingle, and a fourth photovoltaic shingle, each of which includes a first layer, and a second layer overlaying the first layer, wherein the first layer includes a head lap, wherein the second layer includes at least one solar cell, and wherein each of the first photovoltaic shingle and the third photovoltaic shingle includes a wireway located at a first end thereof;

installing a junction box on each of the corresponding wireways of the first and third photovoltaic shingles;

installing the first photovoltaic shingle on a roof deck;

installing the second photovoltaic shingle on the roof deck such that a first end of the second photovoltaic shingle abuts the wireway of the first photovoltaic shingle;

installing the third photovoltaic shingle on the roof deck by overlaying the third photovoltaic shingle on at least the head lap of the first photovoltaic shingle; and installing the fourth photovoltaic shingle on the roof deck such that a first end of the fourth photovoltaic shingle abuts the wireway of the third photovoltaic shingle and overlays at least the head lap of the second photovoltaic shingle.

In some embodiments, the method of installing the photovoltaic system may include the step of covering each of the wireways and junction boxes with a corresponding lid.

In some embodiments, a method of installing a photovoltaic system includes the following steps:

Obtaining a plurality of photovoltaic shingles, with each photovoltaic shingle of the plurality of the photovoltaic shingles including a first end, a first layer including a head lap portion, a second layer overlaying the first layer, the second layer including at least one solar cell, Laying a first photovoltaic shingle of the plurality of photovoltaic shingles directly on a deck surface of a steep slope roof Attaching the first photovoltaic shingle of the plurality of photovoltaic shingles to the deck surface of the steep slope roof.

Laying a second photovoltaic shingle of the plurality of photovoltaic shingles over at least a part of the head lap portion of the first photovoltaic shingle of the plurality of photovoltaic shingles.

Attaching the second photovoltaic shingle to the deck surface of the steep slope roof to form a roof integrated photovoltaic system.

As defined herein, a "steep slope roof" is any roof substrate that is disposed on a roof having a pitch of Y/X, where Y and X are in a ratio of 4:12 to 12:12, where Y corresponds to the "rise" of the roof, and where X corresponds to the "run" of the roof.

In some embodiments, Y and X are in a ratio of 5:12 to 12:12. In some embodiments, Y and X are in a ratio of 6:12 to 12:12. In some embodiments, Y and X are in a ratio of 7:12 to 12:12. In some embodiments, Y and X are in a ratio of 6:12 to 12:12. In some embodiments, Y and X are in a ratio of 8:12 to 12:12. In some embodiments, Y and X are in a ratio of 6:12 to 12:12. In some embodiments, Y and X are in a ratio of 9:12 to 12:12. In some embodiments, Y and X are in a ratio of 10:12 to 12:12. In some embodiments, Y and X are in a ratio of 11:12 to 12:12.

In some embodiments, Y and X are in a ratio of 4:12 to 11:12. In some embodiments, Y and X are in a ratio of 4:12 to 10:12. In some embodiments, Y and X are in a ratio of 4:12 to 9:12. In some embodiments, Y and X are in a ratio of 4:12 to 8:12. In some embodiments, Y and X are in a ratio of 4:12 to 7:12. In some embodiments, Y and X are in a ratio of 4:12 to 6:12. In some embodiments, Y and X are in a ratio of 4:12 to 5:12.

[1] In some embodiments, Y and X are in a ratio of 5:12 to 11:12. In some embodiments, Y and X are in a ratio of 6:12 to 10:12. In some embodiments, Y and X are in a ratio of 7:12 to 9:12.

In some embodiments, Y and X are in a ratio of 2:12. In some embodiments, Y and X are in a ratio of 3:12.

Figure 24:
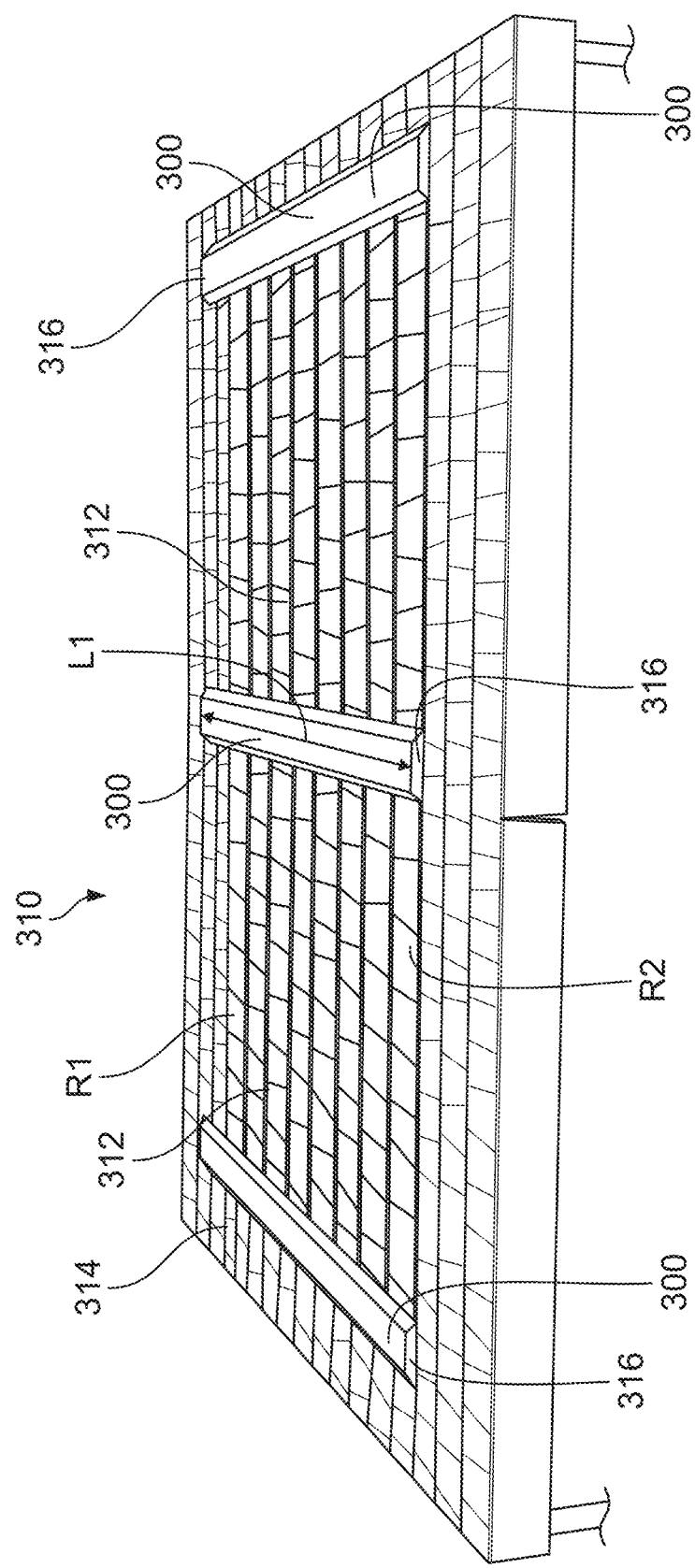
FIG. 24 is a perspective view of a roofing system including some embodiments of a plurality of wireways.

Referring to FIG. 24, in some embodiments, a roofing system 310 includes a plurality of solar shingles 312 arranged in a plurality of rows, a plurality of roofing shingles 314, and a plurality of wireways 300. In some embodiments, the plurality of rows of the solar shingles 312 includes an upper row R1 and a lower row R2. In some embodiments, each of the wireways 300 includes a length L1. In some embodiments, the length L1 extends from the lower row R2 to the upper row R1. In some embodiments, the length L1 extends from the lower row R2 to at least to the upper row R1. In some embodiments, the length L1 extends from the lower row R2 to a location past the upper row R1. In some embodiments, the wireways 300 includes a lid 316. In some embodiments, the lid 316 is a single lid that extends the length L1.

Figure 25:
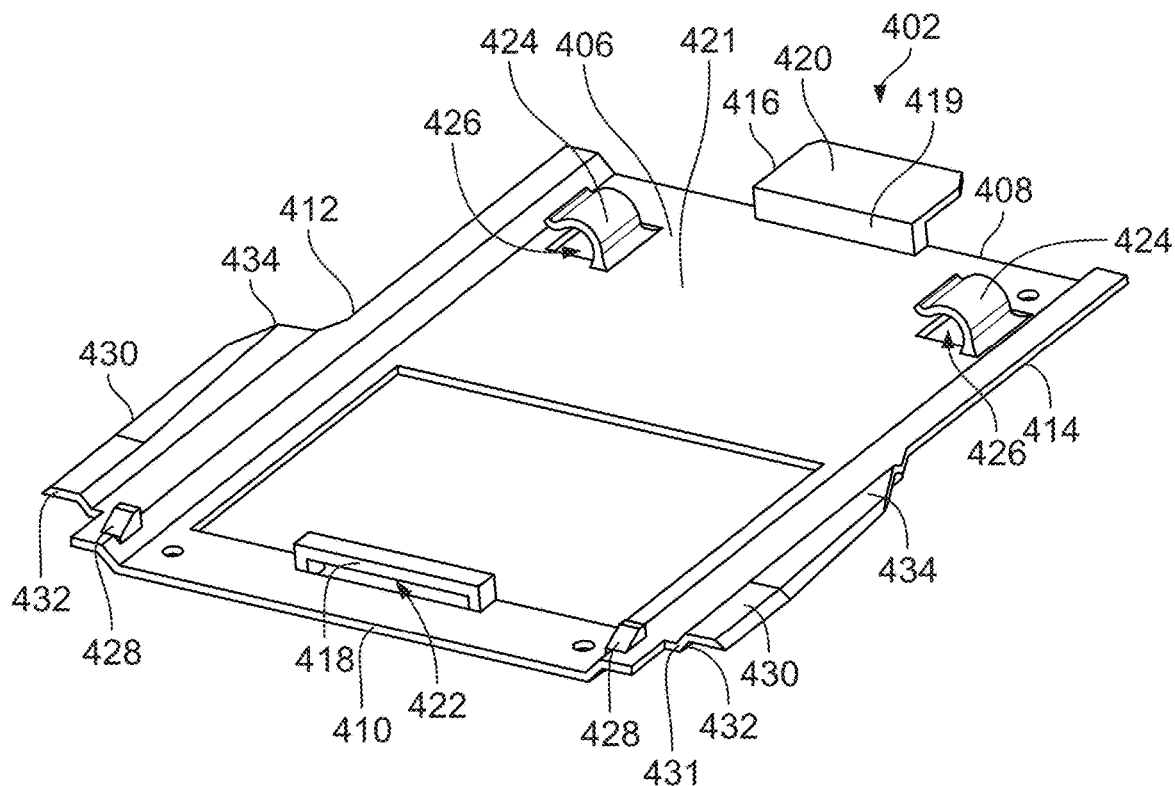
FIGS. 25 through 28 illustrate embodiments of a wireway.
Figure 26:
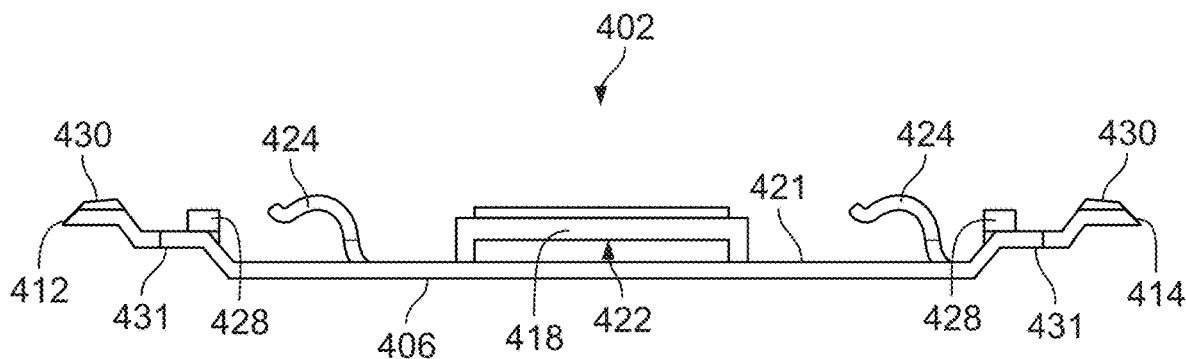
Figure 27:
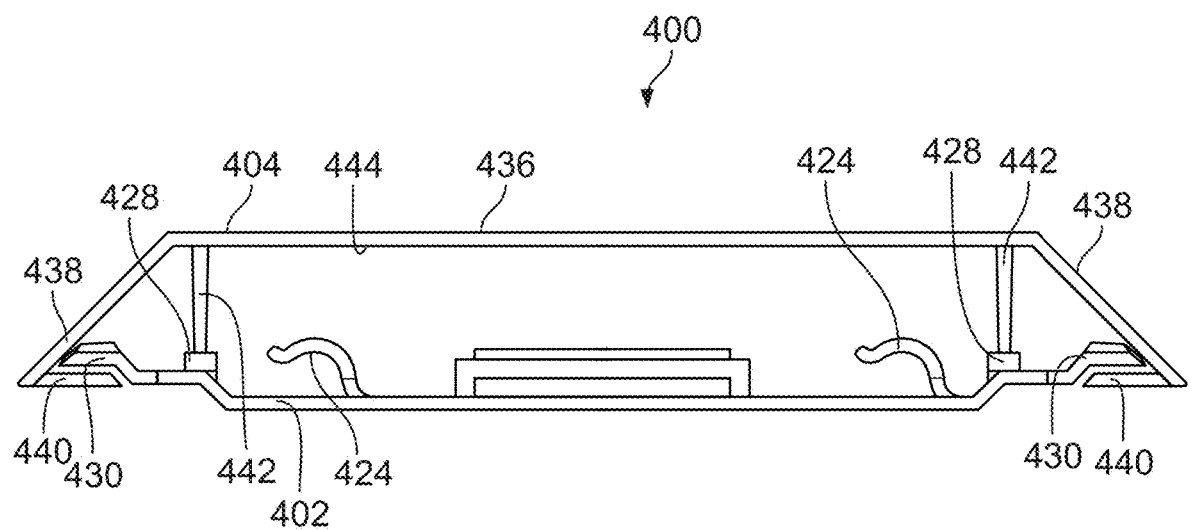

Referring to FIGS. 25 through 27, in some embodiments, a wireway 400 includes a bracket 402 and a lid 404 attached removably to the bracket 402. In some embodiments, the bracket 402 includes a body 406 having a first end 408, a second end 410 opposite the first end 408, and a pair of side edges 412, 414 extending from the first end 408 to the second end 410. In some embodiments, the body 406 is rectangular in shape. In some embodiments, the body 406 includes a first alignment portion 416 located proximate to the first end 408 and a second alignment portion 418 located proximate to the second end 410. In some embodiments, the first alignment portion 416 includes a base 419 and a tab 420 connected to the base 419 and extending outwardly and spaced from a surface 421 of the body 406. In some embodiments, the tab 420 includes an L-shape. In some embodiments, the second alignment portion 418 includes a slot 422. In some embodiments, the slot 422 is rectangular in shape.

In some embodiments, the bracket 402 includes a plurality of clips 424. In some embodiments, the plurality of clips 424 extends outwardly from the surface 421. In some embodiments, each of the plurality of clips 424 is curvilinear in shape and includes a slot 426. In some embodiments, the slot 426 is sized and shaped to receive and hold an electrical wire or cable therein. In some embodiments, one of the plurality of clips 424 is located proximate to the first end 408 and another of the plurality of clips 424 is located proximate to the second end 410. In some embodiments, the bracket 402 includes a plurality of stops 428 located proximate to the second end 410. In some embodiments, one of the plurality of stops 428 is located proximate to the first end 408 and another of the plurality of stops 428 is located proximate to the second end 410. In some embodiments, the bracket 402 includes a plurality of hold down portions 430. In some embodiments, one of the plurality of hold down portions 430 is located proximate to the first end 408 and another of the plurality of hold down portions 430 is located proximate to the second end 410. In some embodiments, each of the hold down portions 430 extends from a first end 432, located proximate to the second end 410, and to a second end 434, located intermediate the first end 408 and the second end 410. In some embodiments, each of the hold down portions 430 includes a stepped surface 431. In some embodiments, each of the stepped surfaces 431 provides clearance for an adjacent photovoltaic shingle.

Referring to FIG. 27, in some embodiments, the lid 404 includes a first portion 436 and side portions 438 extending from the first portion 436. In some embodiments, the side portions 438 are angled (i.e., oblique) relative to the first portion 436. In some embodiments, the side portions 438 are angled to prevent shading over adjacent photovoltaic cells. In some embodiments, each of the side portions 438 includes a tab portion 440 that is sized and shaped to removably engage a corresponding one of the hold down portions 430 of the bracket 402. In some embodiments, the lid 404 includes a plurality of support members 442 extending from an interior surface 444 of the lid 404. In some embodiments, each of the plurality of support members 442 engages a corresponding one of the plurality of stops 428 of the bracket 402. In some embodiments, air is permitted to enter the wireway 400 through the side edges 412, 414 for ventilation, since the hold down portions 430 do not extend the entire length of the wireway 400.

Figure 28:
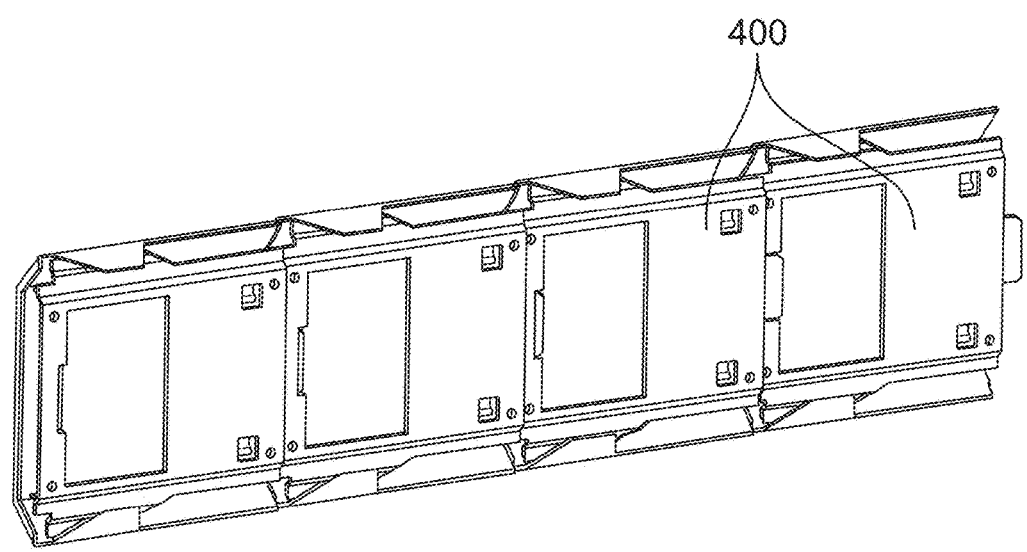

Referring to FIG. 28, in some embodiments, a plurality of the wireways 400 are connected to one another. In some embodiments, the slot 422 of one of the plurality of wireways 400 is sized and shaped to receive the tab 420 of an adjacent one of another of the plurality of wireways 400 to maintain alignment of the plurality of wireways 400 with one another.

Figure 30:
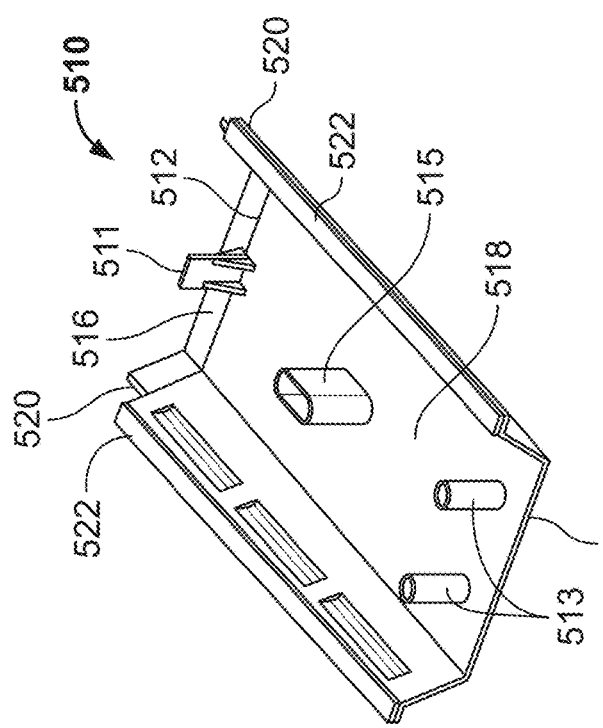
FIGS. 29 through 32 illustrate embodiments of a wireway and an endcap employed thereby.
Figure 32:
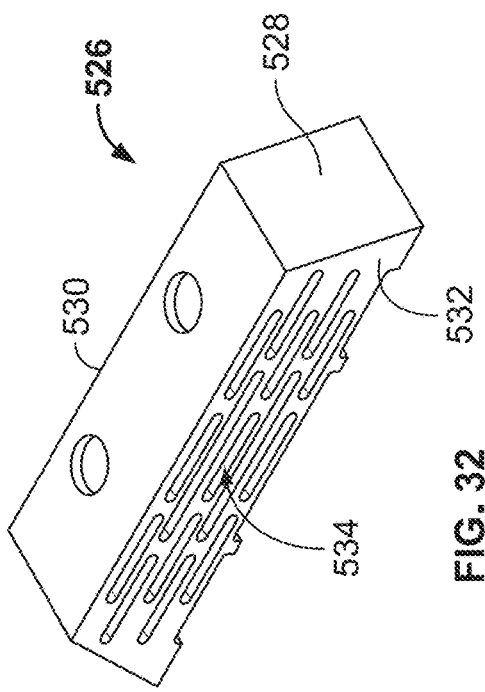
Figure 29:
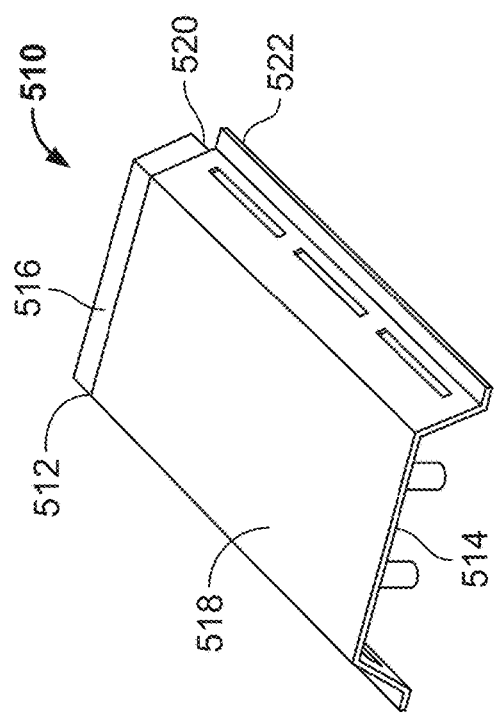
Figure 31:
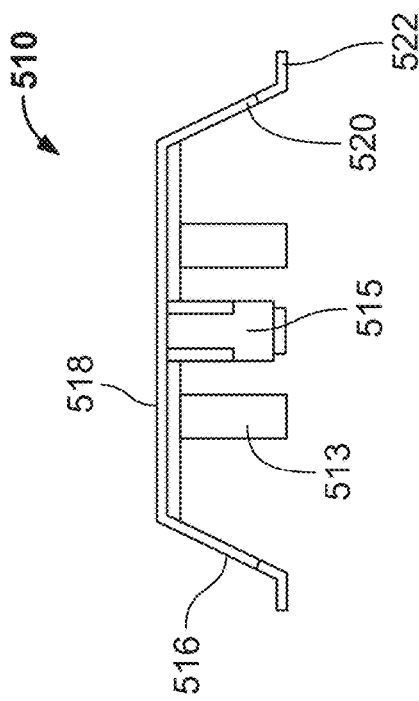

Referring to FIGS. 29 through 31, in some embodiments, a lid 510 for a wireway includes a first end 512 and a second end 514 opposite the first end 512, and an extended portion 516 extending from the first end 512. In some embodiments, the extended portion 516 includes a cross-section similar to the remaining portion 518 of the lid 510, except that ends of side portions 520 of the extended portion 516 are offset from ends of the side portions 522 of the lid 510. In some embodiments, the second end 514 of one of the lids 510 is sized and shaped to overlay the extended portion 516 of another of the lids 510 such that the second end 514 of the one of the lids 510 is aligned with the first end 512 of the other of the lids 510. In some embodiments, the lid 510 includes a first stop 511 extending from an interior surface of the lid 510 and located proximate to the first end 512 for alignment with the second end 514 of an adjacent one of the lids 510. In some embodiments, the lid 510 includes a pair of second stops 513 extending from the interior surface of the lid 510 and located proximate to the second end 514. Referring to FIG. 32, in some embodiments, an end cap 526 includes a body 528 having a first end 530 and a second end 532 opposite the first end 530, and a plurality of vents 534 extending from the first end 530 to the second end 532. In some embodiments, the second end 514 of the lid 510 is sized and shaped to receive the end cap 526. In some embodiments, the second stops 513 prevent the end cap 526 from being pushed too far within the lid 510 and fully past the second end 514. In some embodiments, the plurality of vents 534 permit air flow within the wireway. In some embodiments, the lid 510 includes a centrally located third stop 515 for support and stability of the lid 510 on the wireway.

Figure 33:
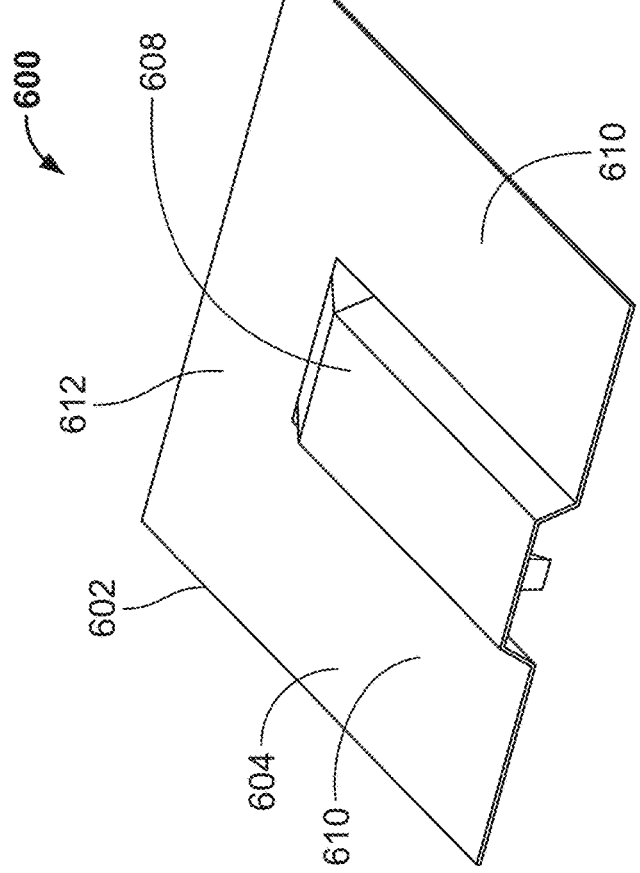
FIGS. 33 and 34 are top perspective and side elevational views, respectively, of some embodiments of a wireway.
Figure 34:
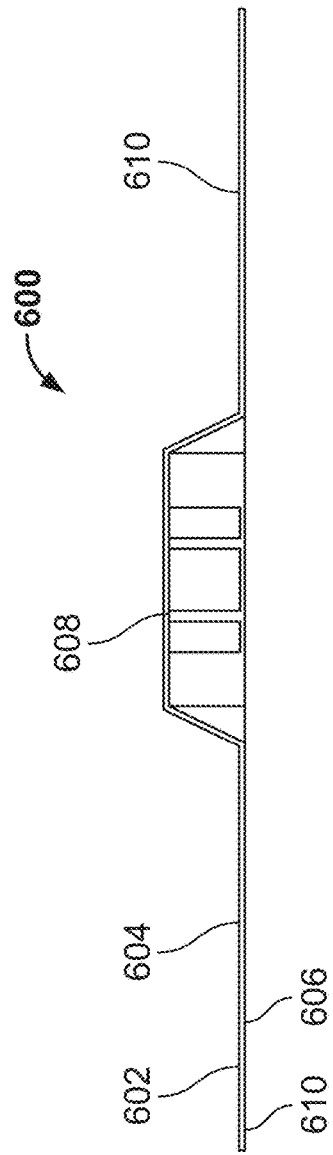

Referring to FIGS. 33 and 34, in some embodiments, a lid 600 for a wireway includes a base 602 having a first surface 604 and a second surface 606 opposite the first surface 604. In some embodiments, the base 602 is square in shape. In some embodiments, the base 602 is rectangular in shape. In some embodiments, the lid 600 includes a cover portion 608 extending outwardly from the first surface 604. In some embodiments, the cover portion 608 is integral with the base 602. In some embodiments, the cover portion 608 is sized and shaped to cover an end of a wireway. In some embodiments, the cover portion 608 is sized and shaped to cover a wireway located at an end of a column of a plurality of wireways. In some embodiments, the lid 600 includes a pair of side flaps 610. In some embodiments, one or more roofing shingles are configured to overlay each of the side flaps 610. In some embodiments, an electrical component is configured to overlay either of the side flaps 610. In some embodiments, the electrical component is a junction box. In some embodiments, the electrical component is at least one electrical connector. In some embodiments, the lid 600 includes a head lap 612. In some embodiments, one or more roofing shingles are configured to overlay the head lap 612. In some embodiments, an electrical component is configured to overlay the head lap 612. In some embodiments, an electrical component is configured to overlay the head lap 612. In some embodiments, the electrical component is an electrical termination box.

Figure 35B:
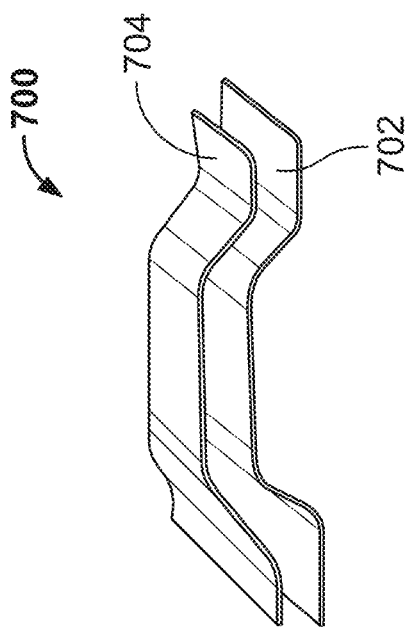
FIGS. 35A and 35B illustrate some embodiments of a lid for a wireway.
Figure 35A:
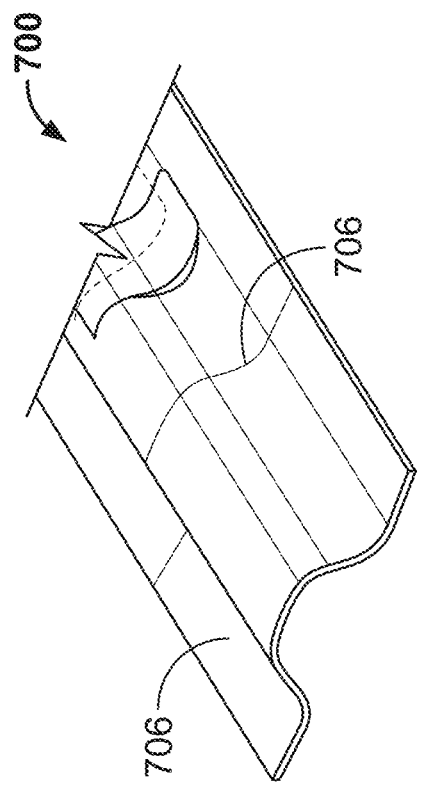

Referring to FIGS. 35A and 35B, in some embodiments, a lid 700 for a wireway includes a first portion 702 and a second portion 704 overlaying the first portion 702. In some embodiments, the lid 700 includes opposed sidewalls 706. In some embodiments, the sidewalls 706 include a curvilinear profile. In some embodiments, the sidewalls 706 include a linear profile. In some embodiments, the first portion 702 is composed of an opaque material. In some embodiments, the second portion 704 is composed of a transparent material. In some embodiments, the second portion 704 is composed of a translucent material. In some embodiments, the second portion 704 includes a coating. In some embodiments, the second portion 704 is composed of a polymer gel. In some embodiments, the first portion 702 and the second portion 704 are laminated with one another. In some embodiments, the lid 700 is configured to mimic the appearance of a photovoltaic module having a glass layer.

Figure 36B:
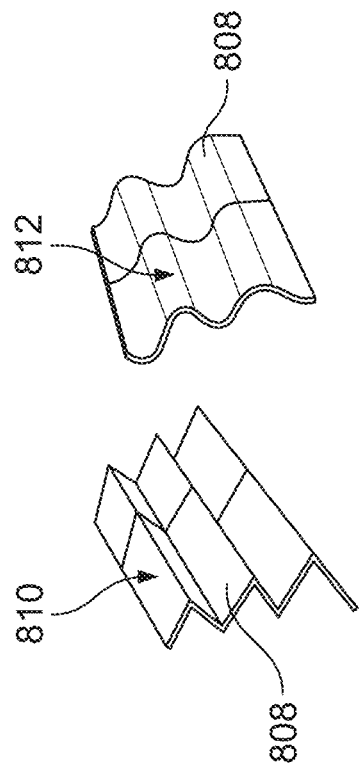
FIGS. 36A and 36B illustrate some embodiments of a lid for a wireway.
Figure 36A:
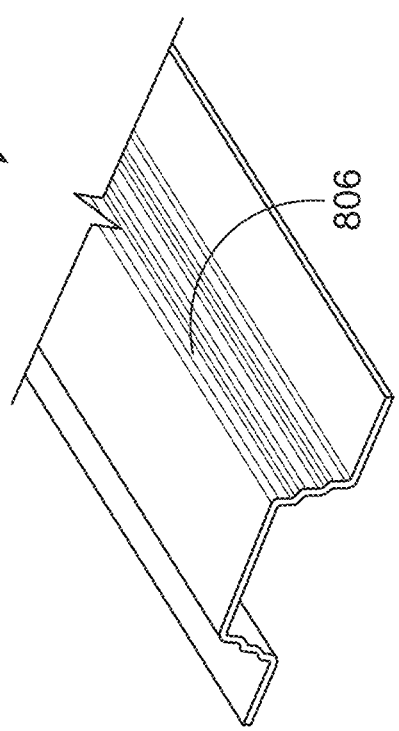

Referring to FIGS. 36A and 36B, in some embodiments, a lid 800 for a wireway includes opposed sidewalls 806. In some embodiments, the each of the sidewalls 806 includes a plurality of surfaces 808. In some embodiments, the plurality of surfaces 808 includes linear surfaces 810. In some embodiments, the linear surfaces 810 form an angled pattern. In some embodiments, the plurality of surfaces 808 includes curvilinear surfaces 812. In some embodiments, the plurality of surfaces 808 form a sinusoidal pattern. In some embodiments, each of the plurality of surfaces 808 is configured to create shadows on the sidewalls 806 to provide a consistent tone of the lid 800 and enable the lid 800 to blend in with other components of a roofing system, such as roofing shingles and photovoltaic shingles.

Referring to FIGS. 37A and 37B, in some embodiments, a lid 900 for a wireway includes opposed sidewalls 906. In some embodiments, each of the sidewalls 906 includes a plurality of fins 908. In some embodiments, the plurality of fins 908 is configured to dissipate heat from and within the wireway. In some embodiments, the plurality of fins 908 includes an angular profile 910. In some embodiments, the plurality of fins 908 includes a curvilinear profile 912. In some embodiments, the plurality of fins 908 includes a rectangular profile 914 (e.g., similar to a heat sink).

Referring to FIGS. 38A and 38B, in some embodiments, a lid 1000 for a wireway includes an upper portion 1002 and pair of sidewalls 1004 extending from the upper portion 1002. In some embodiments, each of the sidewalls 1004 includes a rail 1006 that extends the length of the lid 1000 and forms a slot 1008 between the rail 1006 and the upper portion 1002. In some embodiments, an insert 1010 is sized and shaped to be slidably received within the slots 1008 and over the upper portion 1002. In some embodiments, the insert 1010 is rectangular in shape. In some embodiments, the insert 1010 is flat. In some embodiments, the insert 1010 is U-shaped. In some embodiments, the insert 1010 includes asphalt material. In some embodiments, the insert 1010 includes an appearance that mimics the appearance of an asphalt roofing shingle. In some embodiments, the insert 1010 includes a photovoltaic cell. In some embodiments, the insert 1010 includes an appearance that mimics the appearance of a photovoltaic cell. In some embodiments, the insert 1010 includes a printed graphic.

Referring to FIGS. 39A and 39B, in some embodiments, a photovoltaic module 1110 includes an active area 1109 having a plurality of solar cells 1112. In some embodiments, the photovoltaic module 1110 includes an inactive area comprising a headlap portion 1113, a first side lap 1115 located at one end of the photovoltaic module 1110, and a second side lap 1117 located at an opposite end of the photovoltaic module 1110. In some embodiments, the headlap portion 1113 is textured. In some embodiments, the texture of the headlap portion 1113 is different from a texture of the solar cells 1112. In some embodiments, a wire cover bracket 1300 is attached to the first side lap 1115. In some embodiments, the wire cover bracket 1300 includes a junction box 1423. Details of the wire cover bracket 1300 shall be provided hereinbelow.

In some embodiments, the plurality of solar cells 1112 includes a first set of solar cells 1112a and a second set of solar cells 1112b. In some embodiments, the first set of solar cells 1112a includes eight of the solar cells 1112. In some embodiments, the second set of solar cells 1112b includes eight of the solar cells 1112. In some embodiments, each of the first set of solar cells 1112a and the second set of solar cells 1112b includes more or less than eight of the solar cells 1112. In some embodiments, a last one of the solar cells 1112 of the first set of solar cells 1112a is separated by a first one of the solar cells 1112 of the second set of solar cells 1112b by a space S. In some embodiments, the space S is located approximately half the length of the photovoltaic module 1110. In some embodiments, the solar cells 1112 of each of the first and second sets of solar cells 1112a, 1112b are strung together with bussing 1101. In some embodiments, the bussing 1101 includes nine bussing wires. In some embodiments, the bussing 1101 may include more or less than the nine bussing wires.

In some embodiments, a first bussing wire 1103a extends from the first side lap 1115 to the space S. In some embodiments, the first bussing wire 1103a extends to approximately half the length of the photovoltaic module 1110. In some embodiments, one end of the first bussing wire 1103a is electrically connected to the junction box 1423 and the other end of the first bussing wire 1103a is electrically connected to the first set of solar cells 1112a. In some embodiments, a second bussing wire 1103b extends from the first side lap 1115 to a location proximate to the second side lap 1117. In some embodiments, the second bussing wire 1103b extends substantially the entire length of the photovoltaic module 1110. In some embodiments, one end of the second bussing wire 1103b is electrically connected to the junction box 1423 and the other end of the second bussing wire 1103b is electrically connected to the second set of solar cells 1112b. In some embodiments, each of the first bussing wire 1103a and the second bussing wire 1103b is covered with a polymer layer. In some embodiments, each of the first bussing wire 1103a and the second bussing wire 1103b is covered with expanded polyethylene ("EPE"). In some embodiments, the EPE is comprised of a black strip. In some embodiments, each of the first bussing wire 1103a and the second bussing wire 1103b is coated with a colorant or dye to reduce reflectivity.

In some embodiments, the plurality of solar cells 1112 includes a plurality of the solar cells 1112. In some embodiments, the plurality of solar cells 1112 is arranged in one row (i.e., one reveal). In some embodiments, the plurality of solar cells 1112 is arranged in two rows (i.e., two reveals). In some embodiments, the plurality of solar cells 1112 is arranged in three rows (i.e., three reveals). In some embodiments, the plurality of solar cells 1112 is arranged in four rows (i.e., four reveals). In some embodiments, the plurality of solar cells 1112 is arranged in five rows (i.e., five reveals). In some embodiments, the plurality of solar cells 1112 is arranged in six rows (i.e., six reveals). In some embodiments, the plurality of solar cells 1112 is arranged in more than six rows.

Figure 40:
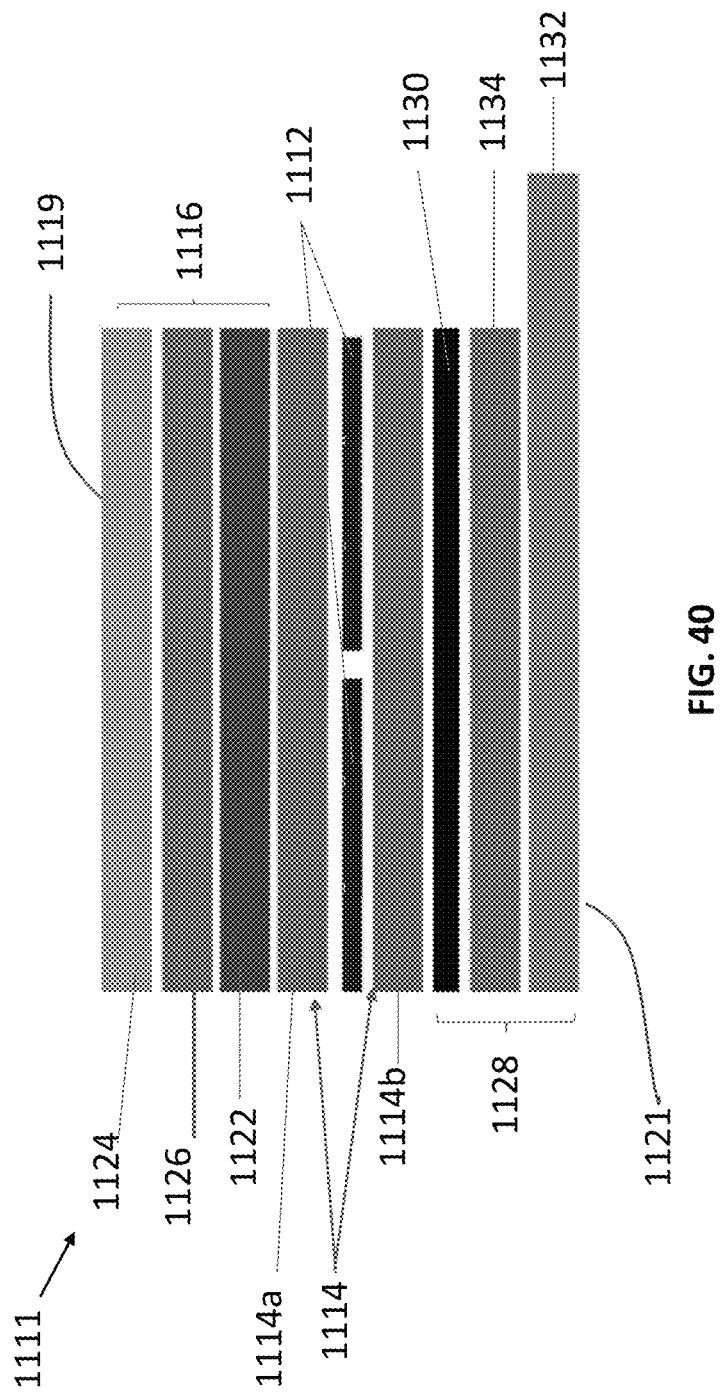
FIGS. 40 and 41 are schematic view of some embodiments of a photovoltaic module.

Referring to FIG. 40, in some embodiments, the active area 1109 of the photovoltaic module 1110 includes the plurality of solar cells 1112, an encapsulant 1114 encapsulating the plurality of solar cells 1112, and a frontsheet 1116 juxtaposed with the encapsulant 1114. In some embodiments, the frontsheet 1116 is juxtaposed with a first surface of the encapsulant 1114. As used herein, the terms "encapsulating" and "encapsulates" mean to partially or fully envelope or enclose, and with respect to certain embodiments of the photovoltaic module 1110, the plurality of solar cells 1112 is fully enveloped by or enclosed within the encapsulant 1114, or partially enveloped by or enclosed within the encapsulant 1114. In some embodiments, the plurality of solar cells 1112 includes a plurality of the solar cells 1112. In some embodiments, the encapsulant 1114 encapsulates 50% to 99.9% of an exterior surface area of the plurality of solar cells 1112. In some embodiments, the encapsulant 1114 encapsulates 55% to 99.9% of an exterior surface area of the plurality of solar cells 1112. In some embodiments, the encapsulant 1114 encapsulates 60% to 99.9% of an exterior surface area of the plurality of solar cells 1112. In some embodiments, the encapsulant 1114 encapsulates 65% to 99.9% of an exterior surface area of the plurality of solar cells 1112. In some embodiments, the encapsulant 1114 encapsulates 70% to 99.9% of an exterior surface area of the plurality of solar cells 1112. In some embodiments, the encapsulant 1114 encapsulates 75% to 99.9% of an exterior surface area of the plurality of solar cells 1112. In some embodiments, the encapsulant 1114 encapsulates 80% to 99.9% of an exterior surface area of the plurality of solar cells 1112. In some embodiments, the encapsulant 1114 encapsulates 85% to 99.9% of an exterior surface area of the plurality of solar cells 1112. In some embodiments, the encapsulant 1114 encapsulates 90% to 99.9% of an exterior surface area of the plurality of solar cells 1112. In some embodiments, the encapsulant 1114 encapsulates 95% to 99.9% of an exterior surface area of the plurality of solar cells 1112.

In some embodiments, the encapsulant 1114 encapsulates 50% to 95% of an exterior surface area of the plurality of solar cells 1112. In some embodiments, the encapsulant 1114 encapsulates 55% to 95% of an exterior surface area of the plurality of solar cells 1112. In some embodiments, the encapsulant 1114 encapsulates 60% to 95% of an exterior surface area of the plurality of solar cells 1112. In some embodiments, the encapsulant 1114 encapsulates 65% to 95% of an exterior surface area of the plurality of solar cells 1112. In some embodiments, the encapsulant 1114 encapsulates 70% to 95% of an exterior surface area of the plurality of solar cells 1112. In some embodiments, the encapsulant 1114 encapsulates 75% to 95% of an exterior surface area of the plurality of solar cells 1112. In some embodiments, the encapsulant 1114 encapsulates 80% to 95% of an exterior surface area of the plurality of solar cells 1112. In some embodiments, the encapsulant 1114 encapsulates 85% to 95% of an exterior surface area of the plurality of solar cells 1112. In some embodiments, the encapsulant 1114 encapsulates 90% to 95% of an exterior surface area of the plurality of solar cells 1112.

In some embodiments, the encapsulant 1114 encapsulates 50% to 90% of an exterior surface area of the plurality of solar cells 1112. In some embodiments, the encapsulant 1114 encapsulates 55% to 90% of an exterior surface area of the plurality of solar cells 1112. In some embodiments, the encapsulant 1114 encapsulates 60% to 90% of an exterior surface area of the plurality of solar cells 1112. In some embodiments, the encapsulant 1114 encapsulates 65% to 90% of an exterior surface area of the plurality of solar cells 1112. In some embodiments, the encapsulant 1114 encapsulates 70% to 90% of an exterior surface area of the plurality of solar cells 1112. In some embodiments, the encapsulant 1114 encapsulates 75% to 90% of an exterior surface area of the plurality of solar cells 1112. In some embodiments, the encapsulant 1114 encapsulates 80% to 90% of an exterior surface area of the plurality of solar cells 1112. In some embodiments, the encapsulant 1114 encapsulates 85% to 90% of an exterior surface area of the plurality of solar cells 1112.

In some embodiments, the encapsulant 1114 encapsulates 50% to 85% of an exterior surface area of the plurality of solar cells 1112. In some embodiments, the encapsulant 1114 encapsulates 55% to 85% of an exterior surface area of the plurality of solar cells 1112. In some embodiments, the encapsulant 1114 encapsulates 60% to 85% of an exterior surface area of the plurality of solar cells 1112. In some embodiments, the encapsulant 1114 encapsulates 65% to 85% of an exterior surface area of the plurality of solar cells 1112. In some embodiments, the encapsulant 1114 encapsulates 70% to 85% of an exterior surface area of the plurality of solar cells 1112. In some embodiments, the encapsulant 1114 encapsulates 75% to 85% of an exterior surface area of the plurality of solar cells 1112. In some embodiments, the encapsulant 1114 encapsulates 80% to 85% of an exterior surface area of the plurality of solar cells 1112.

In some embodiments, the encapsulant 1114 encapsulates 50% to 80% of an exterior surface area of the plurality of solar cells 1112. In some embodiments, the encapsulant 1114 encapsulates 55% to 80% of an exterior surface area of the plurality of solar cells 1112. In some embodiments, the encapsulant 1114 encapsulates 60% to 80% of an exterior surface area of the plurality of solar cells 1112. In some embodiments, the encapsulant 1114 encapsulates 65% to 80% of an exterior surface area of the plurality of solar cells 1112. In some embodiments, the encapsulant 1114 encapsulates 70% to 80% of an exterior surface area of the plurality of solar cells 1112. In some embodiments, the encapsulant 1114 encapsulates 75% to 80% of an exterior surface area of the plurality of solar cells 1112.

In some embodiments, the encapsulant 1114 encapsulates 50% to 75% of an exterior surface area of the plurality of solar cells 1112. In some embodiments, the encapsulant 1114 encapsulates 55% to 75% of an exterior surface area of the plurality of solar cells 1112. In some embodiments, the encapsulant 1114 encapsulates 60% to 75% of an exterior surface area of the plurality of solar cells 1112. In some embodiments, the encapsulant 1114 encapsulates 65% to 75% of an exterior surface area of the plurality of solar cells 1112. In some embodiments, the encapsulant 1114 encapsulates 70% to 75% of an exterior surface area of the plurality of solar cells 1112.

In some embodiments, the encapsulant 1114 encapsulates 50% to 70% of an exterior surface area of the plurality of solar cells 1112. In some embodiments, the encapsulant 1114 encapsulates 55% to 70% of an exterior surface area of the plurality of solar cells 1112. In some embodiments, the encapsulant 1114 encapsulates 60% to 70% of an exterior surface area of the plurality of solar cells 1112. In some embodiments, the encapsulant 1114 encapsulates 65% to 70% of an exterior surface area of the plurality of solar cells 1112.

In some embodiments, the encapsulant 1114 encapsulates 50% to 65% of an exterior surface area of the plurality of solar cells 1112. In some embodiments, the encapsulant 1114 encapsulates 55% to 65% of an exterior surface area of the plurality of solar cells 1112. In some embodiments, the encapsulant 1114 encapsulates 60% to 65% of an exterior surface area of the plurality of solar cells 1112. In some embodiments, the encapsulant 1114 encapsulates 50% to 60% of an exterior surface area of the plurality of solar cells 1112. In some embodiments, the encapsulant 1114 encapsulates 55% to 60% of an exterior surface area of the plurality of solar cells 1112. In some embodiments, the encapsulant 1114 encapsulates 55% to 60% of an exterior surface area of the plurality of solar cells 1112.

In some embodiments, the encapsulant 1114 encapsulates 50% of an exterior surface area of the plurality of solar cells 1112. In some embodiments, the encapsulant 1114 encapsulates 55% of the exterior surface area of the plurality of solar cells 1112. In some embodiments, the encapsulant 1114 encapsulates 60% of the exterior surface area of the plurality of solar cells 1112. In some embodiments, the encapsulant 1114 encapsulates 65% of the exterior surface area of the plurality of solar cells 1112. In some embodiments, the encapsulant 1114 encapsulates 70% of the exterior surface area of the plurality of solar cells 1112. In some embodiments, the encapsulant 1114 encapsulates 75% of the exterior surface area of the plurality of solar cells 1112. In some embodiments, the encapsulant 1114 encapsulates 80% of the exterior surface area of the plurality of solar cells 1112. In some embodiments, the encapsulant 1114 encapsulates 85% of the exterior surface area of the plurality of solar cells 1112. In some embodiments, the encapsulant 1114 encapsulates 90% of the exterior surface area of the plurality of solar cells 1112. In some embodiments, the encapsulant 1114 encapsulates 95% of the exterior surface area of the plurality of solar cells 1112. In some embodiments, the encapsulant 1114 encapsulates 100% of the exterior surface area of the plurality of solar cells 1112.

In some embodiments, the encapsulant 1114 has a thickness of 0.5 mm to 4 mm. In some embodiments, the encapsulant 1114 has a thickness of 0.5 mm to 3.5 mm. In some embodiments, the encapsulant 1114 has a thickness of 0.5 mm to 3 mm. In some embodiments, the encapsulant 1114 has a thickness of 0.5 mm to 2.5 mm. In some embodiments, the encapsulant 1114 has a thickness of 0.5 mm to 2 mm. In some embodiments, the encapsulant 1114 has a thickness of 0.5 mm to 1.5 mm. In some embodiments, the encapsulant 1114 has a thickness of 0.5 mm to 1 mm.

In some embodiments, the encapsulant 1114 has a thickness of 1 mm to 4 mm. In some embodiments, the encapsulant 1114 has a thickness of 1 mm to 3.5 mm. In some embodiments, the encapsulant 1114 has a thickness of 1 mm to 3 mm. In some embodiments, the encapsulant 1114 has a thickness of 1 mm to 2.5 mm. In some embodiments, the encapsulant 1114 has a thickness of 1 mm to 2 mm. In some embodiments, the encapsulant 1114 has a thickness of 1 mm to 1.5 mm. In some embodiments, the encapsulant 1114 has a thickness of 1.5 mm to 4 mm. In some embodiments, the encapsulant 1114 has a thickness of 1.5 mm to 3.5 mm. In some embodiments, the encapsulant 1114 has a thickness of 1.5 mm to 3 mm. In some embodiments, the encapsulant 1114 has a thickness of 1.5 mm to 2.5 mm. In some embodiments, the encapsulant 1114 has a thickness of 1.5 mm to 2 mm.

In some embodiments, the encapsulant 1114 has a thickness of 2 mm to 4 mm. In some embodiments, the encapsulant 1114 has a thickness of 2 mm to 3.5 mm. In some embodiments, the encapsulant 1114 has a thickness of 2 mm to 3 mm. In some embodiments, the encapsulant 1114 has a thickness of 2 mm to 2.5 mm. In some embodiments, the encapsulant 1114 has a thickness of 2.5 mm to 4 mm. In some embodiments, the encapsulant 1114 has a thickness of 2.5 mm to 3.5 mm. In some embodiments, the encapsulant 1114 has a thickness of 2.5 mm to 3 mm. In some embodiments, the encapsulant 1114 has a thickness of 3 mm to 4 mm. In some embodiments, the encapsulant 1114 has a thickness of 3 mm to 3.5 mm. In some embodiments, the encapsulant 1114 has a thickness of 3.5 mm to 4 mm.

In some embodiments, the encapsulant 1114 has a thickness of 0.5 mm. In some embodiments, the encapsulant 1114 has a thickness of 0.6 mm. In some embodiments, the encapsulant 1114 has a thickness of 0.7 mm. In some embodiments, the encapsulant 1114 has a thickness of 0.8 mm. In some embodiments, the encapsulant 1114 has a thickness of 0.9 mm. In some embodiments, the encapsulant 1114 has a thickness of 1 mm. In some embodiments, the encapsulant 1114 has a thickness of 1.5 mm. In some embodiments, the encapsulant 1114 has a thickness of 2 mm. In some embodiments, the encapsulant 1114 has a thickness of 2.5 mm. In some embodiments, the encapsulant 1114 has a thickness of 3 mm. In some embodiments, the encapsulant 1114 has a thickness of 3.5 mm. In some embodiments, the encapsulant 1114 has a thickness of 4 mm.

In some embodiments, the encapsulant 1114 includes a first layer 1114*a* and a second layer 1114*b*. In some embodiments, the first layer 1114*a* of the encapsulant 1114 initially comprises two layers prior to lamination thereof.

In some embodiments, a first layer 1114*a* of the encapsulant 1114 has a thickness of 0.2 mm to 2 mm. In some embodiments, the first layer 1114*a* of the encapsulant 1114 has a thickness of 0.2 mm to 1.5 mm. In some embodiments, the first layer 1114*a* of the encapsulant 1114 has a thickness of 0.2 mm to 1 mm. In some embodiments, the first layer 1114*a* of the encapsulant 1114 has a thickness of 0.2 mm to 0.9 mm. In some embodiments, the first layer 1114*a* of the encapsulant 1114 has a thickness of 0.2 mm to 0.8 mm. In some embodiments, the first layer 1114*a* of the encapsulant 1114 has a thickness of 0.2 mm to 0.7 mm. In some embodiments, the first layer 1114*a* of the encapsulant 1114 has a thickness of 0.2 mm to 0.6 mm. In some embodiments, the first layer 1114*a* of the encapsulant 1114 has a thickness of 0.2 mm to 0.5 mm. In some embodiments, the first layer 1114*a* of the encapsulant 1114 has a thickness of 0.2 mm to 0.45 mm. In some embodiments, the first layer 1114*a* of the encapsulant 1114 has a thickness of 0.2 mm to 0.4 mm. In some embodiments, the first layer 1114*a* of the encapsulant 1114 has a thickness of 0.2 mm to 0.3 mm.

In some embodiments, a first layer 1114*a* of the encapsulant 1114 has a thickness of 0.3 mm to 2 mm. In some embodiments, the first layer 1114*a* of the encapsulant 1114 has a thickness of 0.3 mm to 1.5 mm. In some embodiments, the first layer 1114*a* of the encapsulant 1114 has a thickness of 0.3 mm to 1 mm. In some embodiments, the first layer 1114*a* of the encapsulant 1114 has a thickness of 0.3 mm to 0.9 mm. In some embodiments, the first layer 1114*a* of the encapsulant 1114 has a thickness of 0.3 mm to 0.8 mm. In some embodiments, the first layer 1114*a* of the encapsulant 1114 has a thickness of 0.3 mm to 0.7 mm. In some embodiments, the first layer 1114*a* of the encapsulant 1114 has a thickness of 0.3 mm to 0.6 mm. In some embodiments, the first layer 1114*a* of the encapsulant 1114 has a thickness of 0.3 mm to 0.5 mm. In some embodiments, the first layer 1114*a* of the encapsulant 1114 has a thickness of 0.3 mm to 0.45 mm. In some embodiments, the first layer 1114*a* of the encapsulant 1114 has a thickness of 0.3 mm to 0.4 mm.

In some embodiments, a first layer 1114*a* of the encapsulant 1114 has a thickness of 0.4 mm to 2 mm. In some embodiments, the first layer 1114*a* of the encapsulant 1114 has a thickness of 0.4 mm to 1.5 mm. In some embodiments, the first layer 1114*a* of the encapsulant 1114 has a thickness of 0.4 mm to 1 mm. In some embodiments, the first layer 1114*a* of the encapsulant 1114 has a thickness of 0.4 mm to 0.9 mm. In some embodiments, the first layer 1114*a* of the encapsulant 1114 has a thickness of 0.4 mm to 0.8 mm. In some embodiments, the first layer 1114*a* of the encapsulant 1114 has a thickness of 0.4 mm to 0.7 mm. In some embodiments, the first layer 1114*a* of the encapsulant 1114 has a thickness of 0.4 mm to 0.6 mm. In some embodiments, the first layer 1114*a* of the encapsulant 1114 has a thickness of 0.4 mm to 0.5 mm. In some embodiments, the first layer 1114*a* of the encapsulant 1114 has a thickness of 0.4 mm to 0.45 mm.

In some embodiments, a first layer 1114*a* of the encapsulant 1114 has a thickness of 0.45 mm to 2 mm. In some embodiments, the first layer 1114*a* of the encapsulant 1114 has a thickness of 0.45 mm to 1.5 mm. In some embodiments, the first layer 1114*a* of the encapsulant 1114 has a thickness of 0.45 mm to 1 mm. In some embodiments, the first layer 1114*a* of the encapsulant 1114 has a thickness of 0.45 mm to 0.9 mm. In some embodiments, the first layer 1114*a* of the encapsulant 1114 has a thickness of 0.45 mm to 0.8 mm. In some embodiments, the first layer 1114*a* of the encapsulant 1114 has a thickness of 0.45 mm to 0.7 mm. In some embodiments, the first layer 1114*a* of the encapsulant 1114 has a thickness of 0.45 mm to 0.6 mm. In some embodiments, the first layer 1114*a* of the encapsulant 1114 has a thickness of 0.45 mm to 0.5 mm.

In some embodiments, a first layer 1114*a* of the encapsulant 1114 has a thickness of 0.5 mm to 2 mm. In some embodiments, the first layer 1114*a* of the encapsulant 1114 has a thickness of 0.5 mm to 1.5 mm. In some embodiments, the first layer 1114*a* of the encapsulant 1114 has a thickness of 0.5 mm to 1 mm. In some embodiments, the first layer 1114*a* of the encapsulant 1114 has a thickness of 0.5 mm to 0.9 mm. In some embodiments, the first layer 1114*a* of the encapsulant 1114 has a thickness of 0.5 mm to 0.8 mm. In some embodiments, the first layer 1114*a* of the encapsulant 1114 has a thickness of 0.5 mm to 0.7 mm. In some embodiments, the first layer 1114*a* of the encapsulant 1114 has a thickness of 0.5 mm to 0.6 mm.

In some embodiments, a first layer 1114*a* of the encapsulant 1114 has a thickness of 0.6 mm to 2 mm. In some embodiments, the first layer 1114*a* of the encapsulant 1114 has a thickness of 0.6 mm to 1.5 mm. In some embodiments, the first layer 1114*a* of the encapsulant 1114 has a thickness of 0.6 mm to 1 mm. In some embodiments, the first layer 1114*a* of the encapsulant 1114 has a thickness of 0.6 mm to 0.9 mm. In some embodiments, the first layer 1114*a* of the encapsulant 1114 has a thickness of 0.6 mm to 0.8 mm. In some embodiments, the first layer 1114*a* of the encapsulant 1114 has a thickness of 0.6 mm to 0.7 mm.

In some embodiments, a first layer 1114*a* of the encapsulant 1114 has a thickness of 0.7 mm to 2 mm. In some embodiments, the first layer 1114*a* of the encapsulant 1114 has a thickness of 0.7 mm to 1.5 mm. In some embodiments, the first layer 1114*a* of the encapsulant 1114 has a thickness of 0.7 mm to 1 mm. In some embodiments, the first layer 1114*a* of the encapsulant 1114 has a thickness of 0.7 mm to 0.9 mm. In some embodiments, the first layer 1114*a* of the encapsulant 1114 has a thickness of 0.7 mm to 0.8 mm.

In some embodiments, a first layer 1114*a* of the encapsulant 1114 has a thickness of 0.8 mm to 2 mm. In some embodiments, the first layer 1114*a* of the encapsulant 1114 has a thickness of 0.8 mm to 1.5 mm. In some embodiments, the first layer 1114*a* of the encapsulant 1114 has a thickness of 0.8 mm to 1 mm. In some embodiments, the first layer 1114*a* of the encapsulant 1114 has a thickness of 0.8 mm to 0.9 mm. In some embodiments, a first layer 1114*a* of the encapsulant 1114 has a thickness of 0.9 mm to 2 mm. In some embodiments, the first layer 1114*a* of the encapsulant 1114 has a thickness of 0.9 mm to 1.5 mm. In some embodiments, the first layer 1114*a* of the encapsulant 1114 has a thickness of 0.9 mm to 1 mm. In some embodiments, a first layer 1114*a* of the encapsulant 1114 has a thickness of 1 mm to 2 mm. In some embodiments, the first layer 1114*a* of the encapsulant 1114 has a thickness of 1 mm to 1.5 mm. In some embodiments, a first layer 1114*a* of the encapsulant 1114 has a thickness of 1.5 mm to 2 mm.

In some embodiments, the first layer 1114*a* of the encapsulant 1114 has a thickness of 0.2 mm. In some embodiments, the first layer 1114*a* of the encapsulant 1114 has a thickness of 0.3 mm. In some embodiments, the first layer 1114*a* of the encapsulant 1114 has a thickness of 0.4 mm. In some embodiments, the first layer 1114*a* of the encapsulant 1114 has a thickness of 0.45 mm. In some embodiments, the first layer 1114*a* of the encapsulant 1114 has a thickness of 0.5 mm. In some embodiments, the first layer 1114*a* of the encapsulant 1114 has a thickness of 0.6 mm. In some embodiments, the first layer 1114*a* of the encapsulant 1114 has a thickness of 0.7 mm. In some embodiments, the first layer 1114*a* of the encapsulant 1114 has a thickness of 0.8 mm. In some embodiments, the first layer 1114*a* of the encapsulant 1114 has a thickness of 0.9 mm. In some embodiments, the first layer 1114*a* of the encapsulant 1114 has a thickness of 1 mm. In some embodiments, the first layer 1114*a* of the encapsulant 1114 has a thickness of 1.5 mm. In some embodiments, the first layer 1114*a* of the encapsulant 1114 has a thickness of 2 mm. In some embodiments, the first layer 1114*a* of the encapsulant 1114 has a thickness of 2.5 mm. In some embodiments, the first layer 1114*a* of the encapsulant 1114 has a thickness of 3 mm. In some embodiments, the first layer 1114*a* of the encapsulant 1114 has a thickness of 3.5 mm. In some embodiments, the first layer 1114*a* of the encapsulant 1114 has a thickness of 4 mm.

In some embodiments, a second layer 1114*b* of the encapsulant 1114 has a thickness of 0.2 mm to 2 mm. In some embodiments, the second layer 1114*b* of the encapsulant 1114 has a thickness of 0.2 mm to 1.5 mm. In some embodiments, the second layer 1114*b* of the encapsulant 1114 has a thickness of 0.2 mm to 1 mm. In some embodiments, the second layer 1114*b* of the encapsulant 1114 has a thickness of 0.2 mm to 0.9 mm. In some embodiments, the second layer 1114*b* of the encapsulant 1114 has a thickness of 0.2 mm to 0.8 mm. In some embodiments, the second layer 1114*b* of the encapsulant 1114 has a thickness of 0.2 mm to 0.7 mm. In some embodiments, the second layer 1114*b* of the encapsulant 1114 has a thickness of 0.2 mm to 0.6 mm. In some embodiments, the second layer 1114*b* of the encapsulant 1114 has a thickness of 0.2 mm to 0.5 mm. In some embodiments, the second layer 1114*b* of the encapsulant 1114 has a thickness of 0.2 mm to 0.45 mm. In some embodiments, the second layer 1114*b* of the encapsulant 1114 has a thickness of 0.2 mm to 0.4 mm. In some embodiments, the second layer 1114*b* of the encapsulant 1114 has a thickness of 0.2 mm to 0.3 mm.

In some embodiments, a second layer 1114*b* of the encapsulant 1114 has a thickness of 0.3 mm to 2 mm. In some embodiments, the second layer 1114*b* of the encapsulant 1114 has a thickness of 0.3 mm to 1.5 mm. In some embodiments, the second layer 1114*b* of the encapsulant 1114 has a thickness of 0.3 mm to 1 mm. In some embodiments, the second layer 1114*b* of the encapsulant 1114 has a thickness of 0.3 mm to 0.9 mm. In some embodiments, the second layer 1114*b* of the encapsulant 1114 has a thickness of 0.3 mm to 0.8 mm. In some embodiments, the second layer 1114*b* of the encapsulant 1114 has a thickness of 0.3 mm to 0.7 mm. In some embodiments, the second layer 1114*b* of the encapsulant 1114 has a thickness of 0.3 mm to 0.6 mm. In some embodiments, the second layer 1114*b* of the encapsulant 1114 has a thickness of 0.3 mm to 0.5 mm. In some embodiments, the second layer 1114*b* of the encapsulant 1114 has a thickness of 0.3 mm to 0.45 mm. In some embodiments, the second layer 1114*b* of the encapsulant 1114 has a thickness of 0.3 mm to 0.4 mm.

In some embodiments, a second layer 1114*b* of the encapsulant 1114 has a thickness of 0.4 mm to 2 mm. In some embodiments, the second layer 1114*b* of the encapsulant 1114 has a thickness of 0.4 mm to 1.5 mm. In some embodiments, the second layer 1114*b* of the encapsulant 1114 has a thickness of 0.4 mm to 1 mm. In some embodiments, the second layer 1114*b* of the encapsulant 1114 has a thickness of 0.4 mm to 0.9 mm. In some embodiments, the second layer 1114b of the encapsulant 1114 has a thickness of 0.4 mm to 0.8 mm. In some embodiments, the second layer 1114b of the encapsulant 1114 has a thickness of 0.4 mm to 0.7 mm. In some embodiments, the second layer 1114b of the encapsulant 1114 has a thickness of 0.4 mm to 0.6 mm. In some embodiments, the second layer 1114b of the encapsulant 1114 has a thickness of 0.4 mm to 0.5 mm. In some embodiments, the second layer 1114b of the encapsulant 1114 has a thickness of 0.4 mm to 0.45 mm.

In some embodiments, a second layer 1114b of the encapsulant 1114 has a thickness of 0.45 mm to 2 mm. In some embodiments, the second layer 1114b of the encapsulant 1114 has a thickness of 0.45 mm to 1.5 mm. In some embodiments, the second layer 1114b of the encapsulant 1114 has a thickness of 0.45 mm to 1 mm. In some embodiments, the second layer 1114b of the encapsulant 1114 has a thickness of 0.45 mm to 0.9 mm. In some embodiments, the second layer 1114b of the encapsulant 1114 has a thickness of 0.45 mm to 0.8 mm. In some embodiments, the second layer 1114b of the encapsulant 1114 has a thickness of 0.45 mm to 0.7 mm. In some embodiments, the second layer 1114b of the encapsulant 1114 has a thickness of 0.45 mm to 0.6 mm. In some embodiments, the second layer 1114b of the encapsulant 1114 has a thickness of 0.45 mm to 0.5 mm.

In some embodiments, a second layer 1114b of the encapsulant 1114 has a thickness of 0.5 mm to 2 mm. In some embodiments, the second layer 1114b of the encapsulant 1114 has a thickness of 0.5 mm to 1.5 mm. In some embodiments, the second layer 1114b of the encapsulant 1114 has a thickness of 0.5 mm to 1 mm. In some embodiments, the second layer 1114b of the encapsulant 1114 has a thickness of 0.5 mm to 0.9 mm. In some embodiments, the second layer 1114b of the encapsulant 1114 has a thickness of 0.5 mm to 0.8 mm. In some embodiments, the second layer 1114b of the encapsulant 1114 has a thickness of 0.5 mm to 0.7 mm. In some embodiments, the second layer 1114b of the encapsulant 1114 has a thickness of 0.5 mm to 0.6 mm.

In some embodiments, a second layer 1114b of the encapsulant 1114 has a thickness of 0.6 mm to 2 mm. In some embodiments, the second layer 1114b of the encapsulant 1114 has a thickness of 0.6 mm to 1.5 mm. In some embodiments, the second layer 1114b of the encapsulant 1114 has a thickness of 0.6 mm to 1 mm. In some embodiments, the second layer 1114b of the encapsulant 1114 has a thickness of 0.6 mm to 0.9 mm. In some embodiments, the second layer 1114b of the encapsulant 1114 has a thickness of 0.6 mm to 0.8 mm. In some embodiments, the second layer 1114b of the encapsulant 1114 has a thickness of 0.6 mm to 0.7 mm.

In some embodiments, a second layer 1114b of the encapsulant 1114 has a thickness of 0.7 mm to 2 mm. In some embodiments, the second layer 1114b of the encapsulant 1114 has a thickness of 0.7 mm to 1.5 mm. In some embodiments, the second layer 1114b of the encapsulant 1114 has a thickness of 0.7 mm to 1 mm. In some embodiments, the second layer 1114b of the encapsulant 1114 has a thickness of 0.7 mm to 0.9 mm. In some embodiments, the second layer 1114b of the encapsulant 1114 has a thickness of 0.7 mm to 0.8 mm.

In some embodiments, a second layer 1114b of the encapsulant 1114 has a thickness of 0.8 mm to 2 mm. In some embodiments, the second layer 1114b of the encapsulant 1114 has a thickness of 0.8 mm to 1.5 mm. In some embodiments, the second layer 1114b of the encapsulant 1114 has a thickness of 0.8 mm to 1 mm. In some embodiments, the second layer 1114b of the encapsulant 1114 has a thickness of 0.8 mm to 0.9 mm. In some embodiments, a second layer 1114b of the encapsulant 1114 has a thickness of 0.9 mm to 2 mm. In some embodiments, the second layer 1114b of the encapsulant 1114 has a thickness of 0.9 mm to 1.5 mm. In some embodiments, the second layer 1114b of the encapsulant 1114 has a thickness of 0.9 mm to 1 mm. In some embodiments, a second layer 1114b of the encapsulant 1114 has a thickness of 1 mm to 2 mm. In some embodiments, the second layer 1114b of the encapsulant 1114 has a thickness of 1 mm to 1.5 mm. In some embodiments, a second layer 1114b of the encapsulant 1114 has a thickness of 1.5 mm to 2 mm.

In some embodiments, the second layer 1114b of the encapsulant 1114 has a thickness of 0.2 mm. In some embodiments, the second layer 1114b of the encapsulant 1114 has a thickness of 0.3 mm. In some embodiments, the second layer 1114b of the encapsulant 1114 has a thickness of 0.4 mm. In some embodiments, the second layer 1114b of the encapsulant 1114 has a thickness of 0.45 mm. In some embodiments, the second layer 1114b of the encapsulant 1114 has a thickness of 0.5 mm. In some embodiments, the second layer 1114b of the encapsulant 1114 has a thickness of 0.6 mm. In some embodiments, the second layer 1114b of the encapsulant 1114 has a thickness of 0.7 mm. In some embodiments, the second layer 1114b of the encapsulant 1114 has a thickness of 0.8 mm. In some embodiments, the second layer 1114b of the encapsulant 1114 has a thickness of 0.9 mm. In some embodiments, the second layer 1114b of the encapsulant 1114 has a thickness of 1 mm. In some embodiments, the second layer 1114b of the encapsulant 1114 has a thickness of 1.5 mm. In some embodiments, the second layer 1114b of the encapsulant 1114 has a thickness of 2 mm. In some embodiments, the second layer 1114b of the encapsulant 1114 has a thickness of 2.5 mm. In some embodiments, the second layer 1114b of the encapsulant 1114 has a thickness of 3 mm. In some embodiments, the second layer 1114b of the encapsulant 1114 has a thickness of 3.5 mm. In some embodiments, the second layer 1114b of the encapsulant 1114 has a thickness of 4 mm.

In some embodiments, the thickness of the first layer 1114a is equal to the thickness of the second layer 1114b. In some embodiments, the thickness of the first layer 1114a is different from the thickness of the second layer 1114b. In some embodiments, the first layer 1114a of the encapsulant 1114 has a thickness that is sufficient to prevent or reduce leakage current to an amount that will not provide a risk of electrocution to a user by touch in the event the glass layer 1122 breaks or shatters. In some embodiments, such thickness of the first layer 1114a of the encapsulant 1114 is described above. In some embodiments, the first layer 1114a of the encapsulant 1114 has a thickness that is sufficient to prevent or reduce leakage current to an amount that will not provide a risk of electrocution to a user by touch when the photovoltaic module 1110 is wet, in the event the glass layer 1122 breaks or shatters. In some embodiments, such thickness of the first layer 1114a of the encapsulant 1114 is described above.

In some embodiments, the photovoltaic module 1110 withstands walking loads/step resistance that conforms to standards under UL 3741 test standards (UL Standard for Safety Photovoltaic Hazard Control). In some embodiments, the photovoltaic module 1110 includes an axe impact resistance that conforms to standards under UL 3741 test standards. In some embodiments, the photovoltaic module 1110 includes a body fall resistance that conforms to standards under UL 3741 test standards. In some embodiments, a wet leakage current test performed in accordance with UL 3741 results in a leakage current of less than 130 nA.

In some embodiments, the photovoltaic module 1110 includes an impact resistance that conforms to standards under UL 1703 test standards. The UL 1703 test involves attaching the photovoltaic module 1110 to a representative model of a roof and dropping a 2-inch diameter steel ball onto the photovoltaic module 1110 from 1.3 meters. A photovoltaic module is deemed to pass the UL 1703 standard if there are no exposed electrical components and no large pieces of glass are ejected.

In some embodiments, the encapsulant 1114 may be composed of polyolefins, ethyl vinyl acetates, ionomers, silicones, poly vinyl butyral, epoxies, polyurethanes, or combinations/hybrids thereof. In some embodiments, the encapsulant 1114 is composed of thermosetting polyolefin.

In some embodiments, the photovoltaic module 1110 includes a first surface 1119 and a second surface 1121 opposite the first surface 1119. In some embodiments, the first surface 1119 is an upper, sun facing-side surface of the photovoltaic module 1110, and the second surface 1121 is a lower surface configured to face a roof deck on which the photovoltaic module 1110 is installed.

In some embodiments, the frontsheet 1116 includes a glass layer 1122 and a polymer layer 1124 attached to a first surface of the glass layer 1122. In some embodiments, the frontsheet 1116 is juxtaposed with the first layer 1114a of the encapsulant 1114. In some embodiments, each of the encapsulant 1114, the glass layer 1122, and the polymer layer 1124 is transparent. In some embodiments, the polymer layer 1124 is attached to the glass layer 1122 by a first adhesive layer 1126. In some embodiments, the first adhesive layer 1126 may include polyvinyl butyrate, acrylic, silicone, or polycarbonate. In some embodiments, the first adhesive layer 1126 may include pressure sensitive adhesives. In some embodiments, the polymer layer 1124 is attached to the glass layer 1122 by thermal bonding. In some embodiments, the frontsheet 1116 includes at least one of the glass layer 1122 or the polymer layer 1124. In some embodiments, the first adhesive layer 1126 is transparent. As used herein, the term "transparent" means having a solar weighted transmittance of 80% or greater, and with respect to certain embodiments of the photovoltaic module 1110, a transparent layer of the photovoltaic module has a solar weighted transmittance of 80% or greater. In some embodiments, the frontsheet 1116 does not include the glass layer 1122. In some embodiments, the polymer layer 1124 is textured.

In some embodiments, the glass layer 1122 has a thickness of 1 mm to 4 mm. In some embodiments, the glass layer 1122 has a thickness of 1 mm to 3.5 mm. In some embodiments, the glass layer 1122 has a thickness of 1 mm to 3 mm. In some embodiments, the glass layer 1122 has a thickness of 1 mm to 2.5 mm. In some embodiments, the glass layer 1122 has a thickness of 1 mm to 2 mm. In some embodiments, the glass layer 1122 has a thickness of 1 mm to 1.5 mm. In some embodiments, the glass layer 1122 has a thickness of 1.5 mm to 4 mm. In some embodiments, the glass layer 1122 has a thickness of 1.5 mm to 3.5 mm. In some embodiments, the glass layer 1122 has a thickness of 1.5 mm to 3 mm. In some embodiments, the glass layer 1122 has a thickness of 1 mm to 2.5 mm. In some embodiments, the glass layer 1122 has a thickness of 1.5 mm to 2 mm.

In some embodiments, the glass layer 1122 has a thickness of 2 mm to 4 mm. In some embodiments, the glass layer 1122 has a thickness of 2 mm to 3.5 mm. In some embodiments, the glass layer 1122 has a thickness of 2 mm to 3 mm. In some embodiments, the glass layer 1122 has a thickness of 2 mm to 2.5 mm. In some embodiments, the glass layer 1122 has a thickness of 2.5 mm to 4 mm. In some embodiments, the glass layer 1122 has a thickness of 2.5 mm to 3.5 mm. In some embodiments, the glass layer 1122 has a thickness of 2.5 mm to 3 mm. In some embodiments, the glass layer 1122 has a thickness of 3 mm to 4 mm. In some embodiments, the glass layer 1122 has a thickness of 3 mm to 3.5 mm. In some embodiments, the glass layer 1122 has a thickness of 3.5 mm to 4 mm.

In some embodiments, the glass layer 1122 has a thickness of 1 mm. In some embodiments, the glass layer 1122 has a thickness of 1.5 mm. In some embodiments, the glass layer 1122 has a thickness of 2 mm. In some embodiments, the glass layer 1122 has a thickness of 2.5 mm. In some embodiments, the glass layer 1122 has a thickness of 3 mm. In some embodiments, the glass layer 1122 has a thickness of 3.2 mm. In some embodiments, the glass layer 1122 has a thickness of 3.5 mm. In some embodiments, the glass layer 1122 has a thickness of 4 mm.

In some embodiments, the first adhesive layer 1126 is composed of thermosetting polyolefin, thermosetting polyolefin encapsulant material, thermosetting ethylene-vinyl acetate (EVA), EVA encapsulants, thermoplastic olefin, thermoplastic polyolefin (TPO) or hybrids/combinations thereof.

In some embodiments, the first adhesive layer 1126 has a thickness of 0.2 mm to 2 mm. In some embodiments, the first adhesive layer 1126 has a thickness of 0.2 mm to 1.5 mm. In some embodiments, the first adhesive layer 1126 has a thickness of 0.2 mm to 1 mm. In some embodiments, the first adhesive layer 1126 has a thickness of 0.2 mm to 0.5 mm. In some embodiments, the first adhesive layer 1126 has a thickness of 0.5 mm to 2 mm. In some embodiments, the first adhesive layer 1126 has a thickness of 0.5 mm to 1.5 mm. In some embodiments, the first adhesive layer 1126 has a thickness of 0.5 mm to 1 mm. In some embodiments, the first adhesive layer 1126 has a thickness of 1 mm to 2 mm. In some embodiments, the first adhesive layer 1126 has a thickness of 1 mm to 1.5 mm. In some embodiments, the first adhesive layer 1126 has a thickness of 1.5 mm to 2 mm.

In some embodiments, the first adhesive layer 1126 has a thickness of 0.2 mm. In some embodiments, the first adhesive layer 1126 has a thickness of 0.3 mm. In some embodiments, the first adhesive layer 1126 has a thickness of 0.4 mm. In some embodiments, the first adhesive layer 1126 has a thickness of 0.45 mm. In some embodiments, the first adhesive layer 1126 has a thickness of 0.5 mm. In some embodiments, the first adhesive layer 1126 has a thickness of 1 mm. In some embodiments, the first adhesive layer 1126 has a thickness of 1.5 mm. In some embodiments, the first adhesive layer 1126 has a thickness of 2 mm. In some embodiments, the first adhesive layer 1126 has a thickness of 2.5 mm. In some embodiments, the first adhesive layer 1126 has a thickness of 3 mm. In some embodiments, the first adhesive layer 1126 has a thickness of 3.5 mm. In some embodiments, the first adhesive layer 1126 has a thickness of 4 mm.

In some embodiments, the first adhesive layer 1126 has a thickness of 1 μm to 900 μm. In some embodiments, the first adhesive layer 1126 has a thickness of 1 μm to 850 μm. In some embodiments, the first adhesive layer 1126 has a thickness of 1 μm to 800 μm. In some embodiments, the first adhesive layer 1126 has a thickness of 1 μm to 750 μm. In some embodiments, the first adhesive layer 1126 has a thickness of 1 μm to 700 μm. In some embodiments, the first adhesive layer 1126 has a thickness of 1 μm to 650 μm. In some embodiments, the first adhesive layer 1126 has a thickness of 1 μm to 600 μm. In some embodiments, the first adhesive layer 1126 has a thickness of 1 μm to 550 μm. In some embodiments, the first adhesive layer 1126 has a thickness of 1 μm to 500 μm. In some embodiments, the first adhesive layer 1126 has a thickness of 1 μm to 450 μm. In some embodiments, the first adhesive layer 1126 has a thickness of 1 μm to 400 μm. In some embodiments, the first adhesive layer 1126 has a thickness of 1 μm to 350 μm. In some embodiments, the first adhesive layer 1126 has a thickness of 1 μm to 300 μm. In some embodiments, the first adhesive layer 1126 has a thickness of 1 μm to 250 μm. In some embodiments, the first adhesive layer 1126 has a thickness of 1 μm to 200 μm. In some embodiments, the first adhesive layer 1126 has a thickness of 1 μm to 150 μm. In some embodiments, the first adhesive layer 1126 has a thickness of 1 μm to 100 μm. In some embodiments, the first adhesive layer 1126 has a thickness of 1 μm to 50 μm.

In some embodiments, the first adhesive layer 1126 has a thickness of 50 μm to 900 μm. In some embodiments, the first adhesive layer 1126 has a thickness of 50 μm to 850 μm. In some embodiments, the first adhesive layer 1126 has a thickness of 50 μm to 800 μm. In some embodiments, the first adhesive layer 1126 has a thickness of 50 μm to 750 μm. In some embodiments, the first adhesive layer 1126 has a thickness of 50 μm to 700 μm. In some embodiments, the first adhesive layer 1126 has a thickness of 50 μm to 650 μm. In some embodiments, the first adhesive layer 1126 has a thickness of 50 μm to 600 μm. In some embodiments, the first adhesive layer 1126 has a thickness of 50 μm to 550 μm. In some embodiments, the first adhesive layer 1126 has a thickness of 50 μm to 500 μm. In some embodiments, the first adhesive layer 1126 has a thickness of 50 μm to 450 μm. In some embodiments, the first adhesive layer 1126 has a thickness of 50 μm to 400 μm. In some embodiments, the first adhesive layer 1126 has a thickness of 50 μm to 350 μm. In some embodiments, the first adhesive layer 1126 has a thickness of 50 μm to 300 μm. In some embodiments, the first adhesive layer 1126 has a thickness of 50 μm to 250 μm. In some embodiments, the first adhesive layer 1126 has a thickness of 50 μm to 200 μm. In some embodiments, the first adhesive layer 1126 has a thickness of 50 μm to 150 μm. In some embodiments, the first adhesive layer 1126 has a thickness of 50 μm to 100 μm.

In some embodiments, the first adhesive layer 1126 has a thickness of 100 μm to 900 μm. In some embodiments, the first adhesive layer 1126 has a thickness of 100 μm to 850 μm. In some embodiments, the first adhesive layer 1126 has a thickness of 100 μm to 800 μm. In some embodiments, the first adhesive layer 1126 has a thickness of 100 μm to 750 μm. In some embodiments, the first adhesive layer 1126 has a thickness of 100 μm to 700 μm. In some embodiments, the first adhesive layer 1126 has a thickness of 100 μm to 650 μm. In some embodiments, the first adhesive layer 1126 has a thickness of 100 μm to 600 μm. In some embodiments, the first adhesive layer 1126 has a thickness of 100 μm to 550 μm. In some embodiments, the first adhesive layer 1126 has a thickness of 100 μm to 500 μm. In some embodiments, the first adhesive layer 1126 has a thickness of 100 μm to 450 μm. In some embodiments, the first adhesive layer 1126 has a thickness of 100 μm to 400 μm. In some embodiments, the first adhesive layer 1126 has a thickness of 100 μm to 350 μm. In some embodiments, the first adhesive layer 1126 has a thickness of 100 μm to 300 μm. In some embodiments, the first adhesive layer 1126 has a thickness of 100 μm to 250 μm. In some embodiments, the first adhesive layer 1126 has a thickness of 100 μm to 200 μm. In some embodiments, the first adhesive layer 1126 has a thickness of 100 μm to 150 μm.

In some embodiments, the first adhesive layer 1126 has a thickness of 150 μm to 900 μm. In some embodiments, the first adhesive layer 1126 has a thickness of 150 μm to 850 μm. In some embodiments, the first adhesive layer 1126 has a thickness of 150 μm to 800 μm. In some embodiments, the first adhesive layer 1126 has a thickness of 150 μm to 750 μm. In some embodiments, the first adhesive layer 1126 has a thickness of 150 μm to 700 μm. In some embodiments, the first adhesive layer 1126 has a thickness of 150 μm to 650 μm. In some embodiments, the first adhesive layer 1126 has a thickness of 150 μm to 600 μm. In some embodiments, the first adhesive layer 1126 has a thickness of 150 μm to 550 μm. In some embodiments, the first adhesive layer 1126 has a thickness of 150 μm to 500 μm. In some embodiments, the first adhesive layer 1126 has a thickness of 150 μm to 450 μm. In some embodiments, the first adhesive layer 1126 has a thickness of 150 μm to 400 μm. In some embodiments, the first adhesive layer 1126 has a thickness of 150 μm to 350 μm. In some embodiments, the first adhesive layer 1126 has a thickness of 150 μm to 300 μm. In some embodiments, the first adhesive layer 1126 has a thickness of 150 μm to 250 μm. In some embodiments, the first adhesive layer 1126 has a thickness of 150 μm to 200 μm.

In some embodiments, the first adhesive layer 1126 has a thickness of 200 μm to 900 μm. In some embodiments, the first adhesive layer 1126 has a thickness of 200 μm to 850 μm. In some embodiments, the first adhesive layer 1126 has a thickness of 200 μm to 800 μm. In some embodiments, the first adhesive layer 1126 has a thickness of 200 μm to 750 μm. In some embodiments, the first adhesive layer 1126 has a thickness of 200 μm to 700 μm. In some embodiments, the first adhesive layer 1126 has a thickness of 200 μm to 650 μm. In some embodiments, the first adhesive layer 1126 has a thickness of 200 μm to 600 μm. In some embodiments, the first adhesive layer 1126 has a thickness of 200 μm to 550 μm. In some embodiments, the first adhesive layer 1126 has a thickness of 200 μm to 500 μm. In some embodiments, the first adhesive layer 1126 has a thickness of 200 μm to 450 μm. In some embodiments, the first adhesive layer 1126 has a thickness of 200 μm to 400 μm. In some embodiments, the first adhesive layer 1126 has a thickness of 200 μm to 350 μm. In some embodiments, the first adhesive layer 1126 has a thickness of 200 μm to 300 μm. In some embodiments, the first adhesive layer 1126 has a thickness of 200 μm to 250 μm.

In some embodiments, the first adhesive layer 1126 has a thickness of 250 μm to 900 μm. In some embodiments, the first adhesive layer 1126 has a thickness of 250 μm to 850 μm. In some embodiments, the first adhesive layer 1126 has a thickness of 250 μm to 800 μm. In some embodiments, the first adhesive layer 1126 has a thickness of 250 μm to 750 μm. In some embodiments, the first adhesive layer 1126 has a thickness of 250 μm to 700 μm. In some embodiments, the first adhesive layer 1126 has a thickness of 250 μm to 650 μm. In some embodiments, the first adhesive layer 1126 has a thickness of 250 μm to 600 μm. In some embodiments, the first adhesive layer 1126 has a thickness of 250 μm to 550 μm. In some embodiments, the first adhesive layer 1126 has a thickness of 250 μm to 500 μm. In some embodiments, the first adhesive layer 1126 has a thickness of 250 μm to 450 μm. In some embodiments, the first adhesive layer 1126 has a thickness of 250 μm to 400 μm. In some embodiments, the first adhesive layer 1126 has a thickness of 250 μm to 350

µm. In some embodiments, the first adhesive layer 1126 has a thickness of 250 µm to 300 µm.

In some embodiments, the first adhesive layer 1126 has a thickness of 300 µm to 900 µm. In some embodiments, the first adhesive layer 1126 has a thickness of 300 µm to 850 µm. In some embodiments, the first adhesive layer 1126 has a thickness of 300 µm to 800 µm. In some embodiments, the first adhesive layer 1126 has a thickness of 300 µm to 750 µm. In some embodiments, the first adhesive layer 1126 has a thickness of 300 µm to 700 µm. In some embodiments, the first adhesive layer 1126 has a thickness of 300 µm to 650 µm. In some embodiments, the first adhesive layer 1126 has a thickness of 300 µm to 600 µm. In some embodiments, the first adhesive layer 1126 has a thickness of 300 µm to 550 µm. In some embodiments, the first adhesive layer 1126 has a thickness of 300 µm to 500 µm. In some embodiments, the first adhesive layer 1126 has a thickness of 300 µm to 450 µm. In some embodiments, the first adhesive layer 1126 has a thickness of 300 µm to 400 µm. In some embodiments, the first adhesive layer 1126 has a thickness of 300 µm to 350 µm.

In some embodiments, the first adhesive layer 1126 has a thickness of 350 µm to 900 µm. In some embodiments, the first adhesive layer 1126 has a thickness of 350 µm to 850 µm. In some embodiments, the first adhesive layer 1126 has a thickness of 350 µm to 800 µm. In some embodiments, the first adhesive layer 1126 has a thickness of 350 µm to 750 µm. In some embodiments, the first adhesive layer 1126 has a thickness of 350 µm to 700 µm. In some embodiments, the first adhesive layer 1126 has a thickness of 350 µm to 650 µm. In some embodiments, the first adhesive layer 1126 has a thickness of 350 µm to 600 µm. In some embodiments, the first adhesive layer 1126 has a thickness of 350 µm to 550 µm. In some embodiments, the first adhesive layer 1126 has a thickness of 350 µm to 500 µm. In some embodiments, the first adhesive layer 1126 has a thickness of 350 µm to 450 µm. In some embodiments, the first adhesive layer 1126 has a thickness of 350 µm to 400 µm.

In some embodiments, the first adhesive layer 1126 has a thickness of 400 µm to 900 µm. In some embodiments, the first adhesive layer 1126 has a thickness of 400 µm to 850 µm. In some embodiments, the first adhesive layer 1126 has a thickness of 400 µm to 800 µm. In some embodiments, the first adhesive layer 1126 has a thickness of 400 µm to 750 µm. In some embodiments, the first adhesive layer 1126 has a thickness of 400 µm to 700 µm. In some embodiments, the first adhesive layer 1126 has a thickness of 400 µm to 650 µm. In some embodiments, the first adhesive layer 1126 has a thickness of 400 µm to 600 µm. In some embodiments, the first adhesive layer 1126 has a thickness of 400 µm to 550 µm. In some embodiments, the first adhesive layer 1126 has a thickness of 400 µm to 500 µm. In some embodiments, the first adhesive layer 1126 has a thickness of 400 µm to 450 µm.

In some embodiments, the first adhesive layer 1126 has a thickness of 450 µm to 900 µm. In some embodiments, the first adhesive layer 1126 has a thickness of 450 µm to 850 µm. In some embodiments, the first adhesive layer 1126 has a thickness of 450 µm to 800 µm. In some embodiments, the first adhesive layer 1126 has a thickness of 450 µm to 750 µm. In some embodiments, the first adhesive layer 1126 has a thickness of 450 µm to 700 µm. In some embodiments, the first adhesive layer 1126 has a thickness of 450 µm to 650 µm. In some embodiments, the first adhesive layer 1126 has a thickness of 450 µm to 600 µm. In some embodiments, the first adhesive layer 1126 has a thickness of 450 µm to 550 µm. In some embodiments, the first adhesive layer 1126 has a thickness of 450 µm to 500 µm.

In some embodiments, the first adhesive layer 1126 has a thickness of 500 µm to 900 µm. In some embodiments, the first adhesive layer 1126 has a thickness of 500 µm to 850 µm. In some embodiments, the first adhesive layer 1126 has a thickness of 500 µm to 800 µm. In some embodiments, the first adhesive layer 1126 has a thickness of 500 µm to 750 µm. In some embodiments, the first adhesive layer 1126 has a thickness of 500 µm to 700 µm. In some embodiments, the first adhesive layer 1126 has a thickness of 500 µm to 650 µm. In some embodiments, the first adhesive layer 1126 has a thickness of 500 µm to 600 µm. In some embodiments, the first adhesive layer 1126 has a thickness of 500 µm to 550 µm.

In some embodiments, the first adhesive layer 1126 has a thickness of 550 µm to 900 µm. In some embodiments, the first adhesive layer 1126 has a thickness of 550 µm to 850 µm. In some embodiments, the first adhesive layer 1126 has a thickness of 550 µm to 800 µm. In some embodiments, the first adhesive layer 1126 has a thickness of 550 µm to 750 µm. In some embodiments, the first adhesive layer 1126 has a thickness of 550 µm to 700 µm. In some embodiments, the first adhesive layer 1126 has a thickness of 550 µm to 650 µm. In some embodiments, the first adhesive layer 1126 has a thickness of 550 µm to 600 µm.

In some embodiments, the first adhesive layer 1126 has a thickness of 600 µm to 900 µm. In some embodiments, the first adhesive layer 1126 has a thickness of 600 µm to 850 µm. In some embodiments, the first adhesive layer 1126 has a thickness of 600 µm to 800 µm. In some embodiments, the first adhesive layer 1126 has a thickness of 600 µm to 750 µm. In some embodiments, the first adhesive layer 1126 has a thickness of 600 µm to 700 µm. In some embodiments, the first adhesive layer 1126 has a thickness of 600 µm to 650 µm.

In some embodiments, the first adhesive layer 1126 has a thickness of 650 µm to 900 µm. In some embodiments, the first adhesive layer 1126 has a thickness of 650 µm to 850 µm. In some embodiments, the first adhesive layer 1126 has a thickness of 650 µm to 800 µm. In some embodiments, the first adhesive layer 1126 has a thickness of 650 µm to 750 µm. In some embodiments, the first adhesive layer 1126 has a thickness of 650 µm to 700 µm. In some embodiments, the first adhesive layer 1126 has a thickness of 700 µm to 900 µm. In some embodiments, the first adhesive layer 1126 has a thickness of 700 µm to 850 µm. In some embodiments, the first adhesive layer 1126 has a thickness of 700 µm to 800 µm. In some embodiments, the first adhesive layer 1126 has a thickness of 700 µm to 750 µm. In some embodiments, the first adhesive layer 1126 has a thickness of 750 µm to 900 µm. In some embodiments, the first adhesive layer 1126 has a thickness of 750 µm to 850 µm. In some embodiments, the first adhesive layer 1126 has a thickness of 750 µm to 800 µm. In some embodiments, the first adhesive layer 1126 has a thickness of 800 µm to 900 µm. In some embodiments, the first adhesive layer 1126 has a thickness of 800 µm to 850 µm. In some embodiments, the first adhesive layer 1126 has a thickness of 850 µm to 900 µm.

In some embodiments, the first adhesive layer 1126 has a thickness of 1 µm. In some embodiments, the first adhesive layer 1126 has a thickness of 50 µm. In some embodiments, the first adhesive layer 1126 has a thickness of 100 µm. In some embodiments, the first adhesive layer 1126 has a thickness of 150 µm. In some embodiments, the first adhesive layer 1126 has a thickness of 200 µm. In some embodiments, the first adhesive layer 1126 has a thickness of 250

µm. In some embodiments, the first adhesive layer 1126 has a thickness of 300 µm. In some embodiments, the first adhesive layer 1126 has a thickness of 350 µm. In some embodiments, the first adhesive layer 1126 has a thickness of 400 µm. In some embodiments, the first adhesive layer 1126 has a thickness of 450 µm. In some embodiments, the first adhesive layer 1126 has a thickness of 500 µm. In some embodiments, the first adhesive layer 1126 has a thickness of 550 µm. In some embodiments, the first adhesive layer 1126 has a thickness of 600 µm. In some embodiments, the first adhesive layer 1126 has a thickness of 650 µm. In some embodiments, the first adhesive layer 1126 has a thickness of 700 µm. In some embodiments, the first adhesive layer 1126 has a thickness of 750 µm. In some embodiments, the first adhesive layer 1126 has a thickness of 800 µm. In some embodiments, the first adhesive layer 1126 has a thickness of 850 µm. In some embodiments, the first adhesive layer 1126 has a thickness of 900 µm.

In some embodiments, the polymer layer 1124 is composed of a fluoropolymer. In certain embodiments, the fluoropolymer may be ethylene tetrafluoroethylene (ETFE), fluoropolymer is polyvinylidene fluoride (PVDF), tetrafluoroethylene-hexafluoropropylene copolymers (FEP), and tetrafluoroethylene-hexafluoropropylene-vinylidene fluoride copolymers (THV), polyvinyl fluoride (PVF), or blends thereof. In some embodiments, the frontsheet is composed of fluoropolymers, acrylics, polyesters, silicones, polycarbonates, or combinations thereof. In some embodiments, the polymer layer 1124 is composed of polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), polyphenylsulfone (PPSU), polyolefin, cyclic olefin copolymers (CPCs), or polyimide. In some embodiments, the polymer layer 1124 is composed of a crosslinked polymeric material. In some embodiments, 50% to 99% of the polymer chains of the polymeric material are crosslinked.

In some embodiments, the polymer layer 1124 has a thickness of 0.01 mm to 0.5 mm. In some embodiments, the polymer layer 1124 has a thickness of 0.01 mm to 0.45 mm. In some embodiments, the polymer layer 1124 has a thickness of 0.01 mm to 0.4 mm. In some embodiments, the polymer layer 1124 has a thickness of 0.01 mm to 0.35 mm. In some embodiments, the polymer layer 1124 has a thickness of 0.01 mm to 0.3 mm. In some embodiments, the polymer layer 1124 has a thickness of 0.01 mm to 0.25 mm. In some embodiments, the polymer layer 1124 has a thickness of 0.01 mm to 0.2 mm. In some embodiments, the polymer layer 1124 has a thickness of 0.01 mm to 0.15 mm. In some embodiments, the polymer layer 1124 has a thickness of 0.01 mm to 0.1 mm. In some embodiments, the polymer layer 1124 has a thickness of 0.01 mm to 0.05 mm.

In some embodiments, the polymer layer 1124 has a thickness of 0.05 mm to 0.5 mm. In some embodiments, the polymer layer 1124 has a thickness of 0.05 mm to 0.45 mm. In some embodiments, the polymer layer 1124 has a thickness of 0.05 mm to 0.4 mm. In some embodiments, the polymer layer 1124 has a thickness of 0.05 mm to 0.35 mm. In some embodiments, the polymer layer 1124 has a thickness of 0.05 mm to 0.3 mm. In some embodiments, the polymer layer 1124 has a thickness of 0.05 mm to 0.25 mm. In some embodiments, the polymer layer 1124 has a thickness of 0.05 mm to 0.2 mm. In some embodiments, the polymer layer 1124 has a thickness of 0.05 mm to 0.15 mm. In some embodiments, the polymer layer 1124 has a thickness of 0.05 mm to 0.1 mm.

In some embodiments, the polymer layer 1124 has a thickness of 0.1 mm to 0.5 mm. In some embodiments, the polymer layer 1124 has a thickness of 0.1 mm to 0.45 mm. In some embodiments, the polymer layer 1124 has a thickness of 0.1 mm to 0.4 mm. In some embodiments, the polymer layer 1124 has a thickness of 0.1 mm to 0.35 mm. In some embodiments, the polymer layer 1124 has a thickness of 0.1 mm to 0.3 mm. In some embodiments, the polymer layer 1124 has a thickness of 0.1 mm to 0.25 mm. In some embodiments, the polymer layer 1124 has a thickness of 0.1 mm to 0.2 mm. In some embodiments, the polymer layer 1124 has a thickness of 0.1 mm to 0.15 mm. In some embodiments, the polymer layer 1124 has a thickness of 0.15 mm to 0.5 mm. In some embodiments, the polymer layer 1124 has a thickness of 0.15 mm to 0.45 mm. In some embodiments, the polymer layer 1124 has a thickness of 0.15 mm to 0.4 mm. In some embodiments, the polymer layer 1124 has a thickness of 0.15 mm to 0.35 mm. In some embodiments, the polymer layer 1124 has a thickness of 0.15 mm to 0.3 mm. In some embodiments, the polymer layer 1124 has a thickness of 0.15 mm to 0.25 mm. In some embodiments, the polymer layer 1124 has a thickness of 0.15 mm to 0.2 mm.

In some embodiments, the polymer layer 1124 has a thickness of 0.2 mm to 0.5 mm. In some embodiments, the polymer layer 1124 has a thickness of 0.2 mm to 0.45 mm. In some embodiments, the polymer layer 1124 has a thickness of 0.2 mm to 0.4 mm. In some embodiments, the polymer layer 1124 has a thickness of 0.2 mm to 0.35 mm. In some embodiments, the polymer layer 1124 has a thickness of 0.2 mm to 0.3 mm. In some embodiments, the polymer layer 1124 has a thickness of 0.2 mm to 0.25 mm. In some embodiments, the polymer layer 1124 has a thickness of 0.25 mm to 0.5 mm. In some embodiments, the polymer layer 1124 has a thickness of 0.25 mm to 0.45 mm. In some embodiments, the polymer layer 1124 has a thickness of 0.25 mm to 0.4 mm. In some embodiments, the polymer layer 1124 has a thickness of 0.25 mm to 0.35 mm. In some embodiments, the polymer layer 1124 has a thickness of 0.25 mm to 0.3 mm.

In some embodiments, the polymer layer 1124 has a thickness of 0.3 mm to 0.5 mm. In some embodiments, the polymer layer 1124 has a thickness of 0.3 mm to 0.45 mm. In some embodiments, the polymer layer 1124 has a thickness of 0.3 mm to 0.4 mm. In some embodiments, the polymer layer 1124 has a thickness of 0.3 mm to 0.35 mm. In some embodiments, the polymer layer 1124 has a thickness of 0.35 mm to 0.5 mm. In some embodiments, the polymer layer 1124 has a thickness of 0.35 mm to 0.45 mm. In some embodiments, the polymer layer 1124 has a thickness of 0.35 mm to 0.4 mm. In some embodiments, the polymer layer 1124 has a thickness of 0.4 mm to 0.5 mm. In some embodiments, the polymer layer 1124 has a thickness of 0.4 mm to 0.45 mm. In some embodiments, the polymer layer 1124 has a thickness of 0.45 mm to 0.5 mm.

In some embodiments, the polymer layer 1124 has a thickness of 0.01 mm. In some embodiments, the polymer layer 1124 has a thickness of 0.05 mm. In some embodiments, the polymer layer 1124 has a thickness of 0.1 mm. In some embodiments, the polymer layer 1124 has a thickness of 0.15 mm. In some embodiments, the polymer layer 1124 has a thickness of 0.2 mm. In some embodiments, the polymer layer 1124 has a thickness of 0.25 mm. In some embodiments, the polymer layer 1124 has a thickness of 0.3 mm. In some embodiments, the polymer layer 1124 has a thickness of 0.35 mm. In some embodiments, the polymer layer 1124 has a thickness of 0.4 mm. In some embodiments, the polymer layer 1124 has a thickness of 0.45 mm. In some embodiments, the polymer layer 1124 has a thickness of 0.5 mm.

In some embodiments, a backsheet 1128 is juxtaposed with a second layer 1114b of the encapsulant 1114. In some embodiments, the backsheet 1128 includes a first layer 1130 and a second layer 1132. In some embodiments, the first layer 1130 is juxtaposed with the second layer 1114b of the encapsulant 1114. In some embodiments, the second layer 1132 is juxtaposed with the first layer 1130.

In some embodiments, the first layer 1130 of the backsheet 1128 is composed of a polymeric material. In some embodiments, the first layer 1130 of the backsheet 1128 is composed of polyethylene terephthalate ("PET"). In some embodiments, the first layer 1130 of the backsheet 1128 is composed of ethylene tetrafluoroethylene ("ETFE"). In some embodiments, the first layer 1130 of the backsheet 1128 is composed of an acrylic such as polymethyl methacrylate ("PMMA"). In some embodiments, the first layer 1130 of the backsheet 1128 is composed of thermoplastic polyolefin (TPO). In some embodiments, the first layer 1130 of the backsheet 1128 includes of a single ply TPO roofing membrane. In some embodiments, non-limiting examples of TPO membranes are disclosed in U.S. Pat. No. 9,359,014 to Yang et al., which is incorporated by reference herein in its entirety. In some embodiments, the first layer 1130 of the backsheet 1128 is composed of polyvinyl chloride. In some embodiments, the first layer 1130 of the backsheet 1128 is composed of ethylene propylene diene monomer (EPDM) rubber. In some embodiments, the first layer 1130 of the backsheet 1128 includes a flame retardant additive. In some embodiments, the flame retardant additive may be clays, nanoclays, silicas, carbon black, metal hydroxides such as aluminum hydroxide, metal foils, graphite, and combinations thereof.

In some embodiments, the first layer 1130 has a thickness of 0.2 mm to 0.5 mm. In some embodiments, the first layer 1130 has a thickness of 0.2 mm to 0.4 mm. In some embodiments, the first layer 1130 has a thickness of 0.2 mm to 0.3 mm. In some embodiments, the first layer 1130 has a thickness of 0.3 mm to 0.5 mm. In some embodiments, the first layer 1130 has a thickness of 0.3 mm to 0.4 mm. In some embodiments, the first layer 1130 has a thickness of 0.4 mm to 0.5 mm. In some embodiments, the first layer 1130 has a thickness of 0.2 mm. In some embodiments, the first layer 1130 has a thickness of 0.3 mm. In some embodiments, the first layer 1130 has a thickness of 0.4 mm. In some embodiments, the first layer 1130 has a thickness of 0.5 mm.

In some embodiments, the second layer 1132 of the backsheet 1128 is composed of a polymeric material. In some embodiments, the second layer 1132 of the backsheet 1128 is composed of thermoplastic polyolefin (TPO). In some embodiments, the second layer 1132 of the backsheet 1128 includes a single ply TPO roofing membrane. In some embodiments, non-limiting examples of TPO membranes are disclosed in U.S. Pat. No. 9,359,014 to Yang et al., which is incorporated by reference herein in its entirety. In some embodiments, the second layer 1132 of the backsheet 1128 is composed of polyethylene terephthalate ("PET"). In some embodiments, the second layer 1132 is composed of styrene acrylic copolymer. In some embodiments, the second layer 1132 of the backsheet 1128 is composed of ethylene tetrafluoroethylene ("ETFE"). In some embodiments, the second layer 1132 of the backsheet 1128 is composed of an acrylic such as polymethyl methacrylate ("PMMA"). In some embodiments, the second layer 1132 of the backsheet 1128 is composed of polyvinyl chloride. In some embodiments, the second layer 1132 of the backsheet 1128 is composed of ethylene propylene diene monomer (EPDM) rubber. In some embodiments, the second layer 1132 of the backsheet 1128 includes a flame retardant additive. In some embodiments, the flame retardant additive may be clays, nanoclays, silicas, carbon black, metal hydroxides such as aluminum hydroxide, metal foils, graphite, and combinations thereof.

Figure 41:
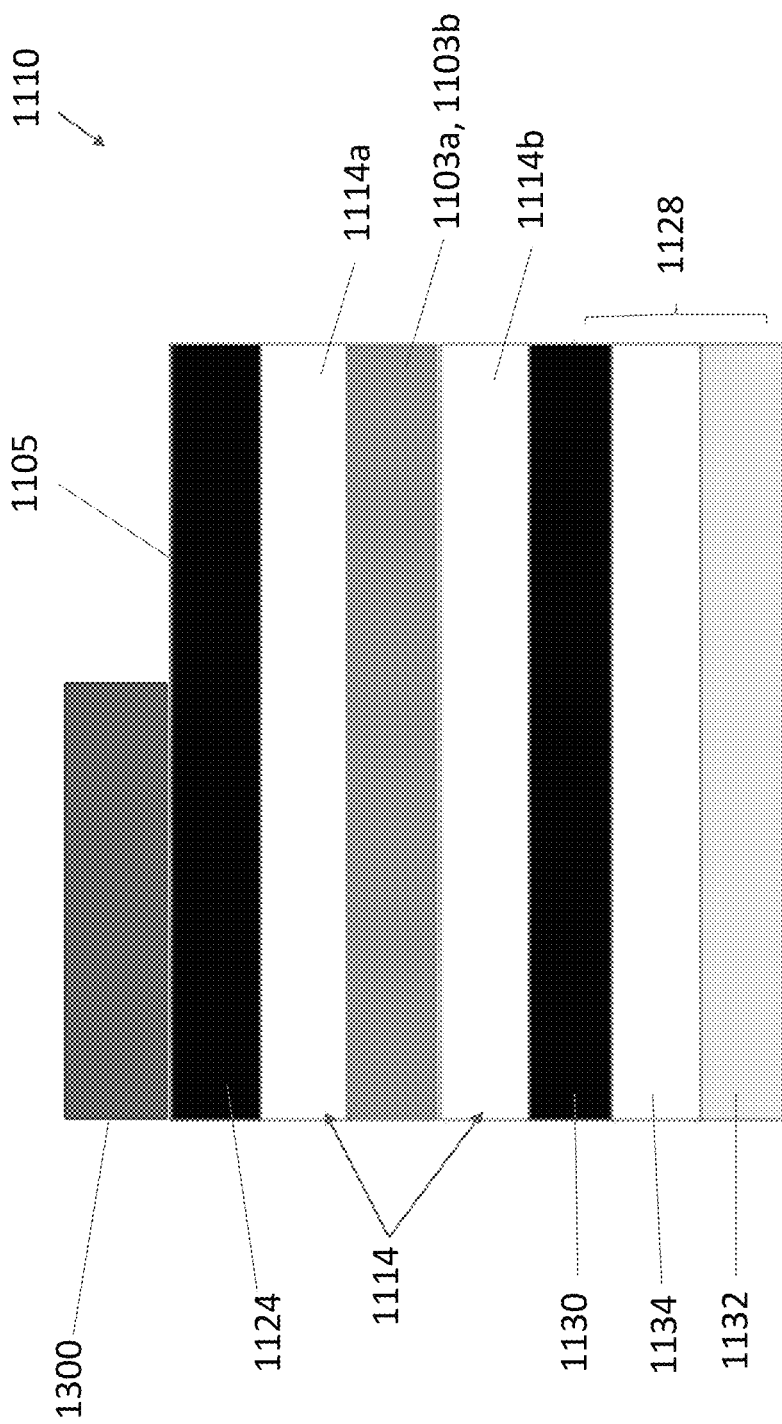
Figure 46:
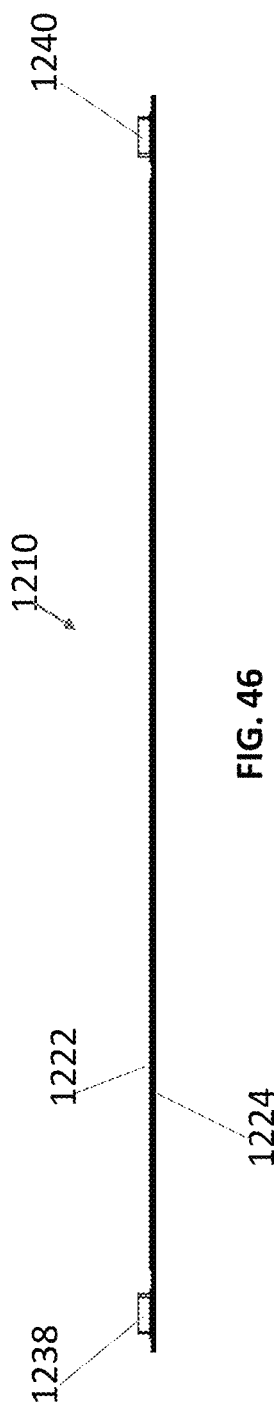
FIG. 46 is a side elevational view of the jumper module shown in FIG. 44.
Figure 47:
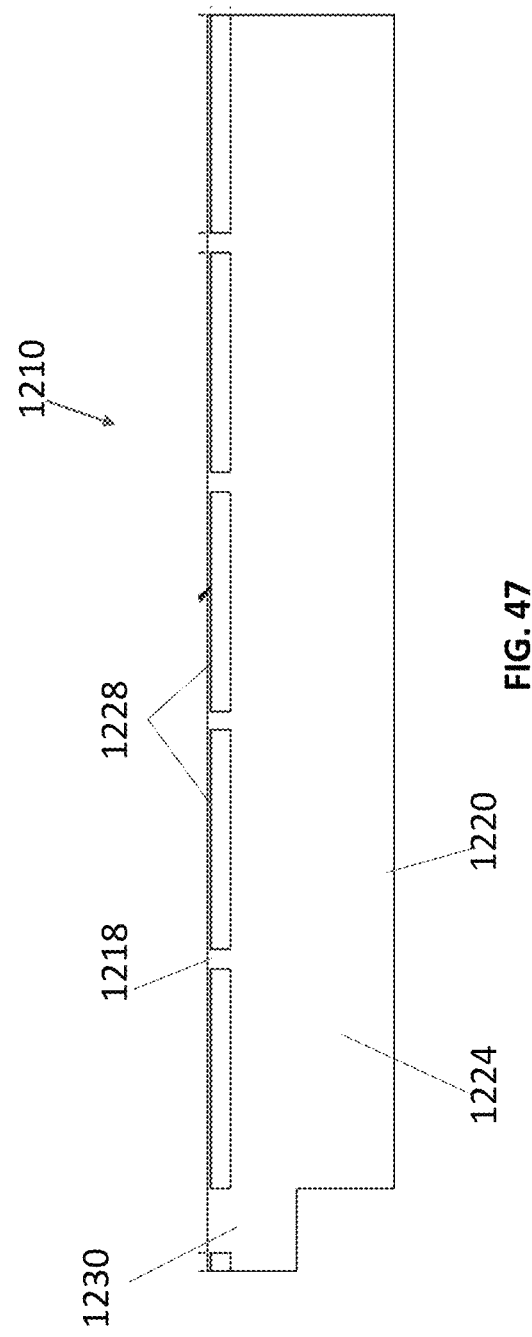
FIG. 47 is a bottom plan view of the jumper module shown in FIG. 44.

FIG. 41 shows a schematic view of the first side lap 1115. In some embodiments, the first side lap 1115 includes a structure and materials similar to those of the active area 1109, with certain differences. In some embodiments, the first side lap 1115 includes ends of the bussing wires 1103a, 1103b encapsulated by the encapsulant 1114. In some embodiments, the first side lap 1115 includes the polymer layer 1124. In some embodiments, the polymer layer 1124 is an upper, sun facing-side surface of the first side lap 1115. In some embodiments, the second side lap 1117 includes a structure and materials similar to those as the first side lap 1115. In some embodiments, the headlap portion 1113 includes a structure and materials similar to those as the first side lap 1115.

In some embodiments, the wire cover bracket 1300 is located on a surface 1105 of the polymer layer 1124. In some embodiments, the wire cover bracket 1300 is composed of a polymer. In some embodiments, the wire cover bracket 1300 is composed of a composite material. In some embodiments, the wire cover bracket 1300 is composed of a reinforced plastic. In some embodiments, the wire cover bracket 1300 is composed of a fiber-reinforced polymer. In some embodiments, the wire cover bracket 1300 is composed of fiberglass. In some embodiments, the wire cover bracket 1300 is injection molded. In some embodiments, the wire cover bracket 1300 is configured to receive a cover 1304, which shall be described in detail hereinafter. In some embodiments, the wire cover bracket 1300 is attached to the surface 1105 of the polymer layer 1124 by an adhesive. In some embodiments, the wire cover bracket 1300 is attached to the surface 1105 of the polymer layer 1124 by thermal bonding. In some embodiments, the wire cover bracket 1300 is attached to the surface 1105 of the polymer layer 1124 by ultrasonic welding.

In some embodiments, the wire cover bracket 1300 has a height of 1 mm to 10 mm. In some embodiments, the wire cover bracket 1300 has a height of 1 mm to 9 mm. In some embodiments, the wire cover bracket 1300 has a height of 1 mm to 8 mm. In some embodiments, the wire cover bracket 1300 has a height of 1 mm to 7 mm. In some embodiments, the wire cover bracket 1300 has a height of 1 mm to 6 mm. In some embodiments, the wire cover bracket 1300 has a height of 1 mm to 5 mm. In some embodiments, the wire cover bracket 1300 has a height of 1 mm to 4 mm. In some embodiments, the wire cover bracket 1300 has a height of 1 mm to 3 mm. In some embodiments, the wire cover bracket 1300 has a height of 1 mm to 2 mm.

In some embodiments, the wire cover bracket 1300 has a height of 2 mm to 10 mm. In some embodiments, the wire cover bracket 1300 has a height of 2 mm to 9 mm. In some embodiments, the wire cover bracket 1300 has a height of 2 mm to 8 mm. In some embodiments, the wire cover bracket 1300 has a height of 2 mm to 7 mm. In some embodiments, the wire cover bracket 1300 has a height of 2 mm to 6 mm. In some embodiments, the wire cover bracket 1300 has a height of 2 mm to 5 mm. In some embodiments, the wire cover bracket 1300 has a height of 2 mm to 4 mm. In some embodiments, the wire cover bracket 1300 has a height of 2 mm to 3 mm. In some embodiments, the wire cover bracket 1300 has a height of 3 mm to 10 mm. In some embodiments, the wire cover bracket 1300 has a height of 3 mm to 9 mm. In some embodiments, the wire cover bracket 1300 has a height of 3 mm to 8 mm. In some embodiments, the wire cover bracket 1300 has a height of 3 mm to 7 mm. In some embodiments, the wire cover bracket 1300 has a height of 3 mm to 6 mm. In some embodiments, the wire cover bracket 1300 has a height of 3 mm to 5 mm. In some embodiments, the wire cover bracket 1300 has a height of 3 mm to 4 mm.

In some embodiments, the wire cover bracket 1300 has a height of 4 mm to 10 mm. In some embodiments, the wire cover bracket 1300 has a height of 4 mm to 9 mm. In some embodiments, the wire cover bracket 1300 has a height of 4 mm to 8 mm. In some embodiments, the wire cover bracket 1300 has a height of 4 mm to 7 mm. In some embodiments, the wire cover bracket 1300 has a height of 4 mm to 6 mm. In some embodiments, the wire cover bracket 1300 has a height of 4 mm to 5 mm. In some embodiments, the wire cover bracket 1300 has a height of 5 mm to 10 mm. In some embodiments, the wire cover bracket 1300 has a height of 5 mm to 9 mm. In some embodiments, the wire cover bracket 1300 has a height of 5 mm to 8 mm. In some embodiments, the wire cover bracket 1300 has a height of 5 mm to 7 mm. In some embodiments, the wire cover bracket 1300 has a height of 5 mm to 6 mm.

In some embodiments, the wire cover bracket 1300 has a height of 6 mm to 10 mm. In some embodiments, the wire cover bracket 1300 has a height of 6 mm to 9 mm. In some embodiments, the wire cover bracket 1300 has a height of 6 mm to 8 mm. In some embodiments, the wire cover bracket 1300 has a height of 6 mm to 7 mm. In some embodiments, the wire cover bracket 1300 has a height of 7 mm to 10 mm. In some embodiments, the wire cover bracket 1300 has a height of 7 mm to 9 mm. In some embodiments, the wire cover bracket 1300 has a height of 7 mm to 8 mm. In some embodiments, the wire cover bracket 1300 has a height of 8 mm to 10 mm. In some embodiments, the wire cover bracket 1300 has a height of 8 mm to 9 mm. In some embodiments, the wire cover bracket 1300 has a height of 9 mm to 10 mm.

In some embodiments, the wire cover bracket 1300 has a height of 1 mm. In some embodiments, the wire cover bracket 1300 has a height of 2 mm. In some embodiments, the wire cover bracket 1300 has a height of 3 mm. In some embodiments, the wire cover bracket 1300 has a height of 4 mm. In some embodiments, the wire cover bracket 1300 has a height of 5 mm. In some embodiments, the wire cover bracket 1300 has a height of 6 mm. In some embodiments, the wire cover bracket 1300 has a height of 7 mm. In some embodiments, the wire cover bracket 1300 has a height of 8 mm. In some embodiments, the wire cover bracket 1300 has a height of 9 mm. In some embodiments, the wire cover bracket 1300 has a height of 10 mm.

Referring to FIG. 42, in some embodiments, an edge 1133 of the second layer 1132 is offset from an edge 1123 of the glass layer 1122 by a distance D. In some embodiments, the distance D is of a sufficient amount so as to enable the edge 1133 to be cut or trimmed when the photovoltaic module 1110 is installed on the roof deck for aesthetically matching the photovoltaic modules 1110 with other ones of the photovoltaic modules 1110. In some embodiments, the distance D is 1 mm to 10 mm. In some embodiments, the distance D is 1 mm to 9 mm. In some embodiments, the distance D is 1 mm to 8 mm. In some embodiments, the distance D is 1 mm to 7 mm. In some embodiments, the distance D is 1 mm to 6 mm. In some embodiments, the distance D is 1 mm to 5 mm. In some embodiments, the distance D is 1 mm to 4 mm. In some embodiments, the distance D is 1 mm to 3 mm. In some embodiments, the distance D is 1 mm to 2 mm.

In some embodiments, the distance D is 2 mm to 10 mm. In some embodiments, the distance D is 2 mm to 9 mm. In some embodiments, the distance D is 2 mm to 8 mm. In some embodiments, the distance D is 2 mm to 7 mm. In some embodiments, the distance D is 2 mm to 6 mm. In some embodiments, the distance D is 2 mm to 5 mm. In some embodiments, the distance D is 2 mm to 4 mm. In some embodiments, the distance D is 2 mm to 3 mm. In some embodiments, the distance D is 3 mm to 10 mm. In some embodiments, the distance D is 3 mm to 9 mm. In some embodiments, the distance D is 3 mm to 8 mm. In some embodiments, the distance D is 3 mm to 7 mm. In some embodiments, the distance D is 3 mm to 6 mm. In some embodiments, the distance D is 3 mm to 5 mm. In some embodiments, the distance D is 3 mm to 4 mm. In some embodiments, the distance D is 4 mm to 10 mm. In some embodiments, the distance D is 4 mm to 9 mm. In some embodiments, the distance D is 4 mm to 8 mm. In some embodiments, the distance D is 4 mm to 7 mm. In some embodiments, the distance D is 4 mm to 6 mm. In some embodiments, the distance D is 4 mm to 5 mm.

In some embodiments, the distance D is 5 mm to 10 mm. In some embodiments, the distance D is 5 mm to 9 mm. In some embodiments, the distance D is 5 mm to 8 mm. In some embodiments, the distance D is 5 mm to 7 mm. In some embodiments, the distance D is 5 mm to 6 mm. In some embodiments, the distance D is 6 mm to 10 mm. In some embodiments, the distance D is 6 mm to 9 mm. In some embodiments, the distance D is 6 mm to 8 mm. In some embodiments, the distance D is 6 mm to 7 mm. In some embodiments, the distance D is 7 mm to 10 mm. In some embodiments, the distance D is 7 mm to 9 mm. In some embodiments, the distance D is 7 mm to 8 mm. In some embodiments, the distance D is 8 mm to 10 mm. In some embodiments, the distance D is 8 mm to 9 mm. In some embodiments, the distance D is 9 mm to 10 mm.

In some embodiments, the distance D is 1 mm. In some embodiments, the distance D is 2 mm. In some embodiments, the distance D is 3 mm. In some embodiments, the distance D is 4 mm. In some embodiments, the distance D is 5 mm. In some embodiments, the distance D is 6 mm. In some embodiments, the distance D is 7 mm. In some embodiments, the distance D is 8 mm. In some embodiments, the distance D is 9 mm. In some embodiments, the distance D is 10 mm.

In some embodiments, the first layer 1130 of the backsheet 1128 includes a composite material. In some embodiments, the second layer 1132 of the backsheet 1128 includes a composite material. In some embodiments, the composite materials may absorb less solar radiation than conventional composite materials (e.g., conventional black building materials, conventional black roofing materials, etc.). In some embodiments, the composite materials may have a solar reflectance that is at least 20% greater than conventional composite materials. In some embodiments, the composite materials may be used as a roof attachment and a water shedding layer. In some embodiments, the composite materials, when used as roofing materials for photovoltaic modules, may increase power for such photovoltaic modules by 1% to 2%. In some embodiments, the composite materials may have a relative temperature index (RTI) of greater than 90° C. In some embodiments, the composite material may be a black thermoplastic polyolefin membrane.

As used herein, the term "building material" may include, without limitation, at least one of a roofing material, a siding, a flooring, or any combination thereof. As used herein, the term "roofing material" may include any material of a roof and may include, for example and without limitation, at least one of shingles (e.g., such as photovoltaic modules), roofing membranes (e.g., such as waterproofing membranes), underlayments, tiles, any component thereof, or any combination thereof. In some embodiments, the roofing material may comprise, consist of, or consist essentially of a photovoltaic module. In some embodiments, the roofing material may comprise, consist of, or consist essentially of a component of a photovoltaic module. For example, in some embodiments, the roofing material may comprise, consist of, or consist essentially of a backsheet or a portion of a backsheet (e.g., a bottom flap, a head flap, etc.). Further examples of roofing materials include, without limitation, at least one of rolled roofing, flexible rolled roofing, or any combination thereof.

In some embodiments, the composite material is a roofing composite material. In some embodiments, the roofing composite material may comprise, consist of, or consist essentially of one or more layers. For example, in some embodiments, the roofing composite material may comprise, consist of, or consist essentially of at least one of a substrate, a cap, a core, or any combination thereof. In some embodiments, the substrate may have a first surface and a second surface opposite the first surface. In some embodiments, the cap may be on the first surface of the substrate. In some embodiments, the cap may be in contact with the first surface of the substrate. In some embodiments, the core may be on the second surface of the substrate. In some embodiments, the core may be in contact with the second surface of the substrate. In some embodiments, one or more layers may be located between the cap and the substrate. In some embodiments, one or more layers may be located between the core and the substrate.

In some embodiments, the roofing composite material is the backsheet 1128 of the photovoltaic module 1110. In some embodiments, the first layer 1130 of the backsheet 1128 is composed of the roofing composite material. In some embodiments, the second layer 1132 of the backsheet 1128 is composed of the roofing composite material.

In some embodiments, the substrate may comprise, consist of, or consist essentially of a scrim (e.g., a polymeric scrim, such as a polyester scrim), a plywood substrate, a glass substrate, a cellulosic substrate, a roof shingle, a mat, a fabric, a glass mat, a fiberglass mat, an underlayment, a roofing membrane, a roof deck, a photovoltaic (PV) panel, a modified bitumen (MODBIT) substrate, a roll good, a board (such as but not limited to at least one of a foam board (e.g., a polyisocyanurate (ISO) foam board), a cover board, or any combination thereof), a pipe, a base sheet, a chimney, a wax paper, or any combination thereof.

In some embodiments, the cap may comprise, consist of, or consist essentially of at least one of the following: one or more polymers, at least one infrared-reflective pigment, a stabilizer package, one or more fillers, or any combination thereof. In some embodiments, the cap may comprise, consist of, or consist essentially of at least one of the following: one or more thermoplastic polyolefins, at least one infrared-reflective black pigment, a stabilizer package, one or more fillers, or any combination thereof. In some embodiments, the stabilizer package may comprise at least one ultraviolet (UV) absorber. In some embodiments, the cap may not comprise a white colorant. In some embodiments, the term white colorant includes white pigments. In some embodiments, the term infrared-reflective black pigment includes infrared-reflective black colorants. In some embodiments, the cap may comprise, consist of, or consist essentially of one or more thermoplastic polyolefins, an ultraviolet absorber, an infrared-reflective black pigment, and optionally one or more fillers, wherein the cap does not comprise at least one of a white colorant, a white pigment, or any combination thereof.

In some embodiments, the white colorant may comprise, consist of, or consist essentially of titanium dioxide ($TiO_2$) particles having a particle size of 200 nm or greater. For example, in some embodiments, the white colorant may comprise, consist of, or consist essentially of titanium dioxide ($TiO_2$) particles having a particle size of 200 nm to 500 nm. In some embodiments, the white colorant may comprise, consist of, or consist essentially of titanium dioxide ($TiO_2$) particles having a particle size of 200 nm to 475 nm. In some embodiments, the white colorant may comprise, consist of, or consist essentially of titanium dioxide ($TiO_2$) particles having a particle size of 200 nm to 450 nm. In some embodiments, the white colorant may comprise, consist of, or consist essentially of titanium dioxide ($TiO_2$) particles having a particle size of 200 nm to 425 nm. In some embodiments, the white colorant may comprise, consist of, or consist essentially of titanium dioxide ($TiO_2$) particles having a particle size of 200 nm to 400 nm. In some embodiments, the white colorant may comprise, consist of, or consist essentially of titanium dioxide ($TiO_2$) particles having a particle size of 200 nm to 375 nm. In some embodiments, the white colorant may comprise, consist of, or consist essentially of titanium dioxide ($TiO_2$) particles having a particle size of 200 nm to 350 nm. In some embodiments, the white colorant may comprise, consist of, or consist essentially of titanium dioxide ($TiO_2$) particles having a particle size of 200 nm to 325 nm. In some embodiments, the white colorant may comprise, consist of, or consist essentially of titanium dioxide ($TiO_2$) particles having a particle size of 200 nm to 300 nm. In some embodiments, the white colorant may comprise, consist of, or consist essentially of titanium dioxide ($TiO_2$) particles having a particle size of 200 nm to 275 nm. In some embodiments, the white colorant may comprise, consist of, or consist essentially of titanium dioxide ($TiO_2$) particles having a particle size of 200 nm to 250 nm. In some embodiments, the white colorant may comprise, consist of, or consist essentially of titanium dioxide ($TiO_2$) particles having a particle size of 200 nm to 225 nm.

In some embodiments, the white colorant may comprise, consist of, or consist essentially of titanium dioxide ($TiO_2$) particles having a particle size of 225 nm to 500 nm. In some embodiments, the white colorant may comprise, consist of, or consist essentially of titanium dioxide ($TiO_2$) particles having a particle size of 250 nm to 500 nm. In some embodiments, the white colorant may comprise, consist of, or consist essentially of titanium dioxide ($TiO_2$) particles having a particle size of 275 nm to 500 nm. In some embodiments, the white colorant may comprise, consist of, or consist essentially of titanium dioxide ($TiO_2$) particles having a particle size of 300 nm to 500 nm. In some embodiments, the white colorant may comprise, consist of, or consist essentially of titanium dioxide ($TiO_2$) particles having a particle size of 325 nm to 500 nm. In some embodiments, the white colorant may comprise, consist of, or consist essentially of titanium dioxide ($TiO_2$) particles having a particle size of 350 nm to 500 nm. In some embodiments, the white colorant may comprise, consist of, or consist essentially of titanium dioxide ($TiO_2$) particles having a particle size of 375 nm to 500 nm. In some embodiments, the white colorant may comprise, consist of, or consist essentially of titanium dioxide (TiO$_2$) particles having a particle size of 400 nm to 500 nm. In some embodiments, the white colorant may comprise, consist of, or consist essentially of titanium dioxide (TiO$_2$) particles having a particle size of 425 nm to 500 nm. In some embodiments, the white colorant may comprise, consist of, or consist essentially of titanium dioxide (TiO$_2$) particles having a particle size of 450 nm to 500 nm. In some embodiments, the white colorant may comprise, consist of, or consist essentially of titanium dioxide (TiO$_2$) particles having a particle size of 475 nm to 500 nm. In some embodiments, the white colorant may comprise, consist of, or consist essentially of titanium dioxide (TiO$_2$) particles having a particle size of 250 nm to 450 nm.

In some embodiments, the cap does not comprise at least one of a white colorant, a white pigment, or any combination thereof. In some embodiments, the cap may comprise an amount of a white colorant, provided that the overall color appearance of the composite material remains black. For example, in some embodiments, the cap may comprise less than 10% by weight of the white colorant based on the total weight of the cap. In some embodiments, the cap may comprise less than 9% by weight of the white colorant based on the total weight of the cap. In some embodiments, the cap may comprise less than 8% by weight of the white colorant based on the total weight of the cap. In some embodiments, the cap may comprise less than 7% by weight of the white colorant based on the total weight of the cap. In some embodiments, the cap may comprise less than 6% by weight of the white colorant based on the total weight of the cap. In some embodiments, the cap may comprise less than 5% by weight of the white colorant based on the total weight of the cap. In some embodiments, the cap may comprise less than 4% by weight of the white colorant based on the total weight of the cap. In some embodiments, the cap may comprise less than 3% by weight of the white colorant based on the total weight of the cap. In some embodiments, the cap may comprise less than 2% by weight of the white colorant based on the total weight of the cap. In some embodiments, the cap may comprise less than 1% by weight of the white colorant based on the total weight of the cap. In some embodiments, the cap may comprise from 0.1% to 1% by weight of the white colorant based on the total weight of the cap.

In some embodiments, the ultraviolet absorber may comprise, consist of, or consist essentially of titanium dioxide (TiO$_2$) particles having a particle size of less than 200 nm. In some embodiments, the ultraviolet absorber may comprise, consist of, or consist essentially of titanium dioxide (TiO$_2$) particles having a particle size of less than 190 nm. In some embodiments, the ultraviolet absorber may comprise, consist of, or consist essentially of titanium dioxide (TiO$_2$) particles having a particle size of less than 180 nm. In some embodiments, the ultraviolet absorber may comprise, consist of, or consist essentially of titanium dioxide (TiO$_2$) particles having a particle size of less than 170 nm. In some embodiments, the ultraviolet absorber may comprise, consist of, or consist essentially of titanium dioxide (TiO$_2$) particles having a particle size of less than 165 nm. In some embodiments, the ultraviolet absorber may comprise, consist of, or consist essentially of titanium dioxide (TiO$_2$) particles having a particle size of less than 150 nm. In some embodiments, the ultraviolet absorber may comprise, consist of, or consist essentially of titanium dioxide (TiO$_2$) particles having a particle size of less than 140 nm. In some embodiments, the ultraviolet absorber may comprise, consist of, or consist essentially of titanium dioxide (TiO$_2$) particles having a particle size of less than 130 nm. In some embodiments, the ultraviolet absorber may comprise, consist of, or consist essentially of titanium dioxide (TiO$_2$) particles having a particle size of less than 120 nm. In some embodiments, the ultraviolet absorber may comprise, consist of, or consist essentially of titanium dioxide (TiO$_2$) particles having a particle size of less than 110 nm. In some embodiments, the ultraviolet absorber may comprise, consist of, or consist essentially of titanium dioxide (TiO$_2$) particles having a particle size of less than 100 nm.

In some embodiments, the ultraviolet absorber may comprise, consist of, or consist essentially of titanium dioxide (TiO$_2$) particles having a particle size of 1 nm to less than 200 nm. In some embodiments, the ultraviolet absorber may comprise, consist of, or consist essentially of titanium dioxide (TiO$_2$) particles having a particle size of 50 nm to 165 nm. In some embodiments, the ultraviolet absorber may comprise, consist of, or consist essentially of titanium dioxide (TiO$_2$) particles having a particle size of 50 nm to 150 nm. In some embodiments, the ultraviolet absorber may comprise, consist of, or consist essentially of titanium dioxide (TiO$_2$) particles having a particle size of 50 nm to 135 nm. In some embodiments, the ultraviolet absorber may comprise, consist of, or consist essentially of titanium dioxide (TiO$_2$) particles having a particle size of 50 nm to 120 nm. In some embodiments, the ultraviolet absorber may comprise, consist of, or consist essentially of titanium dioxide (TiO$_2$) particles having a particle size of 50 nm to 105 nm. In some embodiments, the ultraviolet absorber may comprise, consist of, or consist essentially of titanium dioxide (TiO$_2$) particles having a particle size of 65 nm to 165 nm. In some embodiments, the ultraviolet absorber may comprise, consist of, or consist essentially of titanium dioxide (TiO$_2$) particles having a particle size of 80 nm to 165 nm. In some embodiments, the ultraviolet absorber may comprise, consist of, or consist essentially of titanium dioxide (TiO$_2$) particles having a particle size of 95 nm to 165 nm. In some embodiments, the ultraviolet absorber may comprise, consist of, or consist essentially of titanium dioxide (TiO$_2$) particles having a particle size of 110 nm to 165 nm. In some embodiments, the ultraviolet absorber may comprise, consist of, or consist essentially of titanium dioxide (TiO$_2$) particles having a particle size of 70 nm to 135 nm. In some embodiments, the ultraviolet absorber may comprise, consist of, or consist essentially of titanium dioxide (TiO$_2$) particles having a particle size of 125 nm to 150 nm. In some embodiments, the ultraviolet absorber may comprise, consist of, or consist essentially of titanium dioxide (TiO$_2$) particles having a particle size of 110 nm to 165 nm. In some embodiments, the ultraviolet absorber may comprise, consist of, or consist essentially of titanium dioxide (TiO$_2$) particles having a particle size of 1 nm to 50 nm.

In some embodiments, the ultraviolet absorber is present in the cap in an amount of 0.1% by weight to 10% by weight based on the total weight of the cap. In some embodiments, the ultraviolet absorber is present in the cap in an amount of 1% by weight to 10% by weight based on the total weight of the cap. In some embodiments, the ultraviolet absorber is present in the cap in an amount of 2% by weight to 9% by weight based on the total weight of the cap. In some embodiments, the ultraviolet absorber is present in the cap in an amount of 2% by weight to 8% by weight based on the total weight of the cap. In some embodiments, the ultraviolet absorber is present in the cap in an amount of 2% by weight to 7% by weight based on the total weight of the cap. In some embodiments, the ultraviolet absorber is present in the cap in an amount of 3% by weight to 9% by weight based on the total weight of the cap. In some embodiments, the ultraviolet absorber is present in the cap in an amount of 3% by weight to 8% by weight based on the total weight of the cap. In some embodiments, the ultraviolet absorber is present in the cap in an amount of 4% by weight to 8% by weight based on the total weight of the cap. In some embodiments, the ultraviolet absorber is present in the cap in an amount of 1% by weight to 5% by weight based on the total weight of the cap. In some embodiments, the ultraviolet absorber is present in the cap in an amount of 1% by weight to 4% by weight based on the total weight of the cap. In some embodiments, the ultraviolet absorber is present in the cap in an amount of 1% by weight to 3% by weight based on the total weight of the cap. In some embodiments, the ultraviolet absorber is present in the cap in an amount of 1% by weight to 2% by weight based on the total weight of the cap. In some embodiments, the ultraviolet absorber is present in the cap in an amount of 1% by weight to 2% by weight based on the total weight of the cap. In some embodiments, the ultraviolet absorber is present in the cap in an amount of 1% by weight to 10% by weight based on the total weight of the cap.

In some embodiments, the infrared-reflective pigment may comprise, consist of, or consist essentially of an infrared-reflective black pigment. Examples of infrared-reflective black pigments include, without limitation, one or more of the following commercially available products: "new black" (Ferro product no. V-799) and "old black" (Ferro product no. V-7970), which are available from Ferro Corporation (Cleveland, Ohio) and sold as Cool Colors™ and Eclipse™ pigments. Other infrared-reflective pigments include, for example and without limitation, one or more of the following: "turquoise" (Ferro product no. PC-5686), "blue" (Ferro product no. PC-9250), "camouflage green" (Ferro product no. V-12600), "IR green" (Ferro product no. V-12650), "autumn gold" (Ferro product no. PC9158), "yellow" (Ferro product no. PC-9416), and "red" (Ferro product nos. V-13810 and V-13815).

In some embodiments, the infrared reflective pigment is present in the cap in an amount of 0.01% by weight to 15% by weight based on the total weight of the cap. In some embodiments, the infrared reflective pigment is present in the cap in an amount of 1% by weight to 15% by weight based on the total weight of the cap. In some embodiments, the infrared reflective pigment is present in the cap in an amount of 1% by weight to 14% by weight based on the total weight of the cap. In some embodiments, the infrared reflective pigment is present in the cap in an amount of 1% by weight to 13% by weight based on the total weight of the cap. In some embodiments, the infrared reflective pigment is present in the cap in an amount of 1% by weight to 12% by weight based on the total weight of the cap. In some embodiments, the infrared reflective pigment is present in the cap in an amount of 1% by weight to 11% by weight based on the total weight of the cap. In some embodiments, the infrared reflective pigment is present in the cap in an amount of 1% by weight to 10% by weight based on the total weight of the cap. In some embodiments, the infrared reflective pigment is present in the cap in an amount of 1% by weight to 9% by weight based on the total weight of the cap. In some embodiments, the infrared reflective pigment is present in the cap in an amount of 1% by weight to 8% by weight based on the total weight of the cap. In some embodiments, the infrared reflective pigment is present in the cap in an amount of 1% by weight to 7% by weight based on the total weight of the cap. In some embodiments, the infrared reflective pigment is present in the cap in an amount of 1% by weight to 6% by weight based on the total weight of the cap. In some embodiments, the infrared reflective pigment is present in the cap in an amount of 1% by weight to 5% by weight based on the total weight of the cap. In some embodiments, the infrared reflective pigment is present in the cap in an amount of 1% by weight to 4% by weight based on the total weight of the cap. In some embodiments, the infrared reflective pigment is present in the cap in an amount of 1% by weight to 3% by weight based on the total weight of the cap.

In some embodiments, the infrared reflective pigment is present in the cap in an amount of 2% by weight to 15% by weight based on the total weight of the cap. In some embodiments, the infrared reflective pigment is present in the cap in an amount of 3% by weight to 15% by weight based on the total weight of the cap. In some embodiments, the infrared reflective pigment is present in the cap in an amount of 4% by weight to 15% by weight based on the total weight of the cap. In some embodiments, the infrared reflective pigment is present in the cap in an amount of 5% by weight to 15% by weight based on the total weight of the cap. In some embodiments, the infrared reflective pigment is present in the cap in an amount of 6% by weight to 15% by weight based on the total weight of the cap. In some embodiments, the infrared reflective pigment is present in the cap in an amount of 7% by weight to 15% by weight based on the total weight of the cap. In some embodiments, the infrared reflective pigment is present in the cap in an amount of 8% by weight to 15% by weight based on the total weight of the cap. In some embodiments, the infrared reflective pigment is present in the cap in an amount of 9% by weight to 15% by weight based on the total weight of the cap. In some embodiments, the infrared reflective pigment is present in the cap in an amount of 10% by weight to 15% by weight based on the total weight of the cap. In some embodiments, the infrared reflective pigment is present in the cap in an amount of 11% by weight to 15% by weight based on the total weight of the cap. In some embodiments, the infrared reflective pigment is present in the cap in an amount of 12% by weight to 15% by weight based on the total weight of the cap. In some embodiments, the infrared reflective pigment is present in the cap in an amount of 13% by weight to 15% by weight based on the total weight of the cap.

In some embodiments, the infrared reflective pigment is present in the cap in an amount of 0.01% by weight to 10% by weight based on the total weight of the cap. In some embodiments, the infrared reflective pigment is present in the cap in an amount of 2% by weight to 9% by weight based on the total weight of the cap. In some embodiments, the infrared reflective pigment is present in the cap in an amount of 2% by weight to 8% by weight based on the total weight of the cap. In some embodiments, the infrared reflective pigment is present in the cap in an amount of 2% by weight to 7% by weight based on the total weight of the cap. In some embodiments, the infrared reflective pigment is present in the cap in an amount of 2% by weight to 6% by weight based on the total weight of the cap. In some embodiments, the infrared reflective pigment is present in the cap in an amount of 3% by weight to 9% by weight based on the total weight of the cap. In some embodiments, the infrared reflective pigment is present in the cap in an amount of 3% by weight to 8% by weight based on the total weight of the cap. In some embodiments, the infrared reflective pigment is present in the cap in an amount of 4% by weight to 6% by weight based on the total weight of the cap.

In some embodiments, the cap has a CIELAB color value comprises an L value range of $0 \leq L^* < 40$. In some embodiments, the cap has a CIELAB color value comprises an L value range of $0 \leq L^* < 35$. In some embodiments, the cap has a CIELAB color value comprises an L value range of $0 \leq L^* < 30$. In some embodiments, the cap has a CIELAB color value comprises an L value range of $0 \leq L^* < 25$. In some embodiments, the cap has a CIELAB color value comprises an L value range of $0 \leq L^* < 20$. In some embodiments, the cap has a CIELAB color value comprises an L value range of $0 \leq L^* < 15$. In some embodiments, the cap has a CIELAB color value comprises an L value range of $0 \leq L^* < 10$. In some embodiments, the cap has a CIELAB color value comprises an L value range of $0 \leq L^* < 5$. In some embodiments, the cap has a CIELAB color value comprises an L value range of $0 \leq L^* < 4$. In some embodiments, the cap has a CIELAB color value comprises an L value range of $0 \leq L^* < 3$. In some embodiments, the cap has a CIELAB color value comprises an L value range of $0 \leq L^* < 2$. In some embodiments, the cap has a CIELAB color value comprises an L value range of $0 \leq L^* < 1$.

In some embodiments, the core may comprise, consist of, or consist essentially of at least one of the following: one or more polymers (e.g., thermoplastic polyolefins), a stabilizer package, one or more fillers, or any combination thereof.

A non-limiting example of a cross-section of at least a portion of a composite material is shown in FIG. 43, according to some embodiments of the present disclosure. As shown in FIG. 43, in some embodiments, the composite material 1100 may comprise, consist of, or consist essentially of a substrate 1170, a cap 1172, and a core 1174. In some embodiments, the substrate 1170 has a first surface and a second surface. In some embodiments, the cap 1172 may be on the first surface of the substrate 1170. In some embodiments, the core 1174 may be on the second surface of the substrate 1170.

In some embodiments, the second layer 1132 has a thickness of 1 mm to 5 mm. In some embodiments, the second layer 1132 has a thickness of 1 mm to 4 mm. In some embodiments, the second layer 1132 has a thickness of 1 mm to 3 mm. In some embodiments, the second layer 1132 has a thickness of 1 mm to 2 mm. In some embodiments, the second layer 1132 has a thickness of 2 mm to 5 mm. In some embodiments, the second layer 1132 has a thickness of 2 mm to 4 mm. In some embodiments, the second layer 1132 has a thickness of 2 mm to 3 mm. In some embodiments, the second layer 1132 has a thickness of 3 mm to 5 mm. In some embodiments, the second layer 1132 has a thickness of 3 mm to 4 mm. In some embodiments, the second layer 1132 has a thickness of 4 mm to 5 mm. In some embodiments, the second layer 1132 has a thickness of 1 mm. In some embodiments, the second layer 1132 has a thickness of 2 mm. In some embodiments, the second layer 1132 has a thickness of 3 mm. In some embodiments, the second layer 1132 has a thickness of 4 mm. In some embodiments, the second layer 1132 has a thickness of 5 mm.

In some embodiments, the first layer 1130 is attached to the second layer 1132 by a second adhesive layer 1134. In some embodiments, the second adhesive layer 1134 may include polyvinyl butyrate, acrylic, silicone, or polycarbonate. In some embodiments, the second adhesive layer 1134 may include pressure sensitive adhesives. In some embodiments, the second adhesive layer 1134 is composed of thermosetting polyolefin, thermosetting polyolefin encapsulant material, thermosetting ethylene-vinyl acetate (EVA), EVA encapsulants, thermoplastic olefin, thermoplastic polyolefin (TPO) or hybrids/combinations thereof.

In some embodiments, the second adhesive layer 1134 has a thickness of 0.2 mm to 2 mm. In some embodiments, the second adhesive layer 1134 has a thickness of 0.2 mm to 1.5 mm. In some embodiments, the second adhesive layer 1134 has a thickness of 0.2 mm to 1 mm. In some embodiments, the second adhesive layer 1134 has a thickness of 0.2 mm to 0.5 mm. In some embodiments, the second adhesive layer 1134 has a thickness of 0.5 mm to 2 mm. In some embodiments, the second adhesive layer 1134 has a thickness of 0.5 mm to 1.5 mm. In some embodiments, the second adhesive layer 1134 has a thickness of 0.5 mm to 1 mm. In some embodiments, the second adhesive layer 1134 has a thickness of 1 mm to 2 mm. In some embodiments, the second adhesive layer 1134 has a thickness of 1 mm to 1.5 mm. In some embodiments, the second adhesive layer 1134 has a thickness of 1.5 mm to 2 mm.

In some embodiments, the second adhesive layer 1134 has a thickness of 0.2 mm. In some embodiments, the second adhesive layer 1134 has a thickness of 0.3 mm. In some embodiments, the second adhesive layer 1134 has a thickness of 0.4 mm. In some embodiments, the second adhesive layer 1134 has a thickness of 0.45 mm. In some embodiments, the second adhesive layer 1134 has a thickness of 0.5 mm. In some embodiments, the second adhesive layer 1134 has a thickness of 1 mm. In some embodiments, the second adhesive layer 1134 has a thickness of 1.5 mm. In some embodiments, the second adhesive layer 1134 has a thickness of 2 mm. In some embodiments, the second adhesive layer 1134 has a thickness of 2.5 mm. In some embodiments, the second adhesive layer 1134 has a thickness of 3 mm. In some embodiments, the second adhesive layer 1134 has a thickness of 3.5 mm. In some embodiments, the second adhesive layer 1134 has a thickness of 4 mm.

In some embodiments, the second adhesive layer 1134 has a thickness of 1 µm to 900 µm. In some embodiments, the second adhesive layer 1134 has a thickness of 1 µm to 850 µm. In some embodiments, the second adhesive layer 1134 has a thickness of 1 µm to 800 µm. In some embodiments, the second adhesive layer 1134 has a thickness of 1 µm to 750 µm. In some embodiments, the second adhesive layer 1134 has a thickness of 1 µm to 700 µm. In some embodiments, the second adhesive layer 1134 has a thickness of 1 µm to 650 µm. In some embodiments, the second adhesive layer 1134 has a thickness of 1 µm to 600 µm. In some embodiments, the second adhesive layer 1134 has a thickness of 1 µm to 550 µm. In some embodiments, the second adhesive layer 1134 has a thickness of 1 µm to 500 µm. In some embodiments, the second adhesive layer 1134 has a thickness of 1 µm to 450 µm. In some embodiments, the second adhesive layer 1134 has a thickness of 1 µm to 400 µm. In some embodiments, the second adhesive layer 1134 has a thickness of 1 µm to 350 µm. In some embodiments, the second adhesive layer 1134 has a thickness of 1 µm to 300 µm. In some embodiments, the second adhesive layer 1134 has a thickness of 1 µm to 250 µm. In some embodiments, the second adhesive layer 1134 has a thickness of 1 µm to 200 µm. In some embodiments, the second adhesive layer 1134 has a thickness of 1 µm to 150 µm. In some embodiments, the second adhesive layer 1134 has a thickness of 1 µm to 100 µm. In some embodiments, the second adhesive layer 1134 has a thickness of 1 µm to 50 µm.

In some embodiments, the second adhesive layer 1134 has a thickness of 50 µm to 900 µm. In some embodiments, the second adhesive layer 1134 has a thickness of 50 µm to 850 µm. In some embodiments, the second adhesive layer 1134 has a thickness of 50 µm to 800 µm. In some embodiments, the second adhesive layer 1134 has a thickness of 50 µm to 750 µm. In some embodiments, the second adhesive layer 1134 has a thickness of 50 µm to 700 µm. In some embodiments, the second adhesive layer 1134 has a thickness of 50 µm to 650 µm. In some embodiments, the second adhesive layer 1134 has a thickness of 50 µm to 600 µm. In some embodiments, the second adhesive layer 1134 has a thickness of 50 µm to 550 µm. In some embodiments, the second adhesive layer 1134 has a thickness of 50 µm to 500 µm. In some embodiments, the second adhesive layer 1134 has a thickness of 50 µm to 450 µm. In some embodiments, the second adhesive layer 1134 has a thickness of 50 µm to 400 µm. In some embodiments, the second adhesive layer 1134 has a thickness of 50 µm to 350 µm. In some embodiments, the second adhesive layer 1134 has a thickness of 50 µm to 300 µm. In some embodiments, the second adhesive layer 1134 has a thickness of 50 µm to 250 µm. In some embodiments, the second adhesive layer 1134 has a thickness of 50 µm to 200 µm. In some embodiments, the second adhesive layer 1134 has a thickness of 50 µm to 150 µm. In some embodiments, the second adhesive layer 1134 has a thickness of 50 µm to 100 µm.

In some embodiments, the second adhesive layer 1134 has a thickness of 100 µm to 900 µm. In some embodiments, the second adhesive layer 1134 has a thickness of 100 µm to 850 µm. In some embodiments, the second adhesive layer 1134 has a thickness of 100 µm to 800 µm. In some embodiments, the second adhesive layer 1134 has a thickness of 100 µm to 750 µm. In some embodiments, the second adhesive layer 1134 has a thickness of 100 µm to 700 µm. In some embodiments, the second adhesive layer 1134 has a thickness of 100 µm to 650 µm. In some embodiments, the second adhesive layer 1134 has a thickness of 100 µm to 600 µm. In some embodiments, the second adhesive layer 1134 has a thickness of 100 µm to 550 µm. In some embodiments, the second adhesive layer 1134 has a thickness of 100 µm to 500 µm. In some embodiments, the second adhesive layer 1134 has a thickness of 100 µm to 450 µm. In some embodiments, the second adhesive layer 1134 has a thickness of 100 µm to 400 µm. In some embodiments, the second adhesive layer 1134 has a thickness of 100 µm to 350 µm. In some embodiments, the second adhesive layer 1134 has a thickness of 100 µm to 300 µm. In some embodiments, the second adhesive layer 1134 has a thickness of 100 µm to 250 µm. In some embodiments, the second adhesive layer 1134 has a thickness of 100 µm to 200 µm. In some embodiments, the second adhesive layer 1134 has a thickness of 100 µm to 150 µm.

In some embodiments, the second adhesive layer 1134 has a thickness of 150 µm to 900 µm. In some embodiments, the second adhesive layer 1134 has a thickness of 150 µm to 850 µm. In some embodiments, the second adhesive layer 1134 has a thickness of 150 µm to 800 µm. In some embodiments, the second adhesive layer 1134 has a thickness of 150 µm to 750 µm. In some embodiments, the second adhesive layer 1134 has a thickness of 150 µm to 700 µm. In some embodiments, the second adhesive layer 1134 has a thickness of 150 µm to 650 µm. In some embodiments, the second adhesive layer 1134 has a thickness of 150 µm to 600 µm. In some embodiments, the second adhesive layer 1134 has a thickness of 150 µm to 550 µm. In some embodiments, the second adhesive layer 1134 has a thickness of 150 µm to 500 µm. In some embodiments, the second adhesive layer 1134 has a thickness of 150 µm to 450 µm. In some embodiments, the second adhesive layer 1134 has a thickness of 150 µm to 400 µm. In some embodiments, the second adhesive layer 1134 has a thickness of 150 µm to 350 µm. In some embodiments, the second adhesive layer 1134 has a thickness of 150 µm to 300 µm. In some embodiments, the second adhesive layer 1134 has a thickness of 150 µm to 250 µm. In some embodiments, the second adhesive layer 1134 has a thickness of 150 µm to 200 µm.

In some embodiments, the second adhesive layer 1134 has a thickness of 200 µm to 900 µm. In some embodiments, the second adhesive layer 1134 has a thickness of 200 µm to 850 µm. In some embodiments, the second adhesive layer 1134 has a thickness of 200 µm to 800 µm. In some embodiments, the second adhesive layer 1134 has a thickness of 200 µm to 750 µm. In some embodiments, the second adhesive layer 1134 has a thickness of 200 µm to 700 µm. In some embodiments, the second adhesive layer 1134 has a thickness of 200 µm to 650 µm. In some embodiments, the second adhesive layer 1134 has a thickness of 200 µm to 600 µm. In some embodiments, the second adhesive layer 1134 has a thickness of 200 µm to 550 µm. In some embodiments, the second adhesive layer 1134 has a thickness of 200 µm to 500 µm. In some embodiments, the second adhesive layer 1134 has a thickness of 200 µm to 450 µm. In some embodiments, the second adhesive layer 1134 has a thickness of 200 µm to 400 µm. In some embodiments, the second adhesive layer 1134 has a thickness of 200 µm to 350 µm. In some embodiments, the second adhesive layer 1134 has a thickness of 200 µm to 300 µm. In some embodiments, the second adhesive layer 1134 has a thickness of 200 µm to 250 µm.

In some embodiments, the second adhesive layer 1134 has a thickness of 250 µm to 900 µm. In some embodiments, the second adhesive layer 1134 has a thickness of 250 µm to 850 µm. In some embodiments, the second adhesive layer 1134 has a thickness of 250 µm to 800 µm. In some embodiments, the second adhesive layer 1134 has a thickness of 250 µm to 750 µm. In some embodiments, the second adhesive layer 1134 has a thickness of 250 µm to 700 µm. In some embodiments, the second adhesive layer 1134 has a thickness of 250 µm to 650 µm. In some embodiments, the second adhesive layer 1134 has a thickness of 250 µm to 600 µm. In some embodiments, the second adhesive layer 1134 has a thickness of 250 µm to 550 µm. In some embodiments, the second adhesive layer 1134 has a thickness of 250 µm to 500 µm. In some embodiments, the second adhesive layer 1134 has a thickness of 250 µm to 450 µm. In some embodiments, the second adhesive layer 1134 has a thickness of 250 µm to 400 µm. In some embodiments, the second adhesive layer 1134 has a thickness of 250 µm to 350 µm. In some embodiments, the second adhesive layer 1134 has a thickness of 250 µm to 300 µm.

In some embodiments, the second adhesive layer 1134 has a thickness of 300 µm to 900 µm. In some embodiments, the second adhesive layer 1134 has a thickness of 300 µm to 850 µm. In some embodiments, the second adhesive layer 1134 has a thickness of 300 µm to 800 µm. In some embodiments, the second adhesive layer 1134 has a thickness of 300 µm to 750 µm. In some embodiments, the second adhesive layer 1134 has a thickness of 300 µm to 700 µm. In some embodiments, the second adhesive layer 1134 has a thickness of 300 µm to 650 µm. In some embodiments, the second adhesive layer 1134 has a thickness of 300 µm to 600 µm. In some embodiments, the second adhesive layer 1134 has a thickness of 300 µm to 550 µm. In some embodiments, the second adhesive layer 1134 has a thickness of 300 µm to 500 µm. In some embodiments, the second adhesive layer 1134 has a thickness of 300 µm to 450 µm. In some embodiments, the second adhesive layer 1134 has a thickness of 300 µm to 400 µm. In some embodiments, the second adhesive layer 1134 has a thickness of 300 µm to 350 µm.

In some embodiments, the second adhesive layer 1134 has a thickness of 350 µm to 900 µm. In some embodiments, the second adhesive layer 1134 has a thickness of 350 µm to 850 µm. In some embodiments, the second adhesive layer 1134 has a thickness of 350 µm to 800 µm. In some embodiments, the second adhesive layer 1134 has a thickness of 350 µm to 750 µm. In some embodiments, the second adhesive layer 1134 has a thickness of 350 µm to 700 µm. In some embodiments, the second adhesive layer 1134 has a thickness of 350 µm to 650 µm. In some embodiments, the second adhesive layer 1134 has a thickness of 350 µm to 600 µm. In some embodiments, the second adhesive layer 1134 has a thickness of 350 µm to 550 µm. In some embodiments, the second adhesive layer 1134 has a thickness of 350 µm to 500 µm. In some embodiments, the second adhesive layer 1134 has a thickness of 350 µm to 450 µm. In some embodiments, the second adhesive layer 1134 has a thickness of 350 µm to 400 µm.

In some embodiments, the second adhesive layer 1134 has a thickness of 400 µm to 900 µm. In some embodiments, the second adhesive layer 1134 has a thickness of 400 µm to 850 µm. In some embodiments, the second adhesive layer 1134 has a thickness of 400 µm to 800 µm. In some embodiments, the second adhesive layer 1134 has a thickness of 400 µm to 750 µm. In some embodiments, the second adhesive layer 1134 has a thickness of 400 µm to 700 µm. In some embodiments, the second adhesive layer 1134 has a thickness of 400 µm to 650 µm. In some embodiments, the second adhesive layer 1134 has a thickness of 400 µm to 600 µm. In some embodiments, the second adhesive layer 1134 has a thickness of 400 µm to 550 µm. In some embodiments, the second adhesive layer 1134 has a thickness of 400 µm to 500 µm. In some embodiments, the second adhesive layer 1134 has a thickness of 400 µm to 450 µm.

In some embodiments, the second adhesive layer 1134 has a thickness of 450 µm to 900 µm. In some embodiments, the second adhesive layer 1134 has a thickness of 450 µm to 850 µm. In some embodiments, the second adhesive layer 1134 has a thickness of 450 µm to 800 µm. In some embodiments, the second adhesive layer 1134 has a thickness of 450 µm to 750 µm. In some embodiments, the second adhesive layer 1134 has a thickness of 450 µm to 700 µm. In some embodiments, the second adhesive layer 1134 has a thickness of 450 µm to 650 µm. In some embodiments, the second adhesive layer 1134 has a thickness of 450 µm to 600 µm. In some embodiments, the second adhesive layer 1134 has a thickness of 450 µm to 550 µm. In some embodiments, the second adhesive layer 1134 has a thickness of 450 µm to 500 µm.

In some embodiments, the second adhesive layer 1134 has a thickness of 500 µm to 900 µm. In some embodiments, the second adhesive layer 1134 has a thickness of 500 µm to 850 µm. In some embodiments, the second adhesive layer 1134 has a thickness of 500 µm to 800 µm. In some embodiments, the second adhesive layer 1134 has a thickness of 500 µm to 750 µm. In some embodiments, the second adhesive layer 1134 has a thickness of 500 µm to 700 µm. In some embodiments, the second adhesive layer 1134 has a thickness of 500 µm to 650 µm. In some embodiments, the second adhesive layer 1134 has a thickness of 500 µm to 600 µm. In some embodiments, the second adhesive layer 1134 has a thickness of 500 µm to 550 µm.

In some embodiments, the second adhesive layer 1134 has a thickness of 550 µm to 900 µm. In some embodiments, the second adhesive layer 1134 has a thickness of 550 µm to 850 µm. In some embodiments, the second adhesive layer 1134 has a thickness of 550 µm to 800 µm. In some embodiments, the second adhesive layer 1134 has a thickness of 550 µm to 750 µm. In some embodiments, the second adhesive layer 1134 has a thickness of 550 µm to 700 µm. In some embodiments, the second adhesive layer 1134 has a thickness of 550 µm to 650 µm. In some embodiments, the second adhesive layer 1134 has a thickness of 550 µm to 600 µm.

In some embodiments, the second adhesive layer 1134 has a thickness of 600 µm to 900 µm. In some embodiments, the second adhesive layer 1134 has a thickness of 600 µm to 850 µm. In some embodiments, the second adhesive layer 1134 has a thickness of 600 µm to 800 µm. In some embodiments, the second adhesive layer 1134 has a thickness of 600 µm to 750 µm. In some embodiments, the second adhesive layer 1134 has a thickness of 600 µm to 700 µm. In some embodiments, the second adhesive layer 1134 has a thickness of 600 µm to 650 µm.

In some embodiments, the second adhesive layer 1134 has a thickness of 650 µm to 900 µm. In some embodiments, the second adhesive layer 1134 has a thickness of 650 µm to 850 µm. In some embodiments, the second adhesive layer 1134 has a thickness of 650 µm to 800 µm. In some embodiments, the second adhesive layer 1134 has a thickness of 650 µm to 750 µm. In some embodiments, the second adhesive layer 1134 has a thickness of 650 µm to 700 µm. In some embodiments, the second adhesive layer 1134 has a thickness of 700 µm to 900 µm. In some embodiments, the second adhesive layer 1134 has a thickness of 700 µm to 850 µm. In some embodiments, the second adhesive layer 1134 has a thickness of 700 µm to 800 µm. In some embodiments, the second adhesive layer 1134 has a thickness of 700 µm to 750 µm. In some embodiments, the second adhesive layer 1134 has a thickness of 750 µm to 900 µm. In some embodiments, the second adhesive layer 1134 has a thickness of 750 µm to 850 µm. In some embodiments, the second adhesive layer 1134 has a thickness of 750 µm to 800 µm. In some embodiments, the second adhesive layer 1134 has a thickness of 800 µm to 900 µm. In some embodiments, the second adhesive layer 1134 has a thickness of 800 µm to 850 µm. In some embodiments, the second adhesive layer 1134 has a thickness of 850 µm to 900 µm.

In some embodiments, the second adhesive layer 1134 has a thickness of 1 µm. In some embodiments, the second adhesive layer 1134 has a thickness of 50 µm. In some embodiments, the second adhesive layer 1134 has a thickness of 100 µm. In some embodiments, the second adhesive layer 1134 has a thickness of 150 µm. In some embodiments, the second adhesive layer 1134 has a thickness of 200 µm. In some embodiments, the second adhesive layer 1134 has a thickness of 250 µm. In some embodiments, the second adhesive layer 1134 has a thickness of 300 µm. In some embodiments, the second adhesive layer 1134 has a thickness of 350 µm. In some embodiments, the second adhesive layer 1134 has a thickness of 400 µm. In some embodiments, the second adhesive layer 1134 has a thickness of 450 µm. In some embodiments, the second adhesive layer 1134 has a thickness of 500 µm. In some embodiments, the second adhesive layer 1134 has a thickness of 550 µm. In some embodiments, the second adhesive layer 1134 has a thickness of 600 µm. In some embodiments, the second adhesive layer 1134 has a thickness of 650 µm. In some embodiments, the second adhesive layer 1134 has a thickness of 700 µm. In some embodiments, the second adhesive layer 1134 has a thickness of 750 µm. In some embodiments, the second adhesive layer 1134 has a thickness of 800 µm. In some embodiments, the second adhesive layer 1134 has a thickness of 850 µm. In some embodiments, the second adhesive layer 1134 has a thickness of 900 µm.

In some embodiments, the first layer 1130 is attached to the second layer 1132 by thermal bonding. In some embodiments, each of the plurality of photovoltaic modules 1110 is installed on the roof deck by an adhesive. In some embodiments, the adhesive is adhered directly to the roof deck. In some embodiments, the adhesive is adhered to an underlayment. In some embodiments, the underlayment is adhered directly to the roof deck. In some embodiments, the adhesive is located on a rear surface of the photovoltaic module 1110. In some embodiments, the adhesive is located on the second layer 1132 of the backsheet 1128. In some embodiments, the adhesive includes at least one adhesive strip. In some embodiments, the adhesive includes a plurality of adhesive strips. In some embodiments, the plurality of adhesive strips is arranged intermittently. In some embodiments, the adhesive is located proximate to one edge of the photovoltaic module 1110. In some embodiments, the adhesive is a peel and stick film sheet. In some embodiments, the peel and stick film sheet includes at least one sheet of film removably attached to the rear surface. In some embodiments, the peel and stick film sheet is composed of EverGuard Freedom HW peel and stick membrane manufactured by GAF. In some embodiments, the adhesive includes polyvinyl butyrate, acrylic, silicone, or polycarbonate. In some embodiments, the adhesive includes pressure sensitive adhesives. In some embodiments, the adhesive has a similar structure and location as the adhesive 60 shown in FIG. 2E.

Referring to FIGS. 44 through 49, in some embodiments, a jumper module 1210 includes an active portion 1212 having a first end 1214, a second end 1216 opposite the first end 1214, a first edge 1218 extending from the first end 1214 to the second end 1216, and a second edge 1220 opposite the first edge 1218 and extending from the first end 1214 to the second end 1216. In some embodiments, the active portion 1212 includes a first surface 1222 and a second surface 1224 opposite the first surface 1222. In some embodiments, the jumper module 1210 is configured to be installed on a roof deck. In some embodiments, the jumper module 1210 is installed on the roof deck by a plurality of fasteners. In some embodiments, the active portion 1212 includes a first zone 1226 (nail zone) that extends from the first end 1214 to the second end 1216 and from the first edge 1218 to a location intermediate the first edge 1218 and the second edge 1220. In some embodiments, the first zone 1226 is configured to receive the plurality of fasteners. In some embodiments, the plurality of fasteners is installed through the first zone 1226. In some embodiments, the plurality of fasteners includes a plurality of nails. In some embodiments, the plurality of fasteners includes a plurality of rivets. In some embodiments, the plurality of fasteners includes a plurality of staples. In some embodiments, the plurality of fasteners includes a plurality of screws.

In some embodiments, the jumper module 1210 is installed on the roof deck by an adhesive 1228. In some embodiments, the adhesive 1228 is adhered directly to the roof deck. In some embodiments, the adhesive 1228 is adhered to an underlayment. In some embodiments, the underlayment is adhered directly to the roof deck. In some embodiments, the adhesive 1228 includes at least one adhesive strip. In some embodiments, the adhesive 1228 includes a plurality of adhesive strips. In some embodiments, the adhesive 1228 is located on the second surface 1224. In some embodiments, the adhesive 1228 is located proximate to the first edge 1218. In some embodiments, the adhesive 1228 is located intermediate the first edge 1218 and the second edge 1220. In some embodiments, the adhesive 1228 is located proximate to the second edge 1220. In some embodiments, the adhesive 1228 is a peel and stick film sheet. In some embodiments, the peel and stick film sheet includes at least one sheet of film removably attached to the second surface 1224. In some embodiments, the peel and stick film sheet is composed of EverGuard Freedom HW peel and stick membrane manufactured by GAF. In some embodiments, the adhesive 1228 is covered by a release liner. In some embodiments, the release liner includes paper with a silicone coating. In some embodiments, the adhesive 1228 includes polyvinyl butyrate, butyl, acrylic, silicone, or polycarbonate. In some embodiments, the adhesive 1228 includes pressure sensitive adhesives. In some embodiments, the adhesive 1228 has a similar structure and location as the adhesive 60 shown in FIG. 2E.

Still referring to FIGS. 44 through 49, in some embodiments, the jumper module 1210 includes a first side lap 1230 located the first end 1214. In some embodiments, the jumper module 1210 includes a second side lap 1232 located at the second end 1216. In some embodiments, the first side lap 1230 includes a surface 1234. In some embodiments, the second side lap 1232 includes a surface 1236. In some embodiments, the first side lap 1230 is square in shape. In some embodiments, the first side lap 1230 is rectangular in shape. In some embodiments, the first side lap 1230 includes other suitable shapes and sizes. In some embodiments, the second side lap 1232 is square in shape. In some embodiments, the second side lap 1232 is rectangular in shape. In some embodiments, the second side lap 1232 includes other suitable shapes and sizes. In some embodiments, the first side lap 1230 is integral with the active portion 1212. In some embodiments, the first side lap 1230 is a separate component from the active portion 1212. In some embodiments, the first side lap 1230 is attached to the active portion 1212. In some embodiments, the second side lap 1232 is integral with the active portion 1212. In some embodiments, the second side lap 1232 is a separate component from the active portion 1212. In some embodiments, the second side lap 1232 is attached to the active portion 1212.

In some embodiments, the first side lap 1230 includes a first width W1. In some embodiments, the first width W1 extends from the second edge 1220 to a location intermediate the first edge 1218 and the second edge 1220. In some embodiments, the second side lap 1232 includes a second width W2. In some embodiments, the second width W2 extends from the first edge 1218 to the second edge 1220. In some embodiments, the width W1 of the first side lap 1230 is approximately half the width W2 of the second side lap 1232.

In some embodiments, the width W1 of the first side lap 1230 is 70 mm to 120 mm. In some embodiments, the width W1 of the first side lap 1230 is 70 mm to 110 mm. In some embodiments, the width W1 of the first side lap 1230 is 70 mm to 100 mm. In some embodiments, the width W1 of the first side lap 1230 is 70 mm to 90 mm. In some embodiments, the width W1 of the first side lap 1230 is 70 mm to 80 mm. In some embodiments, the width W1 of the first side lap 1230 is 80 mm to 120 mm. In some embodiments, the width W1 of the first side lap 1230 is 80 mm to 110 mm. In some embodiments, the width W1 of the first side lap 1230 is 80 mm to 100 mm. In some embodiments, the width W1 of the first side lap 1230 is 80 mm to 90 mm. In some embodiments, the width W1 of the first side lap 1230 is 90 mm to 120 mm. In some embodiments, the width W1 of the first side lap 1230 is 90 mm to 110 mm. In some embodiments, the width W1 of the first side lap 1230 is 90 mm to 100 mm. In some embodiments, the width W1 of the first side lap 1230 is 100 mm to 120 mm. In some embodiments, the width W1 of the first side lap 1230 is 100 mm to 110 mm. In some embodiments, the width W1 of the first side lap 1230 is 110 mm to 120 mm.

In some embodiments, the width W2 of the second side lap 1232 is 70 mm to 200 mm. In some embodiments, the width W2 of the second side lap 1232 is 70 mm to 190 mm. In some embodiments, the width W2 of the second side lap 1232 is 70 mm to 180 mm. In some embodiments, the width W2 of the second side lap 1232 is 70 mm to 170 mm. In some embodiments, the width W2 of the second side lap 1232 is 70 mm to 160 mm. In some embodiments, the width W2 of the second side lap 1232 is 70 mm to 150 mm. In some embodiments, the width W2 of the second side lap 1232 is 70 mm to 140 mm. In some embodiments, the width W2 of the second side lap 1232 is 70 mm to 130 mm. In some embodiments, the width W2 of the second side lap 1232 is 70 mm to 120 mm. In some embodiments, the width W2 of the second side lap 1232 is 70 mm to 110 mm. In some embodiments, the width W2 of the second side lap 1232 is 70 mm to 100 mm. In some embodiments, the width W2 of the second side lap 1232 is 70 mm to 90 mm. In some embodiments, the width W2 of the second side lap 1232 is 70 mm to 80 mm.

In some embodiments, the width W2 of the second side lap 1232 is 80 mm to 200 mm. In some embodiments, the width W2 of the second side lap 1232 is 80 mm to 190 mm. In some embodiments, the width W2 of the second side lap 1232 is 80 mm to 180 mm. In some embodiments, the width W2 of the second side lap 1232 is 80 mm to 170 mm. In some embodiments, the width W2 of the second side lap 1232 is 80 mm to 160 mm. In some embodiments, the width W2 of the second side lap 1232 is 80 mm to 150 mm. In some embodiments, the width W2 of the second side lap 1232 is 80 mm to 140 mm. In some embodiments, the width W2 of the second side lap 1232 is 80 mm to 130 mm. In some embodiments, the width W2 of the second side lap 1232 is 80 mm to 120 mm. In some embodiments, the width W2 of the second side lap 1232 is 80 mm to 110 mm. In some embodiments, the width W2 of the second side lap 1232 is 80 mm to 100 mm. In some embodiments, the width W2 of the second side lap 1232 is 80 mm to 90 mm.

In some embodiments, the width W2 of the second side lap 1232 is 90 mm to 200 mm. In some embodiments, the width W2 of the second side lap 1232 is 90 mm to 190 mm. In some embodiments, the width W2 of the second side lap 1232 is 90 mm to 180 mm. In some embodiments, the width W2 of the second side lap 1232 is 90 mm to 170 mm. In some embodiments, the width W2 of the second side lap 1232 is 90 mm to 160 mm. In some embodiments, the width W2 of the second side lap 1232 is 90 mm to 150 mm. In some embodiments, the width W2 of the second side lap 1232 is 90 mm to 140 mm. In some embodiments, the width W2 of the second side lap 1232 is 90 mm to 130 mm. In some embodiments, the width W2 of the second side lap 1232 is 90 mm to 120 mm. In some embodiments, the width W2 of the second side lap 1232 is 90 mm to 110 mm. In some embodiments, the width W2 of the second side lap 1232 is 90 mm to 100 mm.

In some embodiments, the width W2 of the second side lap 1232 is 100 mm to 200 mm. In some embodiments, the width W2 of the second side lap 1232 is 100 mm to 190 mm. In some embodiments, the width W2 of the second side lap 1232 is 100 mm to 180 mm. In some embodiments, the width W2 of the second side lap 1232 is 100 mm to 170 mm. In some embodiments, the width W2 of the second side lap 1232 is 100 mm to 160 mm. In some embodiments, the width W2 of the second side lap 1232 is 100 mm to 150 mm. In some embodiments, the width W2 of the second side lap 1232 is 100 mm to 140 mm. In some embodiments, the width W2 of the second side lap 1232 is 100 mm to 130 mm. In some embodiments, the width W2 of the second side lap 1232 is 100 mm to 120 mm. In some embodiments, the width W2 of the second side lap 1232 is 100 mm to 110 mm.

In some embodiments, the width W2 of the second side lap 1232 is 110 mm to 200 mm. In some embodiments, the width W2 of the second side lap 1232 is 110 mm to 190 mm. In some embodiments, the width W2 of the second side lap 1232 is 110 mm to 180 mm. In some embodiments, the width W2 of the second side lap 1232 is 110 mm to 170 mm. In some embodiments, the width W2 of the second side lap 1232 is 110 mm to 160 mm. In some embodiments, the width W2 of the second side lap 1232 is 110 mm to 150 mm. In some embodiments, the width W2 of the second side lap 1232 is 110 mm to 140 mm. In some embodiments, the width W2 of the second side lap 1232 is 110 mm to 130 mm. In some embodiments, the width W2 of the second side lap 1232 is 110 mm to 120 mm.

In some embodiments, the width W2 of the second side lap 1232 is 120 mm to 200 mm. In some embodiments, the width W2 of the second side lap 1232 is 120 mm to 190 mm. In some embodiments, the width W2 of the second side lap 1232 is 120 mm to 180 mm. In some embodiments, the width W2 of the second side lap 1232 is 120 mm to 170 mm. In some embodiments, the width W2 of the second side lap 1232 is 120 mm to 160 mm. In some embodiments, the width W2 of the second side lap 1232 is 120 mm to 150 mm. In some embodiments, the width W2 of the second side lap 1232 is 120 mm to 140 mm. In some embodiments, the width W2 of the second side lap 1232 is 120 mm to 130 mm.

In some embodiments, the width W2 of the second side lap 1232 is 130 mm to 200 mm. In some embodiments, the width W2 of the second side lap 1232 is 130 mm to 190 mm. In some embodiments, the width W2 of the second side lap 1232 is 130 mm to 180 mm. In some embodiments, the width W2 of the second side lap 1232 is 130 mm to 170 mm. In some embodiments, the width W2 of the second side lap 1232 is 130 mm to 160 mm. In some embodiments, the width W2 of the second side lap 1232 is 130 mm to 150 mm. In some embodiments, the width W2 of the second side lap 1232 is 130 mm to 140 mm.

In some embodiments, the width W2 of the second side lap 1232 is 140 mm to 200 mm. In some embodiments, the width W2 of the second side lap 1232 is 140 mm to 190 mm. In some embodiments, the width W2 of the second side lap 1232 is 140 mm to 180 mm. In some embodiments, the width W2 of the second side lap 1232 is 140 mm to 170 mm. In some embodiments, the width W2 of the second side lap 1232 is 140 mm to 160 mm. In some embodiments, the width W2 of the second side lap 1232 is 140 mm to 150 mm. In some embodiments, the width W2 of the second side lap 1232 is 150 mm to 200 mm. In some embodiments, the width W2 of the second side lap 1232 is 150 mm to 190 mm. In some embodiments, the width W2 of the second side lap 1232 is 150 mm to 180 mm. In some embodiments, the width W2 of the second side lap 1232 is 150 mm to 170 mm. In some embodiments, the width W2 of the second side lap 1232 is 150 mm to 160 mm.

In some embodiments, the width W2 of the second side lap 1232 is 160 mm to 200 mm. In some embodiments, the width W2 of the second side lap 1232 is 160 mm to 190 mm. In some embodiments, the width W2 of the second side lap 1232 is 160 mm to 180 mm. In some embodiments, the width W2 of the second side lap 1232 is 160 mm to 170 mm. In some embodiments, the width W2 of the second side lap 1232 is 170 mm to 200 mm. In some embodiments, the width W2 of the second side lap 1232 is 170 mm to 190 mm. In some embodiments, the width W2 of the second side lap 1232 is 170 mm to 180 mm. In some embodiments, the width W2 of the second side lap 1232 is 180 mm to 200 mm. In some embodiments, the width W2 of the second side lap 1232 is 180 mm to 190 mm. In some embodiments, the width W2 of the second side lap 1232 is 190 mm to 200 mm.

In some embodiments, the jumper module 1210 includes a first junction box 1238. In some embodiments, the first junction box 1238 is located on the surface 1234 of the first side lap 1230. In some embodiments, the first junction box 1238 is attached to the surface 1234 by an adhesive. In some embodiments, the first junction box 1238 is encapsulated by the first side lap 1230. In some embodiments, the jumper module 1210 includes a second junction box 1240. In some embodiments, the second junction box 1240 is located on the surface 1236 of the second side lap 1232. In some embodiments, the second junction box 1240 is attached to the surface 1236 by an adhesive. In some embodiments, the second junction box 1240 is encapsulated by the second side lap 1232. In certain embodiments, other electronic and electrical components may be attached to the first side lap 1230 and/or the second side lap 1232. In some embodiments, non-limiting examples of such electronic and electrical components include an electrical connector, a rapid shutdown device, an optimizer, and an inverter. In some embodiments, the electrical connector includes a flat wire connector.

Figure 48:
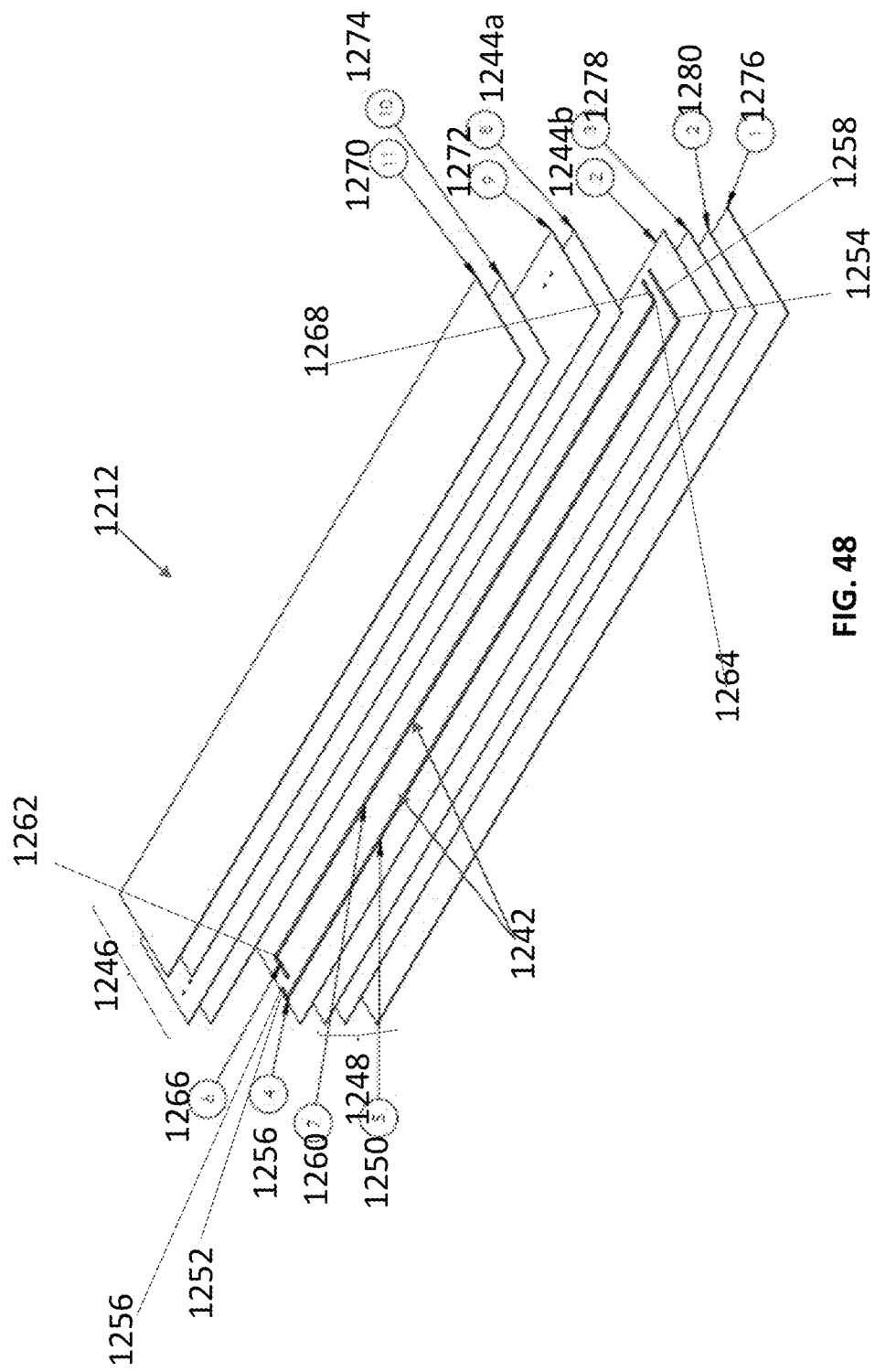
FIG. 48 is an exploded, top perspective view of an active portion of the jumper module shown in FIG. 44.
Figure 49:
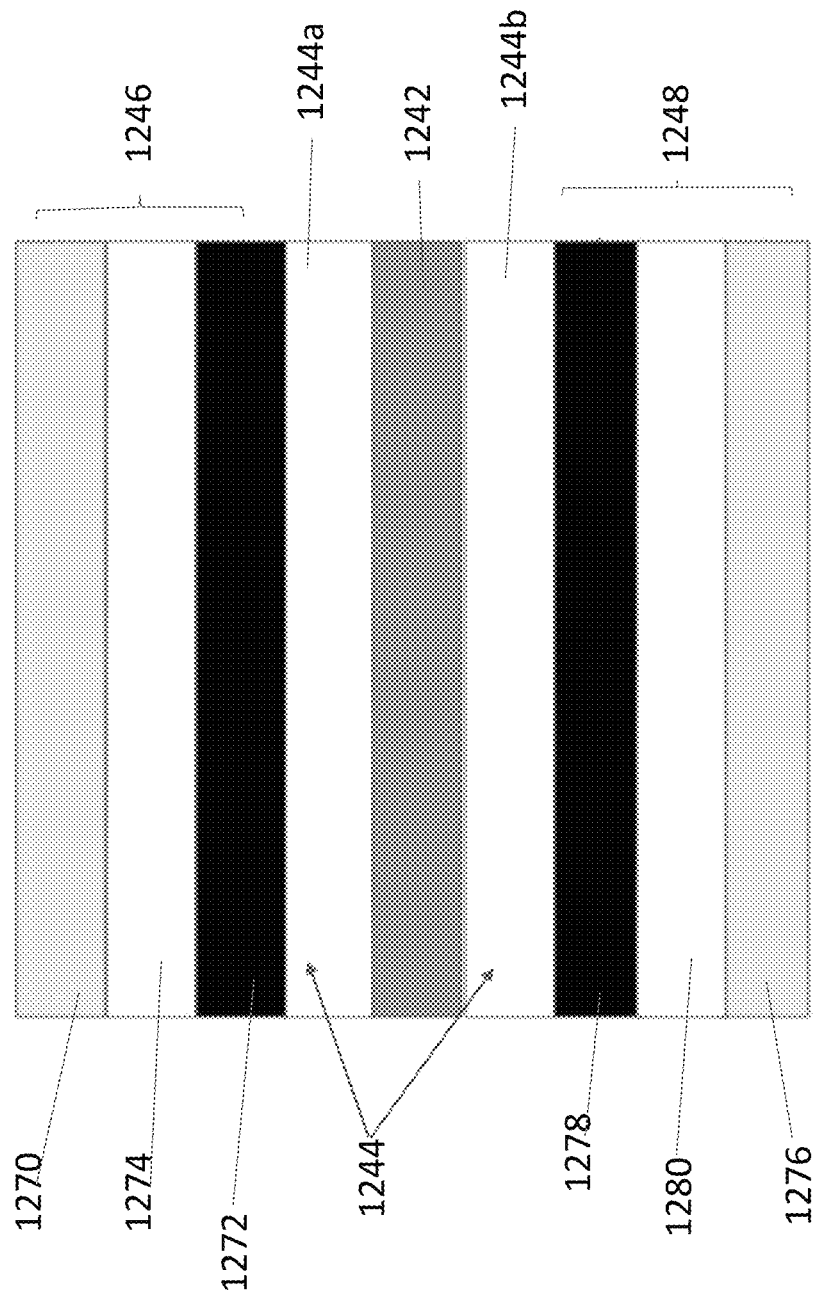
FIG. 49 is schematic view of the active portion of the jumper module shown in FIG. 44.

Referring to FIGS. 48 and 49, in some embodiments, the active portion 1212 is a laminated structure. In some embodiments, the active portion 1212 includes electrical bussing 1242, an encapsulant 1244 encapsulating the electrical bussing 1242, a frontsheet 1246 juxtaposed with the encapsulant 1244, and a backsheet 1248 juxtaposed with the encapsulant 1244. As used herein, the terms "encapsulating" and "encapsulates" mean to partially or fully envelope or enclose, and with respect to certain embodiments of the jumper module 1210, the electrical bussing 1242 is fully enveloped by or enclosed within the encapsulant 1244, or partially enveloped by or enclosed within the encapsulant 1244. In some embodiments, the encapsulant 1244 includes a first layer 1244a and a second layer 1244b. In some embodiments, the encapsulant 1244 includes a structure and/or materials that is similar to the encapsulant 1114.

In some embodiments, the electrical bussing 1242 includes a first bus ribbon 1250 extending from a first end 1252 proximate to the first end 1214 and a second end 1254 proximate to the second end 1216. In some embodiments, the first bus ribbon 1250 includes a first terminal 1256 located at the first end 1252 and a second terminal 1258 located at the second end 1254. In some embodiments, the first terminal 1256 is a positive terminal, while the second terminal 1258 is a negative terminal. In some embodiments, the first terminal 1256 is a negative terminal, while the second terminal 1258 is a positive terminal.

In some embodiments, the electrical bussing 1242 includes a second bus ribbon 1260 extending from a first end 1262 proximate to the first end 1214 and a second end 1264 proximate to the second end 1216. In some embodiments, the second bus ribbon 1260 includes a first terminal 1266 located at the first end 1262 and a second terminal 1268 located at the second end 1264. In some embodiments, the first terminal 1266 is a negative terminal, while the second terminal 1268 is a positive terminal. In some embodiments, the first terminal 1266 is a positive terminal, while the second terminal 1268 is a negative terminal.

In some embodiments, the encapsulant 1244 may be composed of polyolefins, ethyl vinyl acetates, ionomers, silicones, poly vinyl butyral, epoxies, polyurethanes, or combinations/hybrids thereof. In some embodiments, the encapsulant 1244 is composed of thermosetting polyolefin.

In some embodiments, the encapsulant 1244 has a thickness of 0.4 mm to 1.8 mm. In some embodiments, the encapsulant 1244 has a thickness similar to those of the encapsulant 1114 of the photovoltaic module 1110 described above. In some embodiments, the first layer 1244a of the encapsulant 1244 has a thickness of 0.2 mm to 0.9 mm. In some embodiments, the first layer 1244a of the encapsulant 1244 has a thickness similar to those of the first layer 1114a of the encapsulant 1114 described above. In some embodiments, the second layer 1244b of the encapsulant 1244 has a thickness of 0.2 mm to 0.9 mm. In some embodiments, the second layer 1244b of the encapsulant 1244 has a thickness similar to those of the second layer 1114b of the encapsulant 1114 described above. In some embodiments, the thickness of the first layer 1244a is equal to the thickness of the second layer 1244b. In some embodiments, the thickness of the first layer 1244a is different from the thickness of the second layer 1244b.

In some embodiments, the first layer 1244a is white in color. In some embodiments, the second layer 1244b is white in color.

In some embodiments, the frontsheet 1246 includes an upper layer 1270 and a polymer layer 1272 attached to the upper layer 1270. In some embodiments, the frontsheet 1246 is juxtaposed with the first layer 1244a of the encapsulant 1244. In some embodiments, the polymer layer 1272 is attached to the upper layer 1270 by an adhesive layer 1274. In some embodiments, the adhesive layer 1274 may include polyvinyl butyrate, acrylic, silicone, or polycarbonate. In some embodiments, the adhesive layer 1274 may include pressure sensitive adhesives. In some embodiments, the polymer layer 1272 is attached to the upper layer 1270 by thermal bonding. In some embodiments, the frontsheet 1246 includes at least one of the upper layer 1270 or the polymer layer 1272. In some embodiments, the upper layer 1270 is an upper, sun facing-side surface of the jumper module 1210.

In some embodiments, the upper layer 1270 is composed of thermoplastic polyolefin (TPO). In some embodiments, the upper layer 1270 includes a single ply TPO roofing membrane. In some embodiments, the upper layer 1270 is colored black. In some embodiments, non-limiting examples of TPO membranes are disclosed in U.S. Pat. No. 9,359,014 to Yang et al., which is incorporated by reference herein in its entirety.

In some embodiments, the upper layer 1270 is composed of polyvinyl chloride (PVC). In some embodiments, the upper layer 1270 is composed of ethylene propylene diene monomer (EPDM) rubber. In some embodiments, the upper layer 1270 includes a flame retardant additive. In some embodiments, the flame retardant additive may be clays, nanoclays, silicas, carbon black, metal hydroxides such as aluminum hydroxide, metal foils, graphite, and combinations thereof. In some embodiments, the upper layer 1270 is white in color.

In some embodiments, the upper layer 1270 has a thickness of 2.5 mm to 4 mm. In some embodiments, the upper layer 1270 has a thickness of 2.5 mm to 3.5 mm. In some embodiments, the upper layer 1270 has a thickness of 2.5 mm to 3 mm. In some embodiments, the upper layer 1270 has a thickness of 3 mm to 4 mm. In some embodiments, the upper layer 1270 has a thickness of 3 mm to 3.5 mm. In some embodiments, the upper layer 1270 has a thickness of 3.5 mm to 4 mm. In some embodiments, the upper layer 1270 has a thickness of 2.5 mm. In some embodiments, the upper layer 1270 has a thickness of 2.6 mm. In some embodiments, the upper layer 1270 has a thickness of 2.7 mm. In some embodiments, the upper layer 1270 has a thickness of 2.8 mm. In some embodiments, the upper layer 1270 has a thickness of 2.9 mm. In some embodiments, the upper layer 1270 has a thickness of 3 mm. In some embodiments, the upper layer 1270 has a thickness of 3.1 mm. In some embodiments, the upper layer 1270 has a thickness of 3.2 mm. In some embodiments, the upper layer 1270 has a thickness of 3.3 mm. In some embodiments, the upper layer 1270 has a thickness of 3.4 mm. In some embodiments, the upper layer 1270 has a thickness of 3.5 mm. In some embodiments, the upper layer 1270 has a thickness of 3.6 mm. In some embodiments, the upper layer 1270 has a thickness of 3.7 mm. In some embodiments, the upper layer 1270 has a thickness of 3.8 mm. In some embodiments, the upper layer 1270 has a thickness of 3.9 mm. In some embodiments, the upper layer 1270 has a thickness of 4 mm.

In some embodiments, the adhesive layer 1274 is composed of thermosetting polyolefin, thermosetting polyolefin encapsulant material, thermosetting ethylene-vinyl acetate (EVA), EVA encapsulants, thermoplastic olefin, thermoplastic polyolefin (TPO) or hybrids/combinations thereof. In some embodiments, the adhesive layer 1274 is white in color.

In some embodiments, the adhesive layer 1274 has a thickness of 1 μm to 900 μm. In some embodiments, the adhesive layer 1274 has a thickness similar to those of the first adhesive layer 1126 of the photovoltaic module 1110 described above. In some embodiments, the adhesive layer 1274 has a structure and/or is composed of materials similar to the first adhesive layer 1126.

In some embodiments, the polymer layer 1272 is composed of a fluoropolymer. In certain embodiments, the fluoropolymer may be ethylene tetrafluoroethylene (ETFE), fluoropolymer is polyvinylidene fluoride (PVDF), tetrafluoroethylene-hexafluoropropylene copolymers (FEP), and tetrafluoroethylene-hexafluoropropylene-vinylidene fluoride copolymers (THV), polyvinyl fluoride (PVF), or blends thereof. In some embodiments, the frontsheet is composed of fluoropolymers, acrylics, polyesters, silicones, polycarbonates, or combinations thereof. In some embodiments, the polymer layer 1272 is composed of polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), polyphenylsulfone (PPSU), polyolefin, cyclic olefin copolymers (CPCs), or polyimide. In some embodiments, the polymer layer 1272 is composed of a crosslinked polymeric material. In some embodiments, 50% to 99% of the polymer chains of the polymeric material are crosslinked. In some embodiments, the polymer layer 1272 is white in color.

In some embodiments, the polymer layer 1272 has a thickness of 0.01 mm to 0.5 mm. In some embodiments, the polymer layer 1272 has a thickness of 0.01 mm to 0.4 mm. In some embodiments, the polymer layer 1272 has a thickness of 0.01 mm to 0.3 mm. In some embodiments, the polymer layer 1272 has a thickness of 0.01 mm to 0.2 mm. In some embodiments, the polymer layer 1272 has a thickness of 0.01 mm to 0.1 mm. In some embodiments, the polymer layer 1272 has a thickness of 0.01 mm to 0.09 mm. In some embodiments, the polymer layer 1272 has a thickness of 0.01 mm to 0.08 mm. In some embodiments, the polymer layer 1272 has a thickness of 0.01 mm to 0.07 mm. In some embodiments, the polymer layer 1272 has a thickness of 0.01 mm to 0.06 mm. In some embodiments, the polymer layer 1272 has a thickness of 0.01 mm to 0.05 mm. In some embodiments, the polymer layer 1272 has a thickness of 0.01 mm to 0.04 mm. In some embodiments, the polymer layer 1272 has a thickness of 0.01 mm to 0.03 mm. In some embodiments, the polymer layer 1272 has a thickness of 0.01 mm to 0.02 mm.

In some embodiments, the polymer layer 1272 has a thickness of 0.01 mm to 0.4 mm. In some embodiments, the polymer layer 1272 has a thickness of 0.02 mm to 0.4 mm. In some embodiments, the polymer layer 1272 has a thickness of 0.03 mm to 0.4 mm. In some embodiments, the polymer layer 1272 has a thickness of 0.04 mm to 0.4 mm. In some embodiments, the polymer layer 1272 has a thickness of 0.05 mm to 0.4 mm. In some embodiments, the polymer layer 1272 has a thickness of 0.06 mm to 0.4 mm. In some embodiments, the polymer layer 1272 has a thickness of 0.07 mm to 0.4 mm. In some embodiments, the polymer layer 1272 has a thickness of 0.08 mm to 0.4 mm. In some embodiments, the polymer layer 1272 has a thickness of 0.09 mm to 0.4 mm. In some embodiments, the polymer layer 1272 has a thickness of 0.1 mm to 0.4 mm. In some embodiments, the polymer layer 1272 has a thickness of 0.15 mm to 0.4 mm. In some embodiments, the polymer layer 1272 has a thickness of 0.2 mm to 0.4 mm. In some embodiments, the polymer layer 1272 has a thickness of 0.25 mm to 0.4 mm. In some embodiments, the polymer layer 1272 has a thickness of 0.3 mm to 0.4 mm. In some embodiments, the polymer layer 1272 has a thickness of 0.35 mm to 0.4 mm.

In some embodiments, the polymer layer 1272 has a thickness of 0.025 mm to 0.1 mm. In some embodiments, the polymer layer 1272 has a thickness of 0.03 mm to 0.1 mm. In some embodiments, the polymer layer 1272 has a thickness of 0.035 mm to 0.1 mm. In some embodiments, the polymer layer 1272 has a thickness of 0.04 mm to 0.1 mm. In some embodiments, the polymer layer 1272 has a thickness of 0.045 mm to 0.1 mm. In some embodiments, the polymer layer 1272 has a thickness of 0.05 mm to 0.1 mm. In some embodiments, the polymer layer 1272 has a thickness of 0.06 mm to 0.1 mm. In some embodiments, the polymer layer 1272 has a thickness of 0.065 mm to 0.1 mm. In some embodiments, the polymer layer 1272 has a thickness of 0.07 mm to 0.1 mm. In some embodiments, the polymer layer 1272 has a thickness of 0.075 mm to 0.1 mm. In some embodiments, the polymer layer 1272 has a thickness of 0.08 mm to 0.1 mm. In some embodiments, the polymer layer 1272 has a thickness of 0.085 mm to 0.1 mm. In some embodiments, the polymer layer 1272 has a thickness of 0.09 mm to 0.1 mm. In some embodiments, the polymer layer 1272 has a thickness of 0.095 mm to 0.1 mm.

In some embodiments, the polymer layer 1272 has a thickness of 0.01 mm. In some embodiments, the polymer layer 1272 has a thickness of 0.02 mm. In some embodiments, the polymer layer 1272 has a thickness of 0.03 mm. In some embodiments, the polymer layer 1272 has a thickness of 0.04 mm. In some embodiments, the polymer layer 1272 has a thickness of 0.05 mm. In some embodiments, the polymer layer 1272 has a thickness of 0.06 mm. In some embodiments, the polymer layer 1272 has a thickness of 0.07 mm. In some embodiments, the polymer layer 1272 has a thickness of 0.08 mm. In some embodiments, the polymer layer 1272 has a thickness of 0.09 mm. In some embodiments, the polymer layer 1272 has a thickness of 0.1 mm. In some embodiments, the polymer layer 1272 has a thickness of 0.2 mm. In some embodiments, the polymer layer 1272 has a thickness of 0.3 mm. In some embodiments, the polymer layer 1272 has a thickness of 0.4 mm. In some embodiments, the polymer layer 1272 has a thickness of 0.5 mm.

In some embodiments, the backsheet 1248 includes a lower layer 1276. In some embodiments, the backsheet 1248 includes a polymer layer 1278. In some embodiments, the lower layer 1276 and the polymer layer 1278 are attached to one another by an adhesive layer 1280. In some embodiments, the adhesive layer 1280 may include polyvinyl butyrate, acrylic, silicone, or polycarbonate. In some embodiments, the adhesive layer 1280 may include pressure sensitive adhesives. In some embodiments, the adhesive layer 1280 is composed of thermosetting polyolefin, thermosetting polyolefin encapsulant material, thermosetting ethylene-vinyl acetate (EVA), EVA encapsulants, thermoplastic olefin, thermoplastic polyolefin (TPO) or hybrids/combinations thereof. In some embodiments, the adhesive layer 1280 is white in color. In some embodiments, the lower layer 1276 is attached to the polymer layer 1278 by thermal bonding. In some embodiments, the backsheet 1248 includes at least one of the lower layer 1276 or the polymer layer 1278. In some embodiments, the lower layer 1276 is a lower surface of the jumper module 1210 configured to face a roof deck on which the jumper module 1210 is installed.

In some embodiments, the lower layer 1276 is composed of thermoplastic polyolefin (TPO). In some embodiments, the lower layer 1276 includes a single ply TPO roofing membrane. In some embodiments, the lower layer 1276 is colored black. In some embodiments, non-limiting examples of TPO membranes are disclosed in U.S. Pat. No. 9,359,014 to Yang et al., which is incorporated by reference herein in its entirety.

In some embodiments, the lower layer 1276 is composed of polyvinyl chloride. In some embodiments, the lower layer 1276 is composed of ethylene propylene diene monomer (EPDM) rubber. In some embodiments, the lower layer 1276 includes a flame retardant additive. In some embodiments, the flame retardant additive may be clays, nanoclays, silicas, carbon black, metal hydroxides such as aluminum hydroxide, metal foils, graphite, and combinations thereof. In some embodiments, the lower layer 1276 is white in color.

In some embodiments, the lower layer 1276 has a thickness of 2.5 mm to 4 mm. In some embodiments, the lower layer 1276 has a thickness of 2.5 mm to 3.5 mm. In some embodiments, the lower layer 1276 has a thickness of 2.5 mm to 3 mm. In some embodiments, the lower layer 1276 has a thickness of 3 mm to 4 mm. In some embodiments, the lower layer 1276 has a thickness of 3 mm to 3.5 mm. In some embodiments, the lower layer 1276 has a thickness of 3.5 mm to 4 mm.

In some embodiments, the lower layer 1276 has a thickness of 2.5 mm. In some embodiments, the lower layer 1276 has a thickness of 2.6 mm. In some embodiments, the lower layer 1276 has a thickness of 2.7 mm. In some embodiments, the lower layer 1276 has a thickness of 2.8 mm. In some embodiments, the lower layer 1276 has a thickness of 2.9 mm. In some embodiments, the lower layer 1276 has a thickness of 3 mm. In some embodiments, the lower layer 1276 has a thickness of 3.1 mm. In some embodiments, the lower layer 1276 has a thickness of 3.2 mm. In some embodiments, the lower layer 1276 has a thickness of 3.3 mm. In some embodiments, the lower layer 1276 has a thickness of 3.4 mm. In some embodiments, the lower layer 1276 has a thickness of 3.5 mm. In some embodiments, the lower layer 1276 has a thickness of 3.6 mm. In some embodiments, the lower layer 1276 has a thickness of 3.7 mm. In some embodiments, the lower layer 1276 has a thickness of 3.8 mm. In some embodiments, the lower layer 1276 has a thickness of 3.9 mm. In some embodiments, the lower layer 1276 has a thickness of 4 mm.

In some embodiments, the polymer layer 1278 is composed of a fluoropolymer. In certain embodiments, the fluoropolymer may be ethylene tetrafluoroethylene (ETFE), fluoropolymer is polyvinylidene fluoride (PVDF), tetrafluoroethylene-hexafluoropropylene copolymers (FEP), and tetrafluoroethylene-hexafluoropropylene-vinylidene fluoride copolymers (THV), polyvinyl fluoride (PVF), or blends thereof. In some embodiments, the frontsheet is composed of fluoropolymers, acrylics, polyesters, silicones, polycarbonates, or combinations thereof. In some embodiments, the polymer layer 1278 is composed of polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), polyphenylsulfone (PPSU), polyolefin, cyclic olefin copolymers (CPCs), or polyimide. In some embodiments, the polymer layer 1278 is composed of a crosslinked polymeric material. In some embodiments, 50% to 99% of the polymer chains of the polymeric material are crosslinked. In some embodiments, the polymer layer 1278 is white in color.

In some embodiments, the polymer layer 1278 has a thickness of 0.01 mm to 0.5 mm. In some embodiments, the polymer layer 1278 has a thickness of 0.01 mm to 0.4 mm. In some embodiments, the polymer layer 1278 has a thickness of 0.01 mm to 0.3 mm. In some embodiments, the polymer layer 1278 has a thickness of 0.01 mm to 0.2 mm. In some embodiments, the polymer layer 1278 has a thickness of 0.01 mm to 0.1 mm. In some embodiments, the polymer layer 1278 has a thickness of 0.01 mm to 0.09 mm. In some embodiments, the polymer layer 1278 has a thickness of 0.01 mm to 0.08 mm. In some embodiments, the polymer layer 1278 has a thickness of 0.01 mm to 0.07 mm. In some embodiments, the polymer layer 1278 has a thickness of 0.01 mm to 0.06 mm. In some embodiments, the polymer layer 1278 has a thickness of 0.01 mm to 0.05 mm. In some embodiments, the polymer layer 1278 has a thickness of 0.01 mm to 0.04 mm. In some embodiments, the polymer layer 1278 has a thickness of 0.01 mm to 0.03 mm. In some embodiments, the polymer layer 1278 has a thickness of 0.01 mm to 0.02 mm.

In some embodiments, the polymer layer 1278 has a thickness of 0.01 mm to 0.4 mm. In some embodiments, the polymer layer 1278 has a thickness of 0.02 mm to 0.4 mm. In some embodiments, the polymer layer 1278 has a thickness of 0.03 mm to 0.4 mm. In some embodiments, the polymer layer 1278 has a thickness of 0.04 mm to 0.4 mm. In some embodiments, the polymer layer 1278 has a thickness of 0.05 mm to 0.4 mm. In some embodiments, the polymer layer 1278 has a thickness of 0.06 mm to 0.4 mm. In some embodiments, the polymer layer 1278 has a thickness of 0.07 mm to 0.4 mm. In some embodiments, the polymer layer 1278 has a thickness of 0.08 mm to 0.4 mm. In some embodiments, the polymer layer 1278 has a thickness of 0.09 mm to 0.4 mm. In some embodiments, the polymer layer 1278 has a thickness of 0.1 mm to 0.4 mm. In some embodiments, the polymer layer 1278 has a thickness of 0.15 mm to 0.4 mm. In some embodiments, the polymer layer 1278 has a thickness of 0.2 mm to 0.4 mm. In some embodiments, the polymer layer 1278 has a thickness of 0.25 mm to 0.4 mm. In some embodiments, the polymer layer 1278 has a thickness of 0.3 mm to 0.4 mm. In some embodiments, the polymer layer 1278 has a thickness of 0.35 mm to 0.4 mm.

In some embodiments, the polymer layer 1278 has a thickness of 0.025 mm to 0.1 mm. In some embodiments, the polymer layer 1278 has a thickness of 0.03 mm to 0.1 mm. In some embodiments, the polymer layer 1278 has a thickness of 0.035 mm to 0.1 mm. In some embodiments, the polymer layer 1278 has a thickness of 0.04 mm to 0.1 mm. In some embodiments, the polymer layer 1278 has a thickness of 0.045 mm to 0.1 mm. In some embodiments, the polymer layer 1278 has a thickness of 0.05 mm to 0.1 mm. In some embodiments, the polymer layer 1278 has a thickness of 0.06 mm to 0.1 mm. In some embodiments, the polymer layer 1278 has a thickness of 0.065 mm to 0.1 mm. In some embodiments, the polymer layer 1278 has a thickness of 0.07 mm to 0.1 mm. In some embodiments, the polymer layer 1278 has a thickness of 0.075 mm to 0.1 mm. In some embodiments, the polymer layer 1278 has a thickness of 0.08 mm to 0.1 mm. In some embodiments, the polymer layer 1278 has a thickness of 0.085 mm to 0.1 mm. In some embodiments, the polymer layer 1278 has a thickness of 0.09 mm to 0.1 mm. In some embodiments, the polymer layer 1278 has a thickness of 0.095 mm to 0.1 mm.

In some embodiments, the polymer layer 1278 has a thickness of 0.01 mm. In some embodiments, the polymer layer 1278 has a thickness of 0.02 mm. In some embodiments, the polymer layer 1278 has a thickness of 0.03 mm. In some embodiments, the polymer layer 1278 has a thickness of 0.04 mm. In some embodiments, the polymer layer 1278 has a thickness of 0.05 mm. In some embodiments, the polymer layer 1278 has a thickness of 0.06 mm. In some embodiments, the polymer layer 1278 has a thickness of 0.07 mm. In some embodiments, the polymer layer 1278 has a thickness of 0.08 mm. In some embodiments, the polymer layer 1278 has a thickness of 0.09 mm. In some embodiments, the polymer layer 1278 has a thickness of 0.1 mm. In some embodiments, the polymer layer 1278 has a thickness of 0.2 mm. In some embodiments, the polymer layer 12782 has a thickness of 0.3 mm. In some embodiments, the polymer layer 1278 has a thickness of 0.4 mm. In some embodiments, the polymer layer 1278 has a thickness of 0.5 mm.

In some embodiments, the adhesive layer 1280 has a thickness of 1 μm to 900 μm. In some embodiments, the adhesive layer 1280 has a thickness similar to those of the second adhesive layer 1134 described above.

In some embodiments, the jumper module 1210 has a thickness of 1 mm to 10 mm. In some embodiments, the jumper module 1210 has a thickness of 1 mm to 9 mm. In some embodiments, the jumper module 1210 has a thickness of 1 mm to 8 mm. In some embodiments, the jumper module 1210 has a thickness of 1 mm to 7 mm. In some embodiments, the jumper module 1210 has a thickness of 1 mm to 6 mm. In some embodiments, the jumper module 1210 has a thickness of 1 mm to 5 mm. In some embodiments, the jumper module 1210 has a thickness of 1 mm to 4 mm. In some embodiments, the jumper module 1210 has a thickness of 1 mm to 3 mm. In some embodiments, the jumper module 1210 has a thickness of 1 mm to 2 mm.

In some embodiments, the jumper module 1210 has a thickness of 2 mm to 10 mm. In some embodiments, the jumper module 1210 has a thickness of 2 mm to 9 mm. In some embodiments, the jumper module 1210 has a thickness of 2 mm to 8 mm. In some embodiments, the jumper module 1210 has a thickness of 2 mm to 7 mm. In some embodiments, the jumper module 1210 has a thickness of 2 mm to 6 mm. In some embodiments, the jumper module 1210 has a thickness of 2 mm to 5 mm. In some embodiments, the jumper module 1210 has a thickness of 2 mm to 4 mm. In some embodiments, the jumper module 1210 has a thickness of 2 mm to 3 mm.

In some embodiments, the jumper module 1210 has a thickness of 3 mm to 10 mm. In some embodiments, the jumper module 1210 has a thickness of 3 mm to 9 mm. In some embodiments, the jumper module 1210 has a thickness of 3 mm to 8 mm. In some embodiments, the jumper module 1210 has a thickness of 3 mm to 7 mm. In some embodiments, the jumper module 1210 has a thickness of 3 mm to 6 mm. In some embodiments, the jumper module 1210 has a thickness of 3 mm to 5 mm. In some embodiments, the jumper module 1210 has a thickness of 3 mm to 4 mm.

In some embodiments, the jumper module 1210 has a thickness of 4 mm to 10 mm. In some embodiments, the jumper module 1210 has a thickness of 4 mm to 9 mm. In some embodiments, the jumper module 1210 has a thickness of 4 mm to 8 mm. In some embodiments, the jumper module 1210 has a thickness of 4 mm to 7 mm. In some embodiments, the jumper module 1210 has a thickness of 4 mm to 6 mm. In some embodiments, the jumper module 1210 has a thickness of 4 mm to 5 mm. In some embodiments, the jumper module 1210 has a thickness of 5 mm to 10 mm. In some embodiments, the jumper module 1210 has a thickness of 5 mm to 9 mm. In some embodiments, the jumper module 1210 has a thickness of 5 mm to 8 mm. In some embodiments, the jumper module 1210 has a thickness of 5 mm to 7 mm. In some embodiments, the jumper module 1210 has a thickness of 5 mm to 6 mm.

In some embodiments, the jumper module 1210 has a thickness of 6 mm to 10 mm. In some embodiments, the jumper module 1210 has a thickness of 6 mm to 9 mm. In some embodiments, the jumper module 1210 has a thickness of 6 mm to 8 mm. In some embodiments, the jumper module 1210 has a thickness of 6 mm to 7 mm. In some embodiments, the jumper module 1210 has a thickness of 7 mm to 10 mm. In some embodiments, the jumper module 1210 has a thickness of 7 mm to 9 mm. In some embodiments, the jumper module 1210 has a thickness of 7 mm to 8 mm. In some embodiments, the jumper module 1210 has a thickness of 8 mm to 10 mm. In some embodiments, the jumper module 1210 has a thickness of 8 mm to 9 mm. In some embodiments, the jumper module 1210 has a thickness of 9 mm to 10 mm.

In some embodiments, the jumper module 1210 has a thickness of 1 mm. In some embodiments, the jumper module 1210 has a thickness of 2 mm. In some embodiments, the jumper module 1210 has a thickness of 3 mm. In some embodiments, the jumper module 1210 has a thickness of 4 mm. In some embodiments, the jumper module 1210 has a thickness of 5 mm. In some embodiments, the jumper module 1210 has a thickness of 6 mm. In some embodiments, the jumper module 1210 has a thickness of 7 mm. In some embodiments, the jumper module 1210 has a thickness of 8 mm. In some embodiments, the jumper module 1210 has a thickness of 9 mm. In some embodiments, the jumper module 1210 has a thickness of 10 mm.

In some embodiments, the jumper module 1210 is moisture resistant. As used herein, the term "moisture resistant" means having a water transmission rate of less than or equal to 0.05 U.S. perms, as measured by ASTM E 96, Procedure B—Standard Test Methods for Water Vapor Transmission of Materials. In some embodiments, the jumper module 1210 withstands walking loads/step resistance that conforms to standards under UL 3741 test standards (UL Standard for Safety Photovoltaic Hazard Control). In some embodiments, the jumper module 1210 includes an axe impact resistance that conforms to standards under UL 3741 test standards. In some embodiments, the jumper module 1210 includes a body fall resistance that conforms to standards under UL 3741 test standards.

Figure 50:
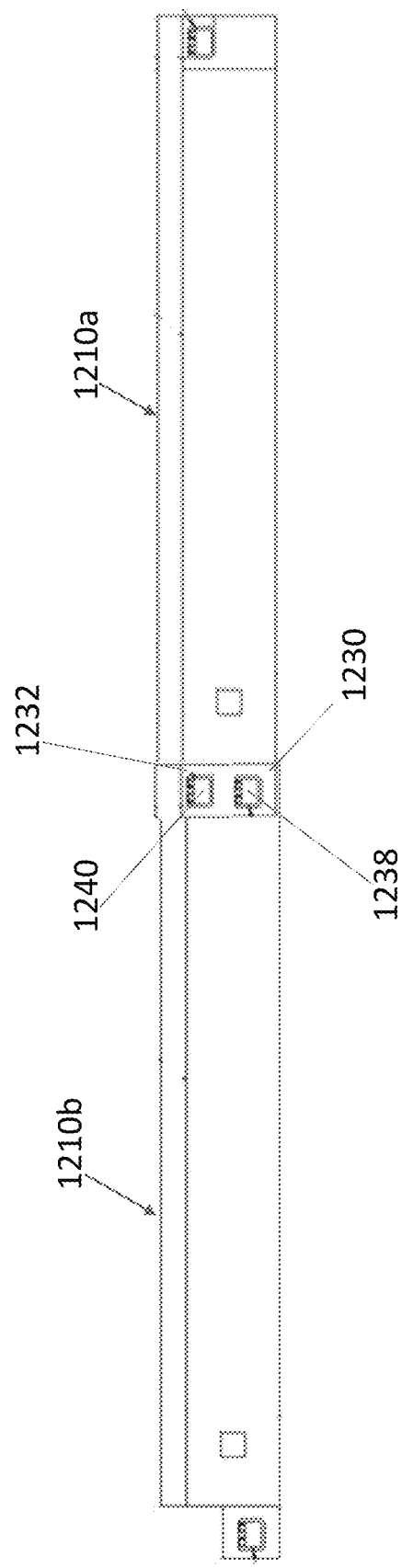
FIG. 50 is a top plan view of a jumper module shown in FIG. 44 overlaying another one of the jumper module.
Figure 55:
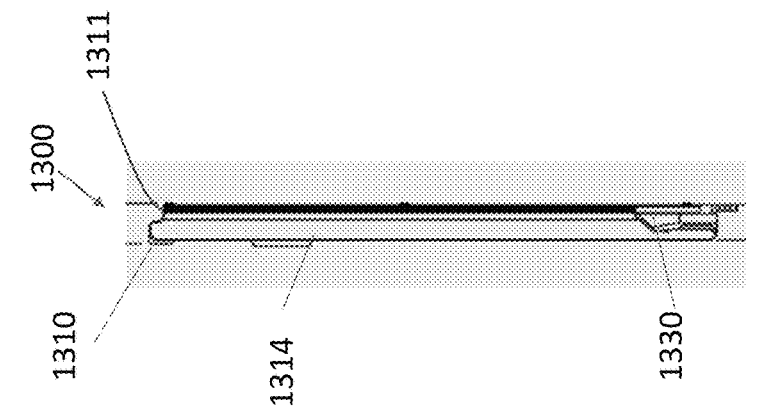
Figure 54:
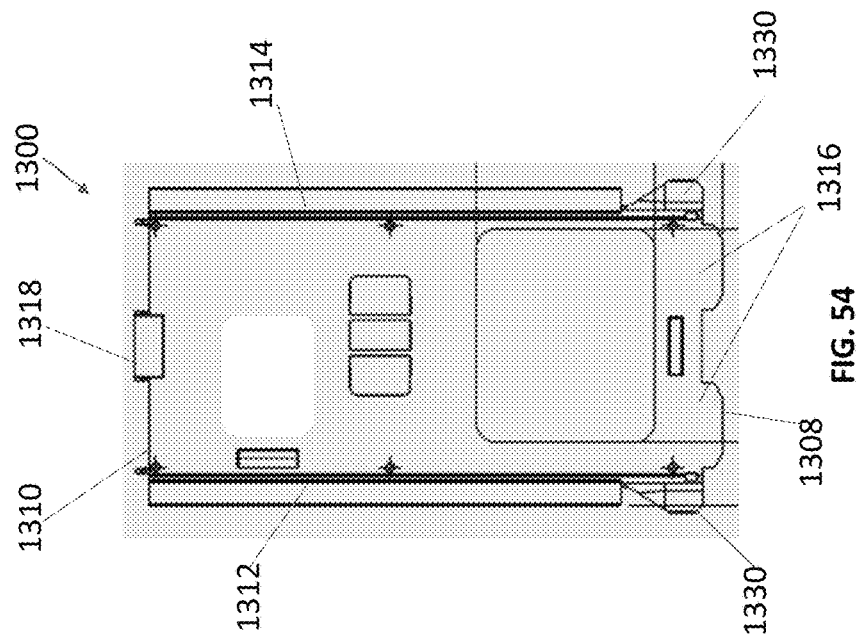
Figure 53:
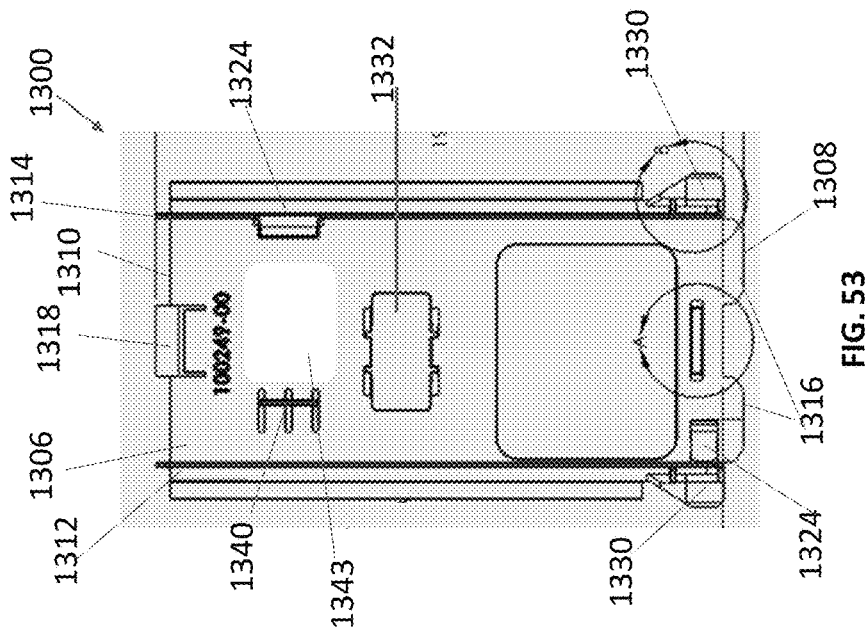

Referring to FIG. 50, in some embodiments, one of the jumper module 1210a is configured to overlay another one of the jumper module 1210b. In some embodiments, the first side lap 1230 of the jumper module 1210a overlays the second side lap 1232 of the jumper module 1210b. In some embodiments, the first side lap 1230 of the jumper module 1210a is attached to the second side lap 1232 of the jumper module 1210b. In some embodiments, the first side lap 1230 of the jumper module 1210a is attached to the second side lap 1232 of the jumper module 1210b by an adhesive. In some embodiments, the first side lap 1230 of the jumper module 1210a is attached to the second side lap 1232 of the jumper module 1210b by thermal bonding. In some embodiments, the first side lap 1230 of the jumper module 1210a is attached to the second side lap 1232 of the jumper module 1210b by ultrasonic welding. In some embodiments, the first side lap 1230 of the jumper module 1210a is attached to the second side lap 1232 of the jumper module 1210b by at least one fastener. In some embodiments, the first junction box 1238 of the jumper module 1210a is positioned proximate to the second junction box 1240 of the jumper module 1210b. In some embodiments, the first junction box 1238 and the second junction box 1240 are arranged in a linear array.

FIGS. 51 through 55 show embodiments of the wire cover bracket 1300. In some embodiments, the wire cover bracket 1300 includes a body 1306 having a first end 1308, a second end 1310 opposite the first end 1308, and a pair of sidewalls 1312, 1314 extending from the first end 1308 to the second end 1310. In some embodiments, the body 1306 is rectangular in shape. In some embodiments, a corresponding side flange 1313 extends from each of the sidewalls 1312, 1314. In some embodiments, the side flange 1313 includes a first portion 1315 and a second portion 1317 connected to and elevated from the first portion 1315 in a step-like or shelf-like manner. In some embodiments, the body 1306 includes a pair of alignment tabs 1316 located proximate to the first end 1308 and an alignment portion 1318 located proximate to the second end 1310. In some embodiments, each of the alignment tabs 1316 includes a substantially rounded rectangular-shaped end. In some embodiments, each of the alignment tabs 1316 includes a rectangular-shaped end. In some embodiments, each of the alignment tabs 1316 includes a rounded end. In some embodiments, the wire cover bracket 1300 includes only one of the alignment tabs 1316. In some embodiments, the wire cover bracket 1300 includes a plurality of the alignment tabs 1316. In some embodiments, the alignment tabs 1316 are configured to overlap the second end 1310 of another adjacent one of the wire cover brackets 1300. In some embodiments, the alignment portion 1318 includes an elevated portion 1319 extending from the body 1306. In some embodiments, the alignment portion 1318 includes a slot 1322. In some embodiments, the slot 1322 is rectangular in shape.

In some embodiments, the wire cover bracket 1300 includes at least one clip 1324. In some embodiments, the at least one clip 1324 extends outwardly from a first surface 1321 of the body 1306. In some embodiments, the at least one clip 1324 is curvilinear in shape and includes a slot 1326. In some embodiments, the at least one clip 1324 includes a plurality of the clips 1324. In some embodiments, the slot 1326 is sized and shaped to receive and hold an electrical wire or cable therein. In some embodiments, one of the plurality of clips 1324 is located proximate to the sidewall 1312 and proximate to the first end 1308. In some embodiments, another of the plurality of clips 1324 is located proximate to the sidewall 1314 and intermediate the first end 1308 and the second end 1310. In some embodiments, the bracket 1300 includes a plurality of hold down portions 1330. In some embodiments, one of the plurality of hold down portions 1330 extends from the sidewall 1312 and another of the plurality of hold down portions 1330 extends from the sidewall 1314.

In some embodiments, the wire cover bracket 1300 includes a table 1332 extending from the first surface 1321. In some embodiments, the table 1332 includes a flat portion 1334 elevated by a pair of supports 1336. In some embodiments, each of the supports 1336 is curvilinear in shape and includes a slot 1338. In some embodiments, the slot 1338 is sized and shaped to receive and/or hold an electrical wire or cable therein. In some embodiments, the flat portion 1334 is configured to receive a printed label. In some embodiments, the printed label includes information concerning components and characteristics of the photovoltaic system. In some embodiments, the wire cover bracket 1300 includes a guiderail 1340 extending from the first surface 1321. In some embodiments, the guiderail 1340 is configured to guide an electrical cable or wire extending within the wire cover bracket 1300. In some embodiments, the guiderail 1340 maintains the cable or wire away a distance away from the sidewall 1312 so that the cable/wire does not impede the attachment of an associated wire cover to the wire cover bracket 1300. In some embodiments, the wire cover bracket 1300 includes a plurality of the guiderails 1340.

In some embodiments, the wire cover bracket 1300 includes a first cutout 1342 extending from the first surface 1321 to the second surface 1325. In some embodiments, the first cutout 1342 is sized and shaped to receive an electrical component. In some embodiments, the electrical component is a junction box 1423. In some embodiments, the wire cover bracket 1300 includes a second cutout 1343. In some embodiments, the second cutout 1343 is for weight and material savings of the wire cover bracket 1300.

In some embodiments, a corresponding one of the wire cover bracket 1300 is located on the first side lap 1115 of each of the plurality of photovoltaic modules 1110. In some embodiments, the wire cover bracket 1300 is attached to the first side lap 1115. In some embodiments, the wire cover bracket 1300 is attached to the first side lap 1115 by an adhesive. In some embodiments, the wire cover bracket 1300 includes a sealant 1323 located on a second surface 1325. In some embodiments, the sealant 1323 is composed of a room temperature vulcanizing material. In some embodiments, the sealant 1323 is composed of silicone. In some embodiments, the sealant 1323 is located around a perimeter of the second surface 1325. In some embodiments, the wire cover bracket 1300 is attached to the first side lap 1115 by thermal bonding. In some embodiments, the wire cover bracket 1300 is attached to the first side lap 1115 by ultrasonic welding. In some embodiments, the wire cover bracket 1300 is laminated with the first side lap 1115. In some embodiments, the wire cover bracket 1300 is attached to the second side lap 1117 of the photovoltaic module 1110.

In some embodiments, a corresponding one of the wire cover bracket 1300 is located on the first side lap 1230 of the jumper module 1210. In some embodiments, the wire cover bracket 1300 is attached to the first side lap 1230 by an adhesive. In some embodiments, the wire cover bracket 1300 is attached to the first side lap 1230 by thermal bonding. In some embodiments, the wire cover bracket 1300 is attached to the first side lap 1230 by ultrasonic welding. In some embodiments, the wire cover bracket 1300 is laminated with the first side lap 1230. In some embodiments, the wire cover bracket 1300 is attached to the second side lap 1232 of the jumper module 1210.

Referring to FIGS. 56A through 56C, in some embodiments, a cover 1304 is removably attached to the wire cover bracket 1300. In some embodiments, the cover 1304 includes a first portion 1337 and side portions 1339 extending from the first portion 1337. In some embodiments, the side portions 1339 are angled (i.e., oblique) relative to the first portion 1337. In some embodiments, the side portions 1339 are angled to prevent shading over adjacent photovoltaic cells. In some embodiments, each of the side portions 1339 includes a tab portion 1341 that is sized and shaped to removably engage a corresponding one of the hold down portions 1330 of the bracket 1300. In some embodiments, the side portions 1339 are positioned on the first portion 1315 of the bracket 1300. In some embodiments, the first portion 1337 is textured. In some embodiments, the side portions 1339 are textured.

In some embodiments, the plurality of the wire cover brackets 1300 engage one another such that the alignment tabs 1316 of one of the wire cover brackets 1300 overlaps an adjacent one of another adjacent one of the wire cover brackets 1300. In some embodiments, the alignment portion 1318 supports the cover 1304. Referring to FIG. 57, in some embodiments, an end cap 1344 includes a first end 1346 and a second end 1348 opposite the first end 1346, and a plurality of louvers 1350 extending from the first end 1346 to the second end 1348. In some embodiments, a plurality of vents 1352 are formed between the louvers 1350. In some embodiments, one end of the cover 1304 is sized and shaped to receive the end cap 1344.

Figure 58:
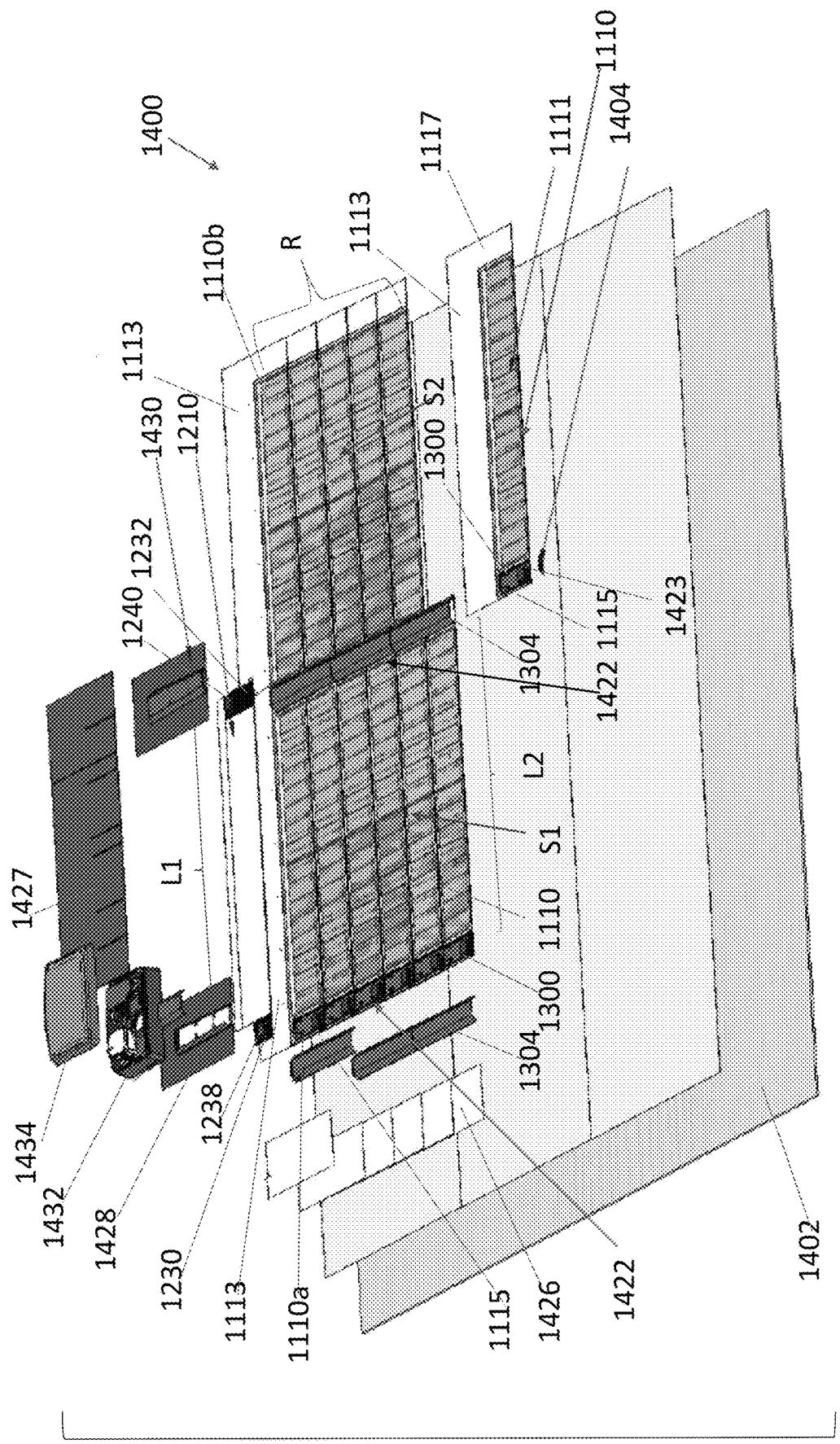
FIG. 58 is an exploded, top perspective view of a photovoltaic system.

Referring to FIG. 58, in some embodiments, a photovoltaic system 1400 includes an underlayment layer 1404 installed on a roof deck 1402. In some embodiments, the photovoltaic system 1400 includes a plurality of the photovoltaic modules 1110. In some embodiments, the plurality of photovoltaic modules 1110 overlay the underlayment layer 1404. In some embodiments, the photovoltaic modules 1110 are arranged in an array on the roof deck 1402. In some embodiments, the array of the photovoltaic modules 1110 includes subarrays S1, S2. In certain embodiments, the array includes more than the two subarrays S1, S2. In some embodiments, the array includes a single array S1. In some embodiments, each of the subarrays S1, S2 include a plurality of rows R of the photovoltaic modules 1110.

Figure 59A:
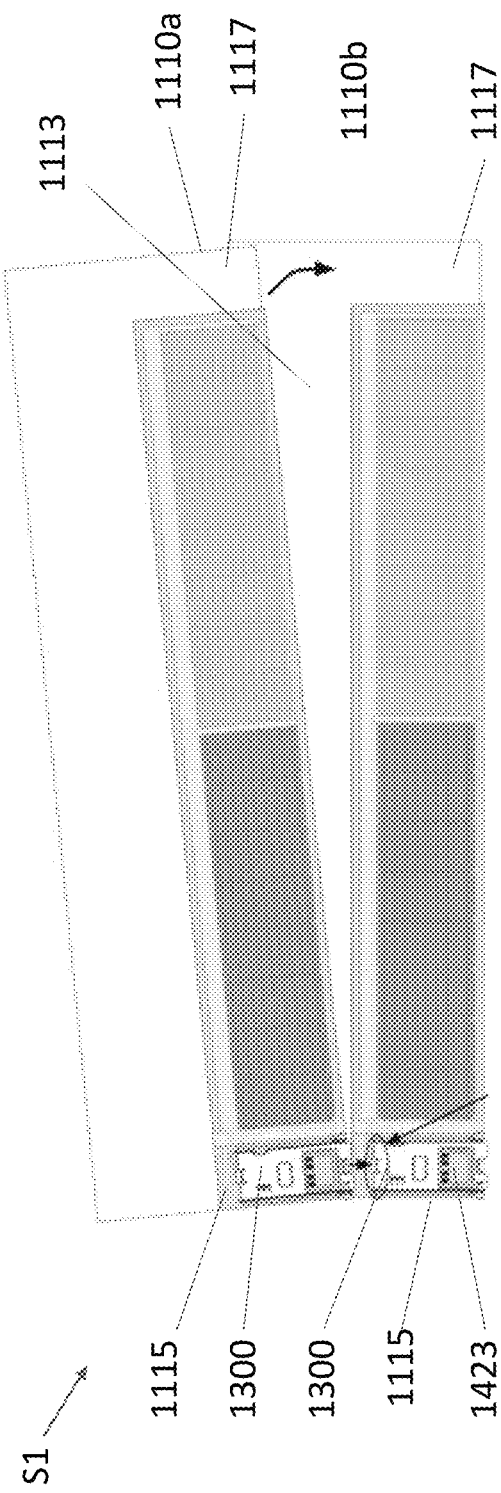
FIGS. 59A and 59B are views of embodiments of photovoltaic modules and associated wire cover brackets.
Figure 59B:
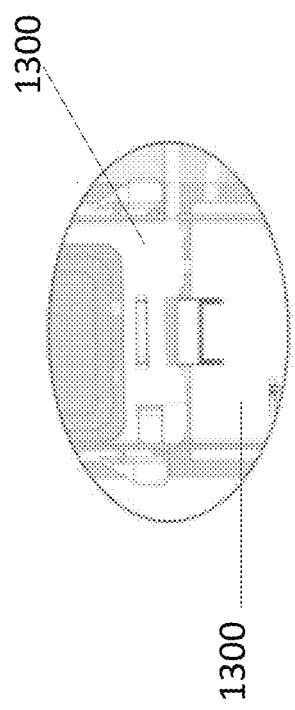

Referring to FIGS. 59A and 59B, in some embodiments, the reveal portion 1111 of one 1110a of the photovoltaic modules 1110 in the subarray S1 overlays the head lap portion 1113 of an adjacent another one of the photovoltaic modules 1110b of the subarray S1. In some embodiments, at least a portion of the first side lap 1115 of the one of the photovoltaic modules 1110a overlays at least a portion of the first side lap 1115 of the another one of the photovoltaic modules 1110b. In some embodiments, at least a portion of the second side lap 1117 of the one of the photovoltaic modules 1110a overlays at least a portion of the second side lap 1117 of the another one of the photovoltaic modules 1110b. Referring to FIGS. 60 and 61, in some embodiments, the wire cover bracket 1300 of the photovoltaic module 1110a overlaps the wire cover bracket 1300 of the photovoltaic module 1110b. In some embodiments, the alignment tabs 1316 of the wire cover bracket 1300 of the photovoltaic module 1110a overlaps the second end 1310 of the wire cover bracket 1300 of the photovoltaic module 1110b. In some embodiments, the end cap 1344 is installed on the wire cover bracket 1300 of the photovoltaic module 1110 in the lowest row R of the subarray S1.

In some embodiments, the reveal portion 1111 has a width of 5 inches to 10 inches. In some embodiments, the reveal portion 1111 has a width of 5 inches to 9 inches. In some embodiments, the reveal portion 1111 has a width of 5 inches to 8 inches. In some embodiments, the reveal portion 1111 has a width of 5 inches to 7 inches. In some embodiments, the reveal portion 1111 has a width of 5 inches to 6 inches. In some embodiments, the reveal portion 1111 has a width of 6 inches to 10 inches. In some embodiments, the reveal portion 1111 has a width of 6 inches to 9 inches. In some embodiments, the reveal portion 1111 has a width of 6 inches to 8 inches. In some embodiments, the reveal portion 1111 has a width of 6 inches to 7 inches. In some embodiments, the reveal portion 1111 has a width of 7 inches to 10 inches. In some embodiments, the reveal portion 1111 has a width of 7 inches to 9 inches. In some embodiments, the reveal portion 1111 has a width of 7 inches to 8 inches. In some embodiments, the reveal portion 1111 has a width of 8 inches to 10 inches. In some embodiments, the reveal portion 1111 has a width of 8 inches to 9 inches. In some embodiments, the reveal portion 1111 has a width of 9 inches to 10 inches.

In some embodiments, the reveal portion 1111 has a width of 5 inches. In some embodiments, the reveal portion 1111 has a width of 6 inches. In some embodiments, the reveal portion 1111 has a width of 7 inches. In some embodiments, the reveal portion 1111 has a width of 8 inches. In some embodiments, the reveal portion 1111 has a width of 9 inches. In some embodiments, the reveal portion 1111 has a width of 10 inches.

In some embodiments, the overlay of the first side laps 1115 form at least one wireway 1422. In some embodiments, the at least one wireway 1422 includes a plurality of wireways. In some embodiments, the at least one wireway 1422 includes a plurality of the wire cover brackets 1300. In some embodiments, the wire cover brackets 1300 are aligned in a column.

Referring to FIGS. 58 and 61, in some embodiments, at least one of the cover 1304 is attached to at least a corresponding one of the wire cover brackets 1300. In some embodiments, the at least one cover 1304 is removably attached to at least a corresponding one of the wire cover brackets 1300. In some embodiments, one of the covers 1304 is attached to a plurality of the wire cover brackets 1300. In some embodiments, the at least one cover 1304 includes a plurality of covers 1304. In some embodiments, each of the plurality of covers 1304 is configured to removably interlock with one another.

With reference to FIG. 58, in some embodiments, the first side lap 1115 of one of the photovoltaic modules 1110 in the subarray S2 overlays the second side lap 1117 of an adjacent another one of the photovoltaic modules 1110 in the subarray S1 in the same one of the rows R. In some embodiments, one of the jumper modules 1210 overlays an uppermost one of the photovoltaic modules 1110a in a column of the subarray S1. In some embodiments, the active portion 1212 of the jumper module 1210 overlays the head lap portion 1113 of the photovoltaic module 1110a. In some embodiments, the active portion 1212 of the jumper module 1210 overlays a portion of the head lap portion 1113 of the photovoltaic module 1110a. In some embodiments, active portion 1212 of the jumper module 1210 overlays the entirety of the head lap portion 1113 of the photovoltaic module 1110a. In some embodiments, the first side lap 1230 of the jumper module 1210 aligns with the first side lap 1115 of the photovoltaic module 1110*a*.

In some embodiments, the jumper module 1210 has a length L1. In some embodiments, each of the photovoltaic modules 1110 has a length L2. In some embodiments, the length L1 is equal to L2. In some embodiments, the length L1 is approximately equal to L2.

In some embodiments, the length L1 is 30 inches to 80 inches. In some embodiments, the length L1 is 30 inches to 75 inches. In some embodiments, the length L1 is 30 inches to 70 inches. In some embodiments, the length L1 is 30 inches to 65 inches. In some embodiments, the length L1 is 30 inches to 60 inches. In some embodiments, the length L1 is 30 inches to 55 inches. In some embodiments, the length L1 is 30 inches to 50 inches. In some embodiments, the length L1 is 30 inches to 45 inches. In some embodiments, the length L1 is 30 inches to 40 inches. In some embodiments, the length L1 is 30 inches to 35 inches.

In some embodiments, the length L1 is 35 inches to 80 inches. In some embodiments, the length L1 is 35 inches to 75 inches. In some embodiments, the length L1 is 35 inches to 70 inches. In some embodiments, the length L1 is 35 inches to 65 inches. In some embodiments, the length L1 is 35 inches to 60 inches. In some embodiments, the length L1 is 35 inches to 55 inches. In some embodiments, the length L1 is 35 inches to 50 inches. In some embodiments, the length L1 is 35 inches to 45 inches. In some embodiments, the length L1 is 35 inches to 40 inches. In some embodiments, the length L1 is 40 inches to 80 inches. In some embodiments, the length L1 is 40 inches to 75 inches. In some embodiments, the length L1 is 40 inches to 70 inches. In some embodiments, the length L1 is 40 inches to 65 inches. In some embodiments, the length L1 is 40 inches to 60 inches. In some embodiments, the length L1 is 40 inches to 55 inches. In some embodiments, the length L1 is 40 inches to 50 inches. In some embodiments, the length L1 is 40 inches to 45 inches.

In some embodiments, the length L1 is 45 inches to 80 inches. In some embodiments, the length L1 is 45 inches to 75 inches. In some embodiments, the length L1 is 45 inches to 70 inches. In some embodiments, the length L1 is 45 inches to 65 inches. In some embodiments, the length L1 is 45 inches to 60 inches. In some embodiments, the length L1 is 45 inches to 55 inches. In some embodiments, the length L1 is 45 inches to 50 inches. In some embodiments, the length L1 is 50 inches to 80 inches, the length L1 is 50 inches to 75 inches. In some embodiments, the length L1 is 50 inches to 70 inches. In some embodiments, the length L1 is 50 inches to 65 inches. In some embodiments, the length L1 is 50 inches to 60 inches. In some embodiments, the length L1 is 50 inches to 55 inches.

In some embodiments, the length L1 is 55 inches to 80 inches. In some embodiments, the length L1 is 55 inches to 75 inches. In some embodiments, the length L1 is 55 inches to 70 inches. In some embodiments, the length L1 is 55 inches to 65 inches. In some embodiments, the length L1 is 55 inches to 60 inches. In some embodiments, the length L1 is 60 inches to 80 inches. In some embodiments, the length L1 is 60 inches to 75 inches. In some embodiments, the length L1 is 60 inches to 70 inches. In some embodiments, the length L1 is 60 inches to 65 inches. In some embodiments, the length L1 is 65 inches to 80 inches. In some embodiments, the length L1 is 65 inches to 75 inches. In some embodiments, the length L1 is 65 inches to 70 inches. In some embodiments, the length L1 is 70 inches to 80 inches. In some embodiments, the length L1 is 70 inches to 75 inches. In some embodiments, the length L1 is 75 inches to 80 inches.

In some embodiments, the length L1 is 30 inches. In some embodiments, the length L1 is inches. In some embodiments, the length L1 is 40 inches. In some embodiments, the length L1 is 45 inches. In some embodiments, the length L1 is 50 inches. In some embodiments, the length L1 is 55 inches. In some embodiments, the length L1 is 60 inches. In some embodiments, the length L1 is 65 inches. In some embodiments, the length L1 is 70 inches. In some embodiments, the length L1 is 75 inches. In some embodiments, the length L1 is 80 inches.

In some embodiments, the length L2 is 30 inches to 80 inches. In some embodiments, the length L2 is 30 inches to 75 inches. In some embodiments, the length L2 is 30 inches to 70 inches. In some embodiments, the length L2 is 30 inches to 65 inches. In some embodiments, the length L2 is 30 inches to 60 inches. In some embodiments, the length L2 is 30 inches to 55 inches. In some embodiments, the length L2 is 30 inches to 50 inches. In some embodiments, the length L2 is 30 inches to 45 inches. In some embodiments, the length L2 is 30 inches to 40 inches. In some embodiments, the length L2 is 30 inches to 35 inches.

In some embodiments, the length L2 is 35 inches to 80 inches. In some embodiments, the length L2 is 35 inches to 75 inches. In some embodiments, the length L2 is 35 inches to 70 inches. In some embodiments, the length L2 is 35 inches to 65 inches. In some embodiments, the length L2 is 35 inches to 60 inches. In some embodiments, the length L2 is 35 inches to 55 inches. In some embodiments, the length L2 is 35 inches to 50 inches. In some embodiments, the length L2 is 35 inches to 45 inches. In some embodiments, the length L2 is 35 inches to 40 inches. In some embodiments, the length L2 is 40 inches to 80 inches. In some embodiments, the length L2 is 40 inches to 75 inches. In some embodiments, the length L2 is 40 inches to 70 inches. In some embodiments, the length L2 is 40 inches to 65 inches. In some embodiments, the length L2 is 40 inches to 60 inches. In some embodiments, the length L2 is 40 inches to 55 inches. In some embodiments, the length L2 is 40 inches to 50 inches. In some embodiments, the length L2 is 40 inches to 45 inches.

In some embodiments, the length L2 is 45 inches to 80 inches. In some embodiments, the length L2 is 45 inches to 75 inches. In some embodiments, the length L2 is 45 inches to 70 inches. In some embodiments, the length L2 is 45 inches to 65 inches. In some embodiments, the length L2 is 45 inches to 60 inches. In some embodiments, the length L2 is 45 inches to 55 inches. In some embodiments, the length L2 is 45 inches to 50 inches. In some embodiments, the length L2 is 50 inches to 80 inches. In some embodiments, the length L2 is 50 inches to 75 inches. In some embodiments, the length L2 is 50 inches to 70 inches. In some embodiments, the length L2 is 50 inches to 65 inches. In some embodiments, the length L2 is 50 inches to 60 inches. In some embodiments, the length L2 is 50 inches to 55 inches.

In some embodiments, the length L2 is 55 inches to 80 inches. In some embodiments, the length L2 is 55 inches to 75 inches. In some embodiments, the length L2 is 55 inches to 70 inches. In some embodiments, the length L2 is 55 inches to 65 inches. In some embodiments, the length L2 is 55 inches to 60 inches. In some embodiments, the length L2 is 60 inches to 80 inches. In some embodiments, the length L2 is 60 inches to 75 inches. In some embodiments, the length L2 is 60 inches to 70 inches. In some embodiments, the length L2 is 60 inches to 65 inches. In some embodiments, the length L2 is 65 inches to 80 inches. In some embodiments, the length L2 is 65 inches to 75 inches. In some embodiments, the length L2 is 65 inches to 70 inches. In some embodiments, the length L2 is 70 inches to 80 inches. In some embodiments, the length L2 is 70 inches to 75 inches. In some embodiments, the length L2 is 75 inches to 80 inches.

In some embodiments, the length L2 is 30 inches. In some embodiments, the length L2 is 35 inches. In some embodiments, the length L2 is 40 inches. In some embodiments, the length L2 is 45 inches. In some embodiments, the length L2 is 50 inches. In some embodiments, the length L2 is 55 inches. In some embodiments, the length L2 is 60 inches. In some embodiments, the length L2 is 65 inches. In some embodiments, the length L2 is 70 inches. In some embodiments, the length L2 is 75 inches. In some embodiments, the length L2 is 80 inches.

In some embodiments, the reveal portion 1111 has a length of 35 inches to 75 inches. In some embodiments, the reveal portion 1111 has a length of 35 inches to 70 inches. In some embodiments, the reveal portion 1111 has a length of 35 inches to 65 inches. In some embodiments, the reveal portion 1111 has a length of 35 inches to 60 inches. In some embodiments, the reveal portion 1111 has a length of 35 inches to 55 inches. In some embodiments, the reveal portion 1111 has a length of 35 inches to 50 inches. In some embodiments, the reveal portion 1111 has a length of 35 inches to 45 inches. In some embodiments, the reveal portion 1111 has a length of 35 inches to 40 inches.

In some embodiments, the reveal portion 1111 has a length of 40 inches to 75 inches. In some embodiments, the reveal portion 1111 has a length of 40 inches to 70 inches. In some embodiments, the reveal portion 1111 has a length of 40 inches to 65 inches. In some embodiments, the reveal portion 1111 has a length of 40 inches to 60 inches. In some embodiments, the reveal portion 1111 has a length of 40 inches to 55 inches. In some embodiments, the reveal portion 1111 has a length of 40 inches to 50 inches. In some embodiments, the reveal portion 1111 has a length of 40 inches to 45 inches. In some embodiments, the reveal portion 1111 has a length of 45 inches to 75 inches. In some embodiments, the reveal portion 1111 has a length of 45 inches to 70 inches. In some embodiments, the reveal portion 1111 has a length of 45 inches to 65 inches. In some embodiments, the reveal portion 1111 has a length of 45 inches to 60 inches. In some embodiments, the reveal portion 1111 has a length of 45 inches to 55 inches. In some embodiments, the reveal portion 1111 has a length of 45 inches to 50 inches.

In some embodiments, the reveal portion 1111 has a length of 50 inches to 75 inches. In some embodiments, the reveal portion 1111 has a length of 50 inches to 70 inches. In some embodiments, the reveal portion 1111 has a length of 50 inches to 65 inches. In some embodiments, the reveal portion 1111 has a length of 50 inches to 60 inches. In some embodiments, the reveal portion 1111 has a length of 50 inches to 55 inches. In some embodiments, the reveal portion 1111 has a length of 55 inches to 75 inches. In some embodiments, the reveal portion 1111 has a length of 55 inches to 70 inches. In some embodiments, the reveal portion 1111 has a length of 55 inches to 65 inches. In some embodiments, the reveal portion 1111 has a length of 55 inches to 60 inches. In some embodiments, the reveal portion 1111 has a length of 60 inches to 75 inches. In some embodiments, the reveal portion 1111 has a length of 60 inches to 70 inches. In some embodiments, the reveal portion 1111 has a length of 60 inches to 65 inches. In some embodiments, the reveal portion 1111 has a length of 65 inches to 75 inches. In some embodiments, the reveal portion 1111 has a length of 65 inches to 70 inches. In some embodiments, the reveal portion 1111 has a length of 70 inches to 75 inches.

In some embodiments, the reveal portion 1111 has a length of 35 inches. In some embodiments, the reveal portion 1111 has a length of 40 inches. In some embodiments, the reveal portion 1111 has a length of 45 inches. In some embodiments, the reveal portion 1111 has a length of 50 inches. In some embodiments, the reveal portion 1111 has a length of 55 inches. In some embodiments, the reveal portion 1111 has a length of 60 inches. In some embodiments, the reveal portion 1111 has a length of 65 inches. In some embodiments, the reveal portion 1111 has a length of 70 inches. In some embodiments, the reveal portion 1111 has a length of 75 inches.

In some embodiments, the first side lap 1115 has a length of 1 inch to 5 inches. In some embodiments, the first side lap 1115 has a length of 1 inch to 4 inches. In some embodiments, the first side lap 1115 has a length of 1 inch to 3 inches. In some embodiments, the first side lap 1115 has a length of 1 inch to 2 inches. In some embodiments, the first side lap 1115 has a length of 2 inches to 5 inches. In some embodiments, the first side lap 1115 has a length of 2 inches to 4 inches. In some embodiments, the first side lap 1115 has a length of 2 inches to 3 inches. In some embodiments, the first side lap 1115 has a length of 3 inches to 5 inches. In some embodiments, the first side lap 1115 has a length of 3 inches to 4 inches. In some embodiments, the first side lap 1115 has a length of 4 inches to 5 inches.

In some embodiments, the first side lap 1115 has a length of 1 inch. In some embodiments, the first side lap 1115 has a length of 2 inches. In some embodiments, the first side lap 1115 has a length of 3 inches. In some embodiments, the first side lap 1115 has a length of 4 inches. In some embodiments, the first side lap 1115 has a length of 5 inches.

In some embodiments, the second side lap 1117 has a length of 1 inch to 5 inches. In some embodiments, the second side lap 1117 has a length of 1 inch to 4 inches. In some embodiments, the second side lap 1117 has a length of 1 inch to 3 inches. In some embodiments, the second side lap 1117 has a length of 1 inch to 2 inches. In some embodiments, the second side lap 1117 has a length of 2 inches to 5 inches. In some embodiments, the second side lap 1117 has a length of 2 inches to 4 inches. In some embodiments, the second side lap 1117 has a length of 2 inches to 3 inches. In some embodiments, the second side lap 1117 has a length of 3 inches to 5 inches. In some embodiments, the second side lap 1117 has a length of 3 inches to 4 inches. In some embodiments, the second side lap 1117 has a length of 4 inches to 5 inches.

In some embodiments, the second side lap 1117 has a length of 1 inch. In some embodiments, the second side lap 1117 has a length of 2 inches. In some embodiments, the second side lap 1117 has a length of 3 inches. In some embodiments, the second side lap 1117 has a length of 4 inches. In some embodiments, the second side lap 1117 has a length of 5 inches.

In some embodiments, the second side lap 1232 of the jumper module 1210 aligns with the second side lap 1117 of the photovoltaic module 1110a. In some embodiments, the first junction box 1238 of the jumper module 1210 is electrically connected to a junction box 1423 of the photovoltaic module 1110a. In some embodiments, the second junction box 1240 of the jumper module 1210 is electrically connected to the junction box 1423 of another of the photovoltaic modules 1110b. In some embodiments, the jumper module 1210 electrically connects the subarrays S1, S2 of the photovoltaic modules 1110 within the array of the photovoltaic system 1400. In some embodiments, the first bus ribbon 1250 and the second bus ribbon 1260 electrically connect the subarrays of the photovoltaic modules 1110 with one another. In some embodiments, the first bus ribbon 1250 and the second bus ribbon 1260 electrically connect the junction boxes 1423 of the first subarray S1 of the photovoltaic modules 1110 with the junction boxes 1423 of the second subarray S2 of the photovoltaic modules 1110.

In some embodiments, the jumper module 1210 is coplanar with the plurality of photovoltaic modules 1110. As used herein, the term "coplanar" means the jumper module 1210 and the plurality of photovoltaic modules 1110 are positioned and extend within the same plane, or the jumper module 1210 is positioned and extends in a first plane, and the plurality of photovoltaic modules 1110 is positioned and extends within a second plane that is offset from the first plane of no more than ten percent of a height measured from the roof deck 1402 to an upper surface of the jumper module 1210.

In some embodiments, a plurality of step flaps 1426 is installed adjacent to one of the subarrays S1 of the photovoltaic modules 1110. In some embodiments, roofing shingles are configured to overlay the step flaps 1426. In some embodiments, the roofing shingles are asphalt shingles. In some embodiments, the roofing shingles are electrically inactive solar shingles. In some embodiments, a composition shingle 1427 overlays the active portion 1212 of the jumper module 1210. In some embodiments, another one of the jumper module 1210 overlays the jumper module 1210 of the first subarray, as shown in FIG. 58. In some embodiments, the composition shingle 1427 conceals the jumper modules 1210. In some embodiments, the composition shingle 1427 is a watershedding layer. In some embodiments, the composition shingle 1427 is an asphalt shingle. In some embodiments, the composition shingle 1427 is located at least 36 inches away from the roof ridge.

In some embodiments, the second side lap 1117 of at least one of the photovoltaic modules 1110 of the subarray S2 overlaps a roofing shingle. In some embodiments, the roofing shingle is an asphalt shingle. In some embodiments, the second layer 1132 of the backsheet 1128 is attached to the roofing shingle by an adhesive. In some embodiments, the adhesive is a butyl adhesive. In some embodiments, a fleece layer and an adhesive are utilized between the second layer 1132 of the backsheet 1128 and the roofing shingle to secure the bonding thereof. In some embodiments, the second layer 1132 of the backsheet 1128 is attached to the roofing shingle by plasma treatment. the second layer 1132 of the backsheet 1128 is attached to the roofing shingle by a combination of any of the adhesive, the fleece layer and/or plasma treatment. In some embodiments, one or more roofing shingle overlays the second side laps 1117 of the photovoltaic modules 1110 of the subarray S2. In some embodiments, the roofing shingle is an asphalt shingle.

Figure 63:
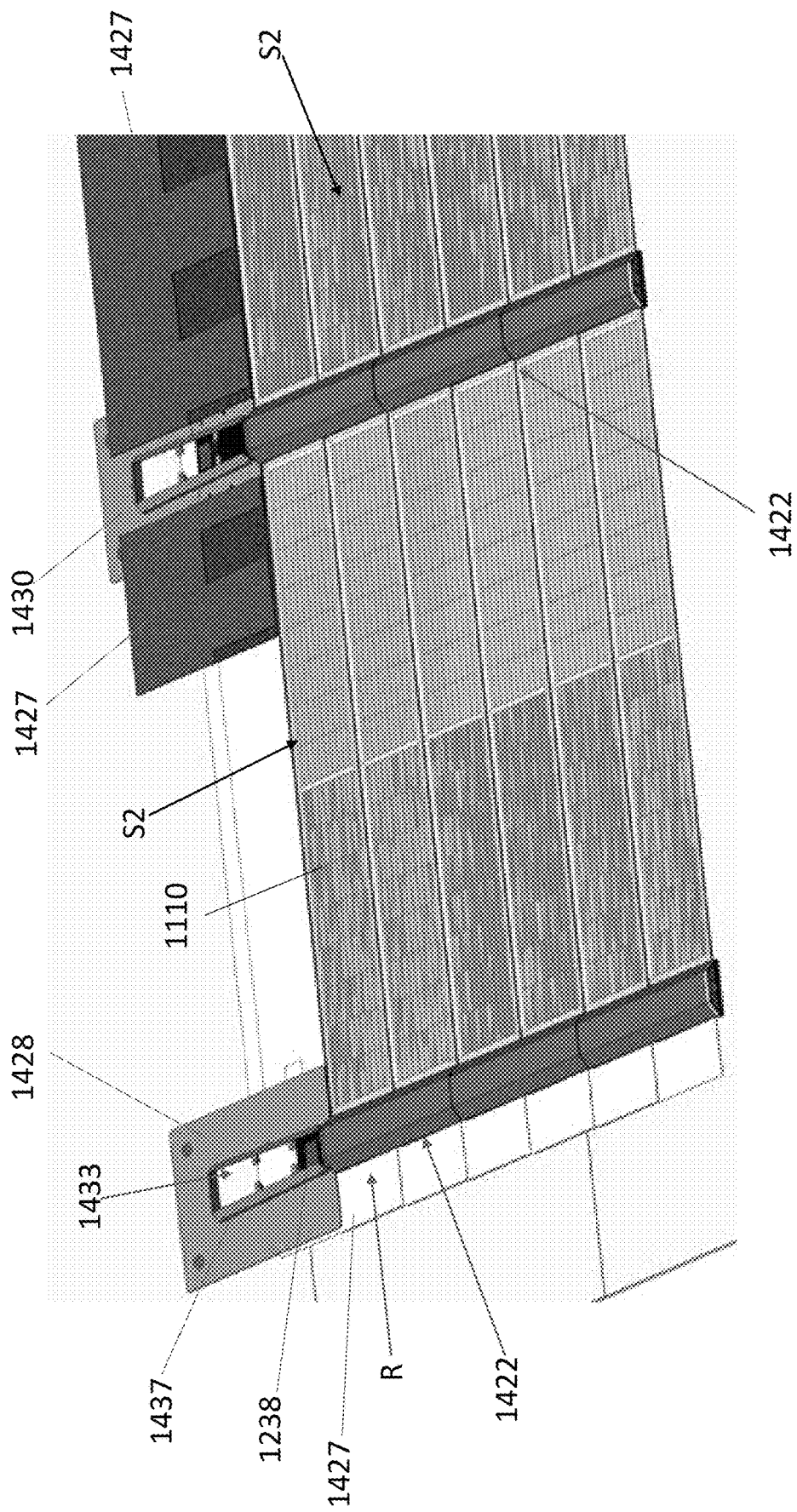
FIG. 63 is a top perspective view of embodiments of flashing bases installed on a roof deck.

Referring to FIGS. 58, 62 and 63, in some embodiments, the photovoltaic system 1400 includes a first flashing base 1428. In some embodiments, the first flashing base 1428 includes a flat base portion 1431 having a first surface and a second surface opposite the first surface, an aperture 1433 extending from the first surface to the second surface, and a sidewall 1435 extending from the first surface to the second surface and surrounding the aperture 1433. In some embodiments, the base portion 1431 is rectangular in shape. In some embodiments, the base portion 1431 is square in shape. In some embodiments, the base portion 1431 is trapezoidal in shape. In some embodiments, the base portion 1431 is circular in shape. In some embodiments, the sidewall 1435 includes flanged portions 1437 extending obliquely and inwardly. In some embodiments, an opening 1439 is located proximate to a lower end 1441 of the first flashing base 1428. In some embodiments, the aperture 1433 is substantially rectangular in shape. In some embodiments, the aperture 1433 extends from a first end 1443 located proximate to the lower end 1441 of the first flashing base 1428 and a second end 1445 located intermediate the lower end 1441 and an upper end 1447 of the first flashing base 1428. In some embodiments, the aperture 1433 is sized and shaped to receive at least one electrical component therein. In some embodiments, the second end 1445 includes a width that is wider than a width of the first end 1443. In some embodiments, the wider width of the second end 1445 is sized and shaped to receive relatively larger sized electrical components. In some embodiments, the at least one electrical component is the junction box 1238 of the jumper module 1210. In some embodiments, the lower end 1441 of the first flashing base 1428 includes a tab 1449. In some embodiments, screw tabs 1451 are located on the flanged portions 1437 and/or an upper end of the sidewall 1435.

In some embodiments, the first flashing base 1428 is configured to be installed on the roof deck 1402. In some embodiments, the first flashing base 1428 is installed at the top of the wireway 1422 of the subarray S1. In some embodiments, the sidewall 1435, the aperture 1433 and the flanged portions 1437 of the first flashing base 1428 are aligned with the wire cover bracket 1300 of the photovoltaic module 1110 in the uppermost row R of the subarray S1. In some embodiments, the tab 1449 is sized and shaped to contact an end of the wire cover bracket 1300. In some embodiments, a first flashing base 1428 overlays the first side lap 1230 of the jumper module 1210. In some embodiments, the first flashing base is 1428 is configured to be installed to the roof deck 1402 by at least one fastener. In some embodiments, the base portion 1431 is configured to receive the at least one fastener. In some embodiments, the at least one fastener includes a plurality of fasteners. In some embodiments, the plurality of fasteners is roofing nails. In some embodiments, the first flashing base is 1428 is configured to be installed to the roof deck by an adhesive. In some embodiments, the first flashing base 1428 overlays at least one of the step flaps 1426.

In some embodiments, the photovoltaic system 1400 includes a second flashing base 1430. In some embodiments, the second flashing base 1430 has a structure and function similar to those of the first flashing base 1428, with certain differences. In some embodiments, the second flashing base 1430 overlays the second side lap 1232 of the jumper module 1210. In some embodiments, the second flashing base 1430 is installed on the roof deck and is aligned with the wireway 1422 of the second subarray S2 in a manner similar to that of the first flashing base 1428.

In some embodiments, one of the composition shingles 1427 overlays the base portion 1431 of the first flashing base 1428 on at least one side of the sidewall 1435 thereof. In some embodiments, each of a plurality of the composition shingles 1427 overlays the base portion 1431 of the first flashing base 1428 on opposite sides of the sidewall 1435. In some embodiments, one of the composition shingles 1427 overlays the base portion 1431 of the second flashing base 1430 on at least one side of the sidewall 1435 thereof. In some embodiments, each of a plurality of the composition shingles 1427 overlays the base portion 1431 of the second flashing base 1430 on opposite sides of the sidewall 1435. In some embodiments, asphalt roofing shingles are utilized instead of the composition shingles 1427.

Figure 64B:
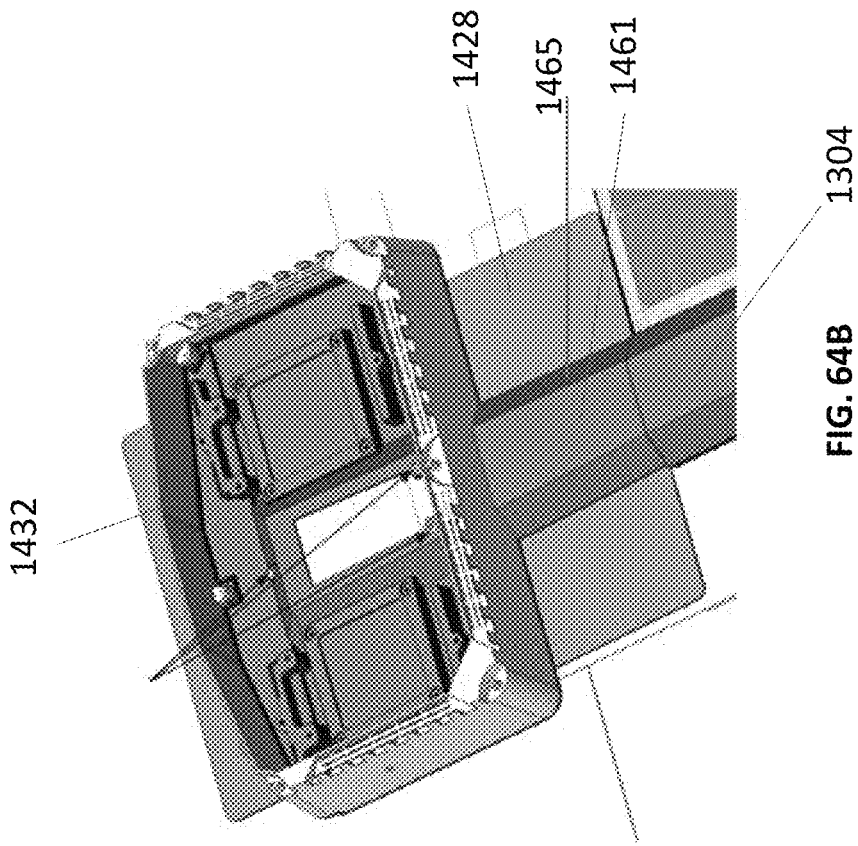
FIGS. 64A through 65 are top perspective views of a transition box employed by the photovoltaic system shown in FIG. 58.
Figure 64A:
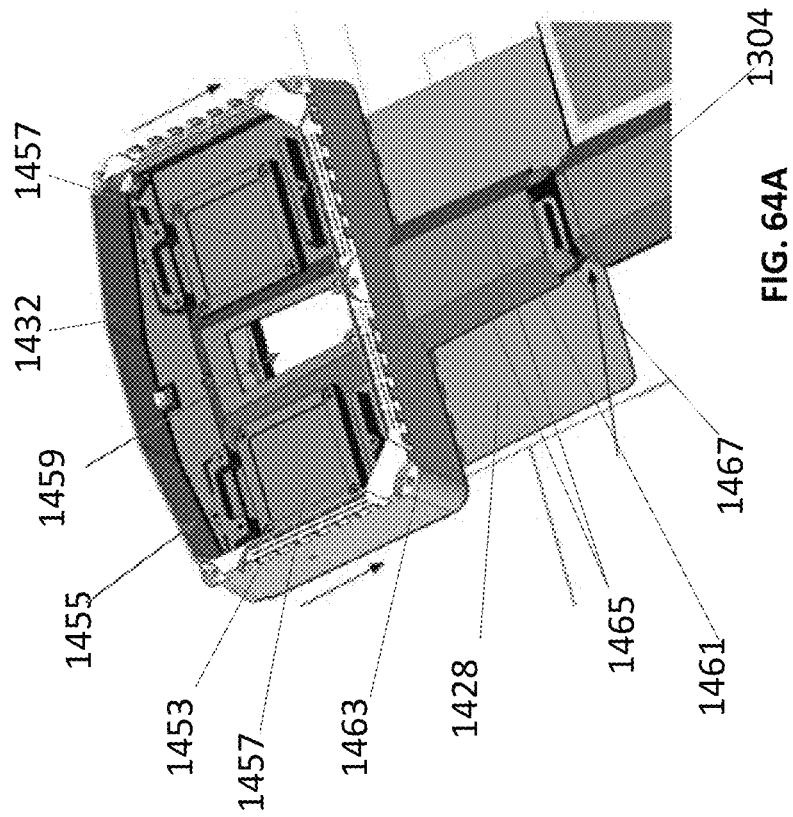

Referring to FIGS. 58 and 64A and 64B, in some embodiments, a transition box 1432 is installed on the first flashing base 1428. In some embodiments, the transition box 1432 includes a housing 1453 having an interior portion 1455. In some embodiments, the interior portion includes at least one base 1457. In some embodiments, the at least one base 1457 is configured to receive an electrical component mounted thereto. In some embodiments, the at least one base 1457 includes a plurality of the bases 1457. In some embodiments, the interior portion 1455 includes an aperture 1459 that extends through a bottom portion of the housing 1453. In some embodiments, a cover portion 1461 extends outwardly from a lower wall 1463 of the housing 1453. In some embodiments, the cover portion 1461 includes flanged walls 1465. In some embodiments, the flanged walls 1465 are angled. In some embodiments, the cover portion includes tabs 1467 extending outwardly from the free end thereof.

In some embodiments, the transition box 1432 is installed on the first flashing base 1428 by fasteners. In some embodiments, the fasteners are screws that engage corresponding ones of the screw tabs 1451 of the first flashing base 1428. In some embodiments, the transition box 1432 is installed on the first flashing base 1428 by an adhesive. In some embodiments, the cover portion 1461 is sized and shaped to cover at least a portion of the sidewall 1435 and at least a portion of the aperture 1433 of the first flashing base 1428. In some embodiments, the flanged walls 1465 of the cover portion 1461 are juxtaposed with the flanged portions 1437 of the first flashing base 1428. In some embodiments, the tabs 1467 of the cover portion 1461 engage the cover 1304 of the wire cover bracket 1300. In some embodiments, the cover portion 1461 slidably engages the cover 1304 of the wire cover bracket 1300, such that a lower end of the cover portion 1461 is juxtaposed with an upper end of the cover 1304. In some embodiments, the cover portion 1461 of the transition box 1432 covers the first junction box 1238 of the jumper module 1210.

In some embodiments, the housing 1453 of the transition box 1432 is sized and shaped to cover at least another portion of the sidewall 1435 and at least a portion of the aperture 1433 of the first flashing base 1428. In some embodiments, at least a portion of the aperture 1459 of the transition box 1432 is substantially aligned with the aperture 1433 of the first flashing base 1428. In some embodiments, the aperture 1459 and the aperture 1433 substantially align with an aperture or penetration within the roof deck 1402. In some embodiments, the transition box 1432 covers the aperture or penetration in the roof deck 1402 and is used as part of a pathway to run electrical wiring therethrough. In some embodiments, a passthrough 1460 is located within the aperture 1459 and the aperture 1433. In some embodiments, the passthrough 1460 is inserted within the aperture or penetration of the roof deck 1402. In some embodiments, the passthrough 1460 is configured to receive an electrical wire or cable to facilitate its insertion through the roof deck aperture an into the associated structure.

Figure 65:
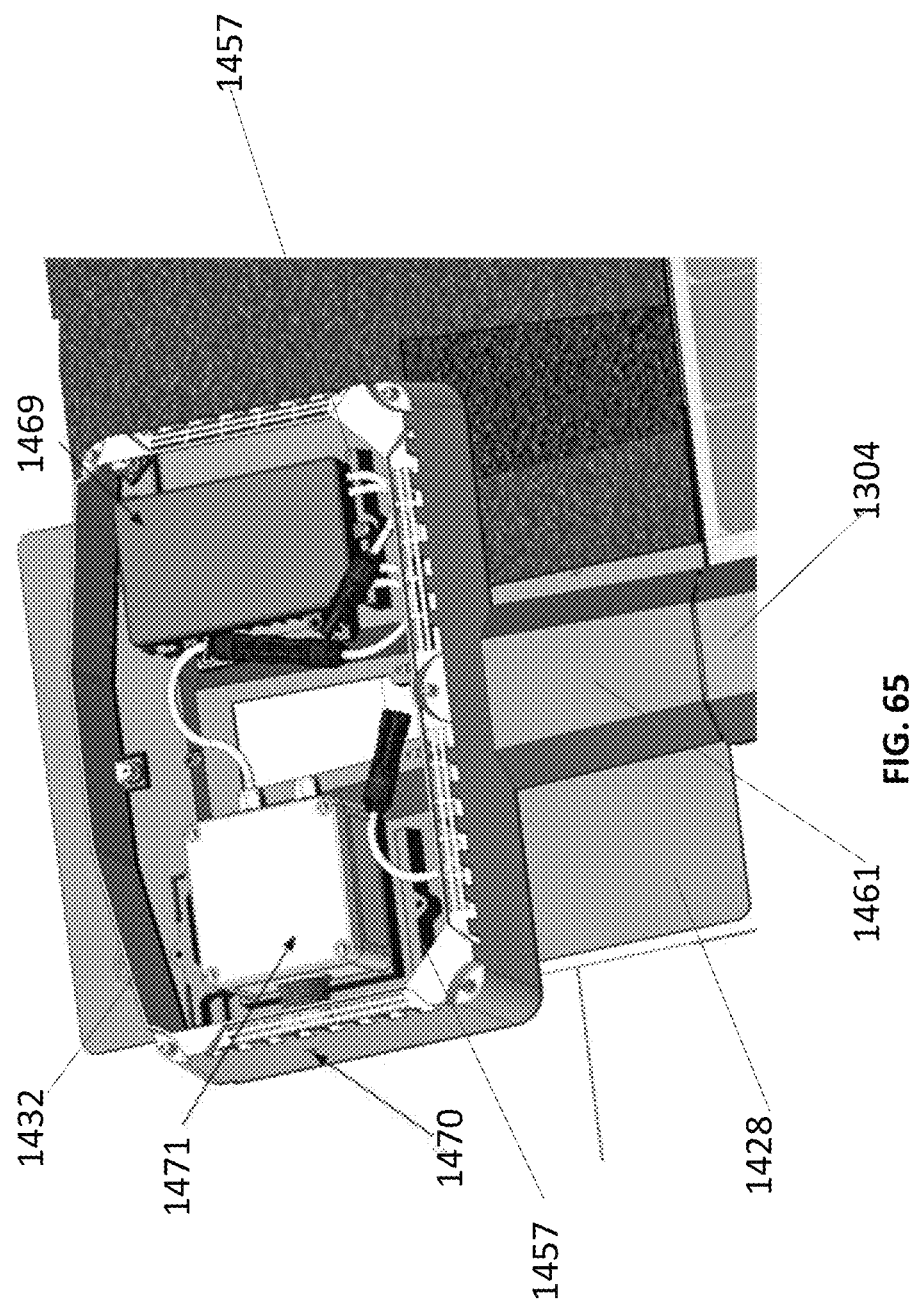

Referring to FIG. 65, in some embodiments, the transition box 1432 includes a rapid shutdown device. In some embodiments, the transition box 1432 includes a middle circuit interrupter (MCI) 1469. In some embodiments, the transition box includes a junction box 1471. In some embodiments, the transition box 1432 houses electrical wiring for the photovoltaic system 1400. In some embodiments, the electrical wiring includes THEN electrical wiring. In some embodiments, the THHN electrical wire is electrically connected to an inverter.

Figure 66:
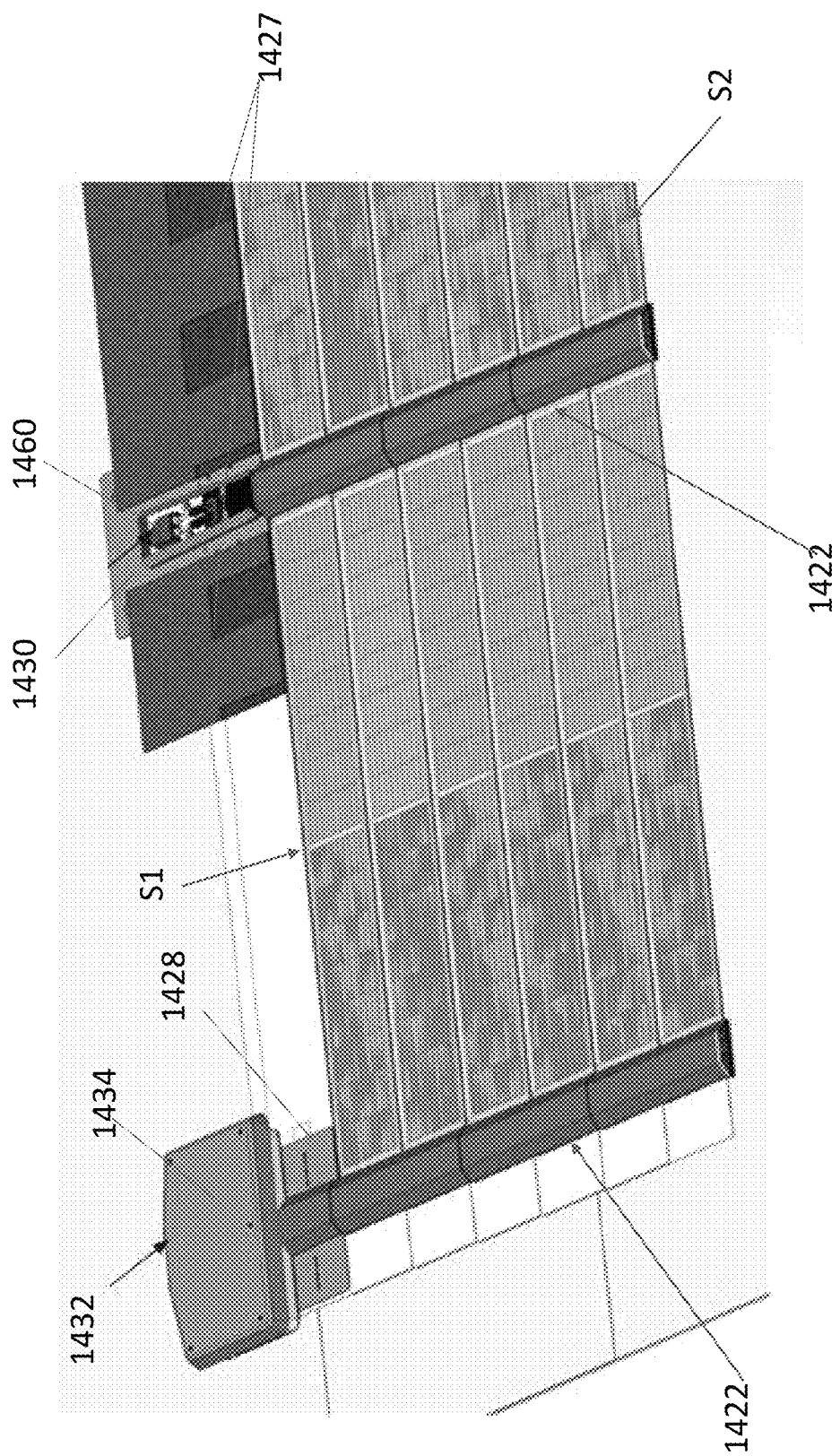
FIG. 66 is a top perspective view of embodiments of the transition box shown in FIGS. 64A through 65 installed on a roof deck.

Referring to FIG. 66, in some embodiments, the transition box 1432 includes a cover 1434. In some embodiments, the cover 1434 is removably attached to the housing 1453. In some embodiments, the cover 1434 includes an interior surface. In some embodiments, the interior surface includes an interior wall structure that is configured to provide structural integrity and strength to the cover 1434. In some embodiments, the interior wall structure is configured to maintain its structural integrity due to hail impacts. In some embodiments, the interior wall structure is a honeycomb structure. In some embodiments, a sidewall 1470 of the transition box 1432 is configured to have an aperture formed therein, either by drilling or cutting. In some embodiments, the aperture is sized and shaped to receive a conduit connected to the junction box 1471. In some embodiments, the conduit is configured to house and run electrical wiring across the roof.

Figure 67:
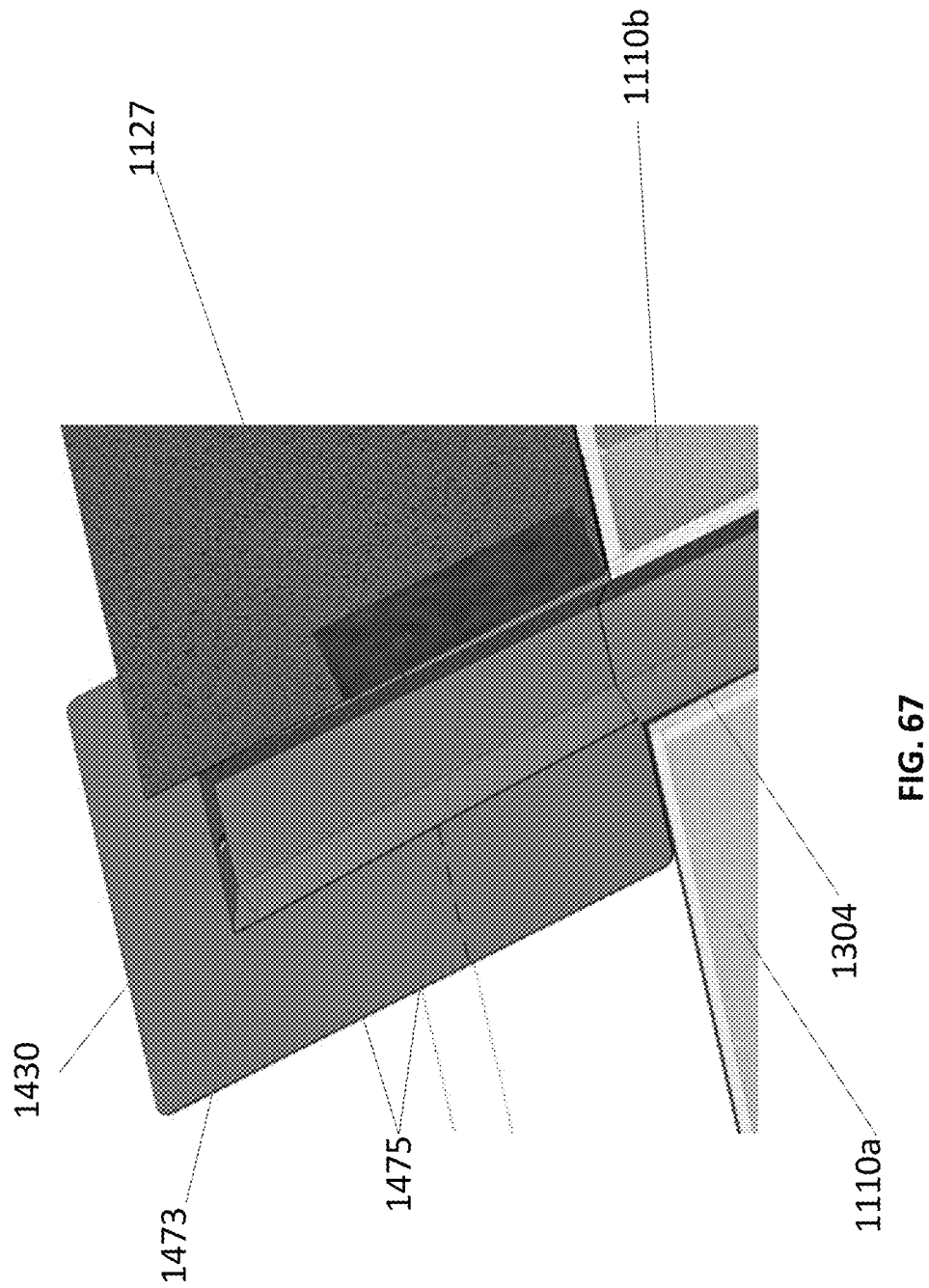
FIG. 67 is a top perspective view of embodiments of a second flashing base employed by the photovoltaic system shown in FIG. 58.

Referring to FIG. 67, in some embodiments, the second flashing base 1430 includes a cover 1473. In some embodiments, the cover 1473 is sized and shaped to cover the aperture 1433 of the second flashing base 1430. In some embodiments, flanged walls 1475 of the cover 1473 are juxtaposed with the flanged portions 1437 of the second flashing base 1430. In some embodiments, the cover portion 1461 slidably engages the cover 1304 of the wire cover bracket 1300, such that a lower end of the cover 1473 is juxtaposed with an upper end of the cover 1304. In some embodiments, the cover 1473 covers the second junction box 1240 of the jumper module 1210.

Figure 68:
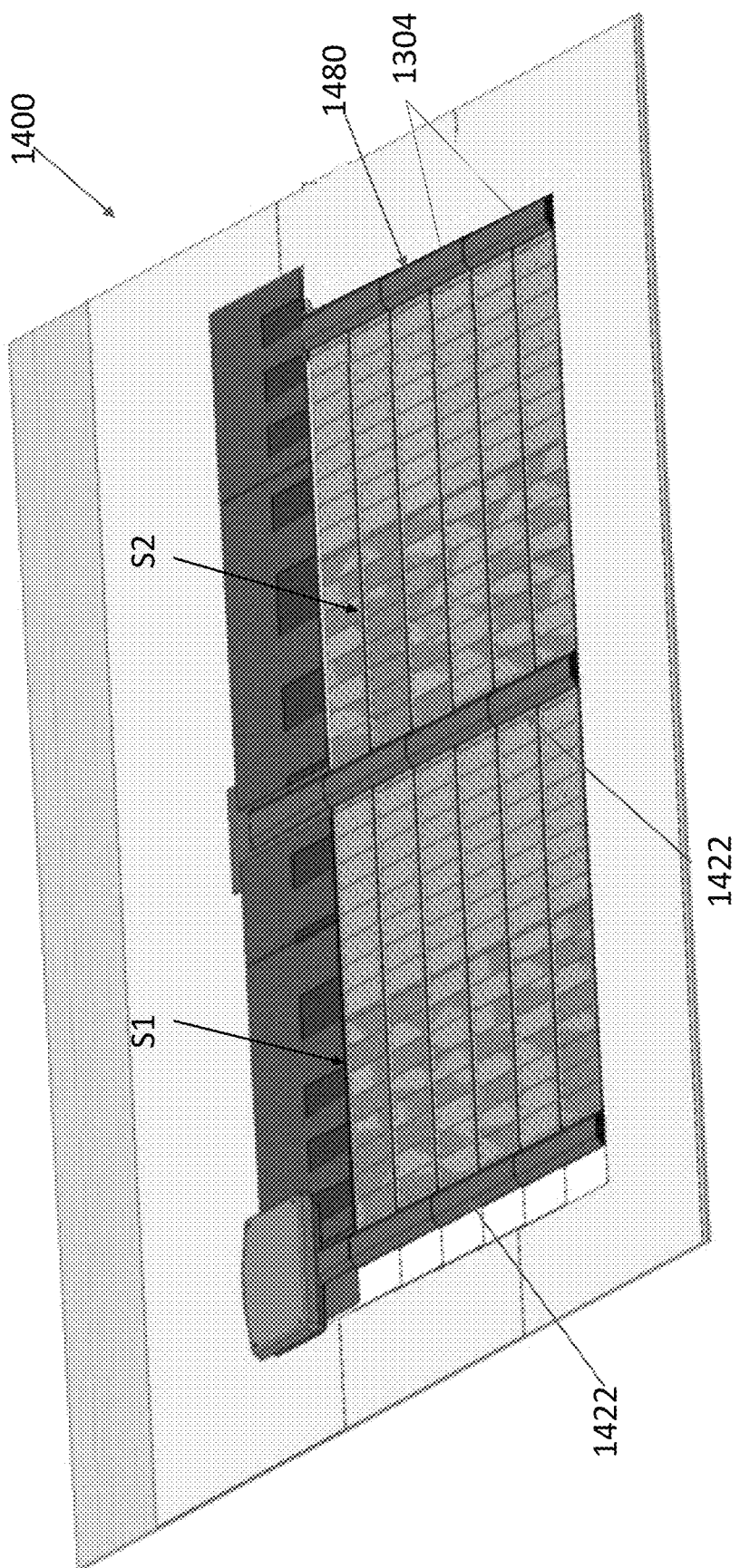
FIG. 68 is a top perspective view of embodiments of a building integrated photovoltaic system installed on a roof deck.

Referring to FIG. 68, in some embodiments, the photovoltaic system 1400 is installed on the roof deck 1402. In some embodiments, an additional, non-active (i.e., "dummy") wireway 1480 and associated cover 1304, similar to the at least one wireway 1422 and the associated covers 1304, may be installed on the end of the second subarray S2 for symmetry and aesthetics. In some embodiments, the non-active wireway 1480 is installed over the second side laps 1117 of the photovoltaic modules 1110b. In some embodiments, the non-active wireway 1480 does not include any electrical components or electrical wiring. In some embodiments, the non-active wireway 1480 is optional and need not be included. In some embodiments, roofing shingles overlay the second side laps 1117 of the photovoltaic modules 1110b of the second subarray S2. In some embodiments, it should be understood that the non-active wireway 1480 or roofing shingles may overlay the second side laps 1117 of the photovoltaic modules 1110a of the first subarray S1 in the absence of the second subarray S2.

It should be understood that the embodiments described herein are merely exemplary and that a person skilled in the art may make many variations and modifications without departing from the spirit and scope of the invention. All such variations and modifications are intended to be included within the scope of the invention.

What is claimed is:

1. A system, comprising:
   a plurality of photovoltaic modules installed on a roof deck,
     wherein the photovoltaic modules are arranged in an array on the roof deck,
       wherein the array includes a first subarray and a second subarray,
     wherein each of the photovoltaic modules includes
       a first end and a second end opposite the first end, at least one solar cell,
a first encapsulant encapsulating the at least one solar cell,
wherein the first encapsulant includes a first surface and a second surface opposite the first surface,
a frontsheet juxtaposed with the first surface of the first encapsulant,
a backsheet juxtaposed with the second surface of the encapsulant,
a first side lap located at the first end, and
a wire cover bracket located at the first end,
wherein the wire cover bracket is attached to the first side lap,
wherein the wire cover bracket of one of the photovoltaic modules is substantially aligned with the wire cover bracket of an adjacent another one of the photovoltaic modules, and
wherein the wire cover bracket is configured to receive at least one electrical component,
wherein the wire cover brackets of the plurality of photovoltaic modules of the first subarray are configured to form a first wire channel, and wherein the wire cover brackets of the plurality of photovoltaic modules of the second subarray are configured to form a second wire channel; and
at least one jumper module electrically connecting the first subarray and the second subarray,
wherein the at least one jumper module includes a first side lap located at a first end thereof and a second side lap located at a second end thereof opposite the first end of the at least one jumper module,
wherein the at least one jumper module includes a first junction box located on the first side lap of the at least one jumper module,
wherein the at least one jumper module includes a second junction box located on the second side lap of the at least one jumper module, and
wherein the second junction box is electrically connected to the first junction box.

2. The system of claim 1, further comprising at least one cover removably attached to at least one of the wire cover brackets.

3. The system of claim 2, wherein the at least one cover is removably attached to a plurality of the wire cover brackets.

4. The system of claim 1, wherein the at least one electrical component includes a third junction box, wherein the third junction box of each of the photovoltaic modules of the first subarray is electrically connected to the first junction box, and wherein the third junction box of each of the photovoltaic modules of the second subarray is electrically connected to the second junction box.

5. The system of claim 1, further comprising a transition box located proximate to the first wire channel, wherein the transition box is electrically connected to the first junction box.

6. The system of claim 1, wherein the system further comprises a plurality of step flaps, wherein each of the step flaps is installed adjacent to the first end of a corresponding one of the photovoltaic modules in the first subarray.

7. The system of claim 5, further comprising a first flashing base installed on the roof deck proximate to and aligned with the first wire channel, wherein the transition box is installed on the first flashing base.

8. The system of claim 7, wherein the first flashing base includes an aperture, wherein the transition box includes a sidewall and a cover portion extending from the sidewall, and wherein the cover portion of the transition box covers at least a portion of the aperture of the first flashing base, and wherein the first junction box is located within the aperture.

9. The system of claim 8, further comprising a second flashing base installed on the roof deck proximate to and aligned with the second wire channel, wherein the second flashing base includes an aperture, and wherein the second junction box is located within the aperture of the second flashing base.

10. The system of claim 9, further comprising an electrical cable passthrough, wherein the electrical cable passthrough is configured to be installed within the aperture of the first flashing base or the aperture of the second flashing base.

11. The system of claim 10, further comprising a plurality of roofing shingles, wherein the plurality of roofing shingles overlay the first flashing base, the second flashing base, and a headlap of the at least one jumper module.

12. The system of claim 2, wherein the frontsheet includes a glass layer and a polymer layer overlaying the glass layer, and wherein the polymer layer is an uppermost layer of the photovoltaic module, and wherein the polymer layer is textured, and wherein the at least one cover is textured.

13. The system of claim 1, further comprising a third wire channel, wherein the third wire channel is located proximate to the second end of the photovoltaic modules of the second subarray.

14. The system of claim 13, wherein the third wire channel does not include electrically active components.

15. A method, comprising:
obtaining a plurality of photovoltaic modules,
wherein each of the photovoltaic modules includes
a first end and a second end opposite the first end,
a first edge extending from the first end to the second end, and
a second edge opposite the first edge and extending from the first end to the second end,
a head lap portion,
wherein the head lap portion extends from the first end to the second end and from the first edge to a location between the first edge and the second edge,
a side lap located at the first end,
wherein the side lap includes a length extending from the first end to a location between the first end and the second end, and
a wire cover bracket located on the first side lap,
wherein the wire cover bracket is configured to receive at least one electrical component;
installing at least three of the photovoltaic modules on a slope of a roof deck in an array,
wherein a first photovoltaic module of the at least three of the photovoltaic modules is horizontally adjacent to a second photovoltaic module of the at least three of the photovoltaic modules,
wherein a third photovoltaic module of the at least three of the photovoltaic modules is vertically adjacent to the first photovoltaic module,
wherein the first ends of the first and third photovoltaic modules are substantially aligned with each other,
wherein the second ends of the first and third photovoltaic modules are substantially aligned with each other, wherein the first photovoltaic module overlays at least a part of the head lap portion of the third photovoltaic module, wherein the second photovoltaic module overlays at least a part of the side lap of the first photovoltaic module, and wherein the wire cover bracket of the first photovoltaic module is substantially aligned with the wire cover bracket of the third photovoltaic module, wherein the array includes a first subarray and a second subarray, wherein the first subarray includes the first photovoltaic module and the third photovoltaic module, wherein the second subarray includes the second photovoltaic module;

obtaining at least one jumper module, wherein the at least one jumper module includes a first side lap located at a first end thereof and a second side lap located at a second end thereof opposite the first end of the at least one jumper module, wherein the at least one jumper module includes a first junction box located on the first side lap of the at least one jumper module, wherein the at least one jumper module includes a second junction box located on the second side lap of the at least one jumper module, and wherein the second junction box is electrically connected to the first junction box;

installing the at least one jumper module on the roof deck, wherein the at least one jumper module electrically connects the first subarray and the second subarray; and installing at least one lid to at least one of the wire cover brackets.

16. A system, comprising:

a plurality of photovoltaic modules installed on a roof deck, wherein the photovoltaic modules are arranged in an array on the roof deck, wherein the array includes a first subarray and a second subarray, wherein each of the photovoltaic modules includes a first end and a second end opposite the first end, at least one solar cell, a first encapsulant encapsulating the at least one solar cell, wherein the first encapsulant includes a first surface and a second surface opposite the first surface, a frontsheet juxtaposed with the first surface of the first encapsulant, a backsheet juxtaposed with the second surface of the encapsulant, and a wire cover bracket located at the first end, wherein the wire cover bracket of one of the photovoltaic modules is substantially aligned with the wire cover bracket of an adjacent another one of the photovoltaic modules, and wherein the wire cover bracket is configured to receive at least one electrical component; and at least one jumper module electrically connecting the first subarray and the second subarray, wherein the at least one jumper module includes a first side lap located at a first end thereof and a second side lap located at a second end thereof opposite the first end of the at least one jumper module, wherein the at least one jumper module includes a first junction box located on the first side lap of the at least one jumper module, wherein the at least one jumper module includes a second junction box located on the second side lap of the at least one jumper module, and wherein the second junction box is electrically connected to the first junction box.

* * * * *